US008680667B2

(12) United States Patent
Kwon et al.

(10) Patent No.: US 8,680,667 B2
(45) Date of Patent: Mar. 25, 2014

(54) SEMICONDUCTOR DEVICES, PACKAGE SUBSTRATES, SEMICONDUCTOR PACKAGES, PACKAGE STACK STRUCTURES, AND ELECTRONIC SYSTEMS HAVING FUNCTIONALLY ASYMMETRIC CONDUCTIVE ELEMENTS

(75) Inventors: Heung-Kyu Kwon, Seongnam-si (KR); Seong-Ho Shin, Hwasung-si (KR); Yun-Seok Choi, Hwasung-si (KR); Yong-Hoon Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 6 days.

(21) Appl. No.: 13/400,035

(22) Filed: Feb. 17, 2012

(65) Prior Publication Data
US 2013/0043584 A1 Feb. 21, 2013

(30) Foreign Application Priority Data

Aug. 17, 2011 (KR) .......................... 10-2011-0081666

(51) Int. Cl.
*H01L 23/02* (2006.01)
(52) U.S. Cl.
USPC ............ 257/686; 257/E25.006; 257/E25.013; 257/E25.021; 257/E25.027; 257/E23.085
(58) Field of Classification Search
USPC .................. 257/686, 777, E25.006, E25.013, 257/E25.021, E25.027, E23.085
See application file for complete search history.

(56) References Cited

U.S. PATENT DOCUMENTS

| 6,489,574 B1 | 12/2002 | Otaki et al. | |
|---|---|---|---|
| 7,286,386 B2 | 10/2007 | Miwa et al. | |
| 7,901,988 B2 * | 3/2011 | Yusof et al. | 438/109 |
| 2007/0241437 A1 * | 10/2007 | Kagaya et al. | 257/678 |
| 2008/0088001 A1 * | 4/2008 | Kim et al. | 257/686 |
| 2010/0052132 A1 * | 3/2010 | Baek et al. | 257/686 |

FOREIGN PATENT DOCUMENTS

| JP | 2002-111156 | 4/2002 |
|---|---|---|
| JP | 2004-071838 | 3/2004 |
| KR | 1020040023493 A | 3/2004 |
| KR | 1020080088094 A | 10/2008 |

* cited by examiner

*Primary Examiner* — Jasmine Clark
(74) *Attorney, Agent, or Firm* — Renaissance IP Law Group LLP

(57) ABSTRACT

A package stack structure may an upper package include an upper package substrate having a first edge and a second edge opposite to the first edge. The upper package substrate has a first region arranged near the first edge and a second region arranged near the second edge. A first upper semiconductor device is mounted on the upper package substrate. The package stack structure may also include a lower package having a lower package substrate and a lower semiconductor device. The lower package is connected to the upper package through a plurality of inter-package connectors. The plurality of the inter-package connectors may include first inter-package connectors configured to transmit data signals; second inter-package connectors configured to transmit address/control signals; third inter-package connectors configured to provide a supply voltage for an address/control circuit; and fourth inter-package connectors configured to provide a supply voltage for a data circuit.

31 Claims, 98 Drawing Sheets

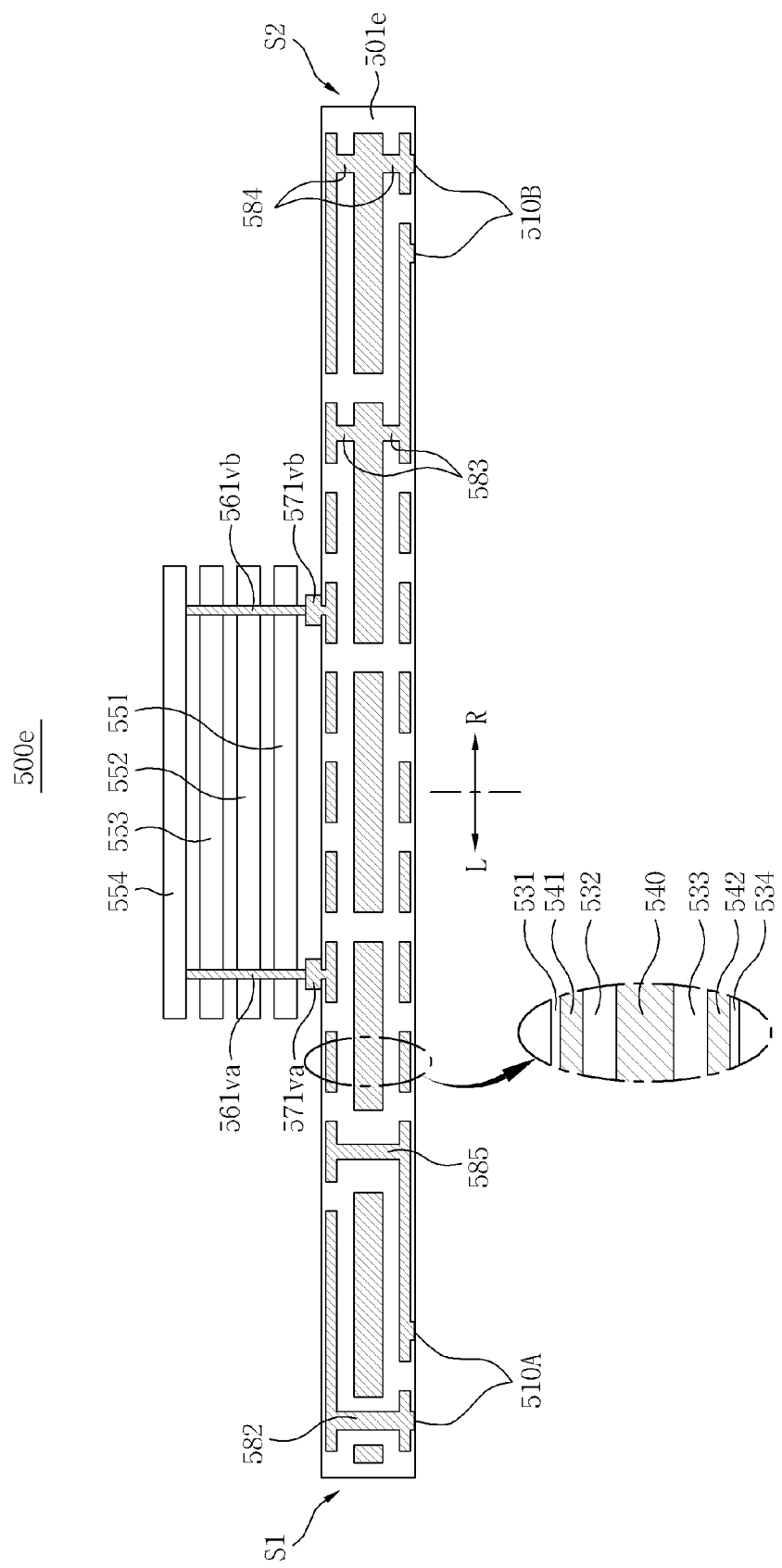

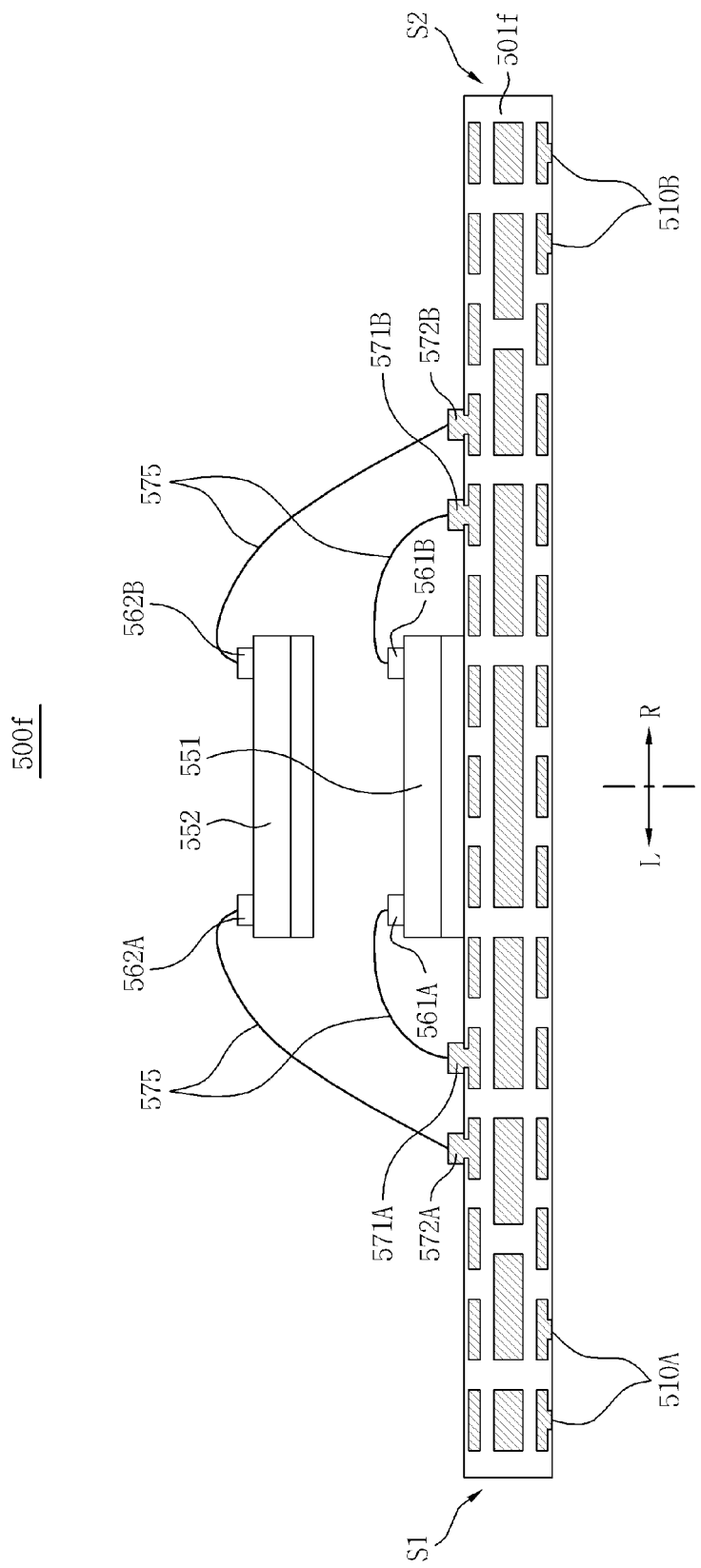

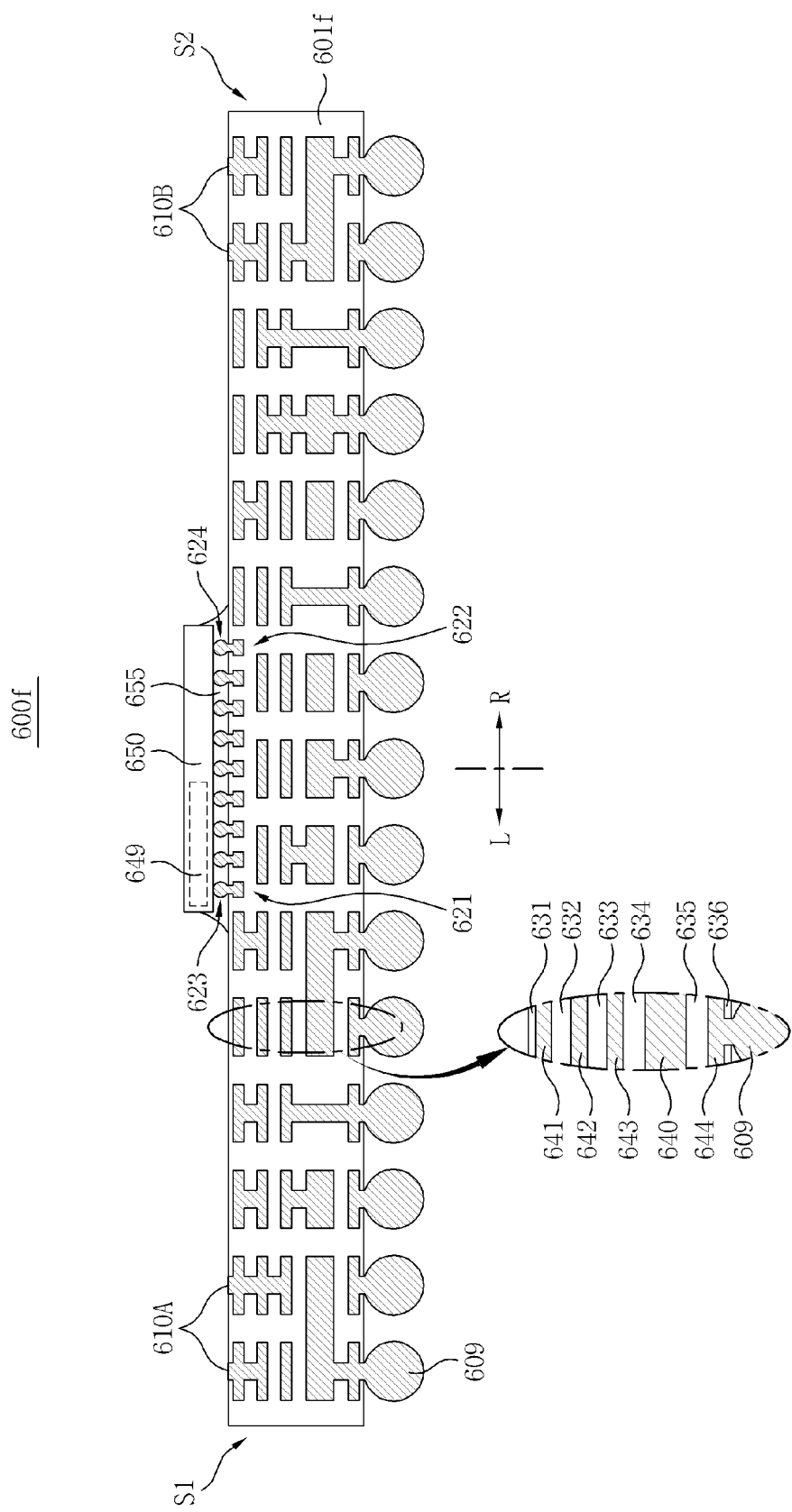

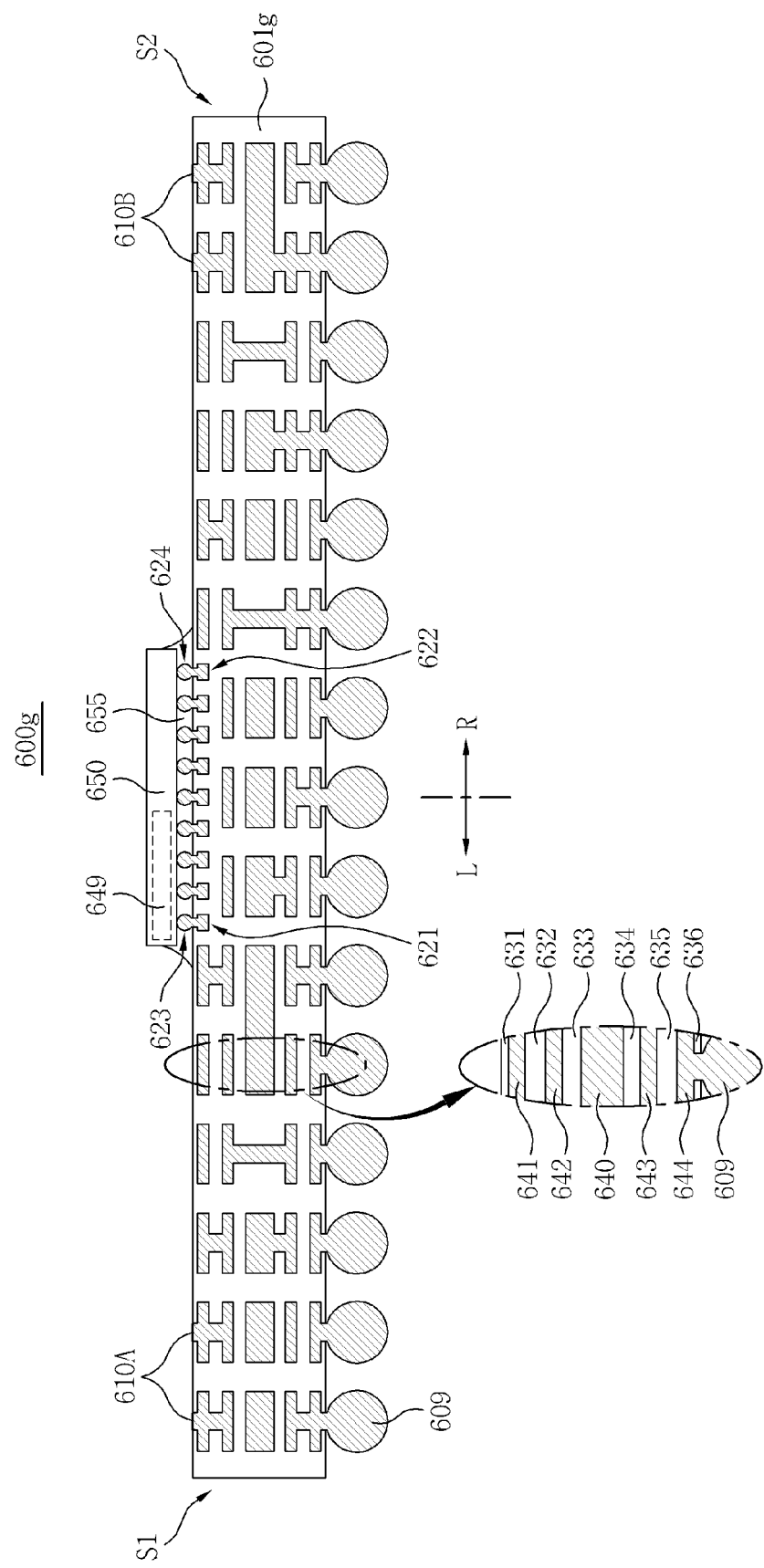

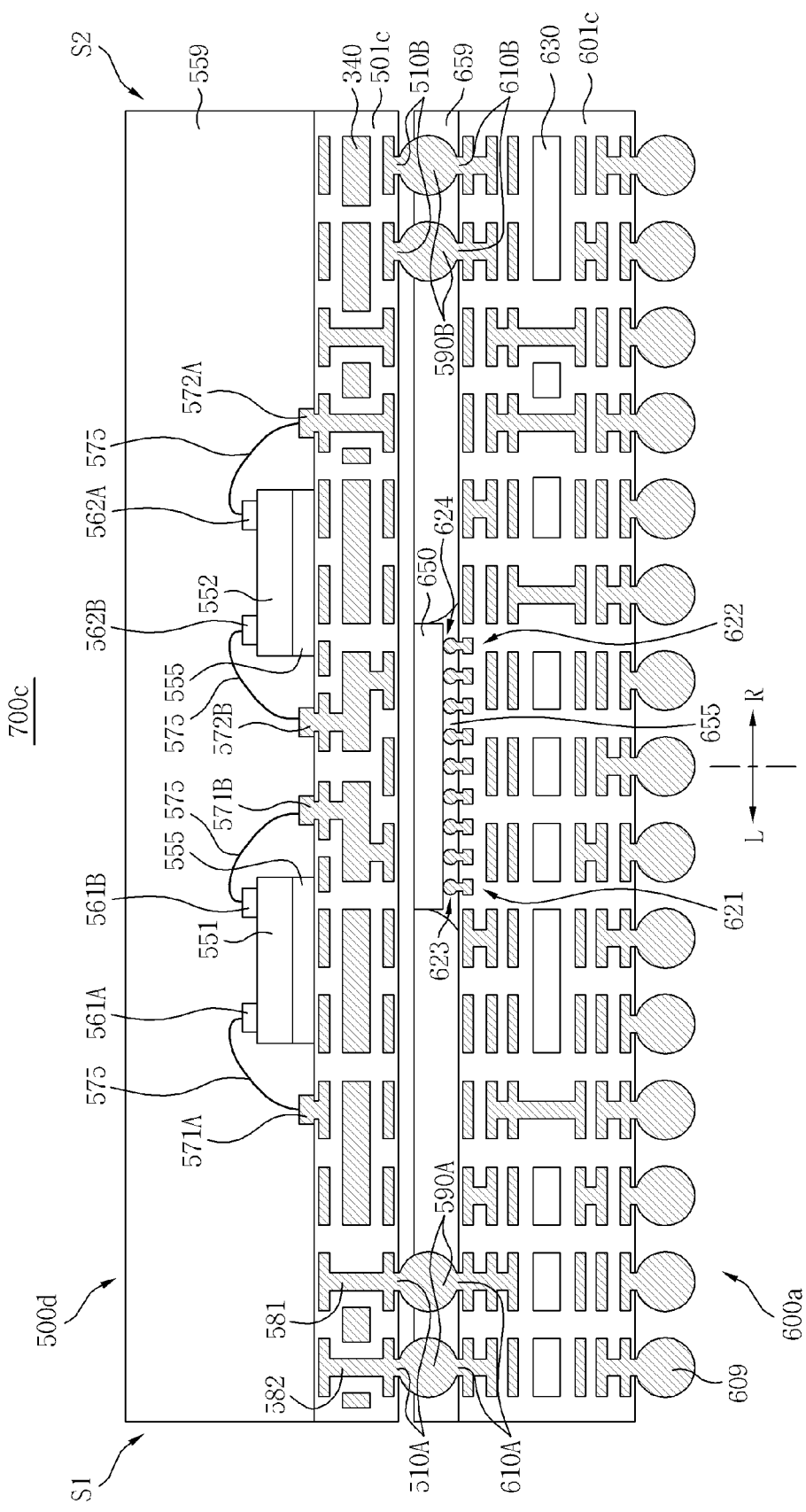

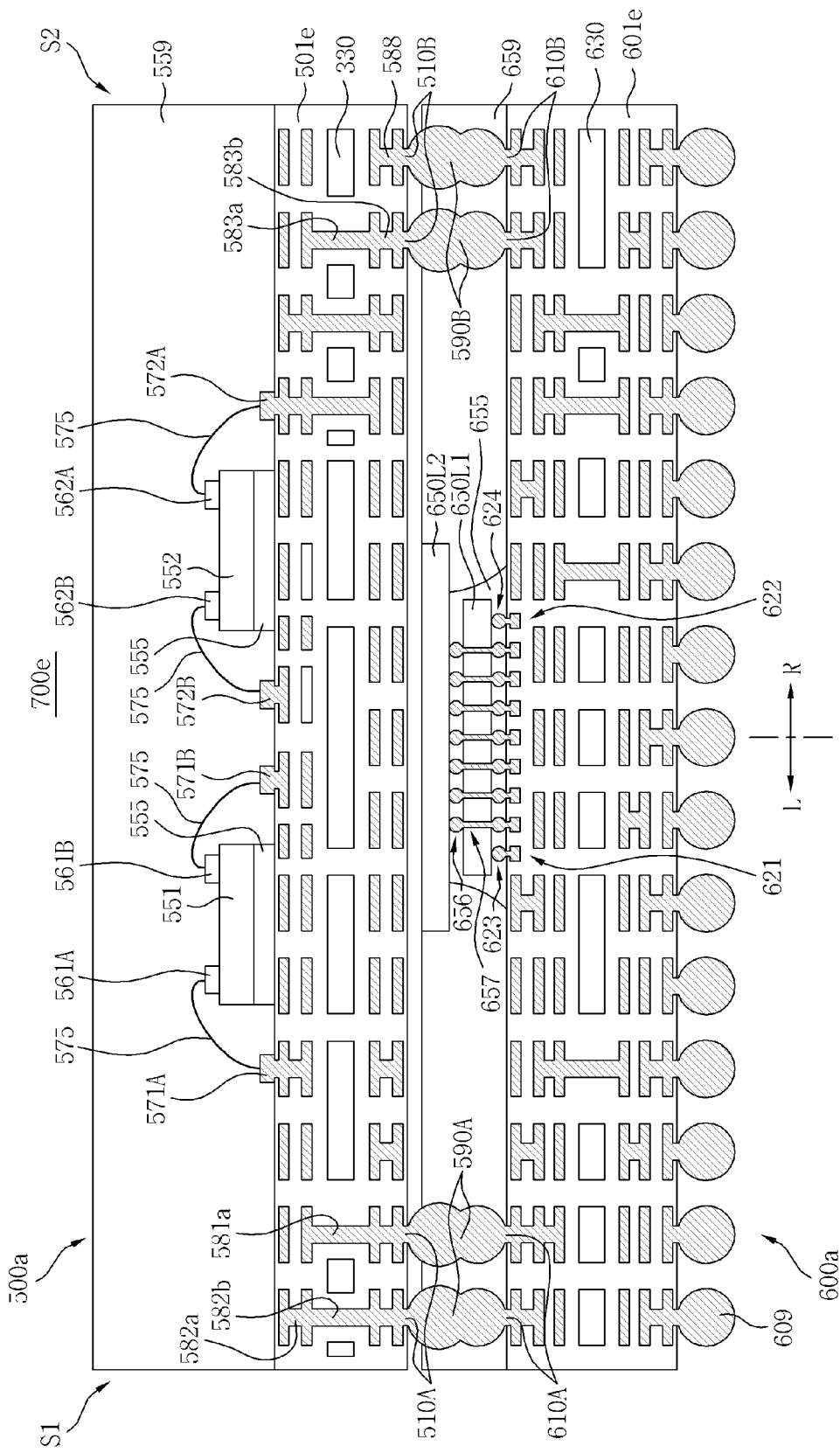

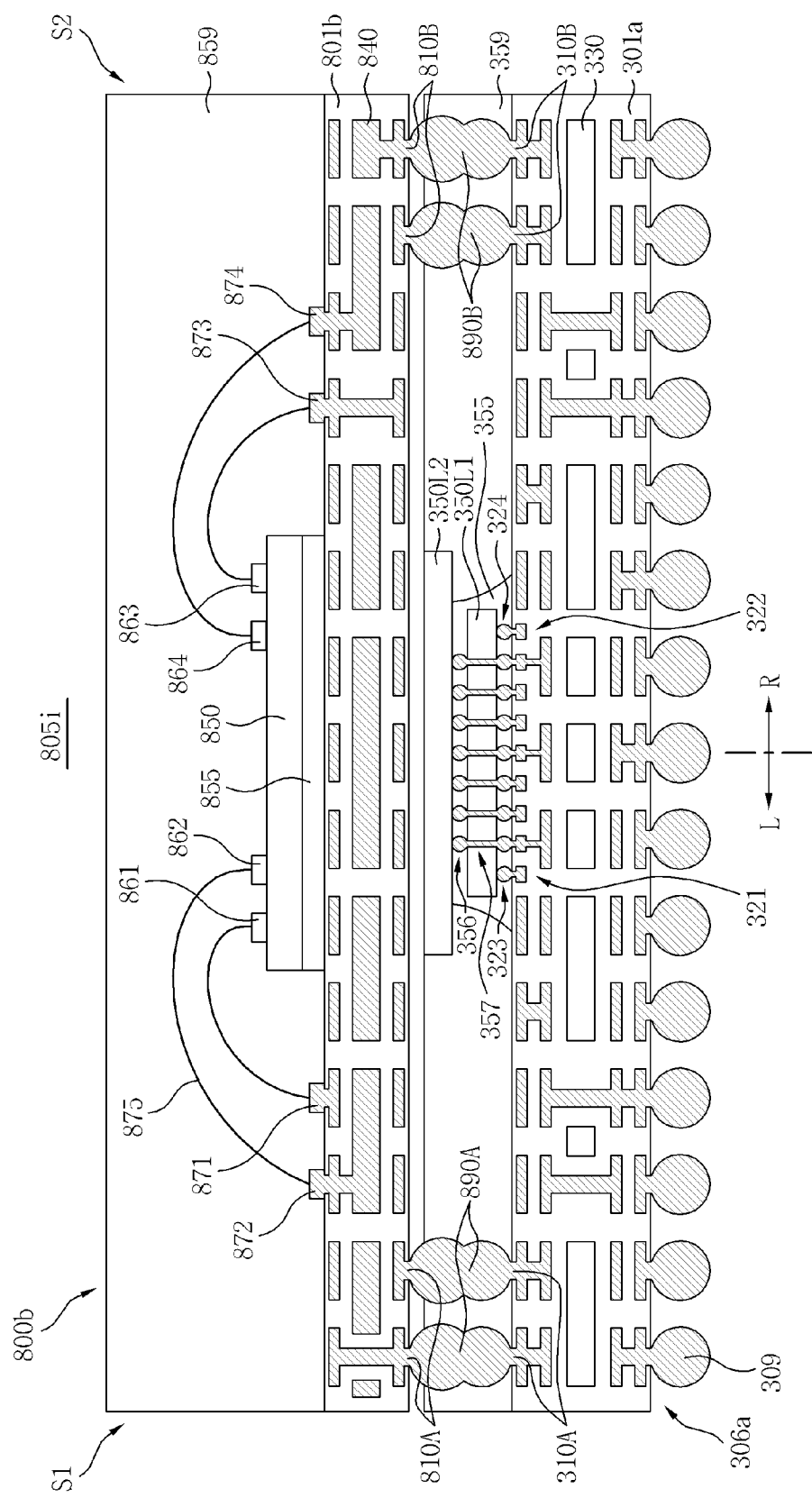

SEMICONDUCTOR DEVICES, PACKAGE SUBSTRATES, SEMICONDUCTOR PACKAGES, PACKAGE STACK STRUCTURES, AND ELECTRONIC SYSTEMS HAVING FUNCTIONALLY ASYMMETRIC CONDUCTIVE ELEMENTS

CROSS-REFERENCE TO RELATED APPLICATION

This application claims priority under 35 U.S.C. §119 to Korean Patent Application No. 10-2011-0081666 filed on Aug. 17, 2011, the disclosure of which is hereby incorporated by reference in its entirety.

BACKGROUND

1. Technical Field

Embodiments of the inventive concept relate to semiconductor devices, package substrates, semiconductor packages, package stack structures, and electronic systems having functionally asymmetric conductive elements.

2. Description of Related Art

In mobile electronic systems, small-sized, thin, and lightweight electronic components have been required more and more. This is especially true with newer mobile devices such as mobile phones or tablet PCs as these devices nowadays have only a small space available for their components.

SUMMARY

In one embodiment, a package stack structure includes an upper package comprising an upper package substrate having a first edge and a second edge opposite to the first edge, the upper package substrate having a first region arranged near the first edge and a second region arranged near the second edge, the upper package comprising a first upper semiconductor device overlying the upper package substrate; a lower package having a lower package substrate and a lower semiconductor device, the lower package connected to the upper package through a plurality of inter-package connectors. The plurality of the inter-package connectors include first inter-package connectors configured to transmit data signals; second inter-package connectors configured to transmit address/control signals; third inter-package connectors configured to provide reference voltage for an address/control circuit; fourth inter-package connectors configured to provide reference voltage for a data circuit. A majority of the first and second inter-package connectors are disposed in the first region, and a majority of the third inter-package connectors are disposed in the second region.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIGS. 7A through 7H are schematic views of upper packages according to various embodiments of the inventive concept;

FIGS. 8A through 8I are lateral sectional, longitudinal sectional, and partial exploded views of lower packages according to some embodiments of the inventive concept;

FIGS. 9A through 9H are cross-sectional views of package stack structures according to various embodiments of the inventive concept;

FIGS. 12A through 12J are lateral sectional and longitudinal sectional views of package stack structures according to various embodiments of the inventive concept;

DETAILED DESCRIPTION OF THE EMBODIMENTS

Figure 1A:
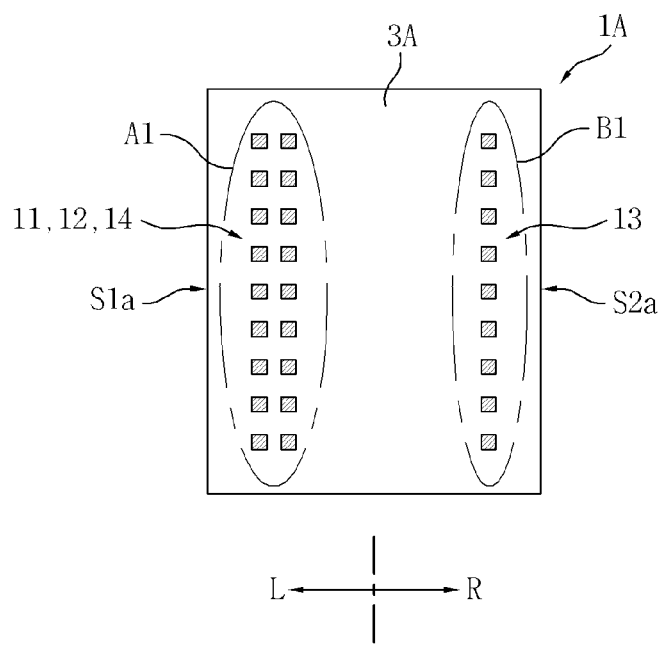
FIGS. 1A through 1D are conceptual plan views showing arrangements of input/output (I/O) elements of semiconductor devices according to some embodiments of the inventive concept.

Various example embodiments will now be described more fully with reference to the accompanying drawings in which some example embodiments are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. In the drawings, the sizes and relative sizes of layers and regions may be exaggerated for clarity. Like numbers refer to like elements throughout.

Embodiments of the inventive concept are described herein with reference to cross-section illustrations that are schematic illustrations of idealized embodiments of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. Thus, the regions illustrated in the figures are schematic in nature and their shapes are not intended to illustrate the precise shape of a region of a device and are not intended to limit the scope of the inventive concept.

In the present specification, the same reference numeral may refer to components having the same function. That is, components denoted by the same reference numeral may assume different shapes.

In the present specification, data signals may refer to electric signals having effective information to be transmitted and received between a memory device and a memory controller.

In the present specification, reference voltages (or supply voltages) for a data circuit may refer to the maximum voltage Vddq of the data signal, the minimum voltage Vssq thereof, or an intermediate voltage Vrefq required for determining an effective value. The reference voltages for a data circuit may be independently variously determined according to the characteristics of a memory device.

In the present specification, address/control signals may refer to signals required for controlling information regarding the position of a cell in which information regarding a memory device is written and operations of the memory device.

In the present specification, reference voltages (or supply voltages) for an address/control circuit may refer to the maximum voltages Vdd or minimum voltages Vss of the address/control signals. The reference voltages for the address/control circuit may be independently variously determined according to the characteristics of a memory device.

In the present specification, reference voltages (or supply voltages) for a data circuit and reference voltages (or supply voltages) for an address/control circuit may have different voltage levels and be interpreted as voltages provided through conductive components distinguished from one another.

In the present specification, the terms a first side, a first side surface, and a left side may be interpreted as being synonymous with one another. Also, the terms a second side, a second side surface, and a right side may be interpreted as being synonymous with one another. The first and second sides may be disposed opposite to each other or disposed near each other at right angles. That is, although the first and second sides may be top and bottom sides or left and right sides, the first and second sides alternatively may be top and left (or right) sides or bottom and left (or right) sides. Therefore, the first and second sides or the first and second lateral surfaces may be interpreted as different features.

In the present specification, the term "near" may be interpreted as "relatively close to". For example, being near a first side may be interpreted as being closer to a first side than to a second side.

FIGS. 1A through 1D are conceptual plan views of arrangements of input/output (I/O) elements (bonding pads) of semiconductor devices according to some embodiments of the inventive concept.

Referring to FIG. 1A, a semiconductor device 1A according to some embodiments of the inventive concept may include first bonding pads 11, second bonding pads 12 and fourth bonding pads 14 disposed in a region A1 near a first side (or first edge) S1a of a surface 3A thereof. The semiconductor device 1A may include third bonding pads 13 disposed in a region B1 thereof near a second side (or second edge) S2a. The semiconductor device 1A according to the present embodiments may include functionally asymmetrical bonding pads 11, 12, 13, and/or 14. For example, the first and second bonding pads 11, 12 for transmitting signals and the fourth bonding pads 14 for providing supply voltages or reference voltages Vddq/Vssq for a data circuit may be asymmetrically disposed in the region A1. Also, the third bonding pads 13 for providing supply voltages (or reference voltages) for an address/control circuit may be asymmetrically disposed in the region B1. In the present specification, the term "asymmetry" may be interpreted as "not equivalent" or not symmetrically located or disposed relative to a given central axis subdividing a substrate's planar surface region. Furthermore, disposing components asymmetrically may be broadly interpreted as concentrating the components on a specific region, e.g. disposed in a region near the first edge or in a first edge region, or interpreted as not disposing the components in other regions.

The first and second bonding pads 11 and 12 may be arranged in at least one column or block or may be disposed non-uniformly within the region A1. The region A1 may be disposed near the first side (or first edge) S1a of the semiconductor device 1A. In other words, the first and second bonding pads 11 and 12 may be functionally asymmetrically disposed near the first side S1a of the semiconductor device 1A. In FIG. 1, according to an embodiment of the inventive concept, assuming that the first side S1a is a left side, the first and second bonding pads 11 and 12 may be near the left side of the semiconductor device 1A or functionally asymmetrically disposed in a left half portion L. The region B1 may be disposed near a second side S2a opposite the first side S1a. The third bonding pads 13 may be arranged in at least one discrete column or block, or be disposed non-uniformly in the region B1. In FIG. 1A, assuming that the second side S2a is a right side, the third and fourth bonding pads 13 and 14 may be near the right side of the semiconductor device 1A or functionally asymmetrically disposed on one or another side of an imaginary centerline, e.g., in a right half portion R.

However, the present disclosure is not limited to the above-described arrangements, and other arrangements are also possible. For example, a portion of the first and/or second bonding pads 11,12, 14 may be disposed in a right half portion R while a majority of the first, second, and/or fourth bonding pads 11,12, 14 may be disposed in a left half portion L or a region near the first side S1a. Also, a portion of the third bonding pads 13 may be disposed in the left half portion L while a majority of the third bonding pads 13 may be disposed in the right half portion R.

In another embodiment, a majority of the first bonding pads 11 may be disposed near the first edge S1*a* and a majority of the second bonding pads 12 are disposed near the second edge S2*a*.

In FIG. 1A, a top side and a bottom side may be interpreted as a third side (or third edge) and a fourth side (or fourth edge), respectively, and vice versa. From a different viewpoint, each of the regions A1 and B1 may be interpreted as any one of a top half portion T, a bottom half portion B, the left half portion L, and the right half portion R of the semiconductor device 1A depending on a direction in which the semiconductor device 1A is placed.

In the present specification, the expression "being disposed opposite each other" may not necessarily refer to being disposed in opposite directions to face or turn against each other. The expression "being disposed opposite" may be interpreted as not being in the same direction. For example, when components are vertically near each other, the components "being disposed opposite each other" may be disposed near each other or spaced apart from each other. Accordingly, although top and bottom sides are typically opposite each other and left and right sides are typically opposite each other, in the specification, the expression "opposite sides" may refer to top and left sides, top and right sides, bottom and left sides, or bottom and right sides.

In some embodiments, the fourth bonding pads 14 may be asymmetrically disposed in the region B1 or distributed between the regions A1 and B1.

In the present embodiments described with respect to FIGS. 1A through 1D, the first bonding pads 11 may transmit data signals, and the second bonding pads 12 may transmit address/control signals. The third bonding pads 13 may provide supply voltages (or reference voltages) Vdd/Vss for an address/control circuit 7125 illustrated in, for example, FIG. 20A. The fourth bonding pads 14 may provide supply voltages (or reference voltages) Vddq/Vssq for a data circuit 7124 illustrated in, for example, FIG. 20A.

Since the semiconductor devices 1A to 1D according to some embodiments of the inventive concept include functionally asymmetric bonding pads 11 to 14, when the semiconductor devices 1A to 1D are packaged, the lengths of metal routes of package substrates corresponding to the respective semiconductor devices 1A to 1D and a deviation between the metal routes may be reduced as explained below.

Figure 10:
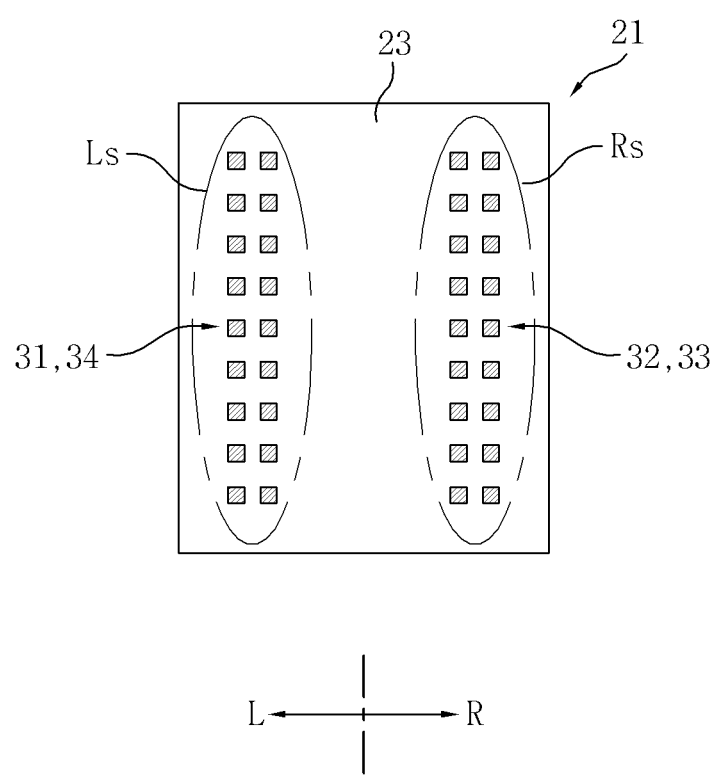
FIG. 10 is a conceptual plan view showing arrangement of bonding pads of a semiconductor device according to some embodiments of the inventive concept.

In a symmetrical arrangement, signal bonding pads, e.g., bonding pads for transmitting data signals and bonding pads for transmitting address/control signals of a memory device such as dynamic random access memories (DRAMs) or non-volatile memories, as a whole, are symmetrically disposed on both sides of a memory device as illustrated in FIG. 10 of the present application. In FIG. 10, bonding pads 31 for transmitting data signals and bonding pads 33 for transmitting address/control signals are disposed on either side of a memory device 21, thus resulting in a symmetrical distribution of signal (for example, data or address/control) bonding pads, i.e., a functionally symmetrical arrangement. In a package-on-package (POP) structure, a memory device may be mounted on and electrically connected to a package substrate. With a functionally symmetrical arrangement, the signal routes in the package substrate, which interconnect the memory device and a logic device, can be complicated such that a large number of package substrate printed circuit board (PCB) layers may be needed. This is especially true when the memory device is stacked over a logic device having a control circuit to control the memory device in a POP structure. However, if functionally asymmetrical (e.g., having asymmetry with respect to the location of signal bonding pads) bonding pad arrangements (as shown, for example, in FIGS. 1A-1D) are employed, signal bonding pads may be concentrated or arranged on a particular side of the memory device. In this configuration, the lengths of signal routes required in the package substrates can be significantly reduced and signal routes can be simplified. This is because routes previously divided into multiple regions may be integrated into a single layer, while a layer previously used only for address routing may be omitted and combined with a data signal routing layer or a land design layer. Thus, the number of PCB layers for the package substrate can be reduced. Furthermore, when an insulating core layer in a package substrate is replaced by a metal core layer, the metal core layer may be employed as both a routing layer of a package substrate and a ground plane surface, thus reducing the total number of PCB layers of a package substrate as will be explained further below.

As described in further detail above, the terms "asymmetry", "asymmetrical", and "functionally asymmetrical" may refer to the location of elements for performing one or more desired functions (such as transmitting signals or providing reference voltages) being arranged in a non-symmetrical manner with respect to the device or substrate on which they are included.

Accordingly, signal loss may be reduced, occurrence of noise may be suppressed, and a signal transmission rate may be enhanced. Also, routing design of the package substrates may be simplified due to the arrangement of the functionally asymmetrical bonding pads 11 to 14. When the routing design of the package substrates is simplified, the number of metal layers of the package substrate may be reduced. The above-described effects will be described in further detail later.

Figure 1B:
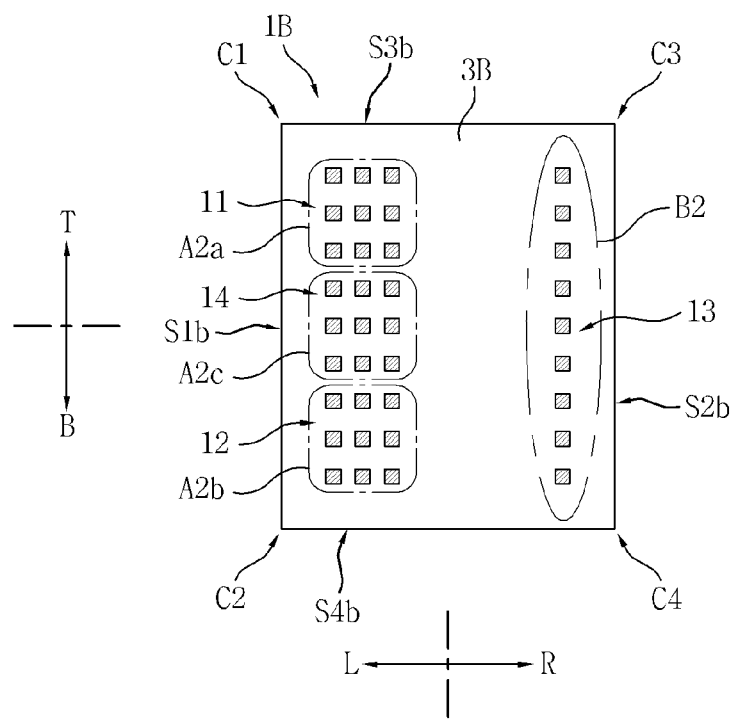

Referring to FIG. 1B, the semiconductor device 1B according to some embodiments of the inventive concept may include first bonding pads 11 functionally asymmetrically disposed in a region A2*a* of a surface 3B thereof and second bonding pads 12 functionally asymmetrically disposed in a region A2*b* of the surface 3B thereof.

Each of the regions A2*a* and A2*b* may form a block. Specifically, the region A2*a* may be near a first corner C1, and the region A2*b* may be near a second corner C2. Third bonding pads 13 and 14 may be functionally asymmetrically disposed near a third corner C3 or a fourth corner C4. The region A2*a* may be near a first side S1*b* and third side S3*b* of the semiconductor device 1B. Assuming that the first side S1*b* is a left side and the third side S3*b* is a top side, the region A2*a* may be disposed in a left half portion L and top half portion T (i.e., an upper left region) of the semiconductor device 1B. The region A2*b* may be near the first side S1*b* and the fourth side S4*b*, while opposite a second side S2*b* and the third side S3*b* of the semiconductor device 1B. Assuming that the third side S3*b* is a top side and the fourth side S4*b* is a bottom surface, the region A2*b* may be disposed in the left half portion L and a bottom half portion B (i.e., a lower left region) of the semiconductor device 1B. A region B2 may be near the second side S2*b* or right side of the semiconductor device 1B. That is, the region B2 may be disposed in a right half portion R of the semiconductor device 1B. The bonding pads 11 to 14 may be arranged to form blocks, lines, or columns. In some embodiments, the fourth bonding pads 14 may be distributed in a region A2*c* between the region A2*a* and the region A2*b*.

Figure 1C:
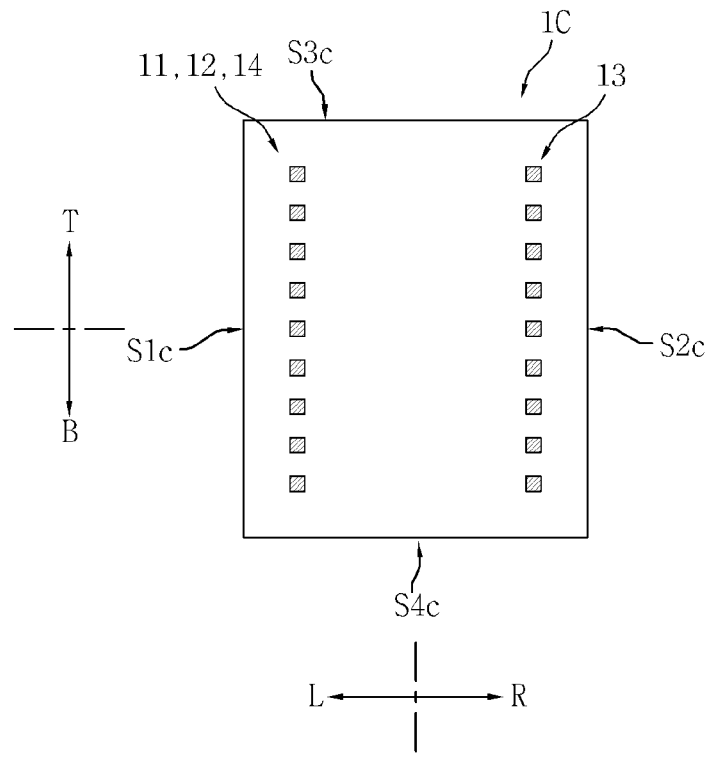

Referring to FIG. 1C, the semiconductor device 1C according to an embodiment of the inventive concept may include bonding pads 11 to 14 distributed on a surface 3C thereof near a first side S1c and a second side S2c opposite the first side S1c. The bonding pads 11 to 14 may be arranged in at least one row or column.

The first and second bonding pads 11 and 12 may be disposed near the first side S1c of the semiconductor device 1C. The first and second bonding pads 11 and 12 may be asymmetrically disposed in a left half portion L. However, some of the first and/or second bonding pads 11 and 12 may be disposed outside of the left half portion L while a majority of the first and/or second bonding pads 11 and 12 are disposed near the first side S1c or the left half portion L depending on the application. The third bonding pads 13 may be disposed near the second side S2c of the semiconductor device 1C. The third bonding pads 13 may be asymmetrically disposed in a right half portion R. However, some of the third bonding pads 13 may be disposed outside of the right half portion R while a majority of the third bonding pads 13 are disposed near the second side S2c or the right half portion R depending on the application.

Figure 1D:
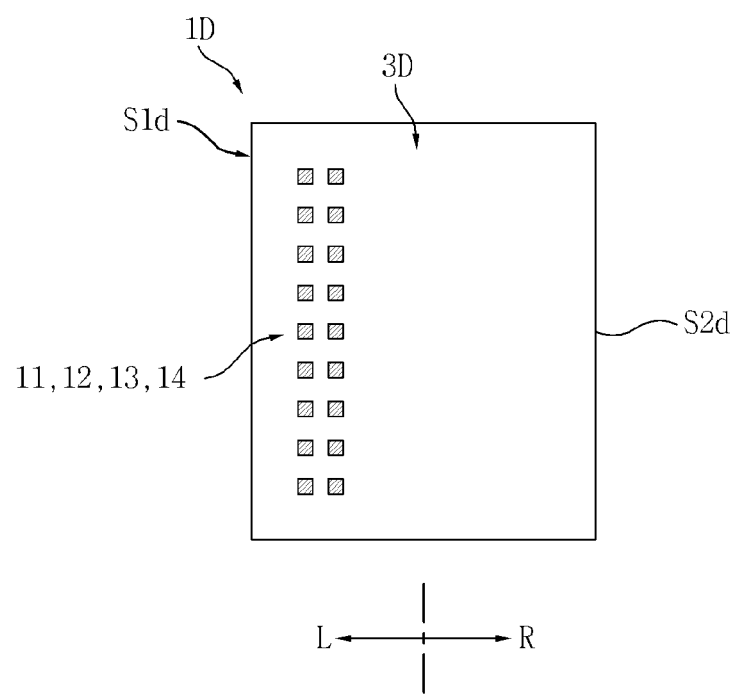

Referring to FIG. 1D, the semiconductor device 1D according to an embodiment of the inventive concept may include bonding pads 11 to 14 disposed near a first side S1d of a surface 3D thereof. The bonding pads 11 to 14 may include first through fourth bonding pads 11 to 14.

Assuming that the first side S1d is a left side, a majority (or all) of the bonding pads 11 to 14 may be disposed near the left side (or near the first edge) S1d of the semiconductor device 1D or asymmetrically disposed in the left half portion L. Alternatively, a majority (or all) of the bonding pads 11 to 14 may be disposed near a right side or the second edge S2d of the semiconductor device 1D or asymmetrically disposed in the right half portion R.

Each of the semiconductor devices 1A to 1D shown in FIGS. 1A through 1D may include a memory device, such as a dynamic random access memory (DRAM), ReRAM, Magnetoresistive random access memory (MRAM) such as spin-transfer torque (STT)-MRAM or a flash memory device.

Figure 2A:
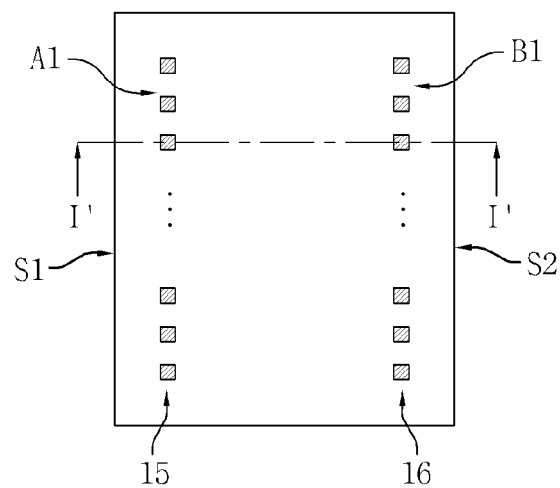
FIGS. 2A through 2D are a plan view schematically illustrating a method of redistributing input/output (I/O) elements of a semiconductor device according to some embodiments of the inventive concept and cross-sectional views taken along line I-I' of FIG. 2A.

FIGS. 2A through 2D are plan views illustrating a method of redistributing bonding pads of a semiconductor device according to embodiments of the inventive concept and cross-sectional views taken along line I-I' of FIG. 2A.

Referring to FIG. 2A, a semiconductor device 2 according to some embodiments of the inventive concept may include bonding pads 15 and bonding pads 16 redistributed on a surface thereof. The bonding pads 15 and the bonding pads 16 may be redistributed near a first side S1 and a second side S2, respectively. As compared with FIGS. 1A through 1D, the bonding pads 15 redistributed near the first side S1 may include first, second and/or fourth bonding pads 11, 12, 14 and the bonding pads 16 disposed near the second side S2 may include third bonding pads 13.

Figure 2B:
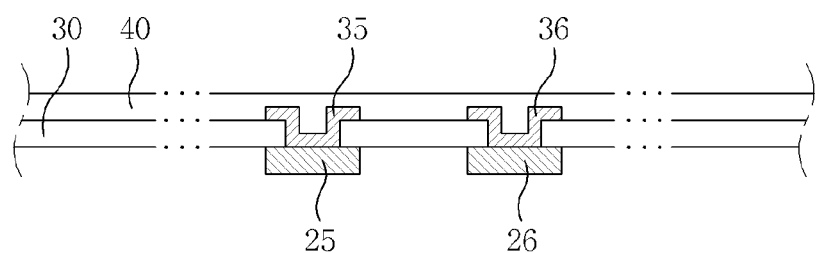

Referring to FIG. 2B, a first interconnection or first chip pad 25 and a second interconnection or second chip pad 26 may be formed on a lower structure 20 in a semiconductor production line. Each of the first and second interconnections 25 and 26 may include a metal, which may correspond to, for example, an uppermost metal layer during a wafer processing process. A first insulating layer 30 may be formed to expose top surfaces of the first and second interconnections 25 and 26. First and second interconnection pads 35 and 36 may extend from the top surfaces of the first and second interconnections 25 and 26, respectively, onto a sidewall and top surface of the first insulating layer 30. A capping layer 40 may partially cover the first and second interconnection pads 35 and 36. The capping layer 40 may include polyimide and/or a dielectric material such as silicon nitride.

Figure 2C:
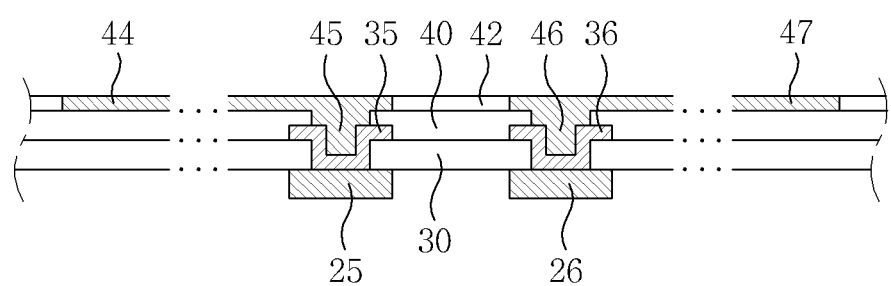

Referring to FIG. 2C, a cast pattern 42 may be formed outside the clean room, for example, in a package fabrication line, to cover the capping layer 40 and expose the first and second interconnection pads 35 and 36, and redistribution patterns 44, 45, 46, and 47 may be formed. The redistribution patterns 44, 45, 46, and 47 may include redistribution patterns 44 and 47 that laterally extend from tops of the interconnection pads 35 and 36. The cast pattern 42 may include photosensitive polyimide. The redistribution patterns 44, 45, 46, and 47 may include a metal. Alternatively, the redistribution patterns 44, 45, 46, and 47 may include a viscous conductive material and be formed using a pasting process or dispensing process and then hardened using a sintering process and/or a curing process.

Figure 2D:
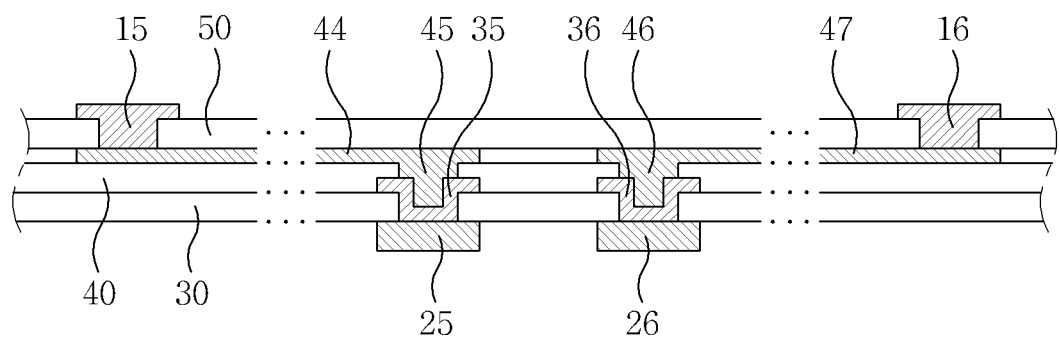

Referring to FIG. 2D, a wrapping layer 50 may be formed to partially expose the redistribution patterns 44 and 47, and bonding pads 15 and 16 may be formed on the redistribution patterns 44 and 47. The wrapping layer 50 and/or the bonding pads 15 and 16 may be omitted. That is, some of the redistribution patterns 44 and 47 may serve as the bonding pads 15 and 16.

Therefore, the first interconnection pad or chip pad 25 may be electrically connected to the first bonding pads 15 via the redistribution patterns 44, 45, 46, and/or 47. Also, the second interconnection pad or chip pad 26 may be electrically connected to the second bonding pads 12 via the redistribution patterns 44, 45, 46, and/or 47.

The processes described with reference to FIGS. 2A through 2D may be performed according to an embodiment of the inventive concept. That is, a method of redistributing bonding pads of a semiconductor device according to the inventive concept may be performed in various ways other than those described in the present specification. When performed in the package fabrication line as in the present embodiments, the redistribution process may be performed in simpler and less expensive manners than in a wafer processing line. For example, the clean room may not need to be as rigorously maintained as the clean room used for the wafer processing line, and the package fabrication line may require less-expensive equipment and lower-priced raw subsidiary materials. Also, the redistribution patterns, e.g., 44 and 47 may have different shapes than those disclosed in FIG. 2D within the sprit and scope of the present disclosure. For example, the bonding pads 15, 16 may be connected to the chip pads 25, 26 without the first and second interconnection pads 35, 36.

In some embodiments, the first, second, third, and/or fourth bonding pads 11, 12, 13, 14 may be formed using processes described in FIGS. 2A-2D. In other words, the first, second, third, and/or fourth bonding pads 11, 12, 13, 14 shown in FIGS. 1A-1D are chip pads similar to the chip pads 25, 26 shown in FIGS. 2A-2D.

FIGS. 3A through 3I are exploded perspective views of package stack structures according to various embodiments of the inventive concept. In FIGS. 3A through 3H, like components and/or like reference numerals may be interpreted as components having the same or similar functions. Accordingly, only key differences among the respective embodiments will be described.

Figure 3A:
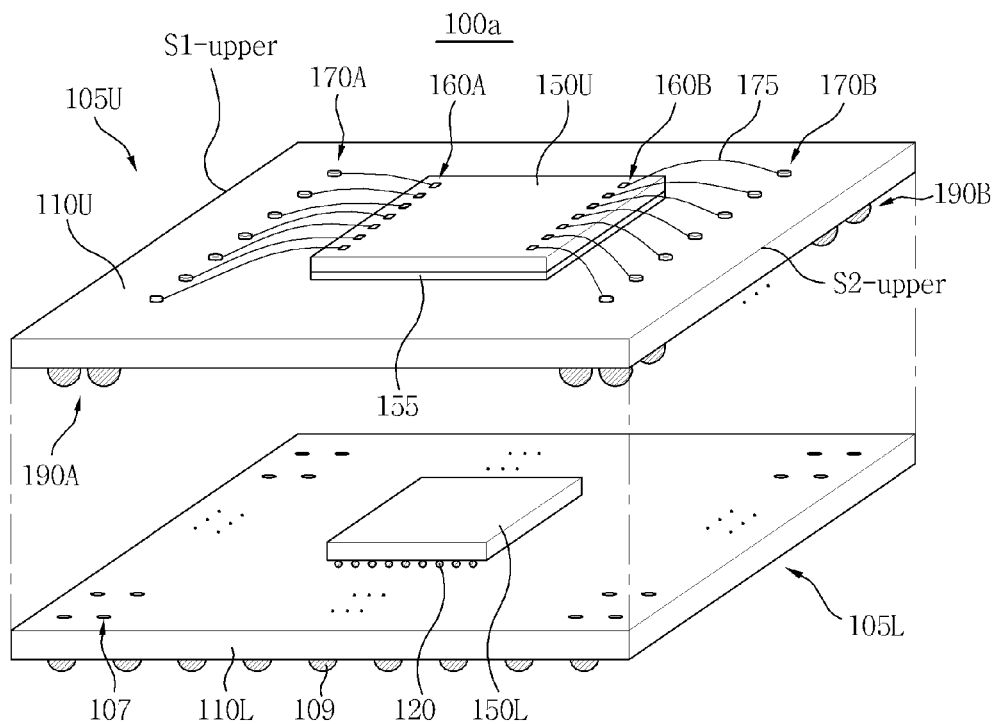
FIGS. 3A through 3I are exploded perspective views of package stack structures according to various embodiments of the inventive concept.
Figure 3B:
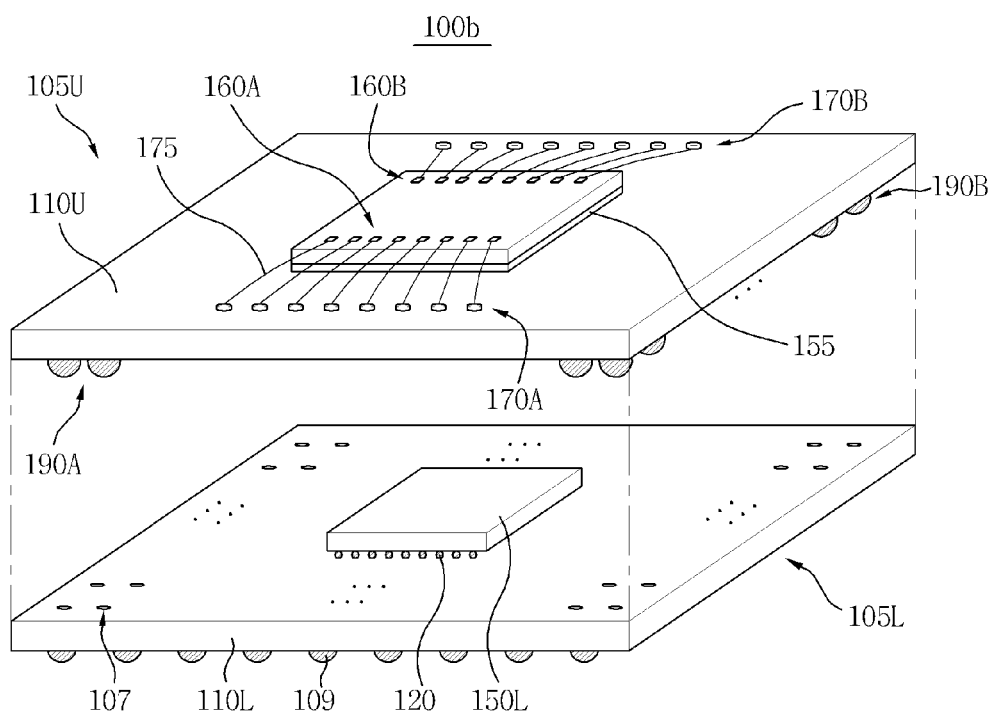

Referring to FIGS. 3A and 3B, each of package stack structures 100a and 100b according to some embodiments of the inventive concept may include an upper package 105U, a lower package 105L, and inter-package connectors 190A and 190B. Each of the package stack structures 100a and 100b may further include board connectors 109 disposed on a bottom surface of the lower package 105L.

The upper package 105U may include an upper package substrate 110U and an upper semiconductor device 150U mounted thereon. The upper semiconductor device 150U may include a memory device. For instance, the upper semiconductor device 150U may include a DRAM, a static RAM (SRAM), a phase-changeable RAM (PRAM), a magnetic RAM (MRAM), a resistive RAM (RRAM), a nonvolatile memory (NVM), a flash memory, an electro-mechanical memory, a carbon nanotube memory, and/or various other memory devices. For brevity, the present embodiment will be described on the assumption that the upper semiconductor device 150U is a DRAM.

Referring to FIGS. 3A and 3B, the upper semiconductor device 150U may include bonding pads 160A having a first characteristic and bonding pads 160B having a second characteristic disposed on the surface thereof. The bonding pads 160A having the first characteristic may be disposed near a left side of the surface of the upper semiconductor device 150U, and the bonding pads 160B having the second characteristic may be disposed near a right side thereof. The bonding pads 160A having the first characteristic may perform a first function. In particular, the bonding pads 160A having the first characteristic may transmit or provide data signals and/or reference voltages (or supply voltages) Vddq and Vssq for a data circuit. The bonding pads 160A having the first characteristic may also serve a second function. In particular, the bonding pads 160A having the first characteristic may transmit address/control signals. The bonding pads 160B having the second characteristic may serve a third function. In particular, the bonding pads 160B having the second characteristic may provide reference voltages (or supply voltages) Vdd and Vss for an address/control circuit.

As used hereinafter in the specification, an element having "the first characteristic" can refer to an element configured to transmit or provide data signals, an address/control signal, a reference voltage (or supply voltage) for a data circuit, or any other desired signal or voltage. Likewise, an element having "the second characteristic" can refer to an element configured to transmit or provide a reference voltage (or supply voltage) for an address/control circuit, or any other circuits for desired signals or voltages.

Also, as used hereinafter in the specification, a first function may refer to "transmitting data signals and/or providing reference voltages (or supply voltages) for a data circuit". A second function may also refer to "transmitting address/control signals." A third function may refer to "providing reference voltages (or supply voltages) for an address/control circuit."

The bonding pads 160A and 160B having the first and second characteristics may be functionally asymmetrically arranged. More specifically, the upper semiconductor device 150U or the bonding pads 160A and 160B having the first and second characteristics may be understood with reference to the arrangement of the semiconductor devices 1A to 1D and the first through fourth bonding pads 11 to 14 described with reference to FIGS. 1A through 1D. Accordingly, the bonding pads 160A and 160B having the first and second characteristics may include an under bumped metal (UBM) for a flip-chip bonding process or wire-bonding process. The bonding pads 160A and 160B having the first and second characteristics may also be referred to using other technical terms such as "functional I/O elements" according to the function they are configured to perform. The upper semiconductor device 150U may be mounted on the upper package substrate 110U using, for example, a die-bond film 155 and covered with an upper molding compound. For clarity, the upper molding compound is omitted.

The upper package substrate 110U may include wire lands 170A and 170B having the first and second characteristics disposed on a top surface thereof and upper inter-package connector lands (not shown) disposed on a bottom surface thereof. The wire lands 170A and 170B having the first and second characteristics may be electrically connected to the bonding pads 160A and 160B having the first and second characteristics, respectively, through wires 175. Specifically, the wire lands 170A having the first characteristic may be electrically connected to the bonding pads 160A having the first characteristic, while the wire lands 170B having the second characteristic may be electrically connected to the bonding pads 160B having the second characteristic. Accordingly, the wire lands 170A having the first characteristic may serve the first and/or second functions. Specifically, the wire lands 170A having the first characteristic may transmit or provide data signals and/or reference voltages (or supply voltages) for a data circuit. Also, the wire lands 170A having the first characteristic may transmit address/control signals. The wire lands 170B having the second characteristic may serve the third function. Specifically, the wire lands 170B having the second characteristic may provide reference voltages (or supply voltages) for an address/control circuit.

Referring back to FIG. 3A, the wire lands 170A and 170B having the first and second characteristics may be functionally asymmetrical in conformity with the functionally asymmetrical arrangement of the bonding pads 160A and 160B having the first and second characteristics. For example, the wire lands 170A and 170B having the first and second characteristics may be respectively disposed close to the bonding pads 160A and 160B having the first and second characteristics. In other words, the wire lands 170A having the first characteristic may be disposed near a left side S1-upper (alternatively, first side or first edge) of the upper package substrate 110U, while the wire lands 170B having the second characteristic may be disposed near a right side S2-upper (alternatively, second side or second edge) of the upper package substrate 110U, which is disposed opposite the first side.

Referring to FIG. 3B, the wire lands 170A and 170B having the first and second characteristics and the bonding pads 160A and 160B having the first and second characteristics may be rotated by an angle of 90° as compared to those shown in FIG. 3A.

Although FIGS. 3A and 3B exemplarily illustrate that the wire lands 170A and 170B and the bonding pads 160A and 160B are connected using the wires 175, the wire lands 170A and 170B and the bonding pads 160A and 160B may be connected in various other shapes or ways than shown in FIGS. 3A and 3B. For example, conductive patterns or through vias such as a through-silicon via (TSV) can be used to interconnect the bonding pads 160A and 160B with the wire lands 170A and 170B. The upper inter-package connector lands (not shown) may electrically connect the upper package substrate 110U or the wire lands 170A and 170B having the first and second characteristics with inter-package connectors 190A and 190B having the first and second characteristics, respectively. The upper inter-package connector lands will be illustrated in other drawings. The upper package substrate 110U may include a plurality of conductive and nonconductive layers stacked sequentially. The conductive and nonconductive layers of the upper package substrate 110U will also be described in further detail with reference to other drawings.

The lower package 105L may include a lower package substrate 110L and a lower semiconductor device 150L mounted thereon.

The lower semiconductor device 150L may include a logic device, such as a microprocessor (MP). The logic device may be of any type including a microcontroller (μC), a digital signal processor (DSP), or any combination thereof. The logic device may include a processor core (not illustrated) that can include a floating point unit (FPU), an arithmetic logic unit (ALU), and a digital signal processing core (DSP Core), or any combination thereof. The logic device may also include registers (not illustrated). A memory controller can also be used with the logic device, or the memory controller can be an internal part of the logic device depending on applications.

The lower semiconductor device 150L may be electrically connected to the lower package substrate 110L using, for example, a flip-chip technique. For instance, the lower semiconductor device 150L may be electrically connected to the lower package substrate 105L by a plurality of flip-chip connectors or conductive bumps 120. The lower semiconductor device 150L may be mounted on the lower package substrate 110L using various methods such as using an under-fill material. The under-fill material is omitted here for simplicity but will be illustrated in other drawings.

The lower package substrate 110L may include lower inter-package connector lands 107 disposed on a top surface thereof and board connector lands disposed on a bottom surface thereof (not shown). The lower inter-package connector lands 107 may be electrically connected to the inter-package connectors 190A and 190B having the first and second characteristics. The inter-package connectors 190A and 190B having the first and second characteristics may be solder balls, while the lower inter-package connector lands 107 may be ball lands connected with the solder balls. The board connector lands of the lower package substrate 110L may be electrically connected via the board connectors 109 to a module board, a system board, or a mother board of an external device. The lower inter-package connector lands 107 and the board connector lands will be illustrated in further detail in other drawings. Similarly, the lower package substrate 110L may include a plurality of conductive and nonconductive layers stacked sequentially. A detailed description of the conductive and nonconductive layers of the lower package substrate 110L will be presented later.

The inter-package connectors 190A and 190B having the first and second characteristics may electrically connect the upper package 105U and the lower package 105L. For example, the inter-package connectors 190A and 190B having the first and second characteristics may electrically connect the upper and lower packages 105U and 105L or the upper and lower semiconductor devices 150U and 150L. The inter-package connectors 190A and 190B having the first and second characteristics may be disposed in conformity with the arrangement of the bonding pads 160A and 160B having the first and second characteristics or the wire lands 170A and 170B having the first and second characteristics. For instance, the inter-package connectors 190A and 190B having the first and second characteristics may be disposed near a side near the wire lands 170A and 170B having the first and second characteristics. Specifically, the inter-package connectors 190A having the first characteristic may be disposed near a left side (or first side or first edge) near the wire lands 170A having the first characteristic, while the inter-package connectors 190B having the second characteristic may be disposed near a right side (or second side or second edge) near the wire lands 170B having the second characteristic. Here, the second side (or the second edge) S2-upper may be disposed opposite the first side (or the first edge) S1-upper.

In one embodiment, the inter-package connectors 190A, 190B are electrically coupled with the bonding pads 160A, 160B.

Referring to FIG. 3B, the inter-package connectors 190A and 190B having the first and second characteristics, respectively, may be disposed near the other sides that are not near the wire lands 170A and 170B having the first and second characteristics, respectively. For example, the wire lands 170A and 170B may be disposed near a top side and/or bottom side of the upper package substrate 110U, while the inter-package connectors 190A and 190B having the first and second characteristics may be disposed near the left and right sides of the upper package substrate 110U. In FIGS. 3A and 3B, the positions of the left, right, top and bottom sides may be interchangeable.

In the present embodiment, the inter-package connectors 190A having the first characteristic may perform the first function. Specifically, the inter-package connectors 190A having the first characteristic may transmit or provide data signals and/or reference voltages (or supply voltages) for a data circuit. Also, the inter-package connectors 190A having the first characteristic may perform the second function. Specifically, the inter-package connectors 190A having the first characteristic may transmit address/control signals.

In some embodiments, the inter-package connectors 190A may include first inter-package connectors configured to transmit data signals; second inter-package connectors configured to transmit address/control signals; fourth inter-package connectors configured to provide supply voltages or ground voltages (Vssq/Vddq) for the data circuit. In this embodiment, the first, second and fourth inter-package connectors are not individually numbered.

The inter-package connectors 190B having the second characteristic may serve the third function. Specifically, the inter-package connectors 190B having the second characteristic may provide reference voltages (or supply voltages) for an address/control circuit.

In some embodiments, the inter-package connectors 190B include third inter-package connectors configured to provide supply voltages or ground voltages (Vss/Vdd) for the address/control circuit.

The inter-package connectors 190A and 190B having the first and second characteristics, respectively, may be asymmetrically disposed near sides opposite to each other. For instance, a majority (or all) of the inter-package connectors 190A having the first characteristic, e.g., the first and second inter-package connectors discussed above, may be disposed near the first side or disposed in a first region near the first side (the first edge) S1-upper, while a majority (or all) of the inter-package connectors 190B, e.g., the third inter-package connectors discussed above, having the second characteristic may be disposed near the second side or disposed in a second region near the second side (the second edge) S2-upper. In some embodiments, the first and second inter-package connectors may be exclusively disposed in the first region and the third inter-package connectors may be exclusively disposed in the second region. The second edge may be opposite the first edge. Alternatively, the inter-package connectors 190A and 190B having the first and second characteristics may each be asymmetrically disposed on two sides located opposite to each other. For example, the inter-package connectors 190A having the first characteristic may be asymmetrically disposed near the left and/or bottom side, while the inter-package connectors 190B having the second characteristic may be asymmetrically disposed near the right and/or top sides.

In some embodiments, a majority of the fourth inter-package connectors are disposed in a region near the first edge S1-upper. Alternatively, the fourth inter-package connectors are exclusively disposed in a region near the first edge S1-upper.

Figure 3C:
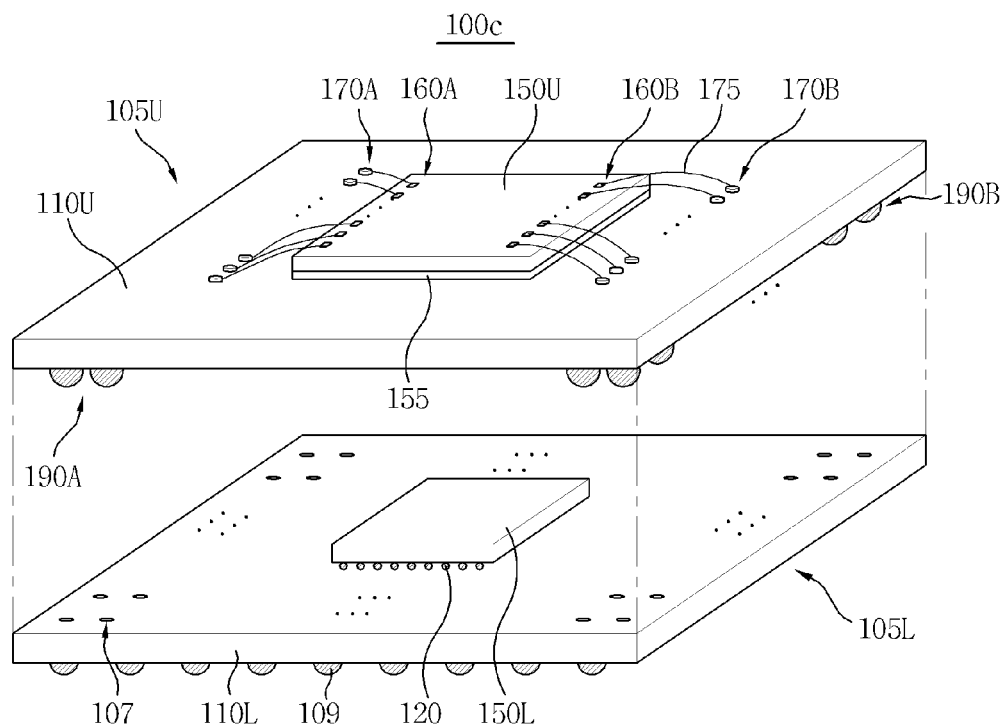
Figure 3D:
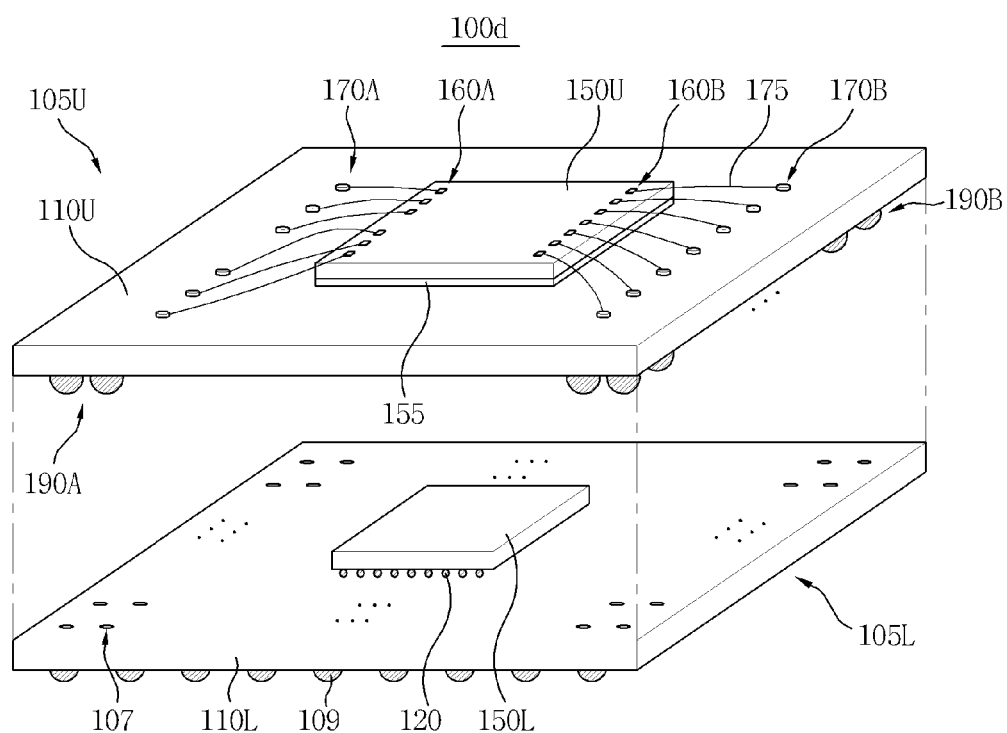
Figure 3E:
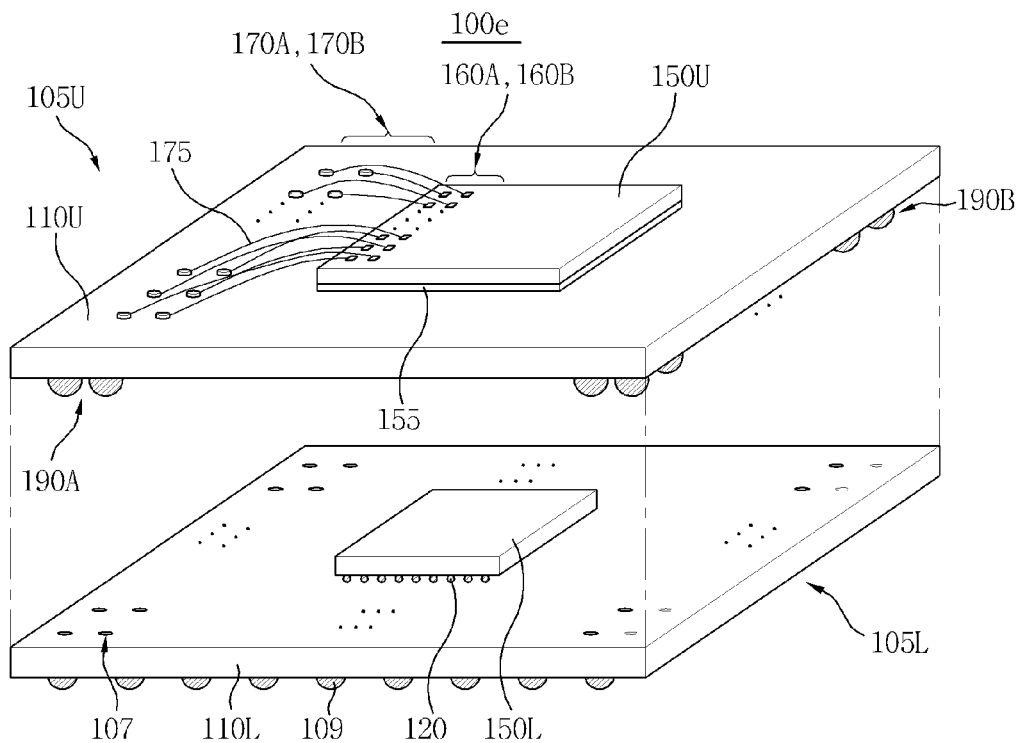
Figure 3F:
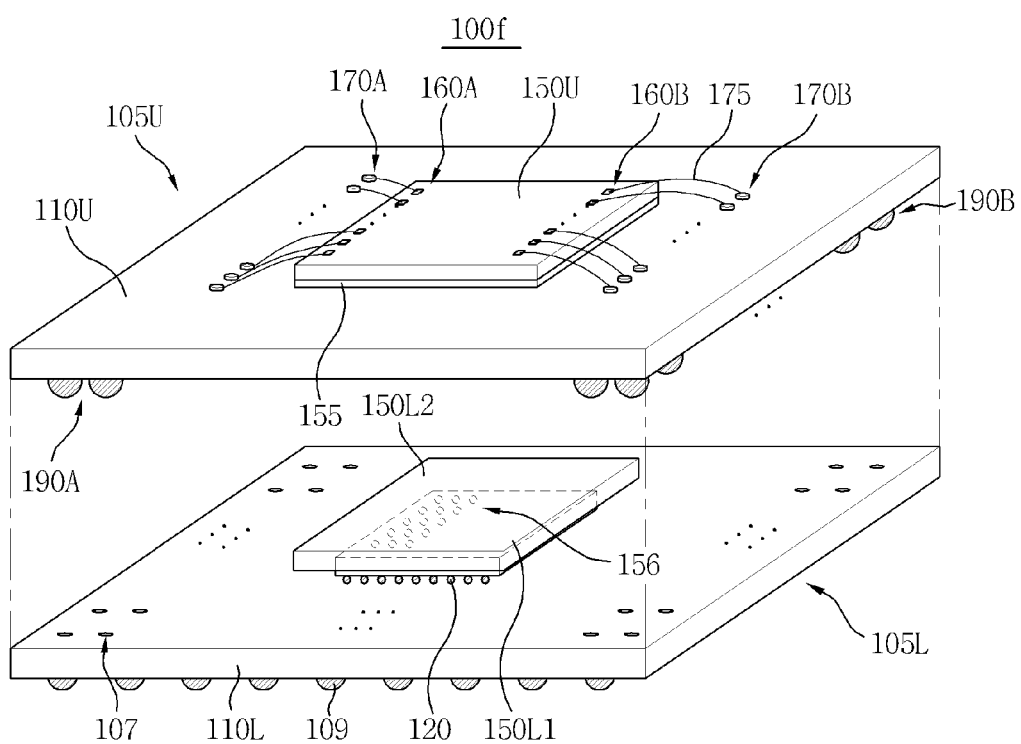
Figure 3G:
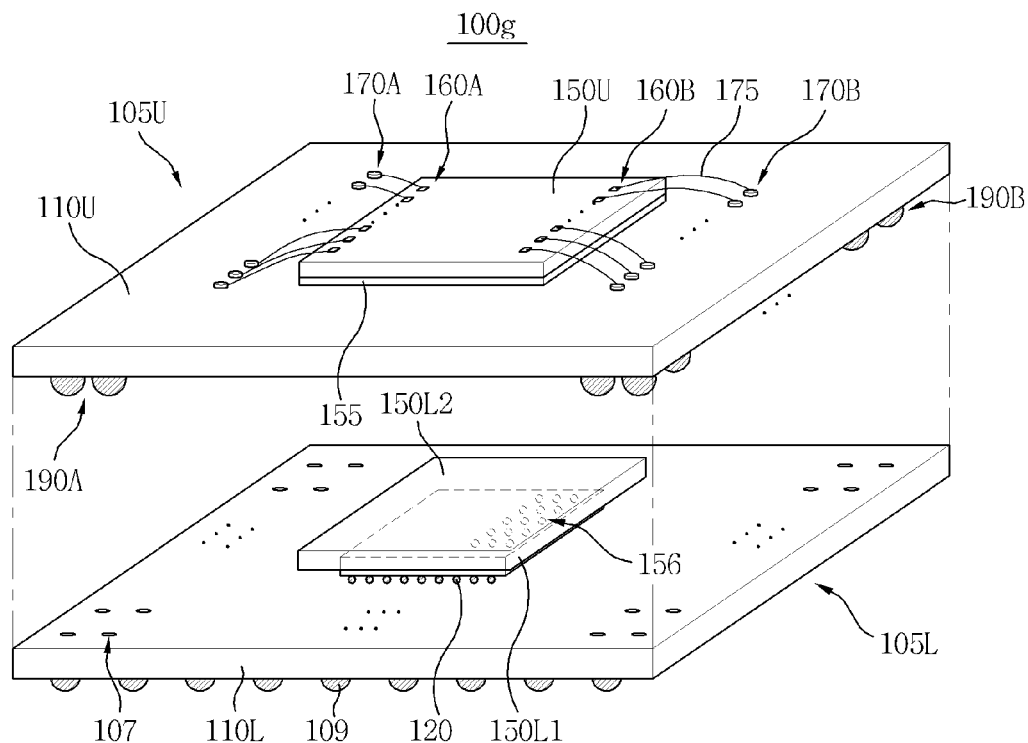
Figure 3H:
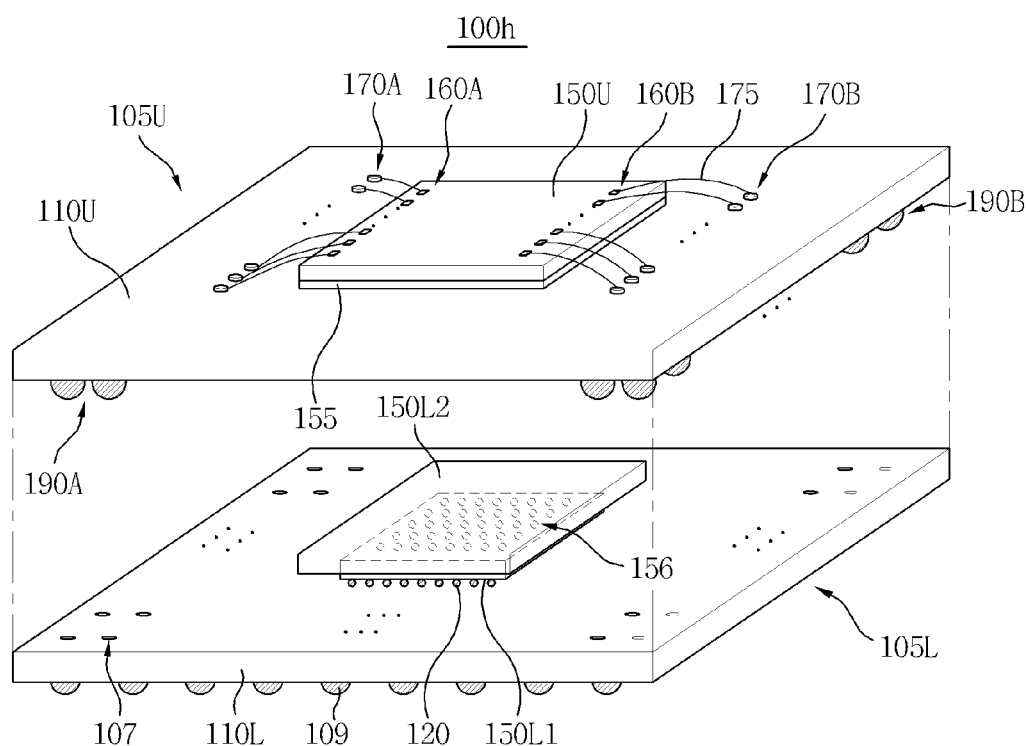
Figure 3I:
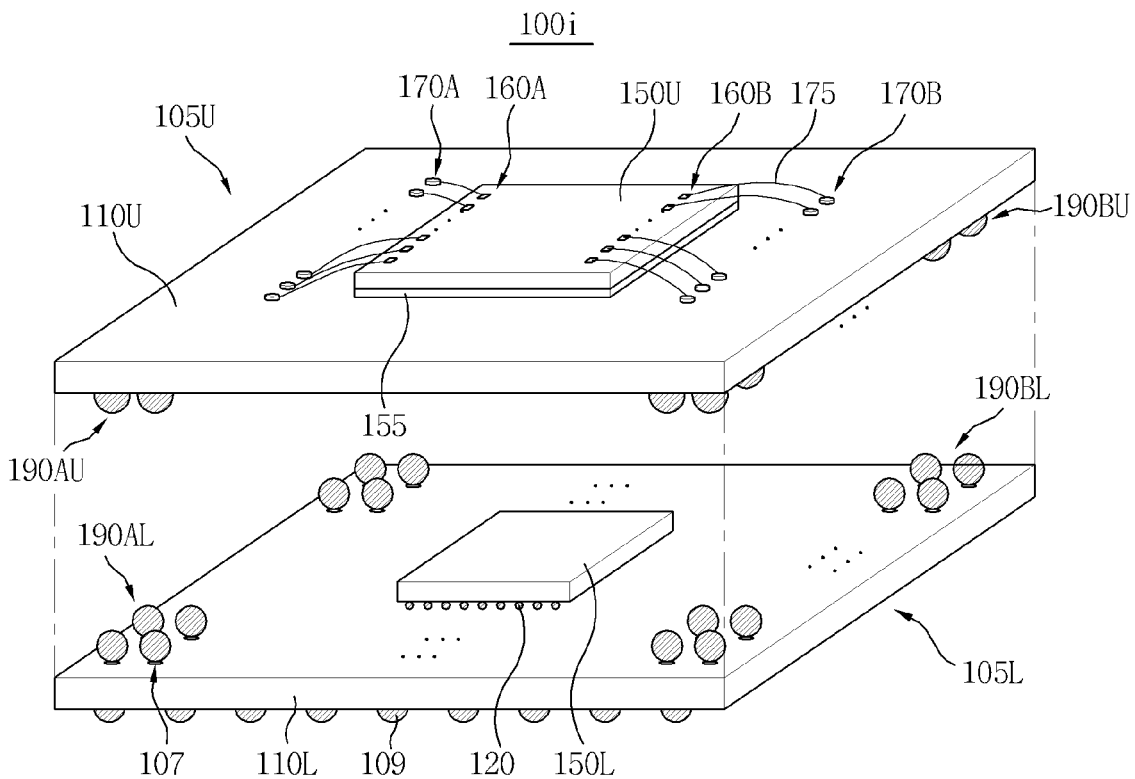
Figure 3J:
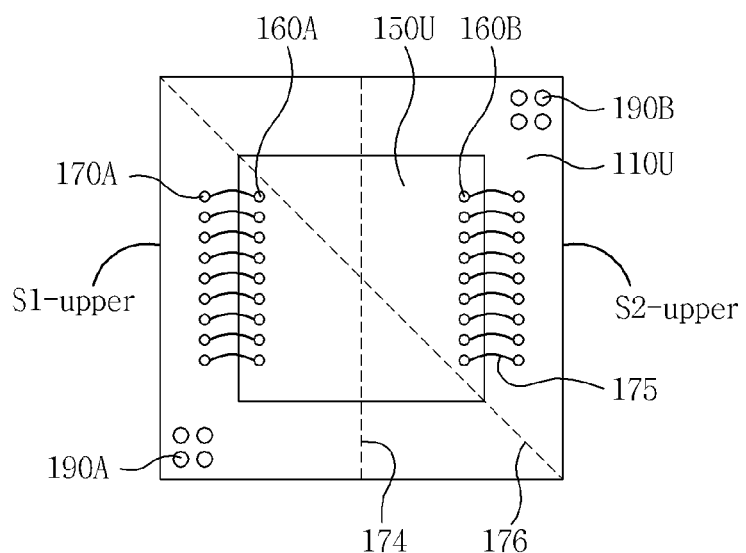
FIG. 3J is a plan view illustrating the package stack structure of FIG. 3A according to an embodiment of the inventive concept.

In some embodiments, an imaginary boundary line 174 dividing the first region and the second region may extend along approximately a center of the upper package substrate 110U as shown in FIG. 3J.

Some of the inter-package connectors 190B having the second characteristic may be dummies or may not be formed. Although simplified in the drawings for clarity, the inter-package connectors 190A and 190B may be mounted on a bottom surface of the upper package substrate 110U or separated from the upper package substrate 110U. Finally, the inter-package connectors 190A and 190B may be mounted on the bottom surface of the upper package substrate 110U and a top surface of the lower package substrate 110L. The board connectors 109 may electrically connect the lower package 105L with a system board or mother board of an external device. The board connectors 109 may include solder balls.

The inter-package connectors 190A and 190B, shown in these embodiments as solder balls, can be any other type of electrical connections between the upper and lower packages 105U, 105L. In one embodiment, the upper package 105U and the lower package 105L may be interconnected without using inter-package connectors 190A and 190B.

Referring to FIGS. 3C through 3E, each of package stack structures 100c to 100e according to some embodiments of the inventive concept may include an upper package 105U, a lower package 105L, and inter-package connectors 190A and 190B. The upper package 105U may include an upper semiconductor device 150U mounted on a top surface thereof. The upper semiconductor device 150U may employ any one of the semiconductor devices 1A to 1D described with reference to FIGS. 1A through 1D or their variations or modifications. In the present embodiments, the upper semiconductor device 150U may include bonding pads 160A and 160B having first and second characteristics, respectively, which may be asymmetrically disposed in various forms. Wire lands 170A and 170B having the first and second characteristics, which correspond to the bonding pads 160A and 160B, respectively, may be asymmetrically disposed on the upper package substrate 110U. Furthermore, inter-package connectors 190A and 190B having the first and second characteristics, respectively, may be variously disposed in conformity with the arrangement of the wire lands 170A and 170B having the first and second characteristics.

Referring to FIGS. 3F through 3H, each of package stack structures 100f to 100h according to some embodiments of the inventive concept may include an upper package 105U, a lower package 105L, and inter-package connectors 190A and 190B. The lower package 105L may include a first lower semiconductor device 150L1 and a second lower semiconductor device 150L2. The first lower semiconductor device 150L1 may be electrically connected to the second lower semiconductor device 150L2 via inter-chip connectors 156. The first lower semiconductor device 150L1 may include a logic device, and the second lower semiconductor device 150L2 may include a wide I/O memory device. The inter-chip connectors 156 may be electrically connected to the lower package substrate 110L through lower through-silicon vias (TSVs, not shown). The inter-chip connectors 156 may be asymmetrically disposed in various shapes or locations on the first or second lower semiconductor device 150L1 or 150L2. For example, as shown in FIGS. 3F through 3H, the inter-chip connectors 156 may be asymmetrically disposed in a left or right half portion of the first or second lower semiconductor device 150L1 or 150L2 or uniformly disposed.

Referring to FIG. 3I, a package stack structure 100i according to an embodiment of the inventive concept may include an upper package 105U, a lower package 105L, upper inter-package connectors 190AU and 190BU, and lower inter-package connectors 190AL and 190BL. The inter-package connectors 190A and 190B described with reference to FIGS. 3A through 3H may be classified into the upper inter-package connectors 190AU and 190BU, and the lower inter-package connectors 190AL and 190BL. The upper inter-package connectors 190AU and 190BU may be integrally formed, and the lower inter-package connectors 190AL and 190BL may be integrally formed, as will be illustrated in other appended drawings. The inventive concept of FIG. 3I may be applied to each of the embodiments shown in FIGS. 3A through 3H.

Figure 4A:
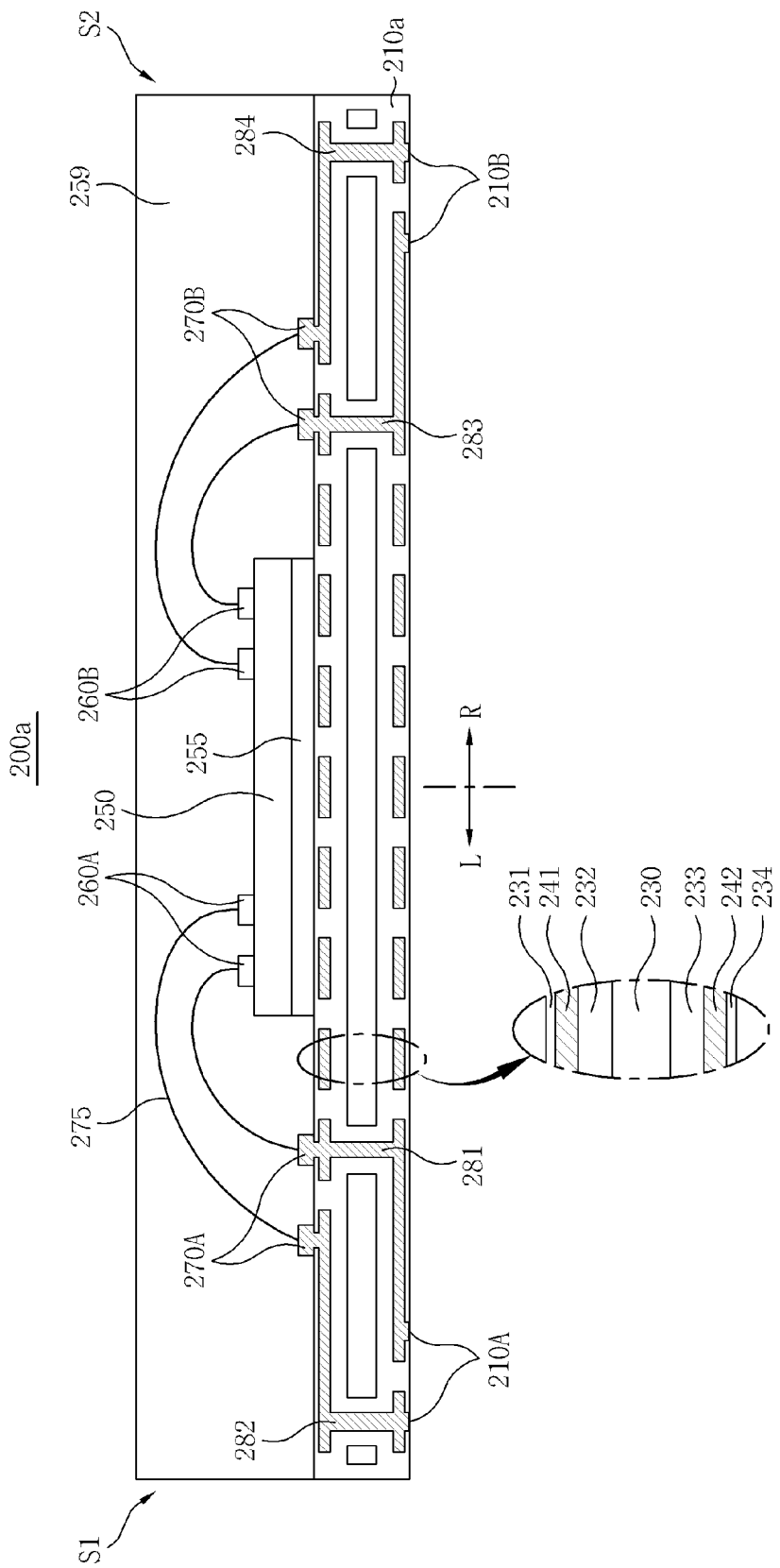
FIGS. 4A and 4B are lateral sectional and longitudinal sectional views of upper packages according to various embodiments of the inventive concept.
Figure 4B:
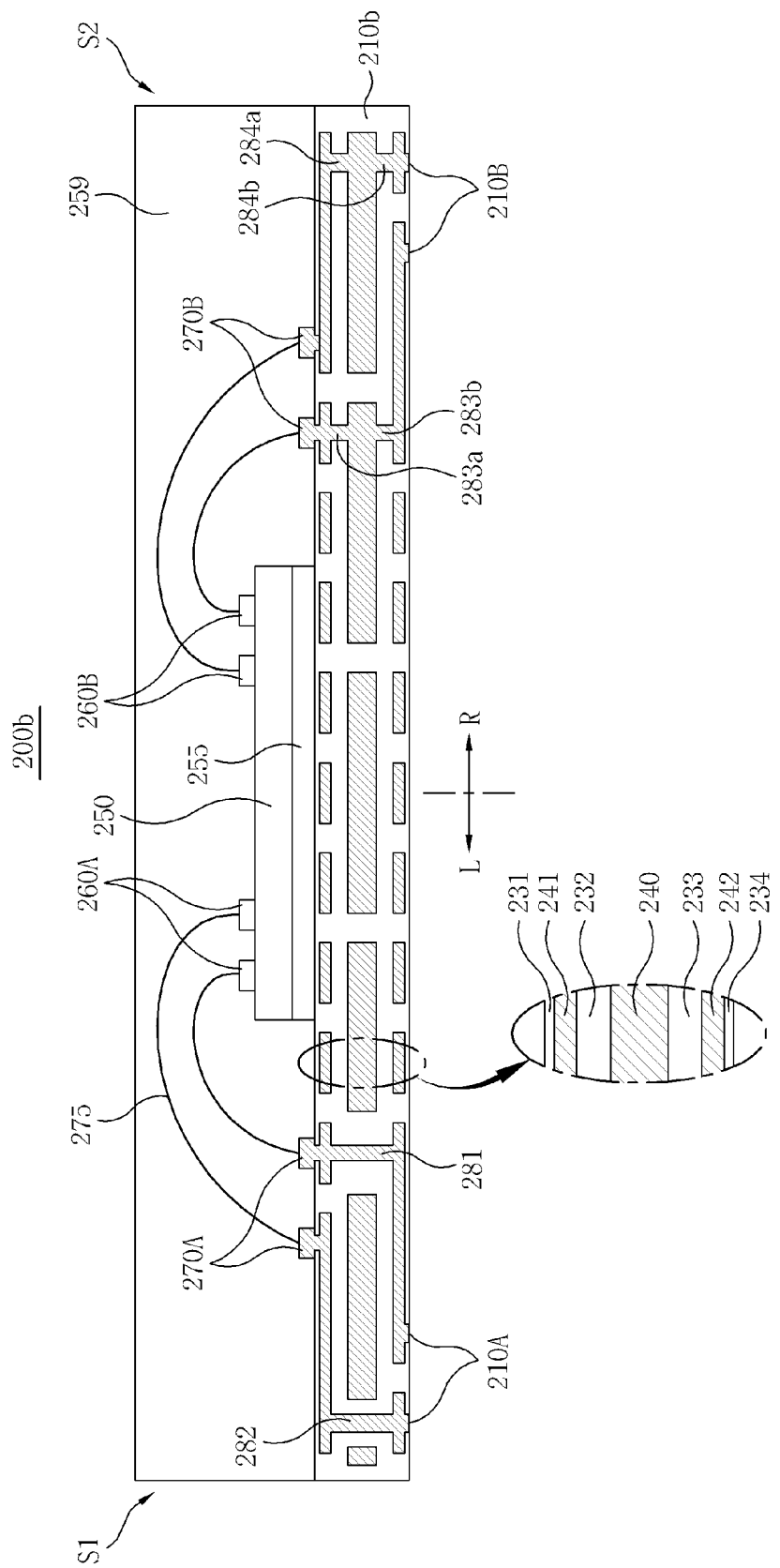

FIGS. 4A and 4B are schematic views of upper packages according to various embodiments of the inventive concept, which show lateral cross-sectional views of semiconductor devices and longitudinal cross-sectional views of package substrates for clarity.

Referring to FIG. 4A, an upper package 200a according to an embodiment of the inventive concept may include an upper semiconductor device 250 mounted on a top surface of an upper package substrate 210a. The upper semiconductor device 250 may be mounted on the upper package substrate 210a using, for example, a die-bonding film 255. However, other methods can be used to mount the upper semiconductor device 250 to the upper package substrate 210a. An upper molding compound 259 may be formed to surround the upper semiconductor device 250. The upper molding compound 259 may include an epoxy resin. The upper semiconductor device 250 may be one of the semiconductor devices 1A to 1D described with reference to FIGS. 1A through 1D or other variations or modifications within the spirit and scope of the present disclosure. For example, the semiconductor device 250 may be one of the semiconductor devices described in connection with FIGS. 2A-2D.

As described above, the upper semiconductor device 250 may include bonding pads 260A having a first characteristic and bonding pads 260B having a second characteristic. Although a single bonding pad 260A and a single bonding pad 260B may be seen from a lateral view, two bonding pads 260A and two bonding pads 260B are shown for better illustration. In addition, the bonding pads 260A having the first characteristic may be asymmetrically disposed in a region disposed near a first side or left side of the upper semiconductor device 150, while the bonding pads 260B having the second characteristic may be asymmetrically disposed in a region disposed near a second side or right side, which is opposite the first side thereof. One or more of the bonding pads 260B having the second characteristic may be a dummy.

Wire lands 270A having the first characteristic and wire lands 270B having the second characteristic may be asymmetrically disposed on the upper package substrate 210a. One or more of the wire lands 270B having the second characteristic may be a dummy. Specifically, the wire lands 270A having the first characteristic may be asymmetrically disposed in a region disposed near a first side S1 (e.g., left side) of the upper package substrate 210a, while the wire lands 270B having the second characteristic may be asymmetrically disposed in a region disposed near a second side S2 (e.g., right side) opposite the first side S1. The bonding pads 260A and 260B may be respectively electrically connected to the wire lands 270A and 270B using, for example, bonding wires 275.

As described above, the bonding pads 260A having the first characteristic and the wire lands 270A having the first characteristic may serve a first function and/or a second function.

For example, the bonding pads 260A having the first characteristic and the wire lands 270A having the first characteristic may transmit or provide data signals; reference voltages (supply voltages) for a data circuit; and/or address/control signals. The bonding pads 260B having the second characteristic and the wire lands 270B having the second characteristic may provide reference voltages (or supply voltages) for an address/control circuit. In the present embodiment, a dummy may be interpreted as an element that may not transmit any signals.

The upper package substrate 210a may include a plurality of layers. Specifically, the upper package substrate 210a may include a first insulating layer 231, a first metal layer 241, a second insulating layer 232, an insulating core layer 230, a third insulating layer 233, a second metal layer 242, and a fourth insulating layer 234 stacked in a sequential or alternating manner. The first insulating layer 231, the first metal layer 241, the second insulating layer 232, the third insulating layer 233, the second metal layer 242, and the fourth insulating layer 234 may each be a thin-film type layer.

The insulating core layer 230 may be thicker than other layers and include a rigid material. For example, the insulating core layer 230 may include glass, a ceramic material, a plastic material, or a solid material. The insulating core layer 230 may be provided as a flat panel type and include holes through which vias 281 and 284 are vertically formed.

Each of the metal layers 241 and 242 may be provided as one of various types of horizontal routes. For instance, rather than a flat panel shape, the metal layers 241 and 242 may be separated into small fragments of a flat panel or routes. Although FIG. 4A illustrates one possible shape of an electrical connection of the metal layers 241 and 242 and the vias 281 to 284, the shape of the electrical connection can be any desired shape and is not limited to that shown. This concept may be applied to all drawings of the present specification.

Upper inter-package connector lands 210A having the first characteristic may be asymmetrically disposed near a first side S1 (left side) of the upper package 200a or the upper package substrate 210a. In other words, the upper inter-package connector lands 210A having the first characteristic may be asymmetrically disposed in a left half portion L of the upper package 200a or the upper package substrate 210a. Upper inter-package connector lands 210B having the second characteristic may be asymmetrically disposed near a second side S2 (right side) opposite the first side S1 of the upper package 200a or the upper package substrate 210a. In other words, the upper inter-package connector lands 210B having the second characteristic may be asymmetrically disposed in a right half portion R of the upper package 200a or the upper package substrate 210a. The upper inter-package connector lands 210A and 210B having the first and second characteristics, respectively, may be formed under the second metal layer 242 and exposed by a bottom surface of the upper package substrate 210a.

The upper inter-package connector lands 210A having the first characteristic may be electrically connected to the wire lands 270A having the first characteristic through metal layers 241 and 242 and vias 281 and 282. Accordingly, the upper inter-package connector lands 210A having the first characteristic may serve the first and second functions. For example, the upper inter-package connector lands 210A may transmit or provide data signals; reference voltages (or supply voltages) for a data circuit; and/or address/control signals.

Upper inter-package connector lands 210B having the second characteristic may be electrically connected to wire lands 270B having the second characteristic through the metal layers 241 and 242 and vias 283 and 284. Accordingly, the upper inter-package connector lands 210B having the second characteristic may serve a third function. For example, the upper inter-package connector lands 210B having the second characteristic may provide reference voltages (or supply voltages) for an address/control circuit. One of the upper inter-package connector lands 210B having the second characteristic may be a dummy.

Referring to FIG. 4B, an upper package 200b according to an embodiment of the inventive concept may include a semiconductor device 250 disposed on an upper package substrate 210b. Only differences from the upper package 200a of FIG. 4 will be described here. The upper package substrate 210b may include a first insulating layer 231, a first metal layer 241, a second insulating layer 232, a metal core layer 240, a third insulating layer 233, a second metal layer 242, and a fourth insulating layer 234 stacked sequentially. The upper package substrate 210b according to an inventive concept may include the metal core layer 240, which may be thicker or harder than other layers. The metal core layer 240 may serve as a plane surface for dividing element/package reference voltages. In particular, the metal core layer 240 may be used as ground voltage plane surface. However, the metal core layer 240 may also, for example, substantially function to electrically connect conductive components having other functions, such as the first function, the second function, or the third function.

To exemplarily show that the metal core layer 240 may be used for the third function, FIG. 4B illustrate that the wire lands having the second characteristic 270A 270B, the inter-package connector lands 210B having the second characteristic, and vias 283a, 283b, 284a, and 284b having the second characteristic are connected to the metal core layer 240. In contrast, to exemplarily show that the metal core layer 240 may not be used for the first function and/or the second function, FIG. 4B illustrate that the wire lands 270A having the first characteristic, the inter-package connector lands 210A having the first characteristic, and vias 281 and 282 having the first characteristic are not connected to the metal core layer 240. However, the above-described illustration is only an example, and the converse is also within the intended scope of the inventive concepts.

In the upper packages 200a and 200b according to the above-described embodiments, the conductive components 260A, 270A, and 210A for the first and second functions may be asymmetrically disposed in a region disposed near left half portions (L) or first sides S1 of the upper package substrates 210a and 210b so that the length of routes configured to connect the conductive components 260A, 270A, and 210A for the first and second functions and a deviation between the routes can be reduced.

Accordingly, the route-shaped arrangement or design of the metal layers 241 and 242 of the upper package substrates 210a and 210b may be simplified, and a deviation in signal delay caused by a difference in signal path may be reduced to improve signal integrity. Also, since the metal core layer 240 is used as a ground plane surface or a plane surface configured to provide various reference voltages, a ground or voltage transmission effect may be enhanced, and the occurrence of noise may be reduced. Furthermore, the metal layers 241 and 242 need not be used as the ground plane surface or to provide various reference voltages so that the metal layers 241 and 242 can be more efficiently utilized for routing signals. In addition, even if the routing requirements become complicated, the necessity for adding another metal layer may be alleviated. In other words, since the number of metal layers may be reduced, the total thickness of the upper package substrates 210a and 210b may be reduced or prevented from being increased. Of course, the metal core layer 240 may be partially employed to transmit electric signals. Although FIG. 4B illustrates the shapes of the metal layers 241 and 242 and the metal core layer 240 to describe conceptual or virtual shapes or electrical connection, the actual shapes are not shown, nor is the inventive concept limited to any particular shape. This concept may be applied all embodiments and drawings appended in the present specification.

FIGS. 5A through 5J are schematic views of package stack structures according to various embodiments of the inventive concept. The package stack structures may include a memory package and a logic package. The package stack structures will be understood in further detail with reference to FIGS. 3A through 3I. For clarity, FIGS. 5A through 5J show lateral sectional, longitudinal sectional, and partial exploded views of the package stack structures.

Figure 5A:
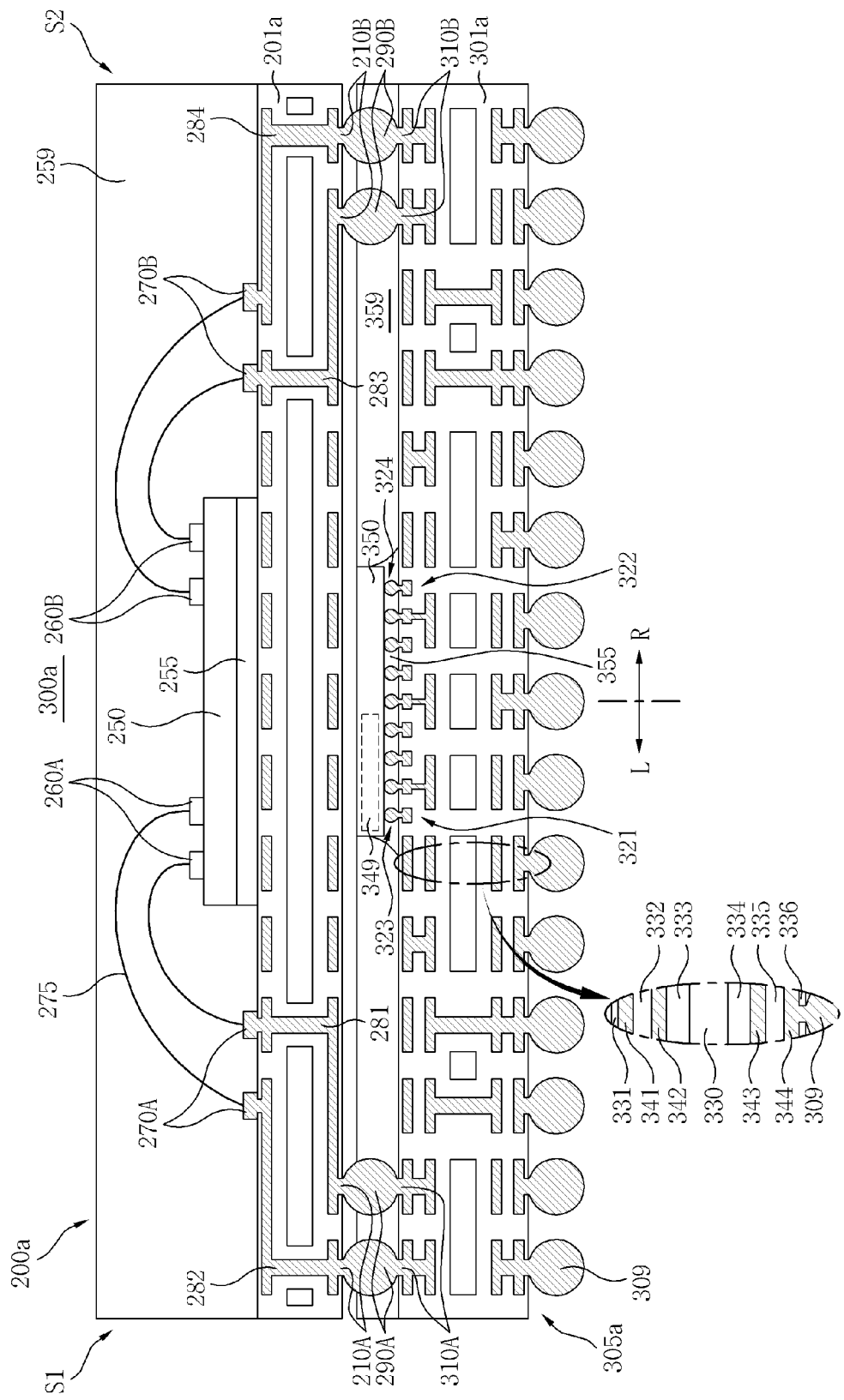
FIGS. 5A through 5J are lateral sectional, longitudinal sectional, and partial exploded views of package stack structures, such as system-on-package (SOC) or package-on-package (POP) stack structures according to various embodiments of the inventive concept.

Referring to FIG. 5A, a package stack structure 300a according to an embodiment of the inventive concept may include an upper package 200a, a lower package 305a, and inter-package connectors 290A and 290B. The lower package 305a may include a lower package substrate 301a and a lower semiconductor device 350. The upper package 200a will be understood in further detail with reference to, for example, FIG. 4A.

The lower package 305a may include the lower semiconductor device 350 disposed on and connected to the lower package substrate 301a. In some embodiments, the lower semiconductor device 350 may be connected to the lower package substrate 301a, for example, by a flip-chip method using first and second flip-chip connectors 323 and 324. The lower semiconductor device 350 may include a memory control circuit 349 disposed therein. The memory control circuit 349 may be asymmetrically disposed in any one side or a region near an edge of the lower semiconductor device 350. As shown in FIG. 5A, for example, the memory control circuit 349 may be disposed in a left side or a region near a left edge of the lower semiconductor device 350. Since positions of left and right sides may be exchanged, the memory control circuit 349 may be asymmetrically disposed in any one side or region of the lower semiconductor device 350. The first flip-chip connectors 323 may be electrically connected to and superposed on or disposed near the memory control circuit 349, while the second flip-chip connectors 324 may be neither superposed on nor disposed near the memory control circuit 349. Accordingly, the first flip-chip connectors 323 may be disposed near a first side S1 (i.e., left side) of the lower semiconductor device 350, while the second flip-chip connectors 324 may be disposed near a second side S2 (i.e., right side) opposite the first side S1 thereof.

The lower package substrate 301a may include a first insulating layer 331, a first metal layer 341, a second insulating layer 332, a second metal layer 342, a third insulating layer 333, an insulating core layer 330, a fourth insulating layer 334, a third metal layer 343, a fifth insulating layer 335, a fourth metal layer 344, and a sixth insulating layer 336 stacked sequentially. The insulating core layer 330 may be provided as a flat panel type and include holes through which vias are vertically formed. Other components may be provided as a thin-film type layer.

Figure 5B:
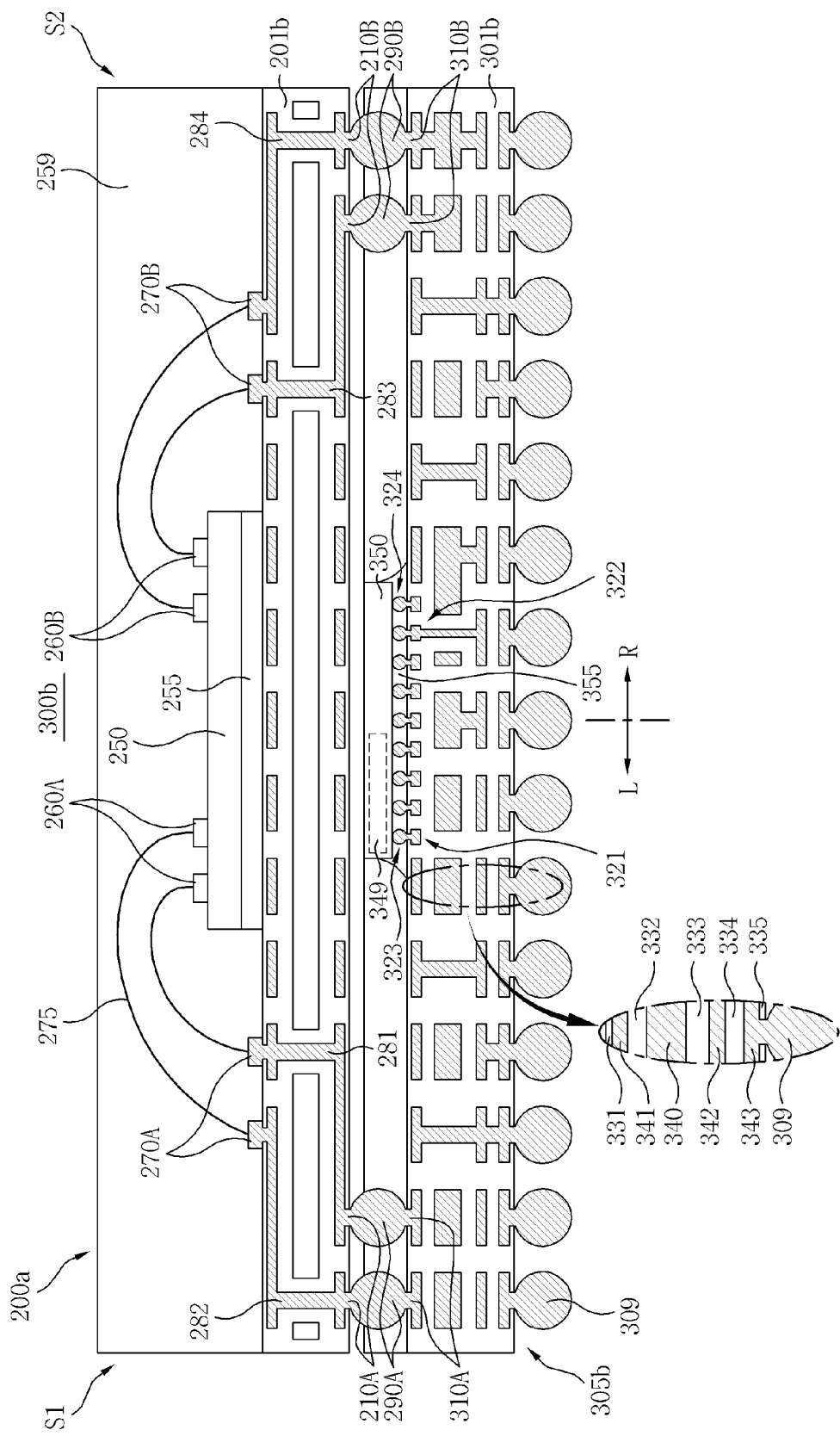

In addition, the metal layers 341 to 344 may be provided as one of various types of horizontal routes. Accordingly, rather than a flat panel shape, the metal layers 341 to 344 may be separated into small fragments of a flat panel or routes. Lower inter-package connector lands 310B having the second characteristic may be formed on the first metal layer 341 as shown in FIG. 5B. The first metal layer 341 may be electrically connected to the upper inter-package connector lands 210A and 210B of the upper package 200a through the inter-package connectors 290A and 290B.

Lower inter-package connector lands 310A and 310B may be respectively electrically connected to upper inter-package connector lands 210A and 210B (having the first and second characteristics respectively) through the inter-package connectors 290A and 290B (having the first and second characteristics respectively).

The lower inter-package connector lands 310A having the first characteristic may be electrically connected to first flip-chip connector lands 321 (this connection being suggested but not expressly shown in FIG. 5B) through one of the metal layers 341 to 344. For example, the lower inter-package connector lands 310A having the first characteristic may be respectively electrically connected to the first flip-chip connector lands 321 through the second metal layer 342. The first flip-chip connector lands 321 may be disposed to correspond to the first flip-chip connectors 323. That is, the first flip-chip connector lands 321 may be disposed near a region where the memory control circuit 349 of the lower semiconductor device 350 is disposed. Accordingly, the first flip-chip connector lands 321 may be disposed near a left region of the lower semiconductor device 350. In other words, the first flip-chip connector lands 321 may be asymmetrically disposed near any one side of a region where the lower semiconductor device 350 is disposed, on the lower package substrate 301a.

In FIG. 5A, it is illustrated that the first flip-chip connector lands 321 are disposed near the first side S1 of the lower semiconductor device 350.

The first flip-chip connector lands 321 may be electrically connected to the lower semiconductor device 350 through the first flip-chip connectors 323. Accordingly, at least one of the bonding pads 260A having the first characteristic of the upper semiconductor device 250, the wire lands 270A having the first characteristic, the upper inter-package connector lands 210A having the first characteristic, the inter-package connectors 290A having the first characteristic, the lower inter-package connector lands 310A having the first characteristic, the first flip-chip connector lands 321, and the first flip-chip connector 323 may be electrically connected so that the upper semiconductor device 250 can be electrically connected to the memory control circuit 349 of the lower semiconductor device 350. At least one of the bonding pads 260B having the second characteristic of the upper semiconductor device 250, the wire lands 270B having the second characteristic, the upper inter-package connectors 210B having the second characteristic, the inter-package connectors 290B having the second characteristic, the lower inter-package connectors 310B having the second characteristic, and board connectors 309 may be electrically connected. The conductive components 260A, 270A, 210A, 290A, and 310A having the first characteristic may not be directly connected to the board connectors 309. However, out of the conductive components 260A, 270A, 210A, 290A, and 310A having the first characteristic, components configured to provide reference voltages (or supply voltages) for a data circuit may be directly connected to the board connectors 309 if desired. Here, direct connection of the components to the board connectors 309 may refer to connecting the components to the board connectors 309 without passing through the lower semiconductor device 350. As a result, the conductive components 260A, 270A, 210A, 290A, and 310A having the first characteristic may be disposed near the first side S1 of the package stack structure 300a or asymmetrically disposed in a left half portion L, while the conductive components 260B, 270B, 210B, 290B, and 310B having the second characteristic may be disposed near a second side of the package stack structure 300a or asymmetrically disposed in a right half portion R.

The second flip-chip connector lands 322 may be disposed to overlap or correspond to the second flip-chip connectors 324.

The positions of the left and right half portions L and R may be exchanged.

A lower under-fill material 355 may be filled between the lower semiconductor device 350 and the lower package substrate 301a to surround lateral surfaces of the first and second flip-chip connectors 323 and 324.

A lower molding compound 359 may be formed on the surface of the lower package substrate 301a to surround lateral surfaces of the lower semiconductor device 350 and inter-package connectors 290A, 290B. The lower molding compound 359 may expose a top surface of the lower semiconductor device 350.

Referring to FIG. 5B, a package stack structure 300b according to an embodiment of the inventive concept may include an upper package 200a and a lower package 305b. The lower package 305b may include a lower package substrate 301b and a lower semiconductor device 350. The lower package substrate 301b may include a first insulating layer 331, a first metal layer 341, a second insulating layer 332, a metal core layer 340, a third insulating layer 333, a second metal layer 342, a fourth insulating layer 334, a third metal layer 343, and a fifth insulating layer 335 stacked sequentially. The metal core layer 340 may be electrically connected to at least one of the inter-package connectors 290A and 290B having the first and/or second characteristics. For example, the metal core layer 340 may be electrically connected to any one of the inter-package connectors 290A having the second characteristic and provide various reference voltages or serve as a reference voltage plane surface or ground plane surface.

Figure 5C:
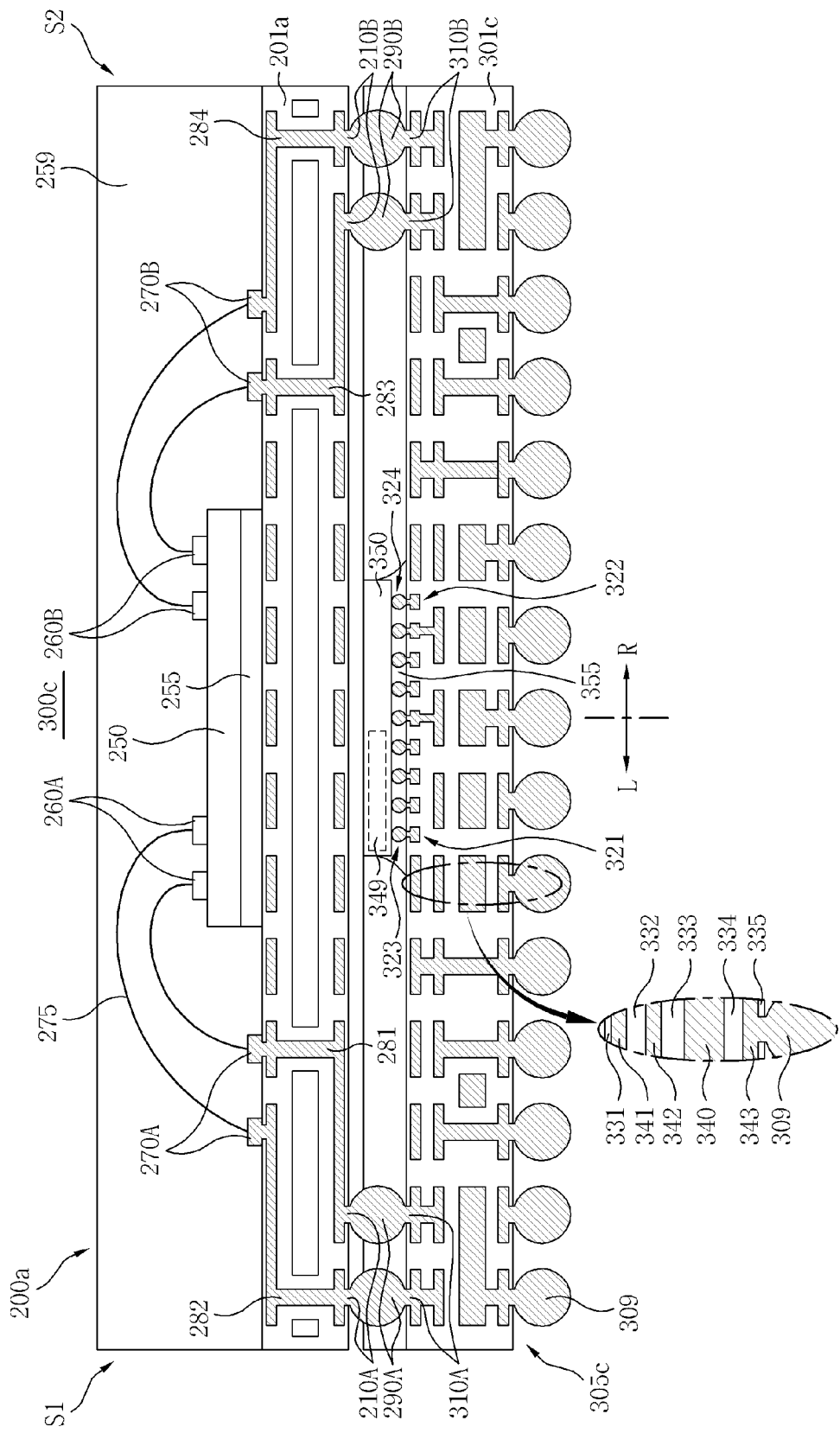

Referring to FIG. 5C, a package stack structure 300c according to an embodiment of the inventive concept may include an upper package 200a and a lower package 305c. The lower package 305c may include a lower package substrate 301c and a lower semiconductor device 350. The lower package substrate 301c may include a first insulating layer 331, a first metal layer 341, a second insulating layer 332, second metal layer 342, a third insulating layer 333, a metal core layer 340, a fourth insulating layer 334, a third metal layer 343, and a fifth insulating layer 335 stacked sequentially. The metal core layer 340 may be electrically connected to at least one of the inter-package connectors 290A and 290B having first and second characteristics. For example, the metal core layer 340 may be electrically connected to any one of the inter-package connectors 290 having the second characteristic and provide various reference voltages or serve as a reference voltage plane surface or ground plane surface.

Figure 5D:
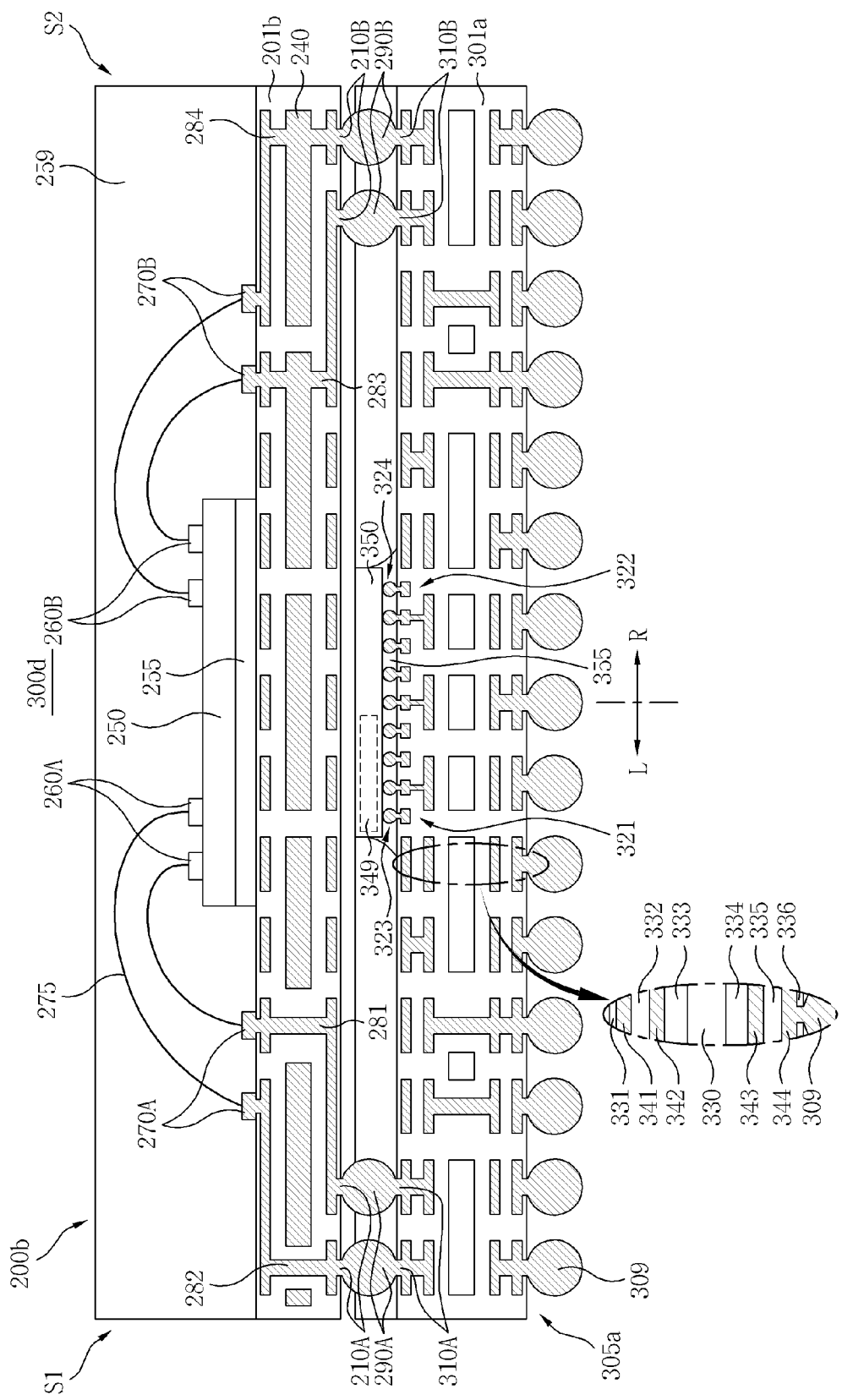
Figure 5E:
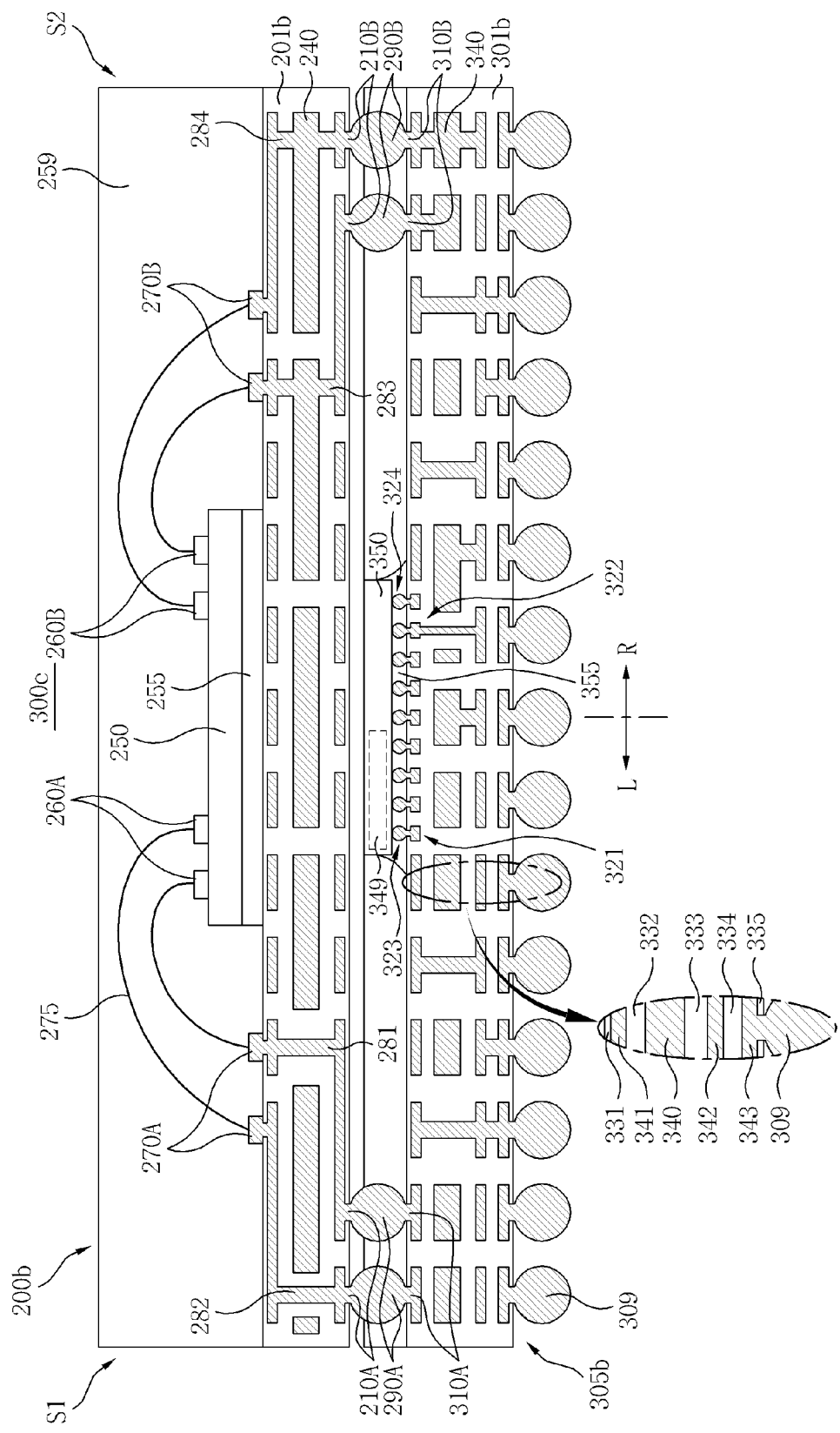
Figure 5F:
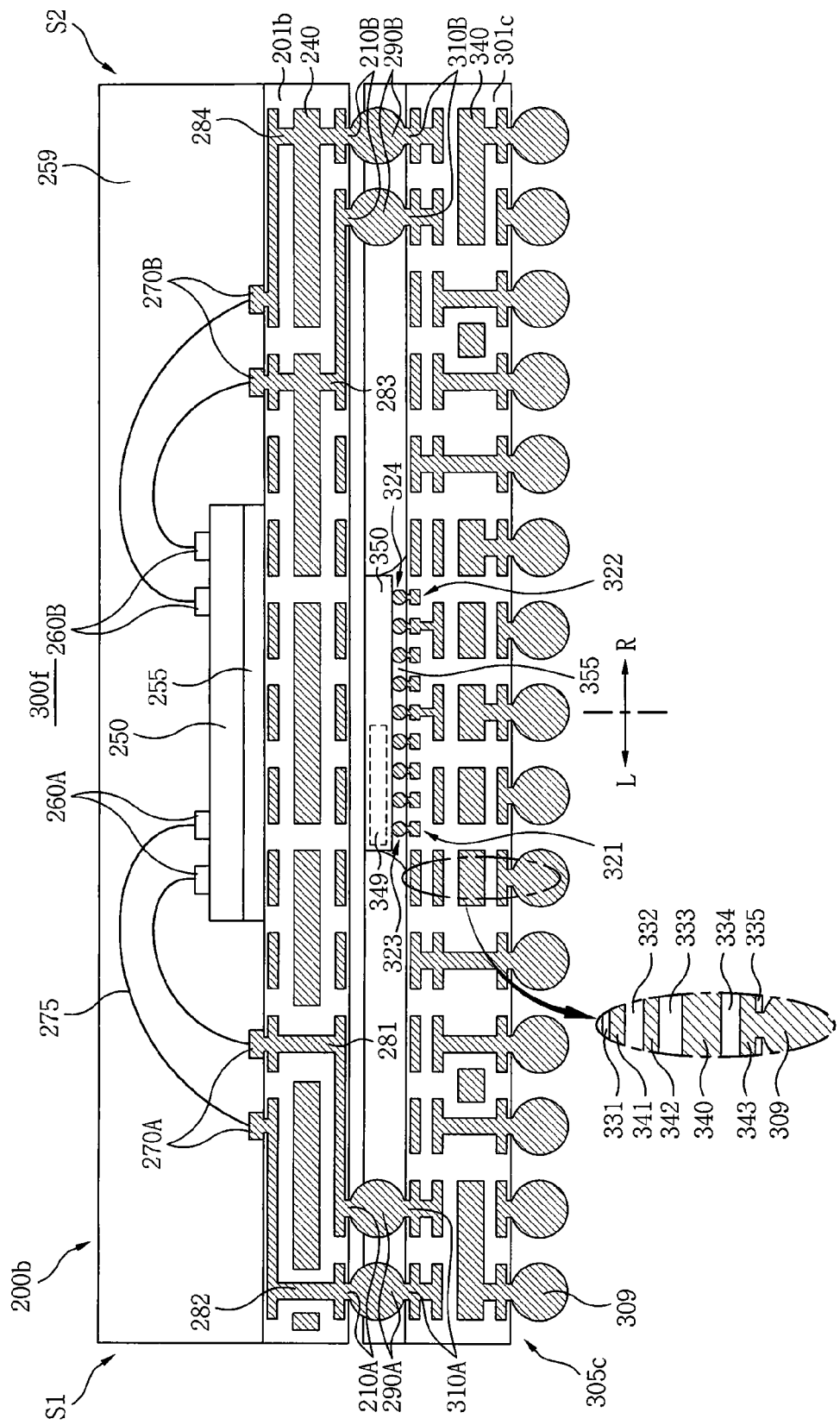
Figure 5G:
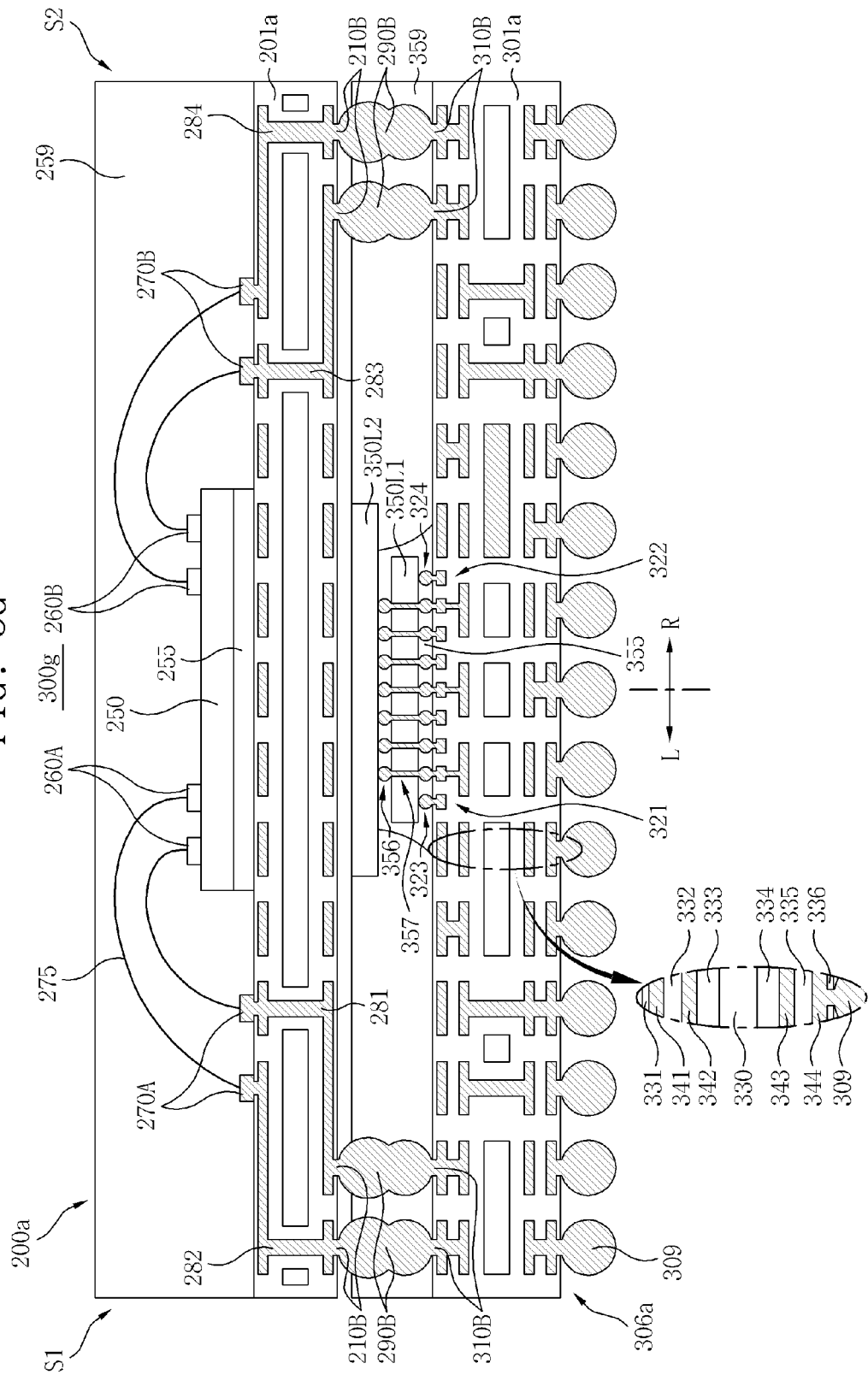
Figure 5H:
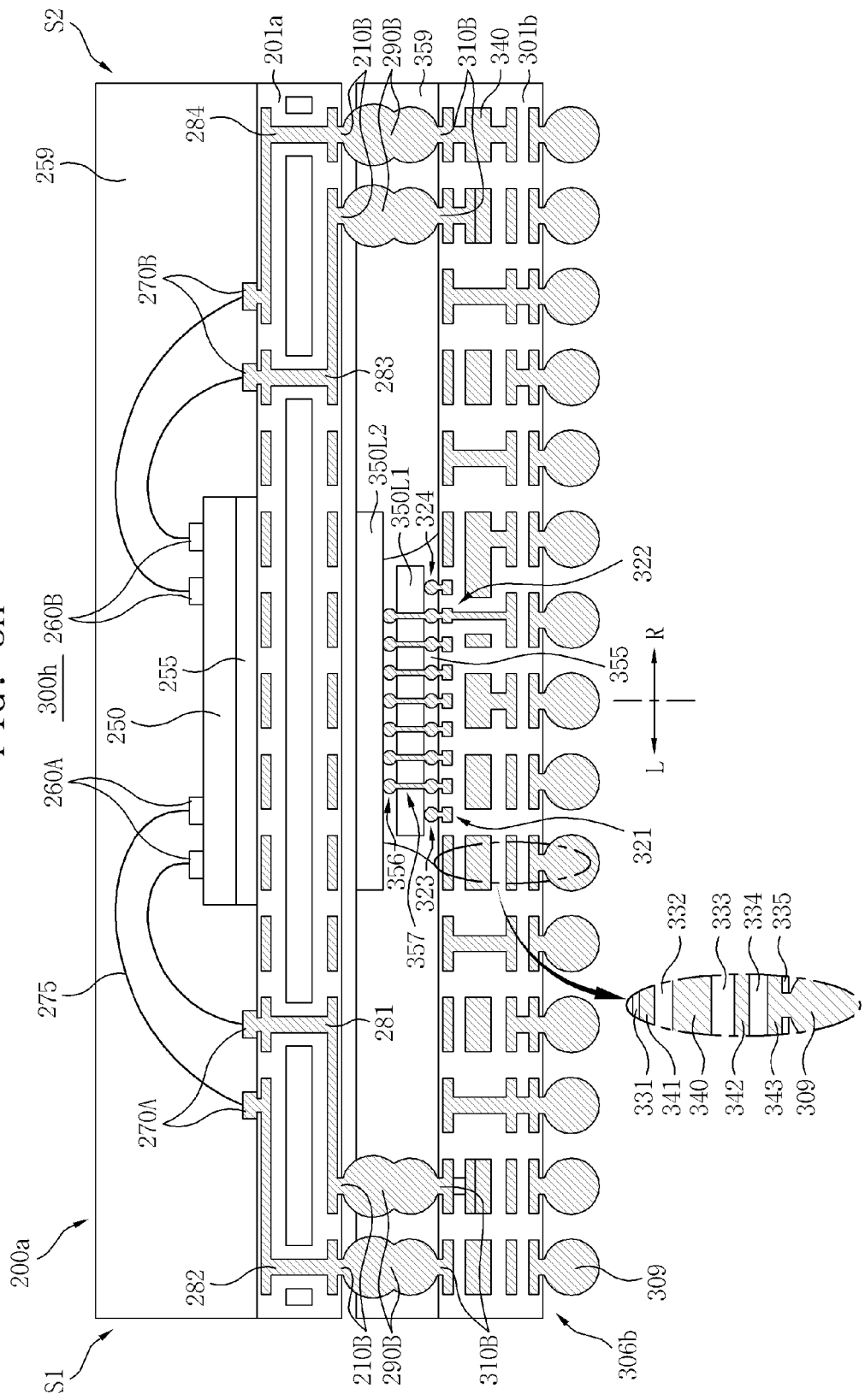
Figure 5I:
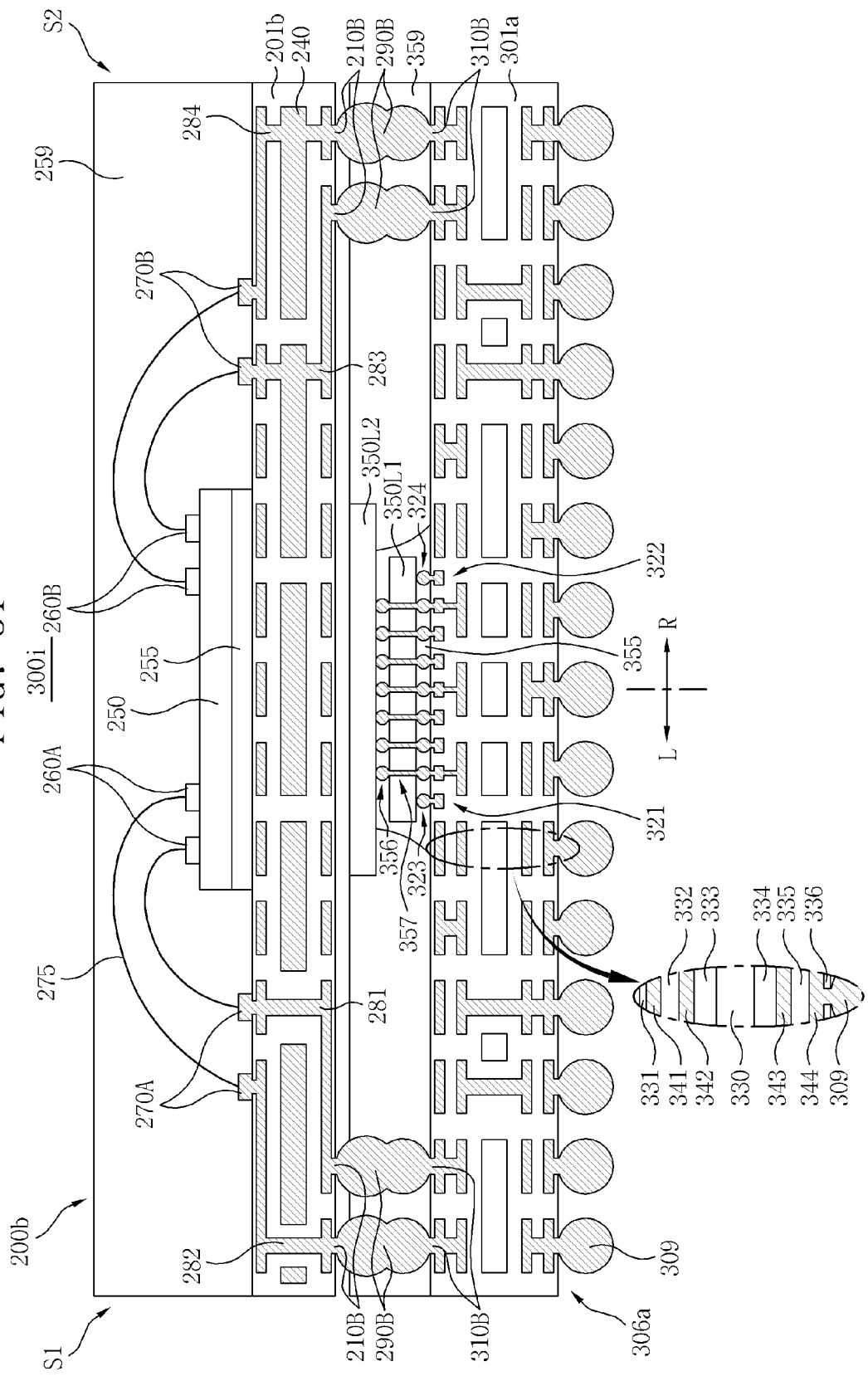
Figure 5J:
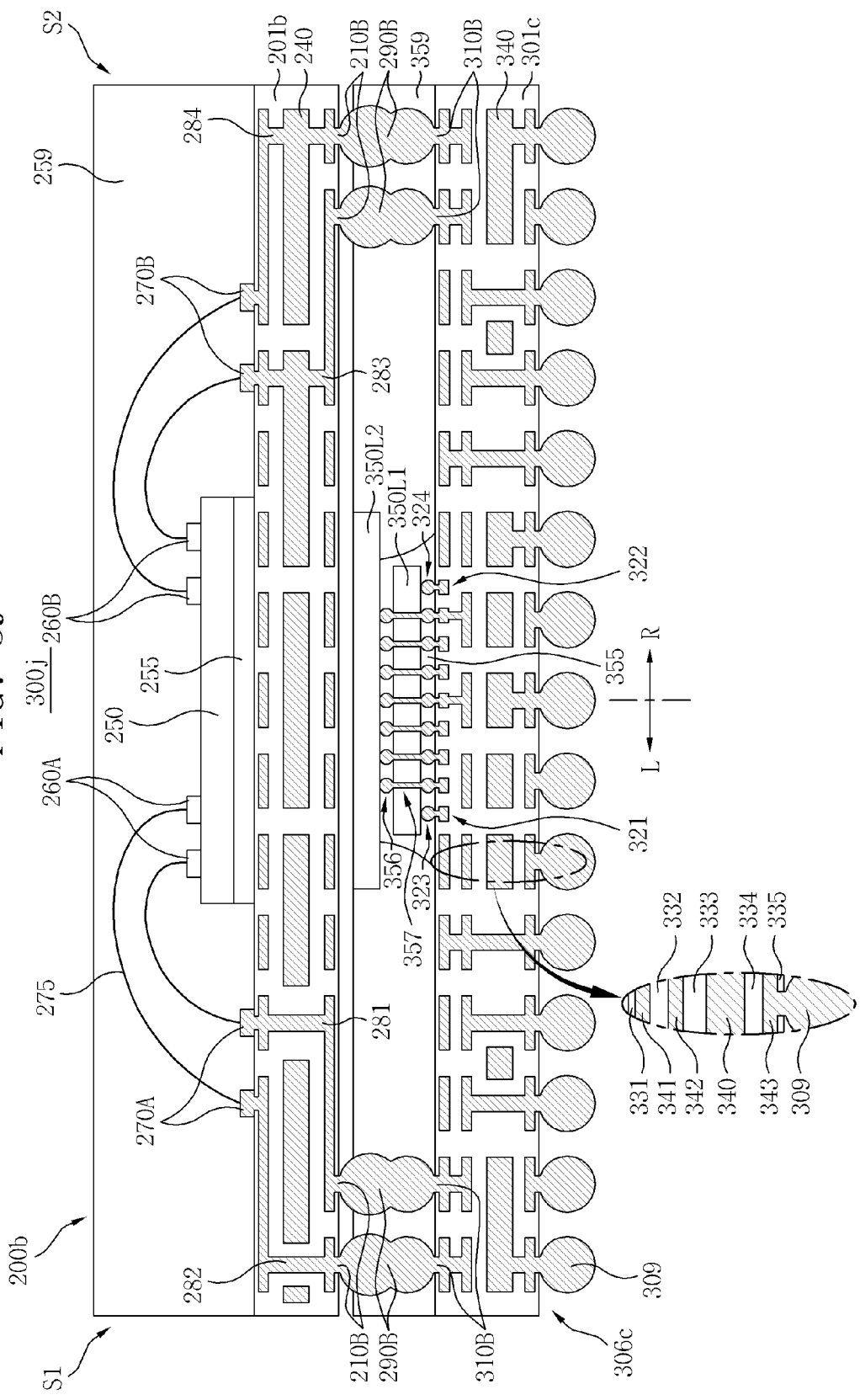

Referring to FIGS. 5D through 5F, the package stack structures 300d to 300f according to various embodiments of the inventive concept may include the upper packages 200b and the lower packages 305a to 305c, respectively.

Referring to FIG. 5D, the upper package substrate 201b may include a metal core layer 240. Referring to FIGS. 5E and 5F, the upper and lower package substrates 201b and 301b may include metal core layers 240 and 340, respectively. The upper package 200b may be understood with reference to FIG. 4B, and the lower packages 305a to 305c may be understood with reference to FIGS. 5A through 5C. A description of the present embodiments will be understood in further detail with reference to FIGS. 5A through 5C.

Referring to FIGS. 5G through 5J, each of package stack structures 300g to 300j according to various embodiments of the inventive concept may include an upper package 200a or 200b and a lower package 306a, 306b, or 306c. As compared with the lower packages 305a to 305c of FIGS. 5A through 5F, each of the lower packages 306a to 306c may include a first lower semiconductor device 350L1 and a second lower semiconductor device 350L2. The lower semiconductor device 350L1 may include lower through-silicon vias 367. The first and second lower semiconductor devices 350L1 and 350L2 may be electrically connected to each other by inter-chip connectors 356. The inter-chip connectors 356 may be electrically connected to lower through silicon vias (TSVs) 357, respectively. The first lower semiconductor device 350L1 may include a logic device, and the second lower semiconductor device 350L2 may include a memory device. For example, the second lower semiconductor device 350L2 may include a wide I/O memory device. That is, each of the lower packages 306a to 306c may include a logic device and a memory device electrically connected to each other using a flip-chip method.

Referring back to FIGS. 5G to 5J, the inter-package connectors 290A and 290B having the first and second characteristics may include upper inter-package connectors 290A and 290B and lower inter-package connectors 290A and 290B, respectively. As mentioned above, the upper and lower inter-package connectors 290A and 290B may be integrally formed. According to the inventive concept, the inter-package connectors 290A and 290B may constitute one inter-package connector, i.e., it may include two or more inter-package connectors formed integrally. Accordingly, the shapes of the inter-package connectors 290A and 290B shown in FIGS. 5A through 5J are compatible with one another.

Each of the package stack structures 300a to 300j described with reference to FIGS. 5A through 5J according to the inventive concept may include conductive components 260A, 270A, 210A, 290A, and 310A having the first characteristic, which may be disposed near the first side S1 thereof or asymmetrically disposed in the left half portion L thereof. The conductive components 260A, 270A, 210A, 290A, and 310A having the first characteristic may serve a first function and/or a second function. The first function may include transmitting or providing data signals and/or reference voltages (or supply voltages) for a data circuit. The second function may include transmitting address/control signals.

Referring back to FIGS. 5A through 5J, each of the package stack structures 300a to 300j according to the inventive concept may include conductive components 260B, 270B, 210B, 290B, and 310B having the second characteristic, which may be disposed near the second side S2 thereof or asymmetrically disposed in the right half portion R thereof. The conductive components 260B, 270B, 210B, 290B, and 310B having the second characteristic may serve a third function. The third function may include transmitting reference voltages for an address/control circuit.

In the inventive concept, the upper and lower semiconductor devices 250 and 350 may transmit and receive data signals and/or address/control signals through some of the conductive components 260A, 270A, 210A, 290A, and 310A having the first characteristic, the first flip-chip connector lands 321, and the first flip-chip connectors 323.

In FIGS. 5G through 5J, the inter-chip connectors 356 may be disposed in various manners with reference to FIGS. 3E through 3G Specifically, the inter-chip connectors 356 may be asymmetrically disposed on a portion of a top surface of the lower semiconductor device 350 or arranged substantially across the entire top surface thereof. For example, the inter-chip connectors 356 may be disposed asymmetrically according to the disposition of the other conductive components 260A, 270A, 210A, 290A, and 310A having the first characteristic or disposed in an opposing position thereto. The inter-chip connectors 356 may be uniformly disposed on substantially the entire surface of the lower semiconductor device. The disposition of the inter-chip connectors 356 may be determined according to the function thereof. Furthermore, when a shielding effect results from transmitting various reference voltages Vdd/Vss through the inter-chip connectors 356, the inter-chip connectors 356 may be generally uniformly disposed or asymmetrically disposed according to the disposition of the conductive components 260A, 270A, 210A, 290A, and 310A having the first characteristic. When it is intended to transmit data signals, address signals, or other oscillating signals through the inter-chip connectors 356, the inter-chip connectors 356 may be variously disposed according to the type of signal transmission/conveyance components. According to an embodiment of the inventive concept, the inter-chip connectors 356 may be asymmetrically disposed in various patterns according to the function thereof.

In the above-described package stack structures 300a to 300j, the route-shaped arrangement or design of the conductive components 260A, 270A, 210A, 290A, and 310A having the first characteristic configured to transmit or provide data signals, reference voltages (or supply voltages) for a data circuit, and/or address/control signals may be simplified, and a deviation in signal delay caused by a difference in signal path may be reduced to improve signal transition arrival timing and thus integrity.

FIGS. 6A through 6K are exploded perspective views of package stack structures according to various embodiments of the inventive concept. In particular, FIGS. 6A through 6K show a case where an upper package includes a plurality of semiconductor devices. In FIGS. 6A through 6K, like components and/or like reference numerals may be interpreted as components having the same or similar functions. Accordingly, only key differences among the respective embodiments will be described.

Figure 6A:
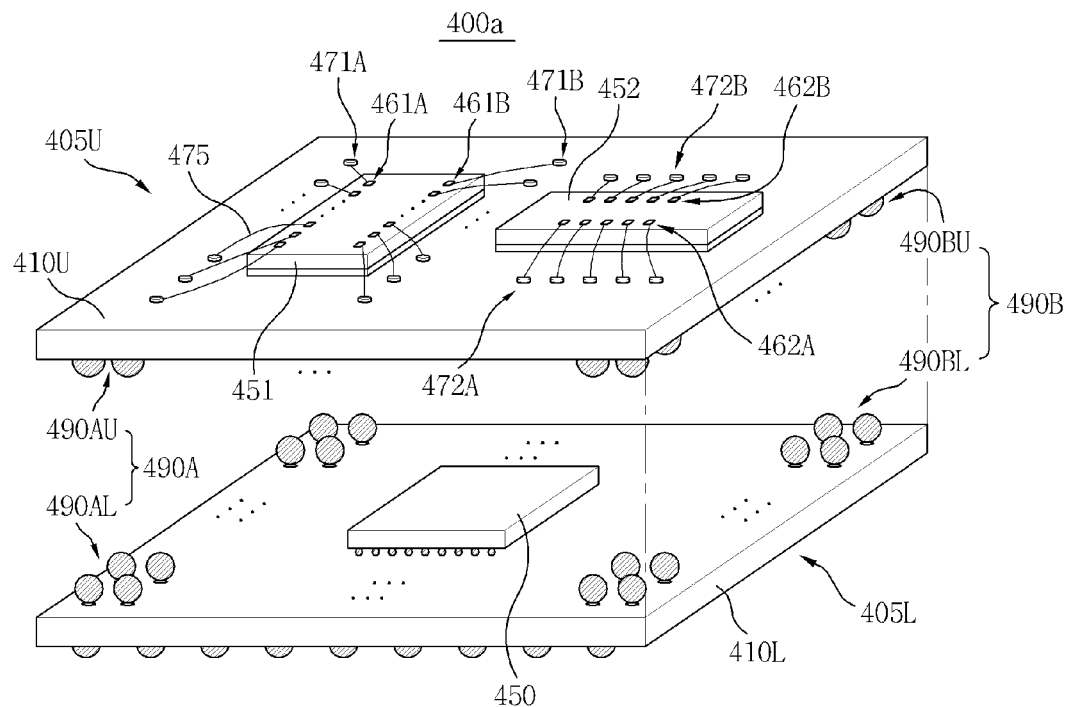
FIGS. 6A through 6K are exploded perspective views of package stack structures according to various embodiments of the inventive concept.

Referring to FIG. 6A, a package stack structure 400a according to an embodiment of the inventive concept may include an upper package 405U, a lower package 405L, and inter-package connectors 490A and 490B.

The upper package 405U may include a plurality of upper semiconductor devices 451 and 452 mounted on a top surface thereof. For brevity, it is assumed that the upper package 405U includes two upper semiconductor devices 451 and 452. However, it may be understood that the upper package 405 may include more than two semiconductor devices. Each of the upper semiconductor devices 451 and 452 may be one of the semiconductor devices shown in the appended various drawings. For example, semiconductor devices may be a master semiconductor chip illustrated in, for example, FIG. 20A or slave semiconductor chips illustrated in, for example, FIG. 20C.

The upper package 405 used in other embodiments (e.g., FIGS. 6B-6J) may also include more than two semiconductor devices mounted thereon. In addition, upper semiconductor devices 451 and 452 of FIGS. 6B-6J can also be a master semiconductor chip illustrated in FIG. 20A or slave semiconductor chips illustrated in FIG. 20C.

According to one aspect of the present disclosure, two upper semiconductor devices 451, 452 may be the same device. Also, one of the two upper semiconductor devices 451, 452 is a DRAM and the other is a non-volatile memory such as a flash memory.

Referring to FIG. 6A, in plan view, the upper package 405U may include a first upper semiconductor device 451 and a second upper semiconductor device 452, which may be rotated by an angle of 90° from each other. The upper semiconductor devices 451 and 452 may include first bonding pads 461A and 462A, both of which have a first characteristic and second bonding pads 461B and 462B, both of which have a second characteristic. As described above, the first bonding pads 461A and 462A having the first characteristic may serve the first function and/or the second function, and the second bonding pads 461B and 462B having the second characteristic may serve the third function.

Wire lands 471A and 472A having the first characteristic may be disposed near two sides of the upper package substrate 410U. In FIG. 6A, it is illustrated that the two sides are left and bottom sides. Wire lands 471B and 472B having the second characteristic may be disposed near the other sides of the upper package substrate 410U. The wire lands 471A and 472A having the first characteristic may be respectively disposed near and electrically connected to the bonding pads 461A and 462A having the first characteristic. The wire lands 471B and 472B having the second characteristic may be respectively disposed near and electrically connected to the bonding pads 461B and 462B having the second characteristic. More specifically, the wire lands 471A and 472A having the first characteristic may include primary wire lands 471A having the first characteristic and secondary wire lands 472A having the first characteristic. The primary wire lands 471A having the first characteristic may be electrically connected to the bonding pads 461A having the first characteristic of the first upper semiconductor device 451. The second wire lands 472A having the first characteristic may be electrically connected to the bonding pads 462A having the first characteristic of the second upper semiconductor device 452. The wire lands 471B and 472B having the second characteristic may be divided into primary wire lands 471B and secondary wire lands 472B. The primary wire lands 471B having the second characteristic may be connected to the bonding pads 461B having the second characteristic of the first upper semiconductor device 451. The secondary wire lands 472B having the secondary characteristic may be connected to the bonding pads 462B having the second characteristic of the second upper semiconductor device 452. The wire lands 471A, 471B, 472A, and 472B having the first and second characteristics may be respectively electrically connected to the inter-package connectors 490A and 490B having the first and second characteristics through, for example, internal signal routing patterns of the upper package substrate 410U.

Referring to FIGS. 6B through 6E, the upper package 405U of each of the package stack structures 400b to 400e according to the embodiments of the inventive concept may include a plurality of upper semiconductor devices 451 and 452 disposed in various shapes.

Figure 6B:
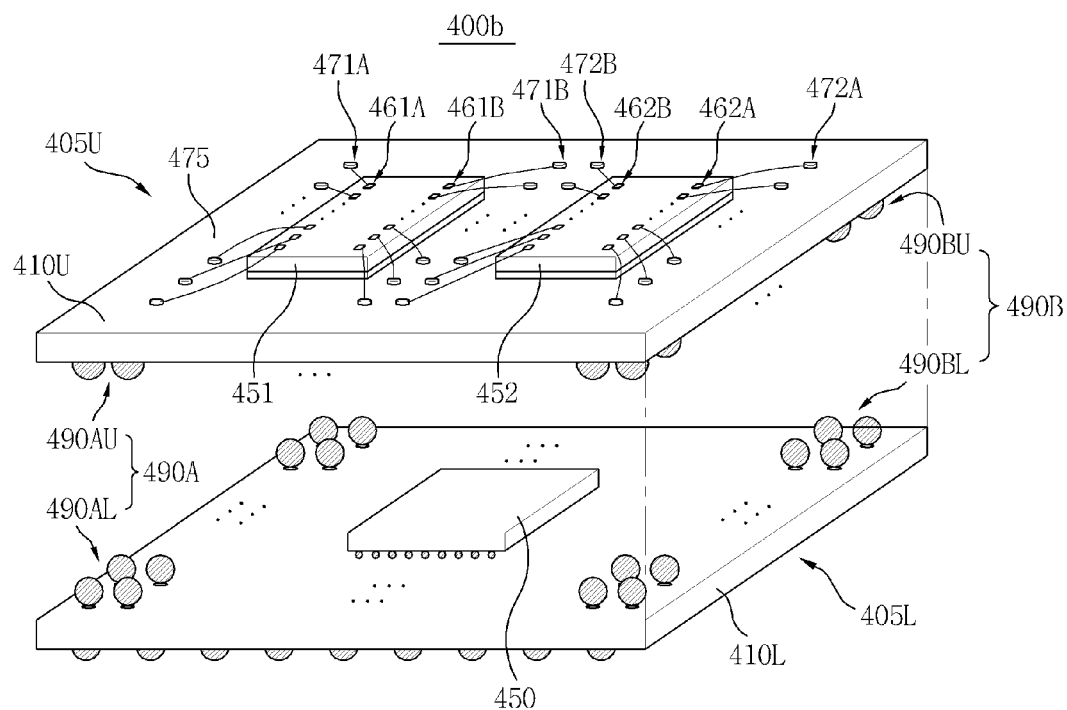
Figure 6C:
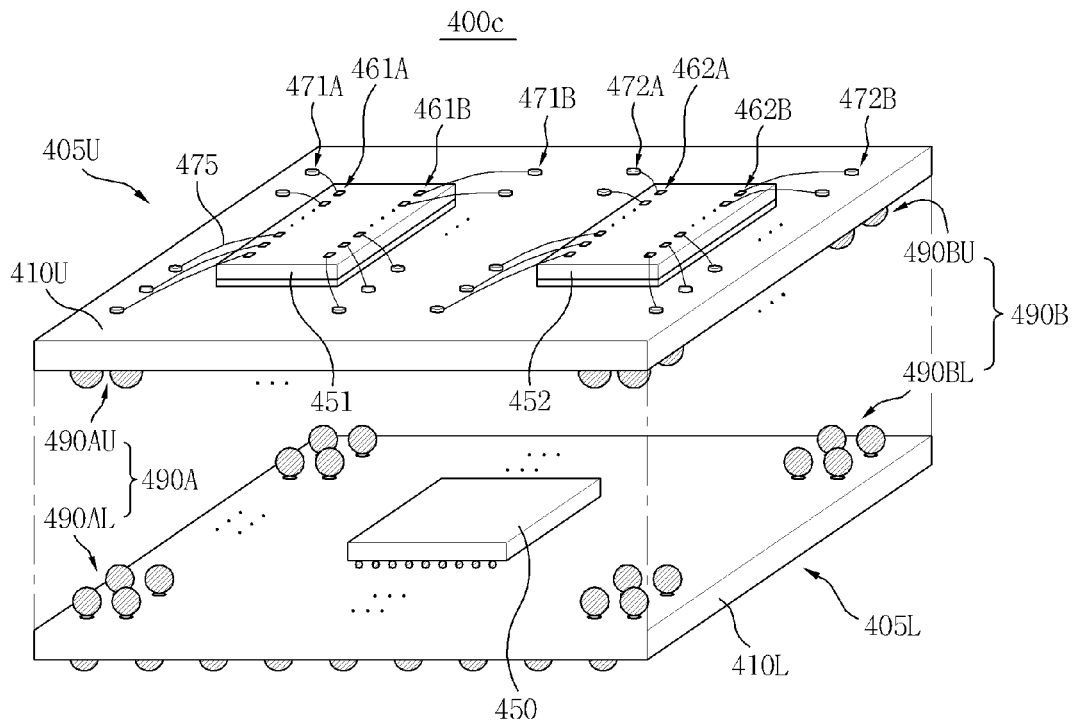

Referring to FIGS. 6B and 6C, the upper semiconductor devices 451 and 452 may be symmetrically disposed relative to a centerline of the package substrate 410U. Referring to FIG. 6B, the bonding pads 461A and 462A having the first characteristic and the wire lands 471A and 472A having the first characteristic may be disposed closer to an outer portion of the upper package substrate 410U. The bonding pads 461B and 462B having the second characteristic and the wire lands 471B and 472B having the second characteristic may be disposed closer to the center of the upper package substrate 410U. Referring back to FIG. 6C, the bonding pads 461A and 462A having the first characteristic and the wire lands 471A and 472A having the first characteristic may be disposed closer to the center of the upper package substrate 410U, while the bonding pads 461B and 462B having the second characteristic and the wire lands 471B and 472B having the second characteristic may be disposed closer to the outer portion of the upper package substrate 410U.

Figure 6D:
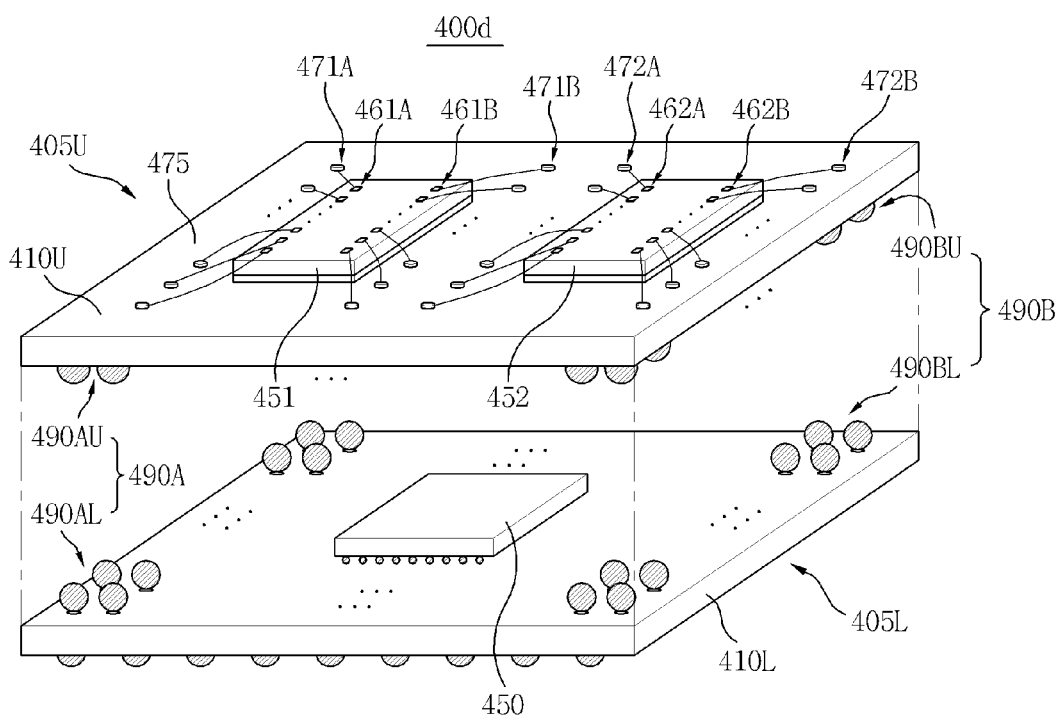
Figure 6E:
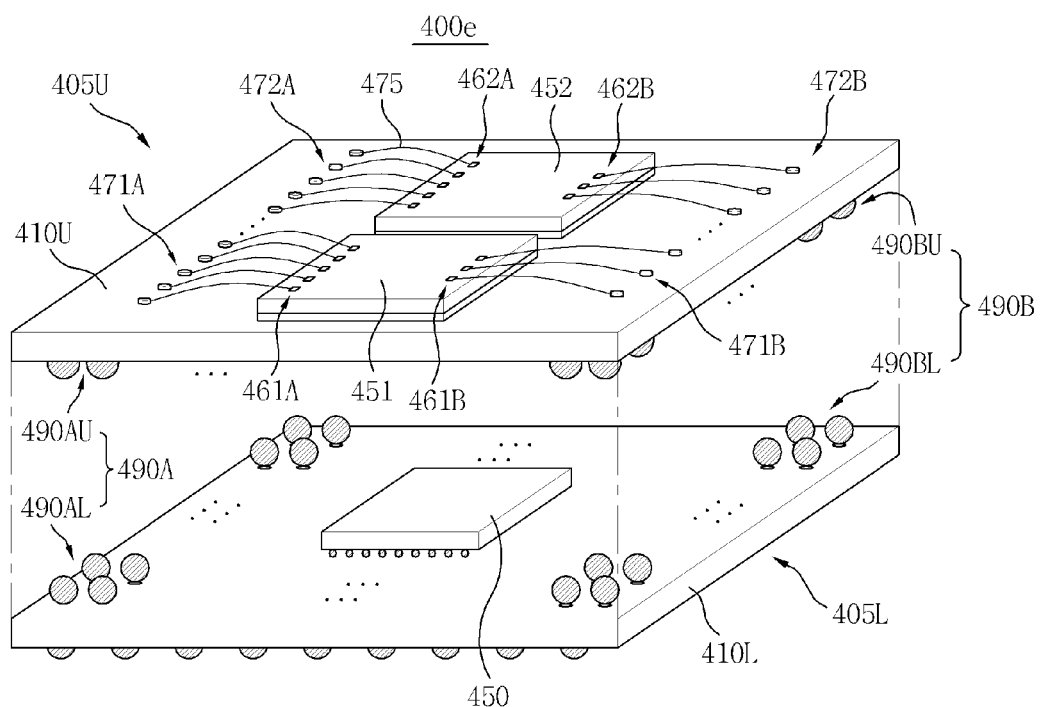

Referring to FIGS. 6D and 6E, the upper semiconductor devices 451 and 452 may be disposed parallel to each other. Referring back to FIG. 6D, the upper semiconductor devices 451 and 452 may be disposed parallel to each other in a lengthwise direction. Referring back to FIG. 6E, the upper semiconductor devices 451 and 452 alternatively may be disposed parallel to each other in a widthwise direction.

Figure 6F:
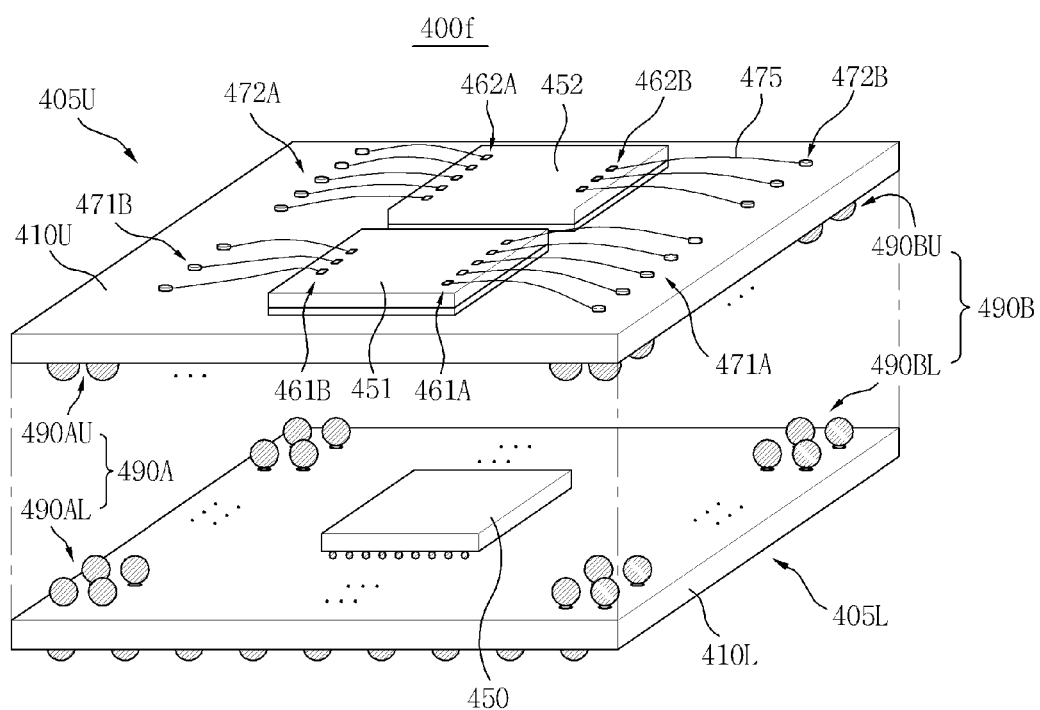

Referring to FIG. 6F, as compared with the package stack structure 400e of FIG. 6E, an upper package 405U of a package stack structure 400f according to an embodiment of the inventive concept may include a plurality of upper semiconductor devices 451 and 452 mounted on an upper package substrate 410 parallel to each other in a widthwise direction. The upper semiconductor device 451 of FIG. 6F is rotated by an angle of 180° with respect to the upper semiconductor device 451 shown in FIG. 6E.

Figure 6G:
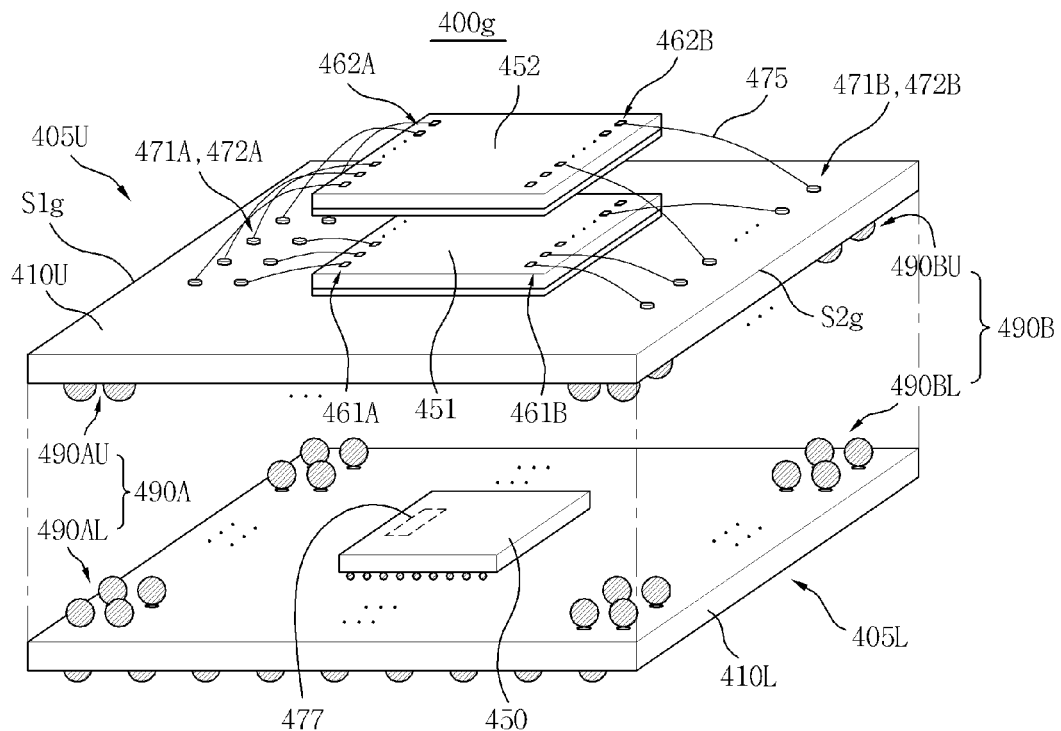

Referring to FIG. 6G, an upper package 405U of a package stack structure 400g according to an embodiment of the inventive concept may include a plurality of upper semiconductor devices 451 and 452 stacked vertically.

A lower package 405L is disposed under the upper package 405U. The lower package 405L includes a lower package substrate 410L and a lower semiconductor device 450. In some embodiments, the lower semiconductor device 450 includes a memory control circuit 477 disposed near a first edge S1g (or a first region adjacent the first edge S1g) of the upper package substrate 410U. A single signal channel may be formed between the bonding pads 461A, 462A of the first and second upper semiconductor devices 451, 452 and the memory control circuit 477 to control the first and second upper semiconductor devices 451, 452 together.

In some embodiments, a long axis of the second upper semiconductor device 452 may be arranged substantially parallel with respect to a long axis of the first upper semiconductor device 451.

In some embodiments, the bonding pads 461A, 462A each have first bonding pads configured to transmit data signals, second bonding pads configured to transmit address/control signals, and fourth bonding pads configured to provide supply voltages for the data circuit. A majority (or all) of the first, second and/or third bonding pads of the bonding pads 461A, 462A of the first and second upper semiconductor devices 451, 452 may be disposed near the first region of the upper package substrate 410U.

Also, the bonding pads 461, 462B may include third bonding pads configured to provide supply voltages for the address/control circuit. A majority (or all) of the third bonding pads of the bonding pads 461B, 462B of the first and second upper semiconductor devices 451, 452 may be disposed near the second region of the upper package substrate 410U opposite to the first region.

Figure 6H:
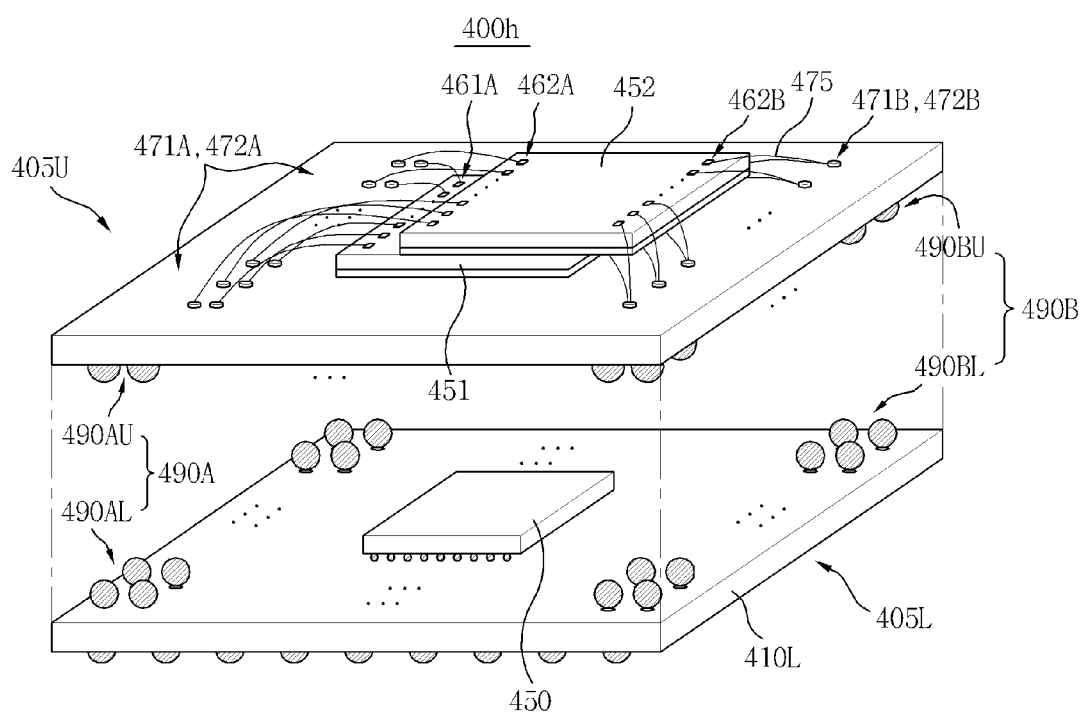
Figure 6I:
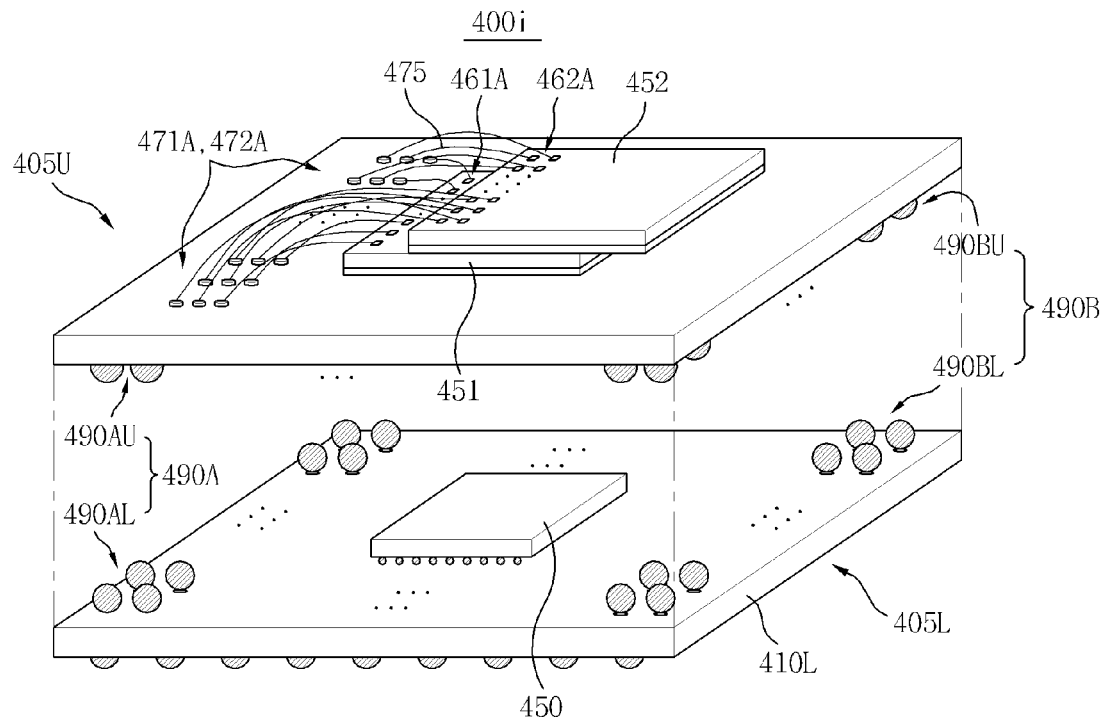

Referring to FIG. 6H, an upper package 405U of a package stack structure 400h according to an embodiment of the inventive concept may include a plurality of upper semiconductor devices 451 and 452 stacked in an offset manner, one on top of the other, to form a staircase-like configuration.

Figure 6J:
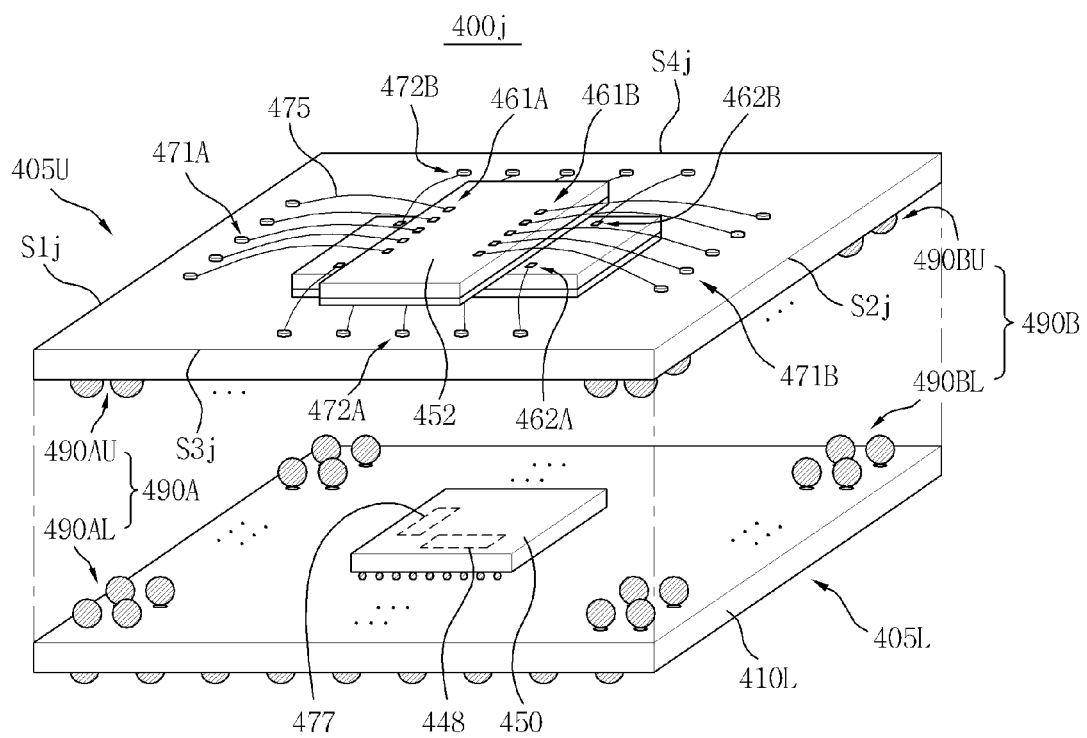

Referring to FIG. 6J, as compared with FIG. 6H, upper semiconductor devices 451 and 452 may respectively include bonding pads 461 and 462 disposed near one side thereof. The upper semiconductor devices 451 and 452 shown in FIGS. 6G through 6I may be rotated by an angle of 90° from each other as shown in FIG. 6A.

Referring to FIG. 6J, an upper package 405U of a package stack structure 400j according to an embodiment of the inventive concept may include a plurality of upper semiconductor devices 451 and 452 stacked one on top of the other at right angles to each other. The shapes and arrangements of the upper semiconductor devices 451 and 452 shown in FIG. 6J may be better understood with reference to FIGS. 6A and 6G through 6I.

In some embodiments, the upper package substrate 410U has a third edge S3j and a fourth edge S4j opposite to the third edge S3j, each of which is disposed between the first edge S1j and the second edge S2j. A majority (or all) of the first and second bonding pads of the second upper semiconductor device 452 are disposed near the third edge S3j and a majority (or all) of the third bonding pads of the second upper semiconductor device 452 are disposed near the fourth edge S4j.

In some embodiments, the lower semiconductor device 450 may include a first memory control circuit 447 disposed near the first edge of the upper package substrate 410U and a second memory control circuit 448 near the third edge S3g of the upper package substrate 410U. According to an embodiment, a first signal channel (not illustrated) may be formed between the first and second bonding pads of the first upper semiconductor device 451 and the first memory control circuit 447 to control the first upper semiconductor device 451, and a second signal channel (not illustrated) may be formed between the first and second bonding pads of the second upper semiconductor device 452 and the second memory control circuit 448 to control the second upper semiconductor device 452. In this manner, multiple signal channels are formed between the first and second upper semiconductor devices 451, 452 and the lower semiconductor device 450.

In some embodiments, the lower semiconductor device 450 may be electrically connected to the lower semiconductor substrate 410L using conductive bumps, which may be electrically connected to the first and second memory control circuits 447, 448.

In some embodiments, the first and second upper semiconductor devices 451, 452 are DRAMs and the lower semiconductor device 450 is a logic device.

In some embodiments, a long axis of the second upper semiconductor device 452 is disposed at right angles with respect to a long axis of the first upper semiconductor device 451.

Figure 6K:
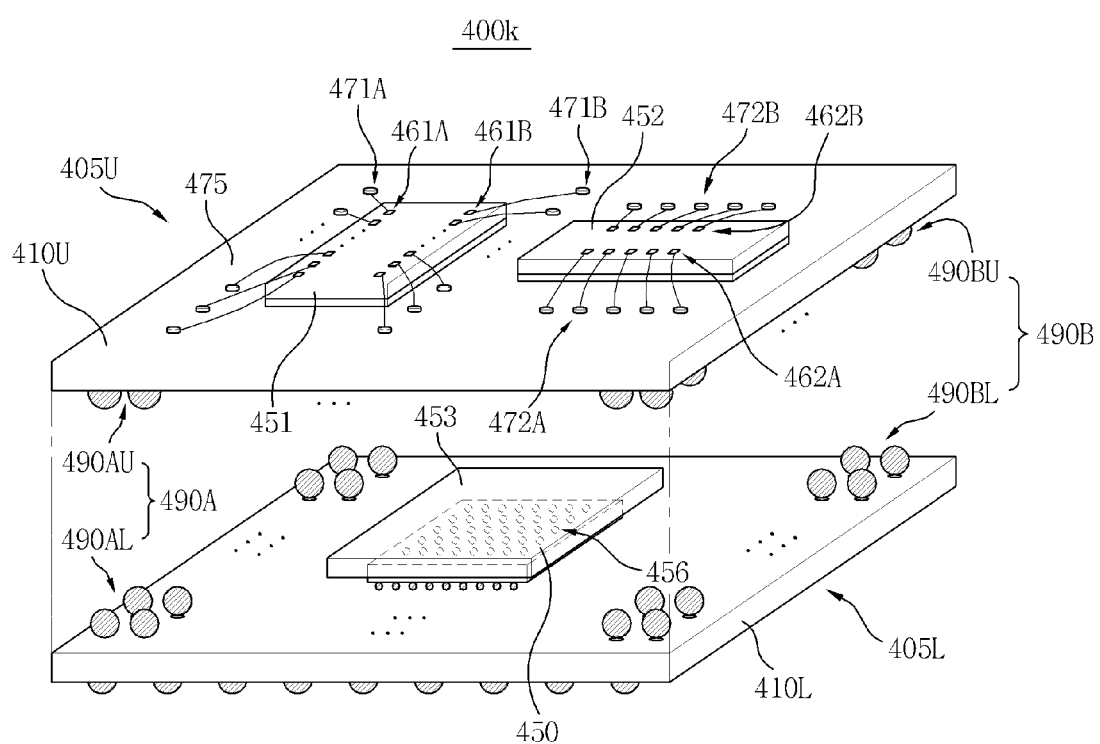

Referring to FIG. 6K, a package stack structure 400k according to an embodiment of the inventive concept may further include a stack semiconductor device disposed on a lower semiconductor device 450. The stack semiconductor device 453 may include a wide I/O memory device. Specifically, inter-chip connectors 456 may be disposed on the surface of the lower semiconductor device 450. The inter-chip connectors 456 may be non-uniformly, not equally, or asymmetrically disposed at both sides of the surface of the lower semiconductor device 450. However, the inter-chip connectors 456 may be formed in one of shapes shown in FIGS. 3E through 3G The lower semiconductor device 450 and the stack semiconductor device 453 may be electrically connected to each other through the inter-chip connectors 456.

Each of the package stack structures 400a to 400k shown in FIGS. 6A through 6K according to various embodiments of the inventive concept may include a plurality of upper semiconductor devices 451 and 452 and may further include the inter-package connectors 490A and 490B having the first and second characteristics. The inter-package connectors 490A and 490B may be asymmetrically disposed in a left or right half portion of the package stack structures 400a to 400k. The inter-package connectors 490A and 490B may include upper inter-package connectors 490AU and 490BU and lower inter-package connectors 490AL and 490BL, respectively. The inventive concept is more broadly described in further detail with reference to other drawings.

FIGS. 7A through 7G are schematic views of upper packages according to various embodiments of the inventive concept. For clarity, FIGS. 7A through 7G illustrate lateral cross-sectional views of semiconductor devices 551 and 552 including bonding wires 575 and schematic longitudinal cross-sectional views of package substrates 501*a* to 501*h*. As shown in FIG. 6A or 6J, one of the semiconductor devices 551 and 552 may be rotated by an angle of 90° from the other and horizontally disposed or stacked. However, in FIGS. 7A through 7G, the semiconductor devices 551 and 552 is shown disposed parallel to each other, similar to the arrangements of the semiconductor devices 451, 452 as shown in FIG. 6B, for simplicity. A die-bonding film 555 and an upper molding compound (not illustrated for the sake of simplicity) may be formed. As described above, the term "primary" may refer to conductive structures electrically connected to the first semiconductor device 551, and the term "secondary" may refer to conductive structures electrically connected to the second semiconductor device 552.

For example, primary conductive structures having a first characteristic may include primary bonding pads 561A having the first characteristic, primary wire lands 571A having the first characteristic, and primary upper inter-package connector lands 510A having the first characteristic. Primary conductive structures having a second characteristic may include primary bonding pads 561B having the second characteristic, primary wire lands 571B having the second characteristic, and primary upper inter-package connector lands 510B having the second characteristic.

Secondary conductive structures having the first characteristic connected to the second semiconductor device 552 may include secondary bonding pads 562A having the first characteristic, secondary wire lands 572A having the first characteristic 572A, and secondary upper inter-package connector lands 510A having the first characteristic.

Secondary conductive structures having the second characteristic may include secondary bonding pads 562B having the second characteristic, secondary wire lands 572B having the second characteristic, and secondary upper inter-package connector lands 510B having the second characteristic.

In the present embodiment, the upper inter-package connector lands 510A having the first characteristic are not divided into primary and secondary upper inter-package connector lands. Also, the upper inter-package connector lands 510B having the second characteristic are not divided into primary and secondary upper inter-package connector lands.

As described above, conductive structures having the first characteristic may serve the first function and/or the second function, and conductive structures having the second characteristic may serve the third function. The first function may include transmitting or providing data signals and/or reference voltages for a data circuit. The second function may include transmitting address/control signals. The third function may include transmitting reference voltages for an address/control circuit.

An upper package 500*a* according to various embodiment of the inventive concept may include a plurality of semiconductor devices 551 and 552 horizontally arranged as shown or vertically stacked on top of each other (not illustrated) on a package substrate 501*a*. The semiconductor devices 551 and 552 may include bonding pads 561A, 562A, having a first characteristic. The semiconductor devices 551 and 552 may also include bonding pads 561B, 562B having a second characteristic. Wire lands 571A, 572A having the first characteristic may be disposed on the package substrate 501*a*. Wire lands 571B, 572B having the second characteristic may also be disposed on the package substrate 501*a*. The wire lands 571A, 571B, 572A, and 572B having the first and second characteristics may be divided into primary wire lands electrically connected to a first upper semiconductor device 551 and secondary wire lands electrically connected to a second upper semiconductor device 552.

The wire lands 571A and 572A having the first characteristic may be electrically connected to the inter-package connector lands 510A having the first characteristic, and the wire lands 571B and 572B having the second characteristic may be electrically connected to the inter-package connector lands 510B having the second characteristic.

According to an aspect of the present disclosure, if the functionally asymmetric bonding pads 561A, 562A discussed above are arranged as shown in FIG. 7*a*, the signal path between the bonding pads 561A, 562A and the wire lands 571A, 572A (or other interconnection elements and/or the memory control circuit) can be made shorter than in conventional arrangements. The package substrate 501*a* may include a first insulating layer 531, a first metal layer 541, a second insulating layer 532, a second metal layer 542, a third insulating layer 533, an insulating core layer 530, a fourth insulating layer 534, a third metal layer 543, a fifth insulating layer 534, a fourth metal layer 544, and a sixth insulating layer 536 stacked sequentially.

Figure 7A:
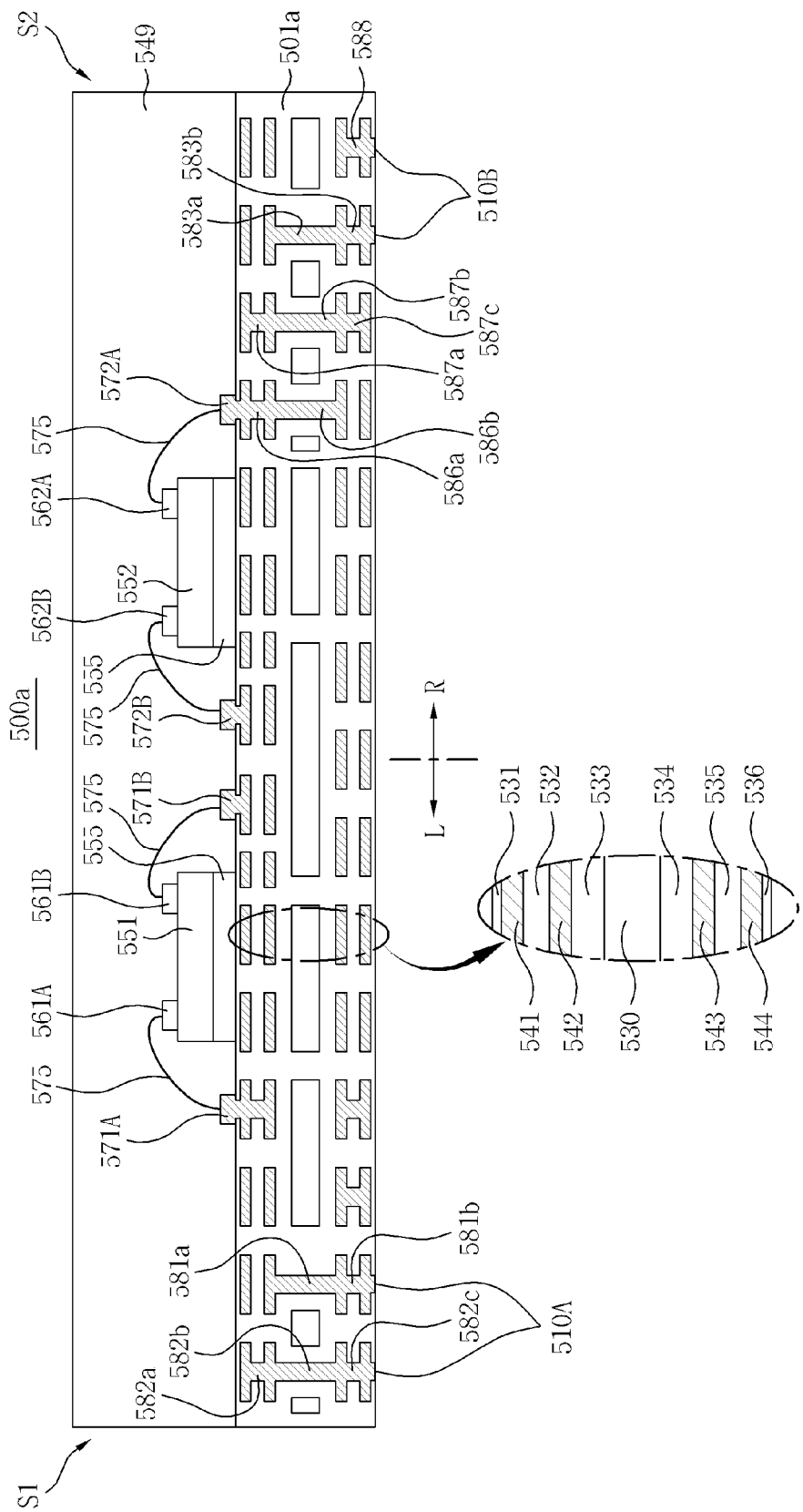

Vias 581*a*, 581*b*, 582*a*, 582*b*, 582*c*, 583*a*, 583*b*, 586*a*, 586*b*, 587*a*, 587*b*, 587*c*, and 588 may vertically connect metal layers 541 to 544 and penetrate the second through fifth insulating layers 532 to 535 and the insulating core layer 530. Although it is illustrated that the vias 581*a*, 581*b*, 582*a*, 582*b*, 582*c*, 583*a*, 583*b*, 586*a*, 586*b*, 587*a*, 587*b*, 587*c*, and 588 are asymmetrically disposed, the vias 581*a*, 581*b*, 582*a*, 582*b*, 582*c*, 583*a*, 583*b*, 586*a*, 586*b*, 587*a*, 587*b*, 587*c*, and 588 may not be asymmetrically disposed but may be instead disposed in various other locations and may assume various other shapes. In FIG. 7A, the vias 581*a*, 581*b*, 582*a*, 582*b*, 582*c*, 583*a*, 583*b*, 586*a*, 586*b*, 587*a*, 587*b*, 587*c*, and 588 are illustrated for a conceptual description of electrical connection.

In the present embodiment, the inter-package connector lands 510A having the first characteristic may be disposed near a first side (or a first edge) S1 of the package substrate 501*a*. In FIG. 7*a*, the first side S1 may be a left side. Accordingly, the inter-package connector lands 510A having the first characteristic may be disposed in a left half portion L of the package substrate 501*a*. The inter-package connector lands 510B having the second characteristic may be disposed near a second side (or a second edge) S2 opposite the first side S1 of the package substrate 501*a*. In FIG. 7A, the second side S2 may be a right side. The inter-package connector lands 510B having the second characteristic may be disposed in a right half portion R of the package substrate 501*a*.

Figure 7B:
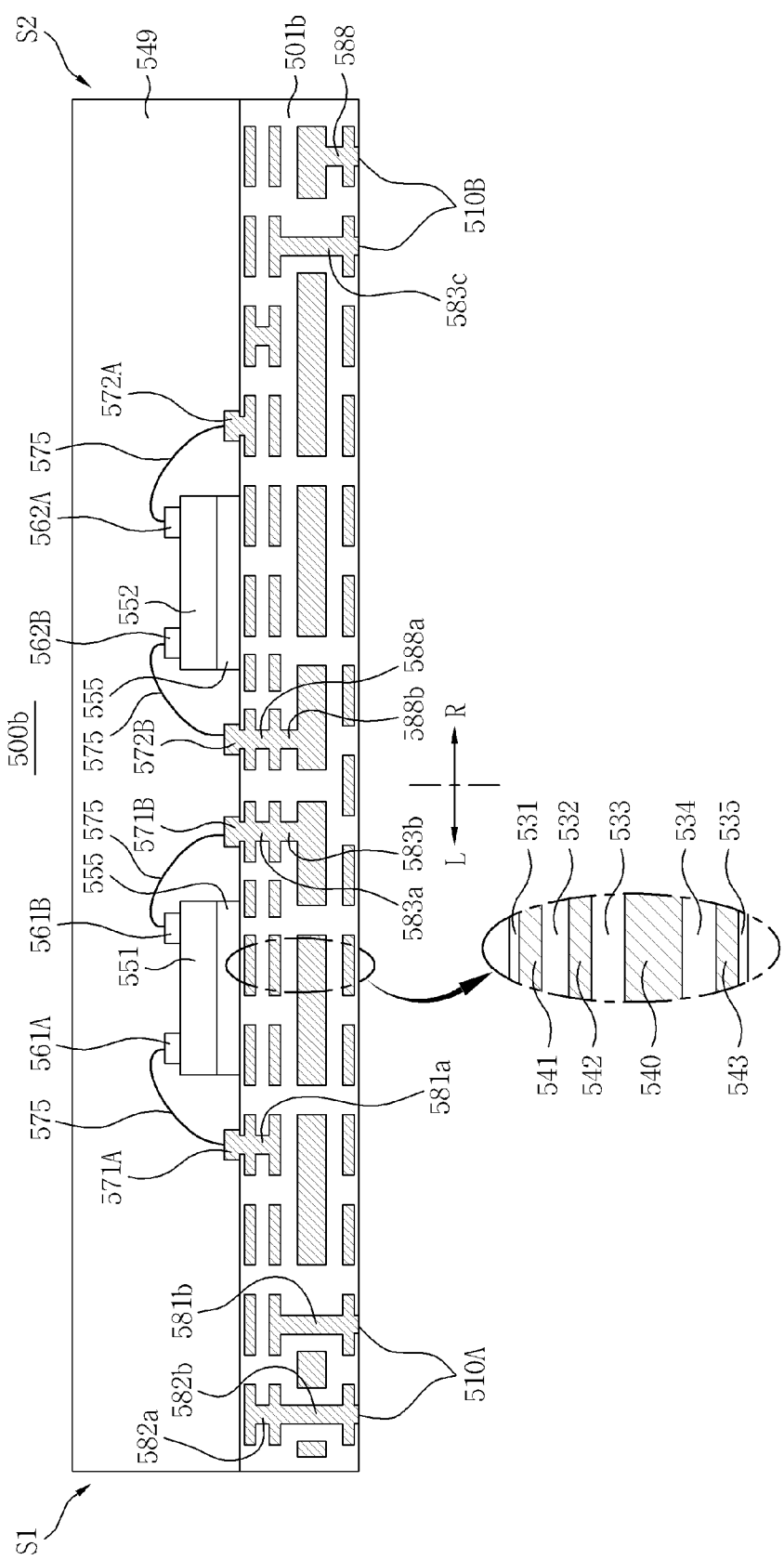

Referring to FIG. 7B, a package substrate 501*b* of an upper package 500*b* according to an embodiment of the inventive concept may include a first insulating layer 531, a first metal layer 541, a second insulating layer 532, a second metal layer 542, a third insulating layer 533, a metal core layer 540, a fourth insulating layer 534, a third metal layer 543, and a fifth insulating layer 535 stacked in a sequential or alternating manner.

Some of conductive components 561B, 562B, 571B and 572B, and 510B having the second characteristic may not be electrically connected to the metal core layer 540. For example, one or more metal core layers such as the metal core layer 540 may be used to provide various reference voltages (or supply voltages). Also, the metal core layer 540 may be used as a plane surface for one reference voltage or various reference voltages. In one example, the metal core layer 540 may be separately or simultaneously connected to the wire lands 571B and 572B having the second characteristic through various vias 583a, 583b, 588a, and 588b.

Figure 7C:
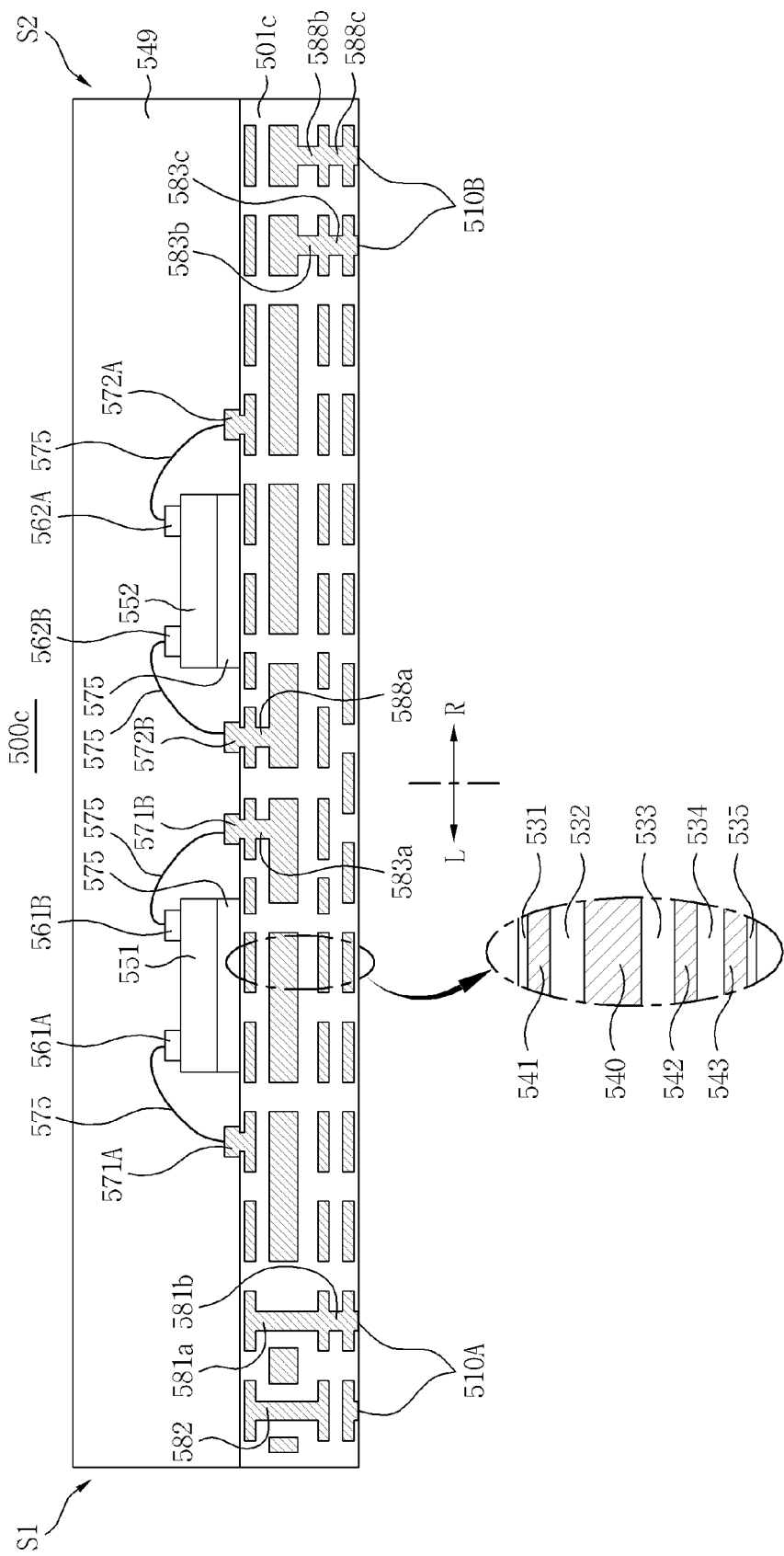

Referring to FIG. 7C, a package substrate 501c of an upper package 500c according to an embodiment of the inventive concept may include a first insulating layer 531, a first metal layer 541, a second insulating layer 532, a metal core layer 540, a third insulating layer 533, a second metal layer 542, a fourth insulating layer 534, a third metal layer 543, and a fifth insulating layer 535 stacked sequentially. A description of the upper package 500c may be understood with reference to FIG. 7B.

Figure 7D:
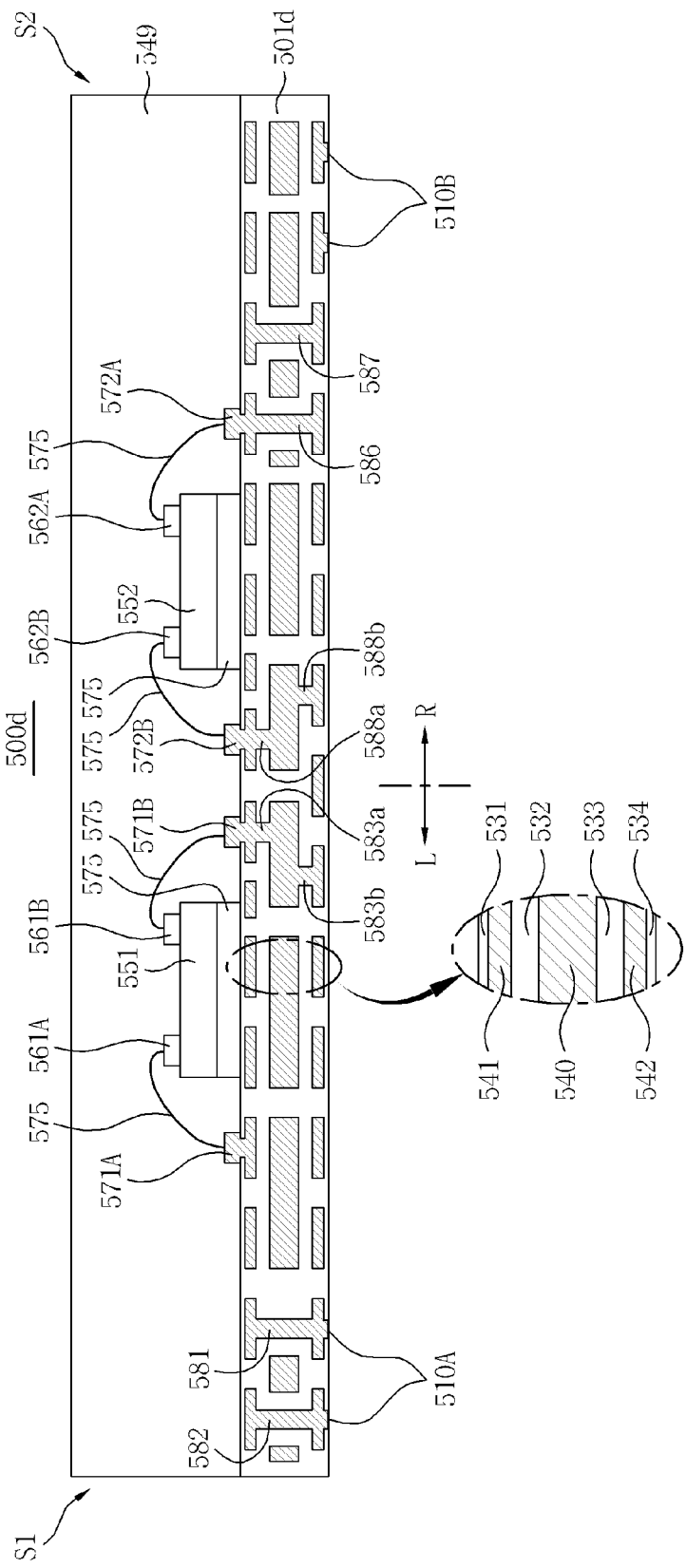

Referring to FIG. 7D, a package substrate 501d of an upper package 500d according to an embodiment of the inventive concept may include a first insulating layer 531, a first metal layer 541, a second insulating layer 532, a metal core layer 540, a third insulating layer 533, a second metal layer 542, and a third insulating layer 534 stacked sequentially. For example, the first metal layer 541 may be stacked on the metal core layer 540, and the second metal layer 542 may be stacked under the metal core layer 540. That is, the first and second metal layers 541 and 542 may be arranged on either side of the metal core layer 540.

In the present embodiment, the primary wire lands 571A having the first characteristic may be electrically connected to the inter-package connector lands 510A having the first characteristic using the first metal layer 541, and the secondary wire lands 572A having the first characteristic may be electrically connected to the inter-package connector lands 510A having the first characteristic through the second metal layer 542.

The metal core layer 540 may be electrically connected to some of the primary and secondary wire lands 571B and 572B having the second characteristic and the inter-package connector lands 510B having the second characteristic.

Referring to FIG. 7E, an upper package 500e according to an embodiment of the inventive concept may include a plurality of upper semiconductor devices 551 to 554 electrically connected to one another through upper TSVs 561va and 561vb. The upper TSVs 561va having the first characteristic may transmit or provide data signals; reference voltages (or supply voltages) for a data circuit; and/or address/control signals. The upper TSVs 561vb having the second characteristic may provide reference voltages (or supply voltages) for an address/control circuit and/or element/package reference voltages. The upper package substrate 501e may include via pads 271va having the first characteristic, which may be electrically connected to the upper TSVs 561va having the first characteristic, and via pads 271vb having the second characteristic, which may be electrically connected to the upper TSVs 561vb having the second characteristic.

The upper TSVs 561va having the first characteristic and the via pads 571va having the first characteristic may be asymmetrically disposed in a left half portion L of each of the semiconductor devices 551 to 554 or the upper package 500e or disposed near a first side S1 thereof. The upper TSVs 561vb having the second characteristic and the via pads 571vb having the second characteristic may be asymmetrically disposed in a right half portion R of each of the semiconductor devices 551 to 554 or the upper package 500e or disposed near a second side S2 thereof. In the drawings, a die-bonding film and a molding compound are omitted. Any suitable encapsulation process or material may be used within sprit and scope of the inventive concept.

The via pads 571va having the first characteristic may be electrically connected to the inter-package connector lands 510A having the first characteristic, and the via pads 571vb having the second characteristic may be electrically connected to the inter-package connector lands 510B having the second characteristic. Accordingly, the inter-package connector lands 510A having the first characteristic may be disposed near the first side S1 of the upper package 500e or asymmetrically disposed in the left half portion L thereof. The inter-package connector lands 510B having the second characteristic may be disposed near the second side S2 of the upper package 500e or asymmetrically disposed in the right half portion R thereof.

Referring to FIG. 7F, an upper package 500f according to an embodiment of the inventive concept may include a plurality of upper semiconductor devices 551 and 552 stacked sequentially. Since the present embodiment may be fully understood with reference to other drawings, a detailed description thereof will be omitted. In FIG. 7F, the semiconductor devices 551 and 552 are illustrated as being spaced apart from each other without an adhesive layer therebetween. However, in practice, the semiconductor device 552 may be stacked on the semiconductor device 551 with an adhesive layer (not shown) arranged therebetween.

Figure 7G:
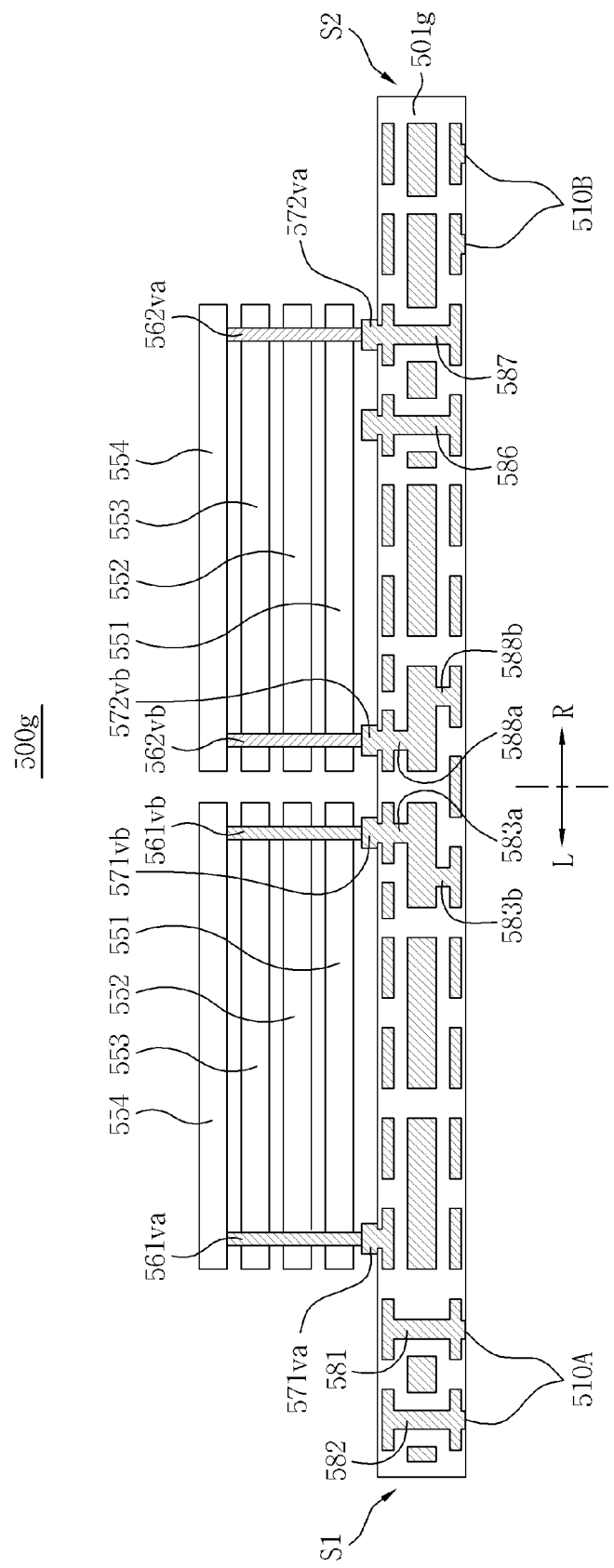

Referring to FIG. 7G, an upper package 500h according to an embodiment of the inventive concept may include a plurality of upper semiconductor devices 551 to 554 electrically connected to one another by upper TSVs 561va, 561vb, 562va, and 562vb. A detailed description of the present embodiment may be understood with reference to FIG. 7F.

Figure 7H:
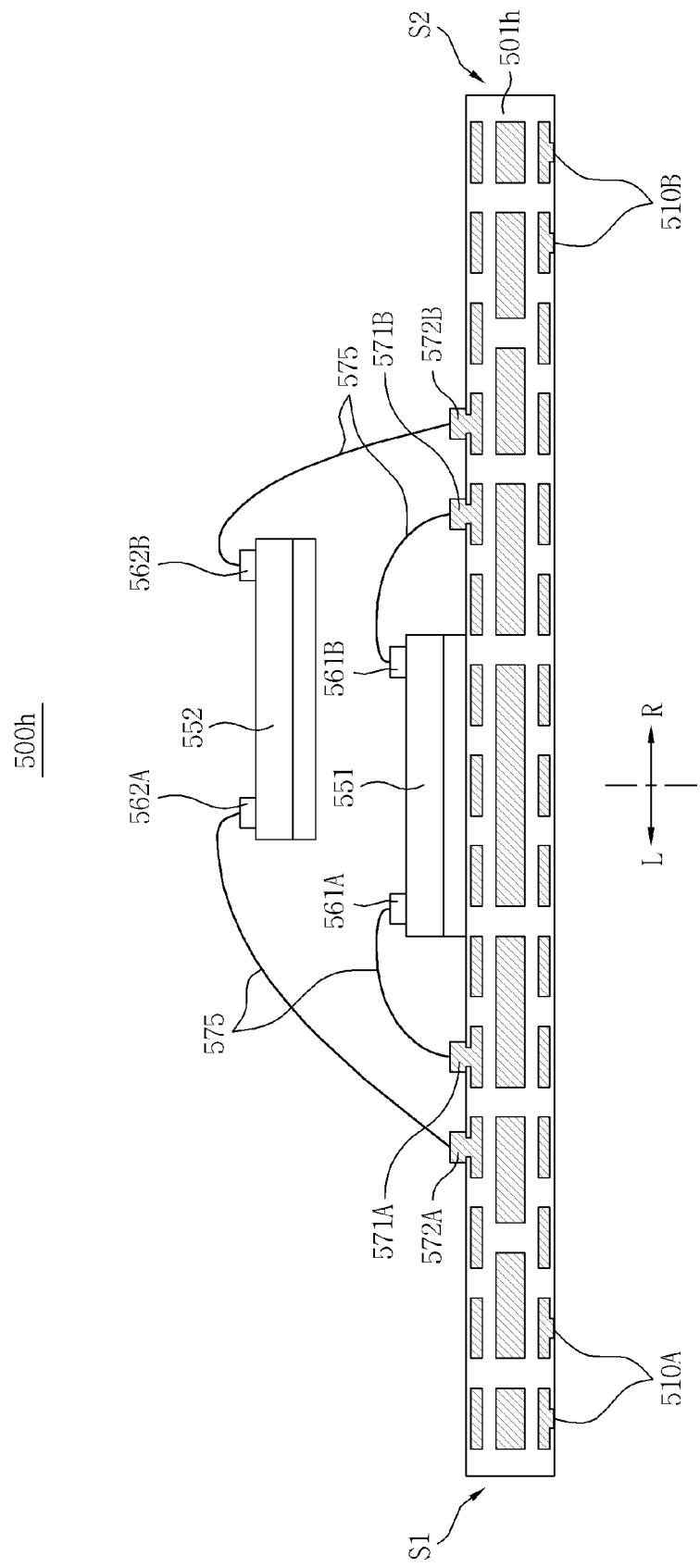

Referring to FIG. 7H, an upper package 500g according to an embodiment of the inventive concept may include a plurality of upper semiconductor devices 551 and 552 stacked in a staircase form. A stack shape of the upper semiconductor devices 551 and 552 according to the present embodiment may be understood in further detail with reference to other drawings of the present specification.

Referring back to FIGS. 7B through 7H, the metal layers 541 to 543 and the metal core layer 540 according to various embodiments of the inventive concept may be employed in various ways as shown in Table 1. The positions of the metal layers 541 to 543 may be interchangeable. Also, the metal layers 541 to 543 and the metal core layer 540 may be employed in various ways other than the examples proposed in Table 1.

TABLE 1

|  | First metal layer | Second metal layer | Third metal layer | Metal core layer |
| --- | --- | --- | --- | --- |
| First example | Transmission of data signal and reference voltages for data signal of first device/Transmission of address/control | Transmission of data signal and reference voltages of second device/Transmission of address/control signals of second | Transmission of other signals | Transmission of element/package reference |
| Second example |  |  | no use | voltage/Ground plane surface |

TABLE 1-continued

|  | First metal layer | Second metal layer | Third metal layer | Metal core layer |
|---|---|---|---|---|
| | signals of first device | device | | |
| Third example | Transmission of data signal and reference voltages for data signal of first and second devices | Transmission of address/control signals of first and second devices | Transmission of other signals no use | Transmission of element/package reference voltage/Ground plane surface |
| Fourth example | | | | |
| Fifth example | Transmission of data signal and reference voltages for data signal of first device/Transmission of address/control signals of second device | Transmission of data signal and reference voltages for data signal of second device/Transmission of address/control signals of first device | Transmission of other signals no use | Transmission of element/package reference voltage/Ground plane surface |
| Sixth example | | | | |

FIGS. 8A through 8I are cross-sectional, longitudinal sectional, and partial exploded views of lower packages according to some embodiments of the inventive concept.

Figure 8A:
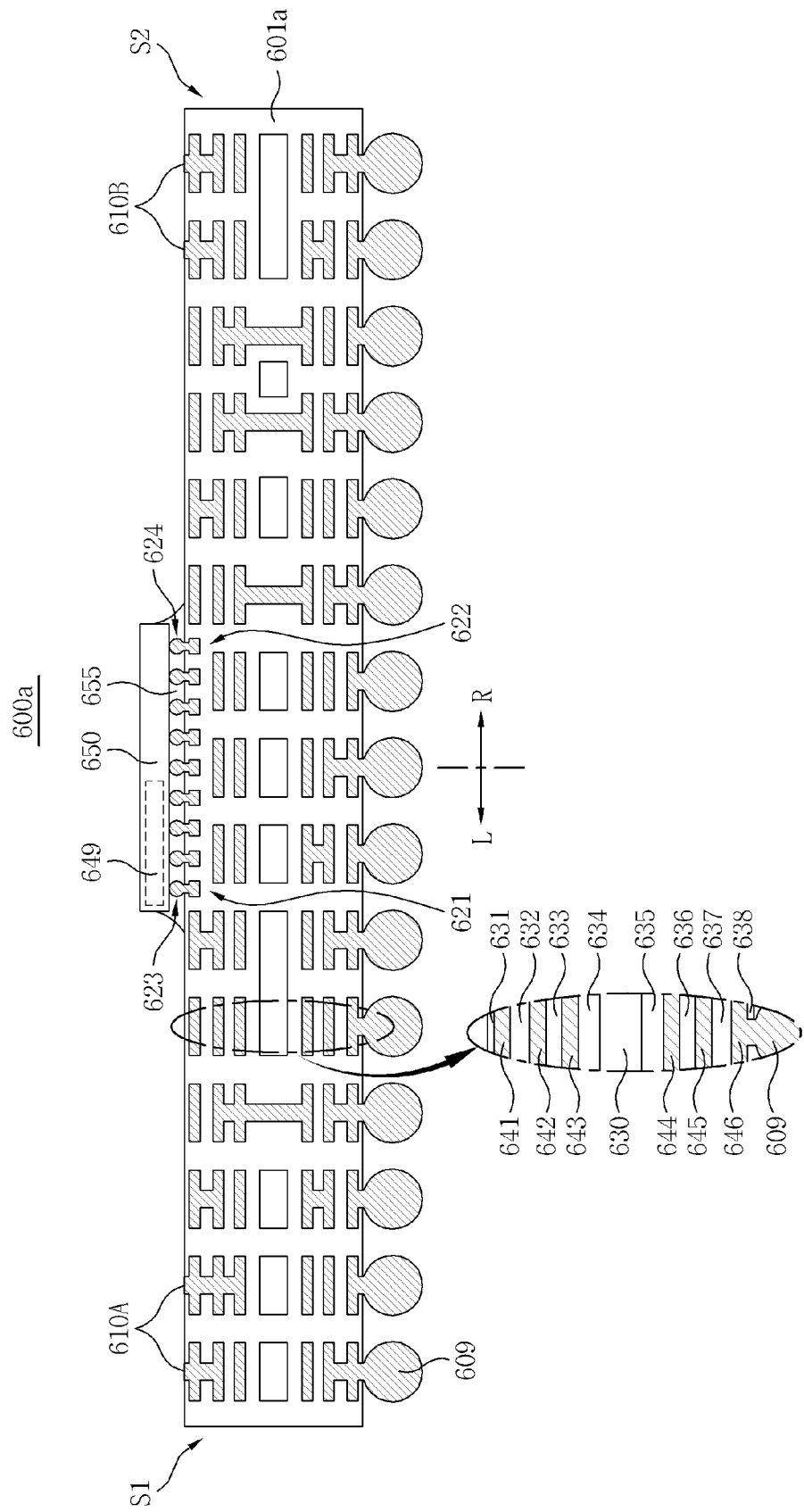
Figure 8B:
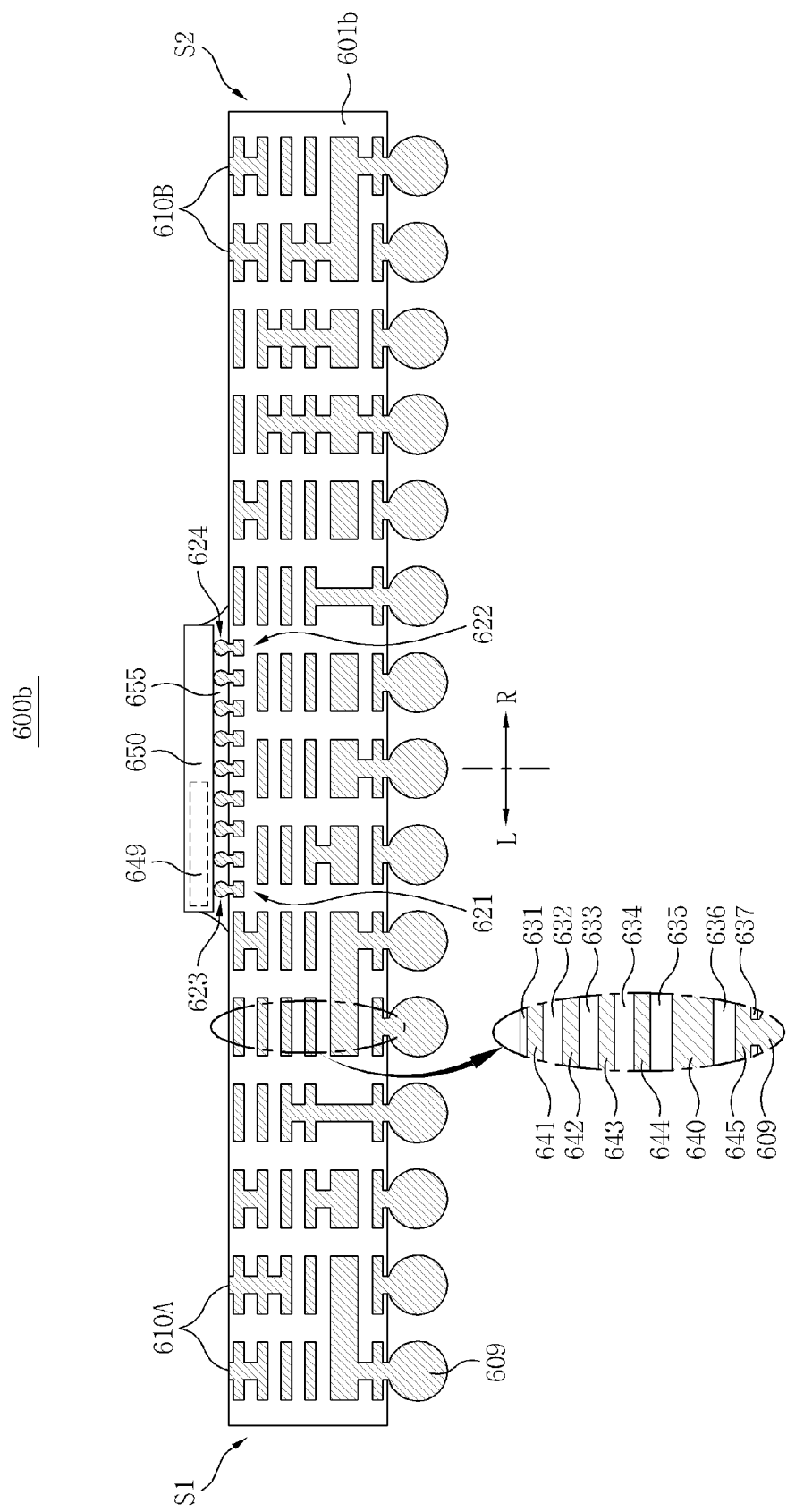
Figure 8C:
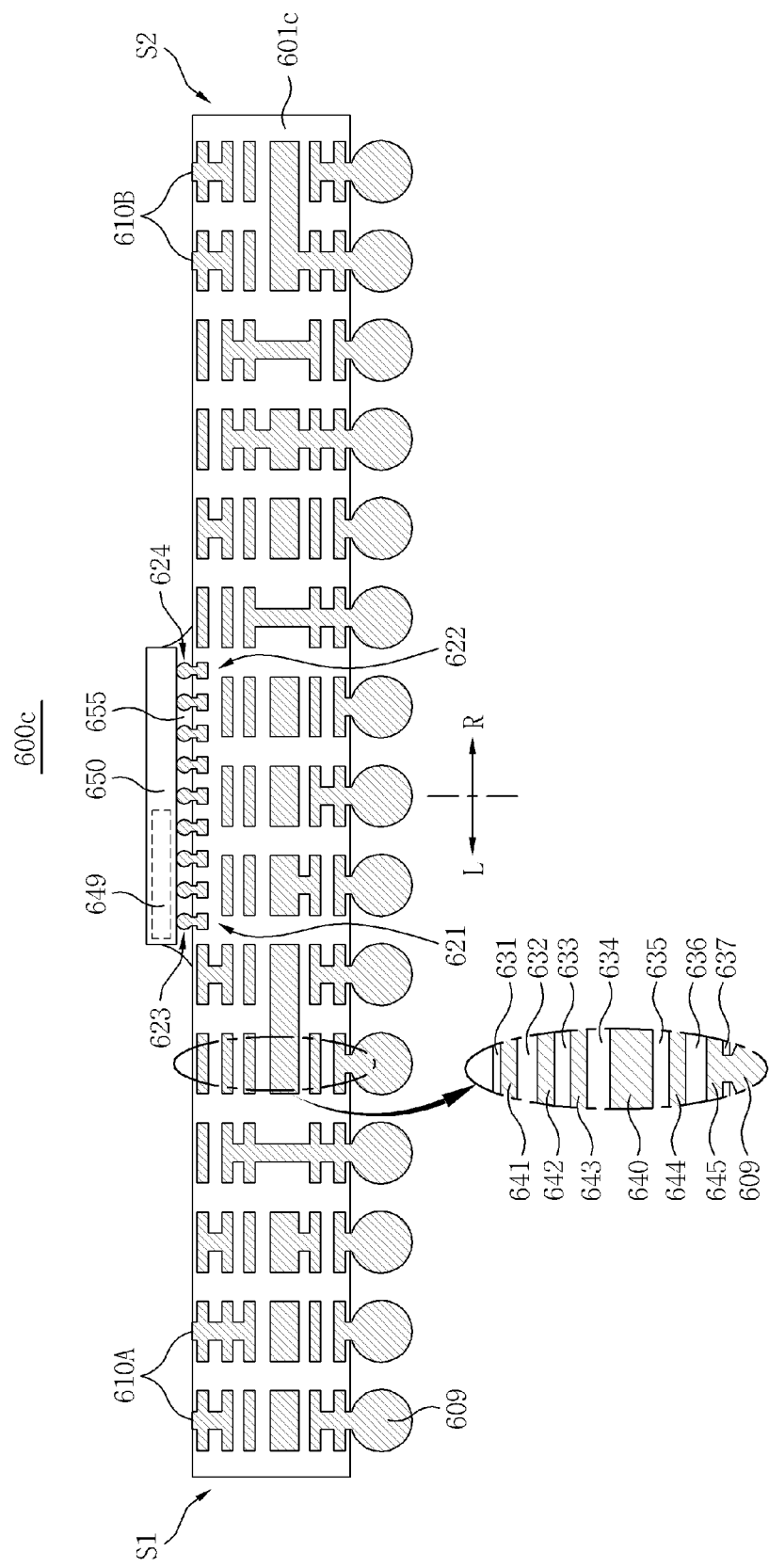
Figure 8D:
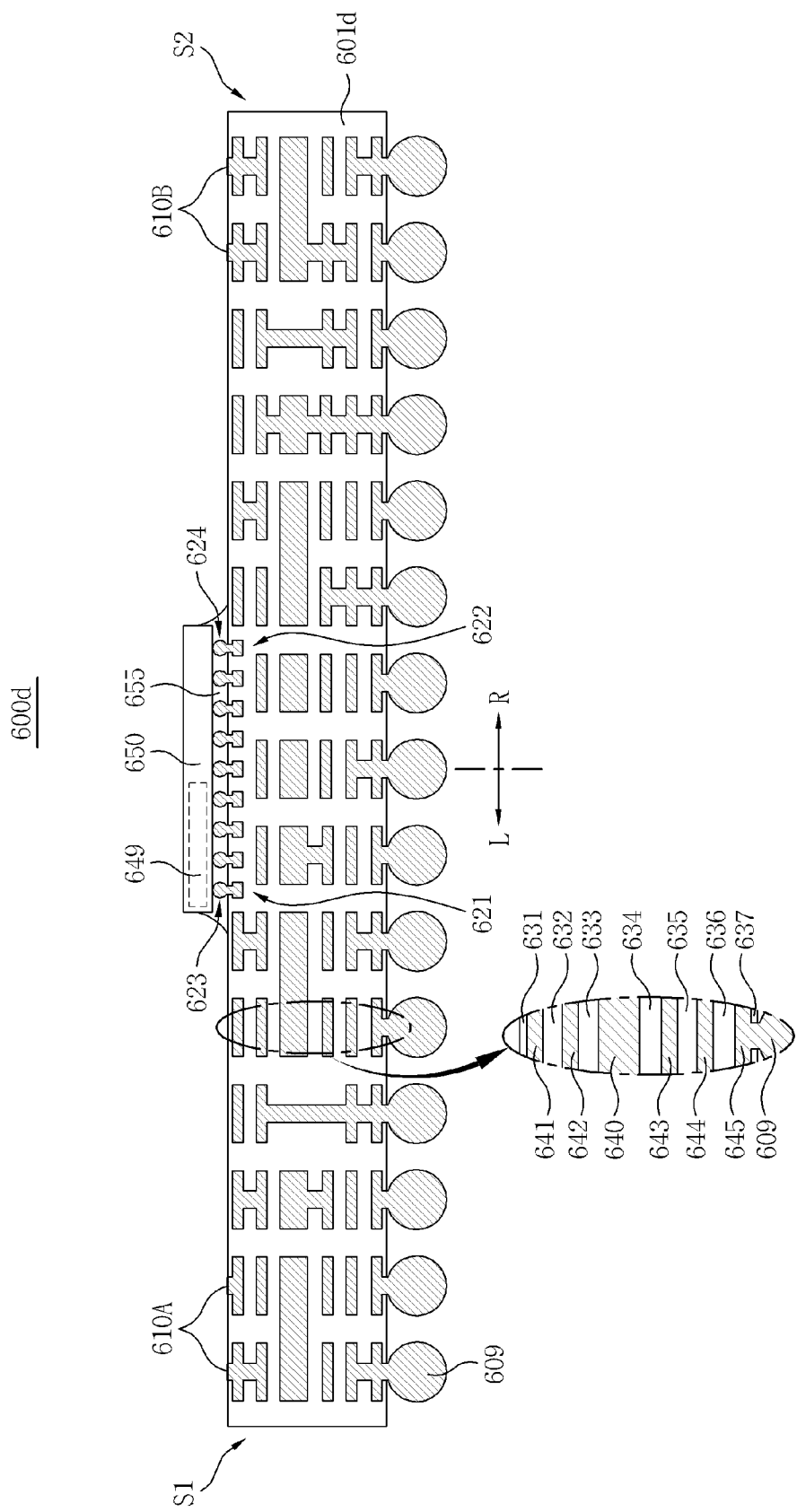
Figure 8E:
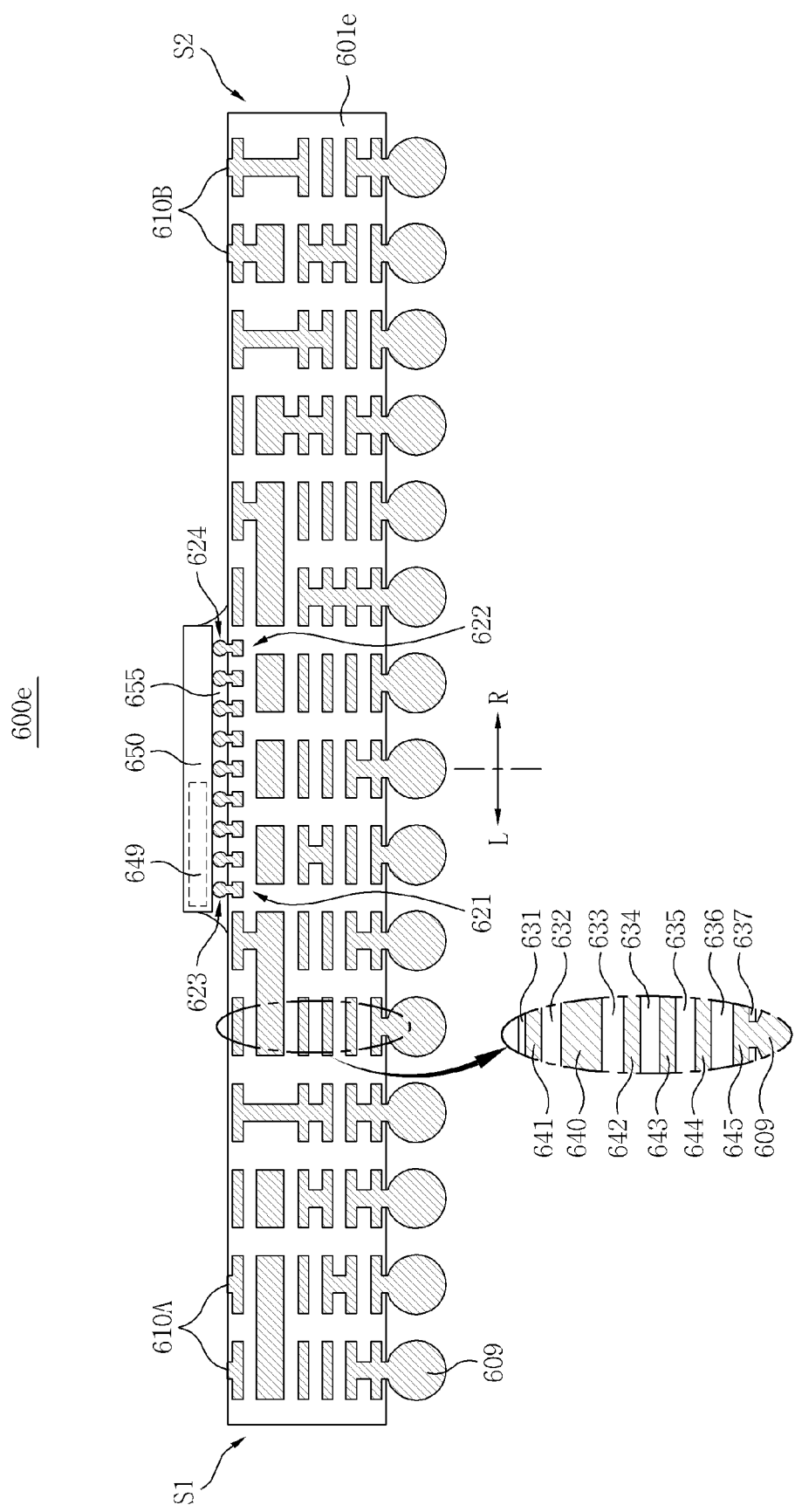

Referring to FIG. 8A, a lower package 600a according to an embodiment of the inventive concept may include a lower package substrate 601a and a lower semiconductor device 650 disposed on the lower package substrate 610a.

The lower package substrate 601a may include lower inter-package connector lands 610A having a first characteristic disposed near a first side or a first edge 51 thereof. That is, the lower package substrate 601a may include lower inter-package connector lands 610A having the first characteristic, which may be asymmetrically disposed in a left half portion L thereof. The lower package substrate 601a may include first flip-chip connectors 623 disposed near a first side S1 of the lower semiconductor device 650 and first flip-chip connector lands 621 corresponding to the first flip-chip connectors 623. That is, the lower package substrate 601a may include the first flip-chip connectors 623 asymmetrically disposed in a left half portion L of the lower semiconductor device 650 and the first flip-chip connector lands 621 corresponding to the first flip-chip connectors 623.

The lower package substrate 601a may include inter-package connector lands 610B having a second characteristic disposed near a second side or a second edge S2 opposite the first side S1 thereof. That is, the lower package substrate 601a may include the inter-package connector lands 610B having the second characteristic, which may be asymmetrically disposed in a right half portion R thereof. The lower package substrate 601a according to the present embodiment may include second flip-chip connector lands 622 corresponding to second flip-chip connectors 624 disposed near a second side S2 opposite the first side S1 thereof. That is, the lower package substrate 610a may include the second flip-chip connector lands 622 corresponding to the second flip-chip connectors 624 asymmetrically disposed in a right half portion R of the lower semiconductor device 650.

The lower package substrate 601a may include a first insulating layer 631, a first metal layer 641, a second insulating layer 632, a second metal layer 642, a third insulating layer 633, a third metal layer 643, a fourth insulating layer 634, an insulating core layer 630, a fifth insulating layer 635, a fourth metal layer 644, a sixth insulating layer 636, a fifth metal layer 645, a seventh insulating layer 637, a sixth metal layer 646, and an eighth insulating layer 638 stacked sequentially.

The first metal layer 641 may include lower inter-package connector lands 610A and 610B and flip-chip connector lands 621 and 622. The first metal layer 641 may be used to provide various reference voltages or supply voltages. In some embodiments, the first metal layer 641 may be used as an element/package reference voltage plane surface, particularly, a ground voltage plane surface. The second metal layer 642 may be used as routes to transmit or provide data signals, reference voltages (or supply voltages) for a data circuit, or address/control signals. The third and fourth metal layers 643 and 644 may be used as routes to transmit or provide data signals, reference voltages for the data circuit, or address/control signals as well. In particular, the third and fourth metal layers 643 and 644 may be used as routes to transmit the address/control signals. The fifth metal layer 645 may be used to transmit other signals than at least one of the data signal, the reference voltages for the data circuit, and the address/control signals. For example, the lower semiconductor device 650 may be mainly used to communicate data signals or other signals with an external apparatus. The sixth metal layer 646 may be electrically connected to board connectors 609. Accordingly, the sixth metal layer 646 may be designed according to the number and arrangement of the board connectors 609. The sixth metal layer 646 may be also used as a plan surface for element/package reference voltages.

The lower semiconductor device 650 may include a logic device. The lower semiconductor device 650 may include a memory control circuit 649 disposed near a left half portion L thereof or a first side S1 of the lower package substrate 601a. The lower semiconductor device 650 may be electrically connected to the metal layers 641 to 646 through the first and second flip-chip connectors 623 and 634. The first flip-chip connectors 623 may be disposed in a position corresponding to the location of the memory control circuit 649 of the lower semiconductor device 650. That is, the first flip-chip connectors 623 and the first flip-chip connector lands 621 may be disposed in the position corresponding to the location of the memory control circuit 649 of the lower semiconductor device 650.

The second flip-chip connectors 624 may be disposed near a right half portion R of the lower semiconductor device 650 or a second side S2 opposite the first side S1 of the lower package substrate 601a. The second side S2 may be a right side. Accordingly, the second flip-chip connectors 624 may be disposed in the right half portion R of the lower semiconductor device 650. The lower semiconductor device 650 may be electrically connected to the first flip-chip connectors 623 and the first flip-chip connector lands 621 and communicate signals or data with an upper semiconductor device (not illustrated) to be located over the lower semiconductor device 650. As described above, the data signal and address/control signals may be communicated between the upper semiconductor device and the lower semiconductor device 650 through the first flip-chip connectors 623 and the first flip-chip connector lands 621. However, various reference voltages, for example, reference voltages for a data circuit, reference voltages for an address/control circuit, and/or element/package reference voltages may not be directly connected to the first flip-chip connectors 623 and the first flip-chip connector lands 621. That is, the various reference voltages may not be provided through the lower semiconductor device 650. A lower molding compound 655 may be filled between the lower semiconductor device 650 and the lower package substrate 610a to surround lateral surfaces of the flip-chip connectors 623 and 624. For brevity, the lower molding compound is omitted in the drawings.

Referring to FIGS. 8B through 8E, each of lower packages 600b to 600e according to some embodiments of the inventive concept may include a lower semiconductor device 650 disposed on the corresponding one of lower package substrates 601b to 601e. Each of the lower package substrates 601b to 601e may include a plurality of insulating layers 631 to 637, a plurality of metal layers 641 to 645, and a metal core layer 640. The insulating layers 631 to 637 may be formed on top and bottom surfaces of the metal layers 641 to 645 and between the metal layers 641 to 645. The lower packages 600b to 600e may be selected and combined in various ways according to the characteristics of a semiconductor device or electronic system. That is, the position of the metal core layer 640 may be variously varied to minimize signal loss, noise, or time delay caused by interference between signals transmitted through the adjacent metal layers 641 to 645.

Referring back to FIGS. 8A through 8E, the lower package substrates 601a to 601e having at least five metal layers 641 to 646 may be used more efficiently when an upper package includes at least three memory devices. Accordingly, a lower package substrate having at least six metal layers 641 to 646 may be used more effectively when an upper package includes more than two memory devices.

The lower packages 600a to 600e described with reference to FIGS. 8A through 8E may be selected and designed according to the purposes of the lower package substrates 601a to 601e. Specifically, the order of stacking of the metal layers 641 to 645 and the metal core layer 640 may be appropriately modified in various ways according to the purposes of the metal layers 641 to 645. For example, the lower packages 600a to 600e may be designed such that signals susceptible to noise can be transmitted to a metal layer disposed near the metal core layer 640.

Figure 8H:
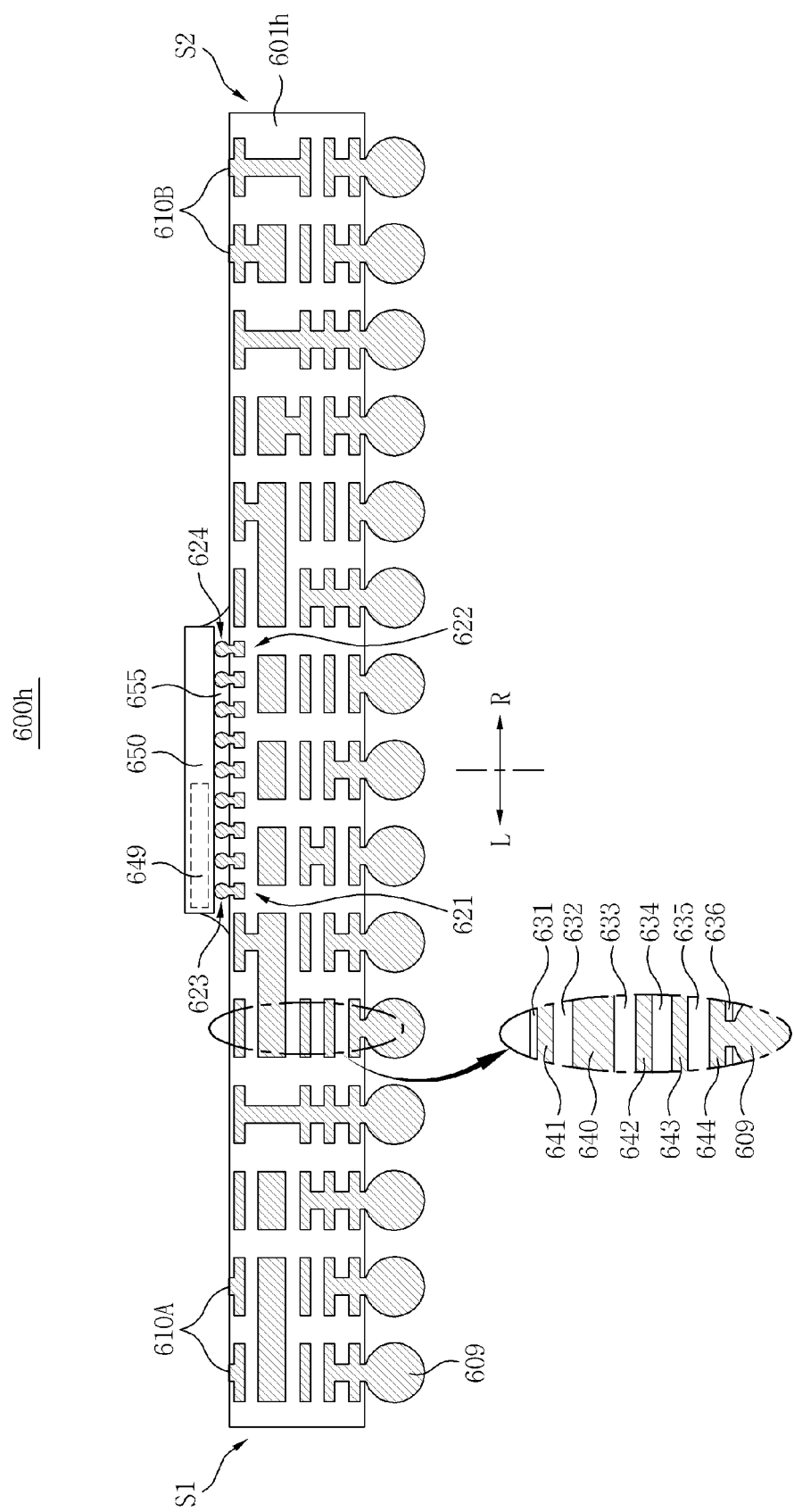

Referring to FIGS. 8F to 8H, each of lower packages 600f to 600h according to various embodiments of the inventive concept may include a lower semiconductor device 650 disposed on the corresponding one of lower package substrates 601f to 601h. Each of the lower package substrates 601f to 601h may include a plurality of insulating layers 631 to 636, a plurality of metal layers 641 to 644, and a metal core layer 640. The lower packages 600f to 600h may be used very effectively when an upper package includes at least two semiconductor devices and requires at least two data signal transmission routes and two address signal transmission routes. Also, the position of the metal core layer 640 may be adjusted in various ways. For example, the first through fourth metal layers 641 to 644 and the metal core layer 640 may be combined in different ways as shown, for example, in Table 2.

TABLE 2

|  | | First metal layer | Second metal layer | Third metal layer | Fourth metal layer | Metal core layer |
|---|---|---|---|---|---|---|
| First example | Inter-package connector lands/ Transmission of primary address/control signals | Transmission of primary and secondary data signal and reference voltages for data signal/Transmission of secondary address/control signals | Transmission of other signals | Board connector lands | Reference-voltage plane surface (including ground plane surface) for element/package reference voltages |
| Second example | Inter-package connector lands/Transmission of secondary address/control signals | Transmission of primary and secondary data signal and reference voltages for data signal/Transmission of primary address/control signals | Transmission of other signals | Board connector lands | Reference-voltage plane surface (including ground plane surface) for element/package reference voltages |
| Third example | Inter-package connector/Transmission of secondary data signal and reference voltages for data signal | Transmission of primary data signal/Transmission of primary and secondary address and control signals | Transmission of other signals | Board connector lands | Reference-voltage plane surface (including ground plane surface) for element/package reference voltages |
| Fourth example | Inter-package connector/Transmission of primary data signal and | Transmission of secondary data signal and reference voltage for data | Transmission of other signals | Board connector lands | Element/package reference-voltage plane surface (including |

TABLE 2-continued

| First metal layer | Second metal layer | Third metal layer | Fourth metal layer | Metal core layer |
|---|---|---|---|---|
| address for data signal | signal/Transmission of primary and secondary address and control signals | | | ground plane surface) |

The embodiments proposed in Table 2 are merely exemplary embodiments, and other embodiments are within the contemplation of the inventive principles herein. The order of stacking of the metal layers 641 to 644 and the metal core layer 640 and the purposes thereof may be modified according to the use of a product or a circuit designer's intention.

Figure 8I:
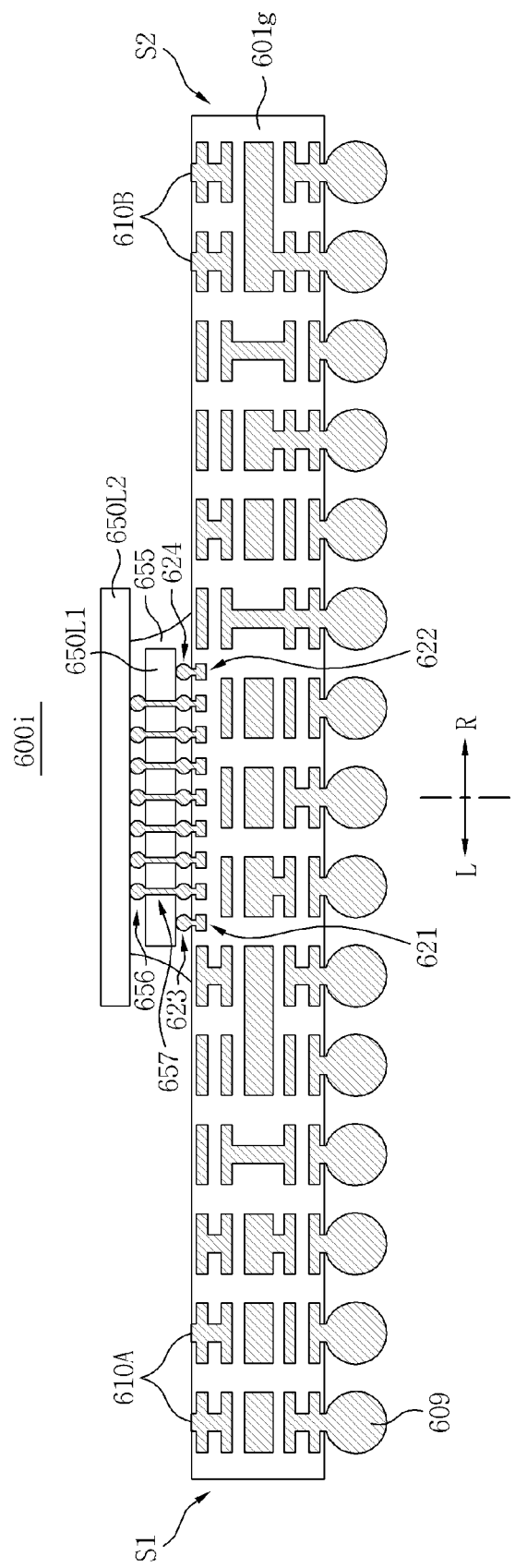

Referring to FIG. 8I, a lower package 600i according to an embodiment of the inventive concept may include a first lower semiconductor device 650L1 and a second lower semiconductor device 650L2. The first lower semiconductor device 650L1 may include a logic device, and the second lower semiconductor device 650L2 may include a wide I/O memory device. The first lower semiconductor device 650L1 may include lower TSVs 657. Inter-chip connectors 656 may be disposed on the lower TSVs 657. The inter-chip connectors 656 may be electrically connected to flip-chip connectors 623 and 624 through the lower TSVs 657, respectively. Accordingly, the first and second lower semiconductor devices 650L1 and 650L2 may be electrically connected to each other. The various arrangements of the inter-chip connectors 656 and the lower TSVs 657 may be understood in further detail with reference to other appended drawings. For example, the inter-chip connectors 656 and the lower TSVs 657 may be asymmetrically disposed near a side of one of the lower semiconductor devices 650L1 and 650L2 as will be understood with reference to the appended drawings.

FIGS. 9A through 9H are cross-sectional views of package stack structures according to various embodiments of the inventive concept.

Referring to FIGS. 9A through 9H, each of package stack structures 700a to 700i according to some embodiments of the inventive concept may include upper packages 500a and 500d, lower packages 600a and 600g, and inter-package connectors 590A and 590B. The upper packages 500a and 500d may be understood in further detail with reference to, for example, FIGS. 7A through 7H, particularly, FIG. 7A or 7D, while the lower packages 600a and 600g may be understood in further detail with reference to, for example, FIGS. 8A through 8I, particularly, FIGS. 8A and 8G.

Figure 9A:
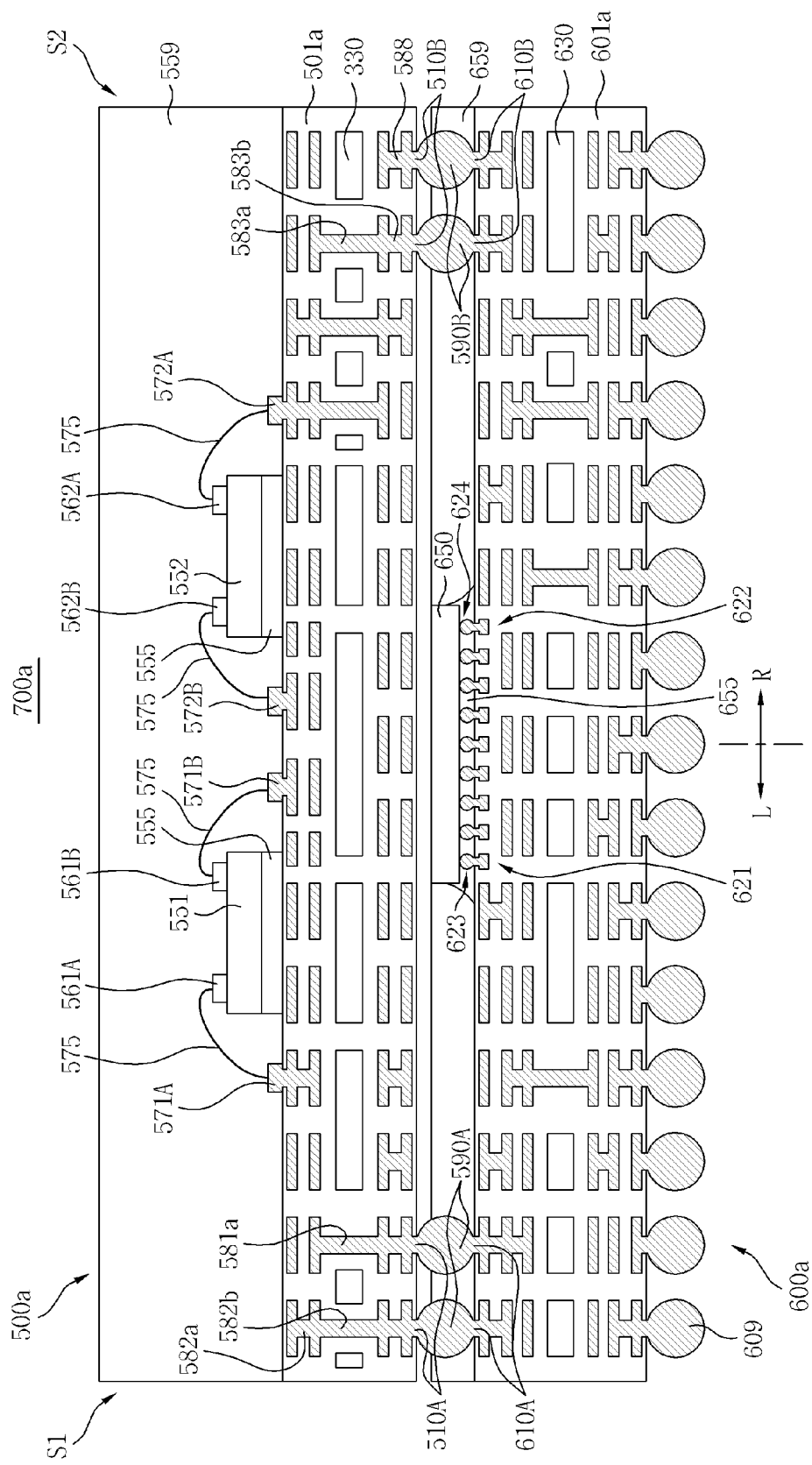

Referring to FIG. 9A, upper and lower package substrates 501a and 601a may include insulating core layers 330 and 630, respectively. An upper package 500a may be understood in further detail with reference to FIG. 7A and a description thereof, while a lower package 600a may be understood in further detail with reference to FIG. 8A and a description thereof.

Figure 9B:
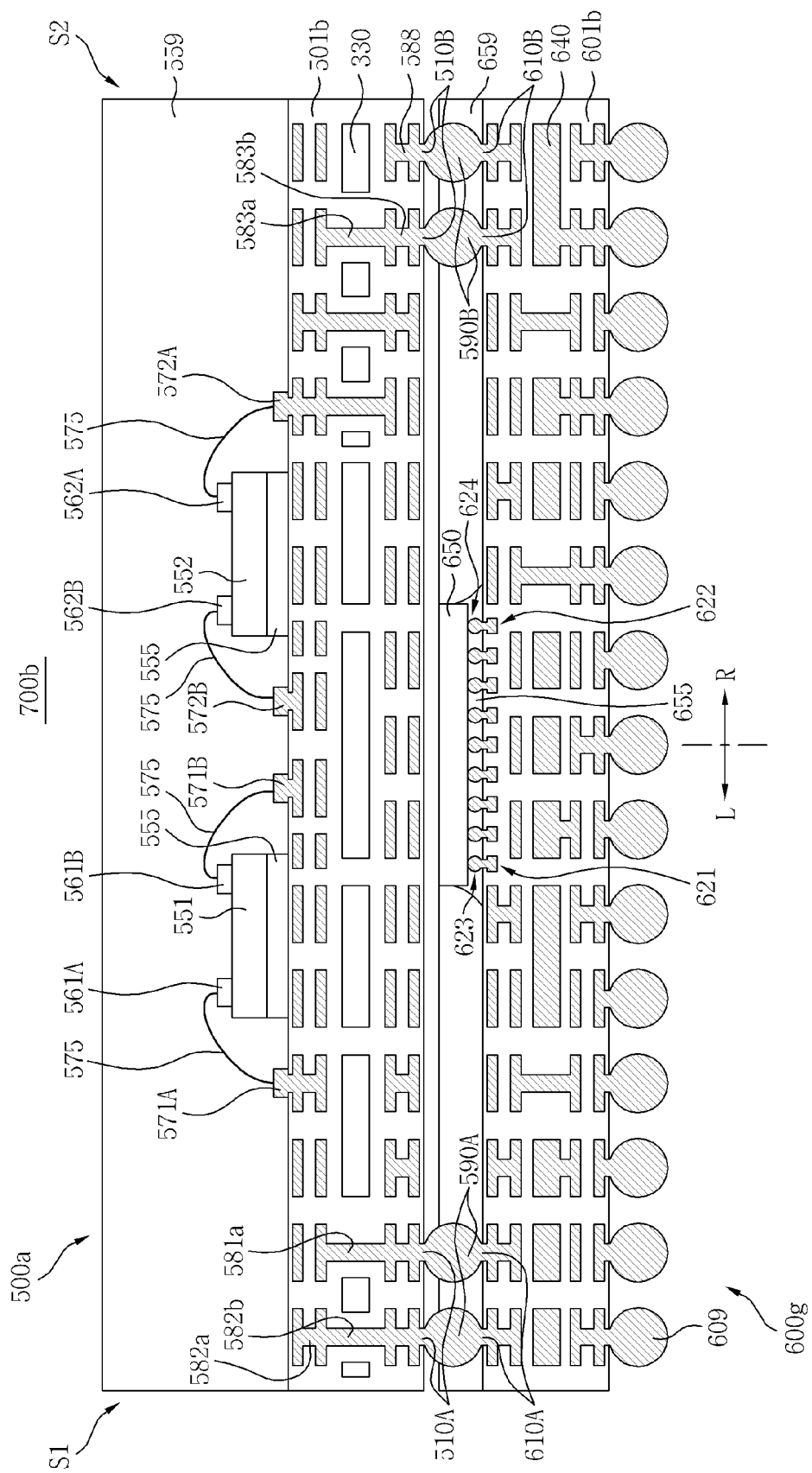

Referring to FIG. 9B, the upper package substrate 501a may include an insulating core layer 330, and the lower package substrate 610g may include a metal core layer 640. The upper package 500a may be understood in further detail with reference to FIG. 7A and a description thereof, and the lower package 600g may be understood in further detail with reference to FIG. 8G and a description thereof.

Referring to FIG. 9C, an upper package substrate 501d may a metal core layer 340, and a lower package 601a may include an insulating core layer 630. An upper package 500d may be understood in further detail with reference to FIG. 7D and a description thereof, and a lower package 600a may be understood in further detail with reference to FIG. 8A and a description thereof.

Figure 9D:
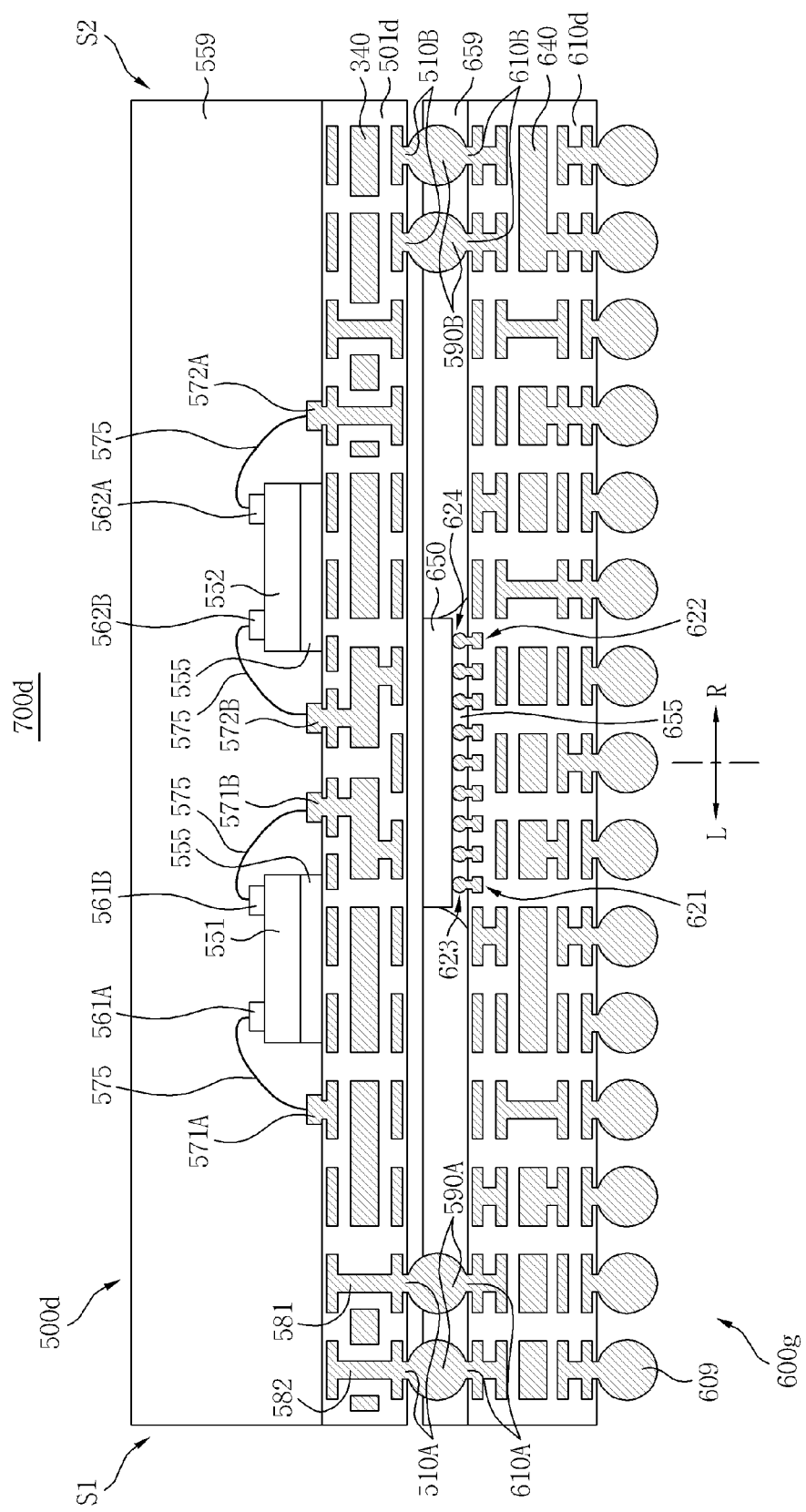
Figure 9F:
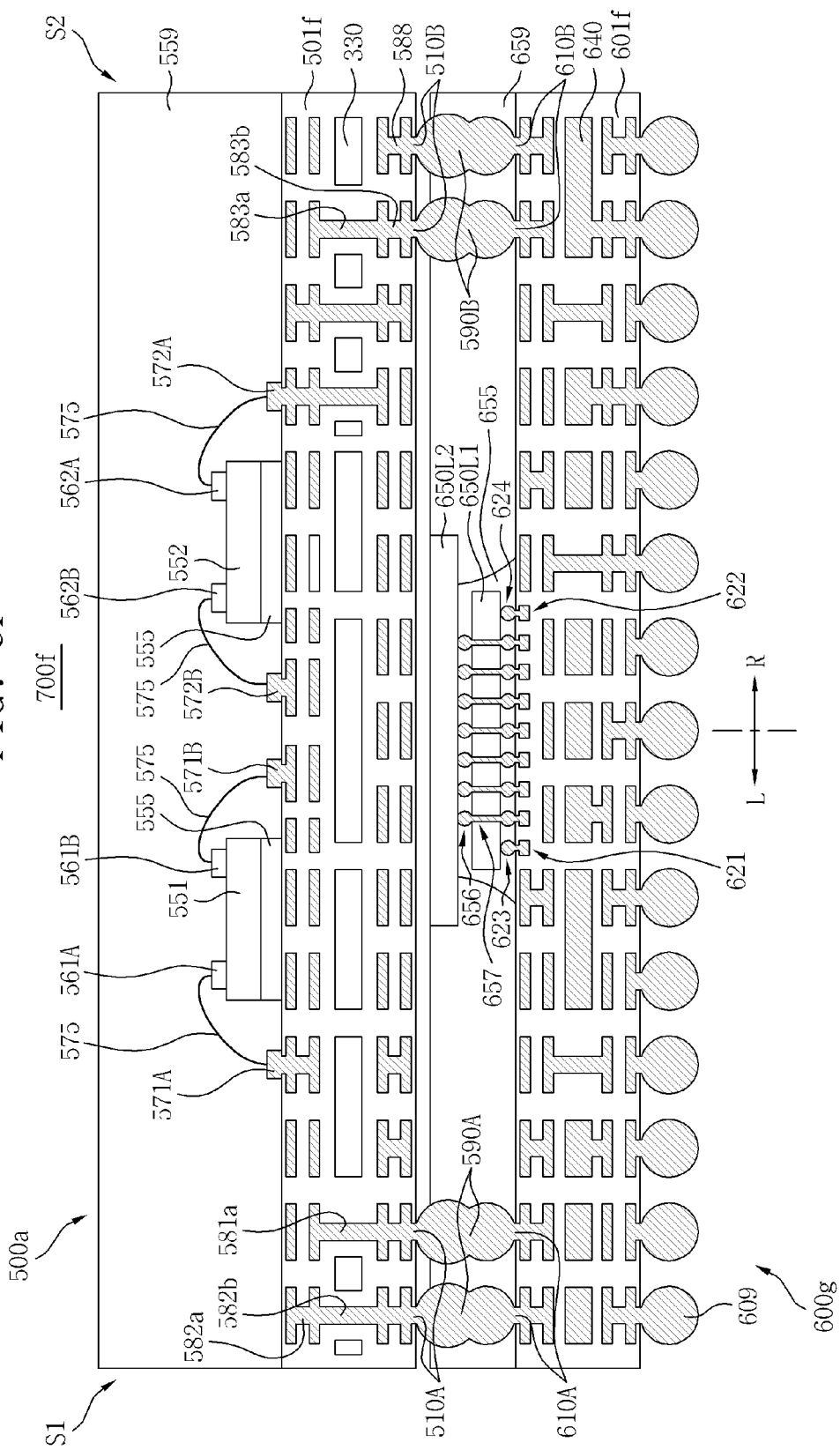
Figure 9G:
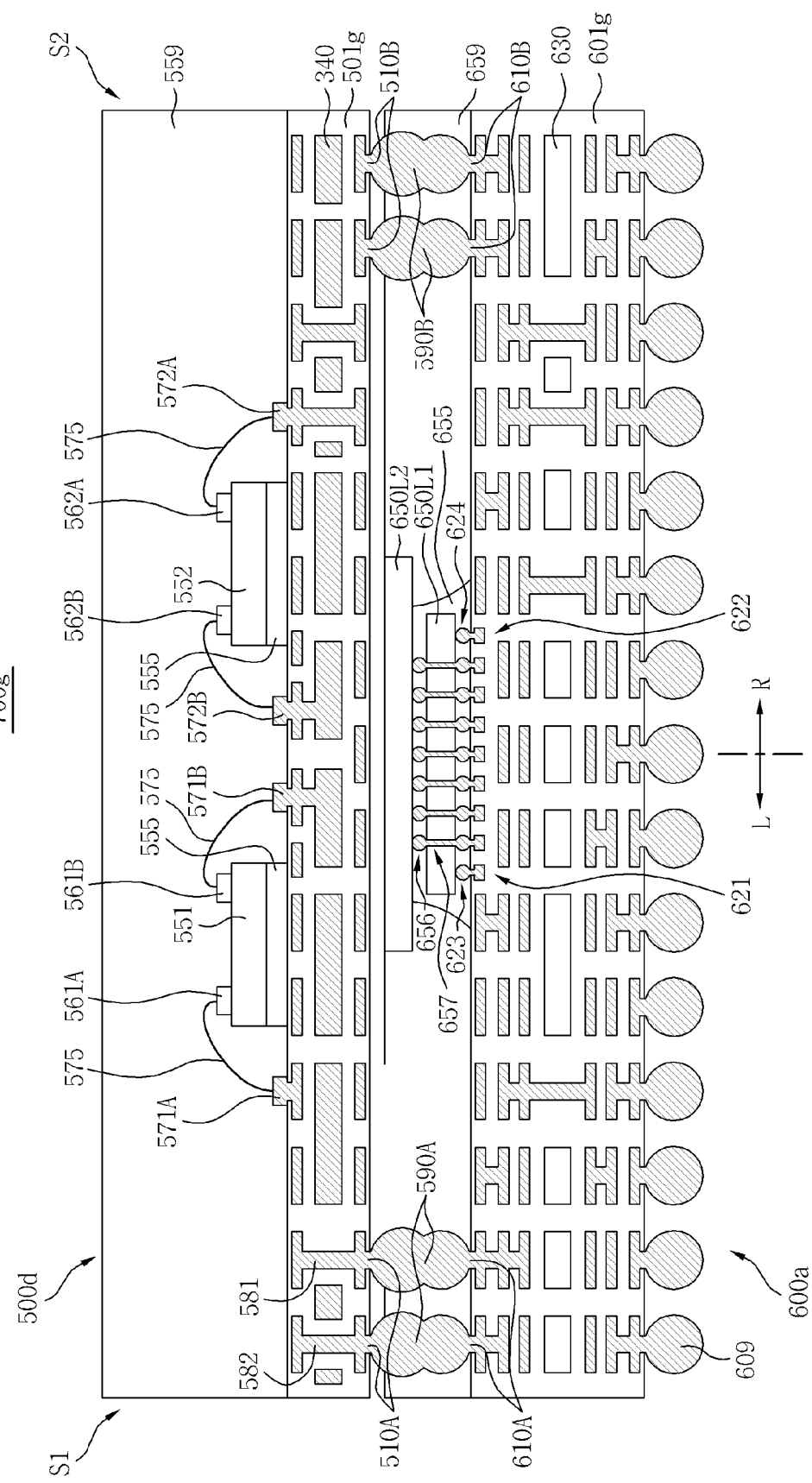
Figure 9H:
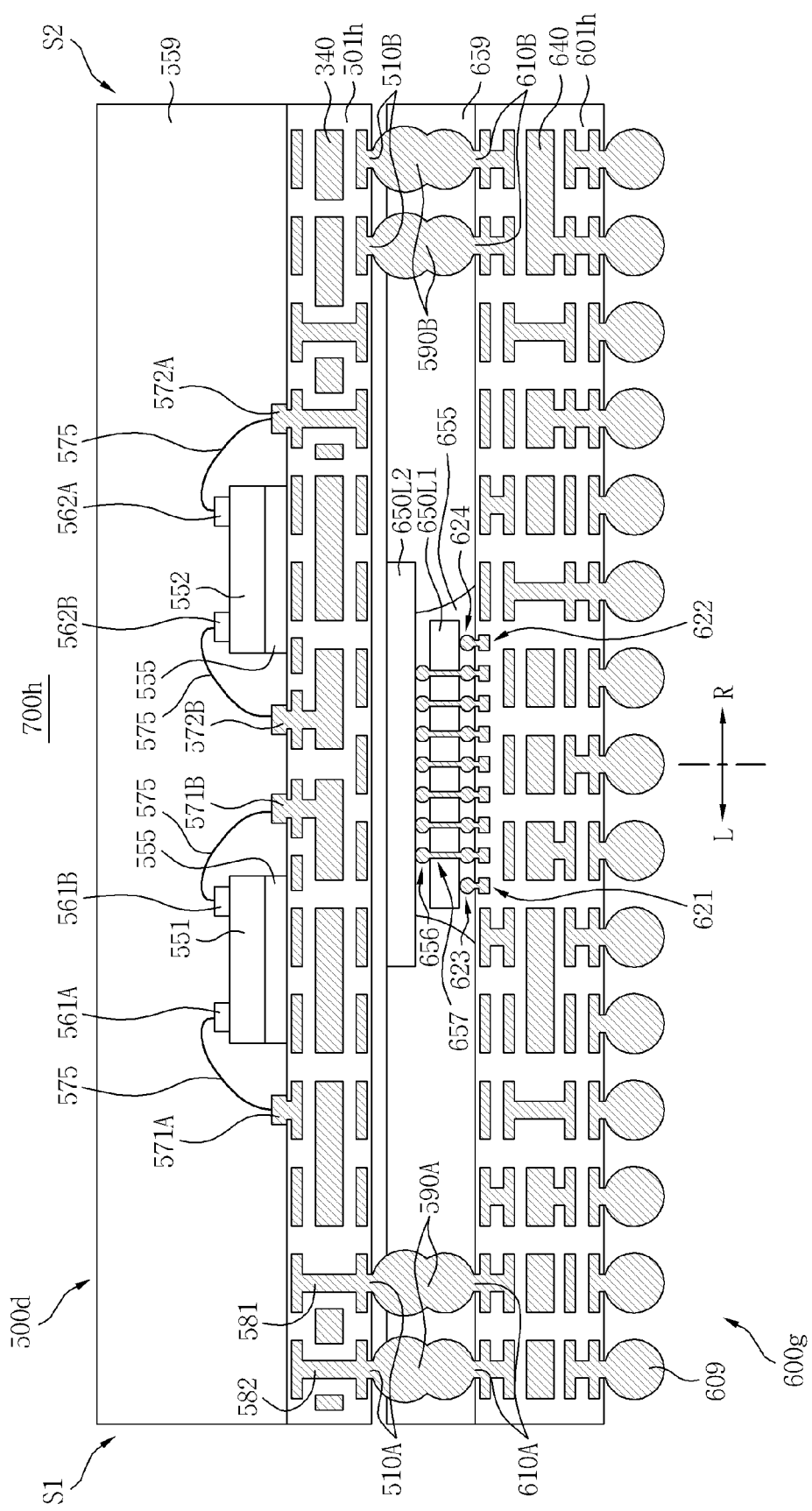

Referring to FIG. 9D, an upper package substrate 501d and a lower package substrate 601g may include metal core layers 340 and 640, respectively. An upper package 500d may be understood in further detail with reference to FIG. 7D and a description thereof, and a lower package 600g may be understood in further detail with reference to FIG. 8G and a description thereof.

Referring back to FIGS. 9A through 9D, each of the upper packages 500a and 500d may include at least two upper semiconductor devices 551 and 552. In a plan view, the upper semiconductor devices 551 and 552 may be rotated by an angle of 90° from each other and disposed in a horizontal or vertical direction as described in further detail with reference to FIGS. 6A through 6K. In each of the upper semiconductor devices 551 and 552, each of the package stack structures 700a to 700d may include inter-package connectors 590A having a first characteristic disposed near a first side S1 thereof (or near a region near the first side or first edge S1) and inter-package connectors 590B having a second characteristic disposed near a second side S2 opposite the first side S1 thereof (or near a region near the second side or second edge S2). Alternatively, each of the package stack structures 700a to 700d may include inter-package connectors 590A having a first characteristic asymmetrically disposed in a left half portion L thereof and inter-package connectors 590B having a second characteristic asymmetrically disposed in a right half portion R thereof.

As described above, the inter-package connectors 590A having the first characteristic may serve a first function and/or a second function, and the inter-package connectors 590B having the second characteristic may serve a third function. The first function may include transmitting or provide data signals and/or reference voltages (or supply voltages) for a data circuit of the upper semiconductor devices 551 and 552. The second function may include transmitting address/control signals of the upper semiconductor devices 551 and 552. The third function may include providing reference voltages (or supply voltages) for an address/control circuit of the upper semiconductor devices 551 and 552.

A description of other components may be understood with reference to various other appended drawings.

Referring back to FIGS. 9E to 9H, each of package stack structures 700e to 700h according to various embodiments of the inventive concept may include upper packages 500a and 500d, lower packages 610a and 610g, and inter-package connectors 591 to 593 and 596 to 598, and each of the lower packages 610a and 610g may include a first lower semiconductor device 650L1 and a second lower semiconductor device 650L2. A detailed description of the package stack structures 700e to 700h may be understood with reference to FIG. 8I.

FIG. 10 is a conceptual plan view of arrangement of bonding pads of a semiconductor device according to some embodiments of the inventive concept.

Referring to FIG. 10, a semiconductor device 21 may include first bonding pads 31 and fourth bonding pads 34 disposed in a left region Ls of a left half portion L and third bonding pads 33 and second bonding pads 32 disposed in a right region Rs of a right half portion R. The fourth bonding pads 34 may be arranged in a left region Ls of a left half portion L. The first bonding pads 31 may transmit data signals, the fourth bonding pads 34 may provide reference voltages (or supply voltages) for a data circuit, the third bonding pads 33 may transmit address/control signals, and the second bonding pads 32 may provide reference voltages (or supply voltages) for the address/control circuit and/or element/package reference voltages. More specifically, the first and fourth bonding pads 31 and 34 corresponding to the data signal may be disposed in the left region Ls, and the third bonding pads 33 corresponding to the address/control signals and the second bonding pads 32 corresponding to the element/package reference voltages may be disposed in the right region Rs. Accordingly, embodiments of the present disclosure may be employed even when semiconductor devices have symmetrical signal bonding pad arrangement discussed above. In other words, even if the bonding pads 31 for the data signal and the bonding pads 33 for the address/control signal are not asymmetrically disposed in the memory device (as shown in FIG. 10), the conductive elements or inter-package connectors for data signals and the conductive elements or inter-package connectors for the address/control signal may be asymmetrically disposed in a memory package substrate of a POP structure. As a result, the number of package substrate PCB layers can be reduced and efficient signal routing can be achieved.

Figure 11A:
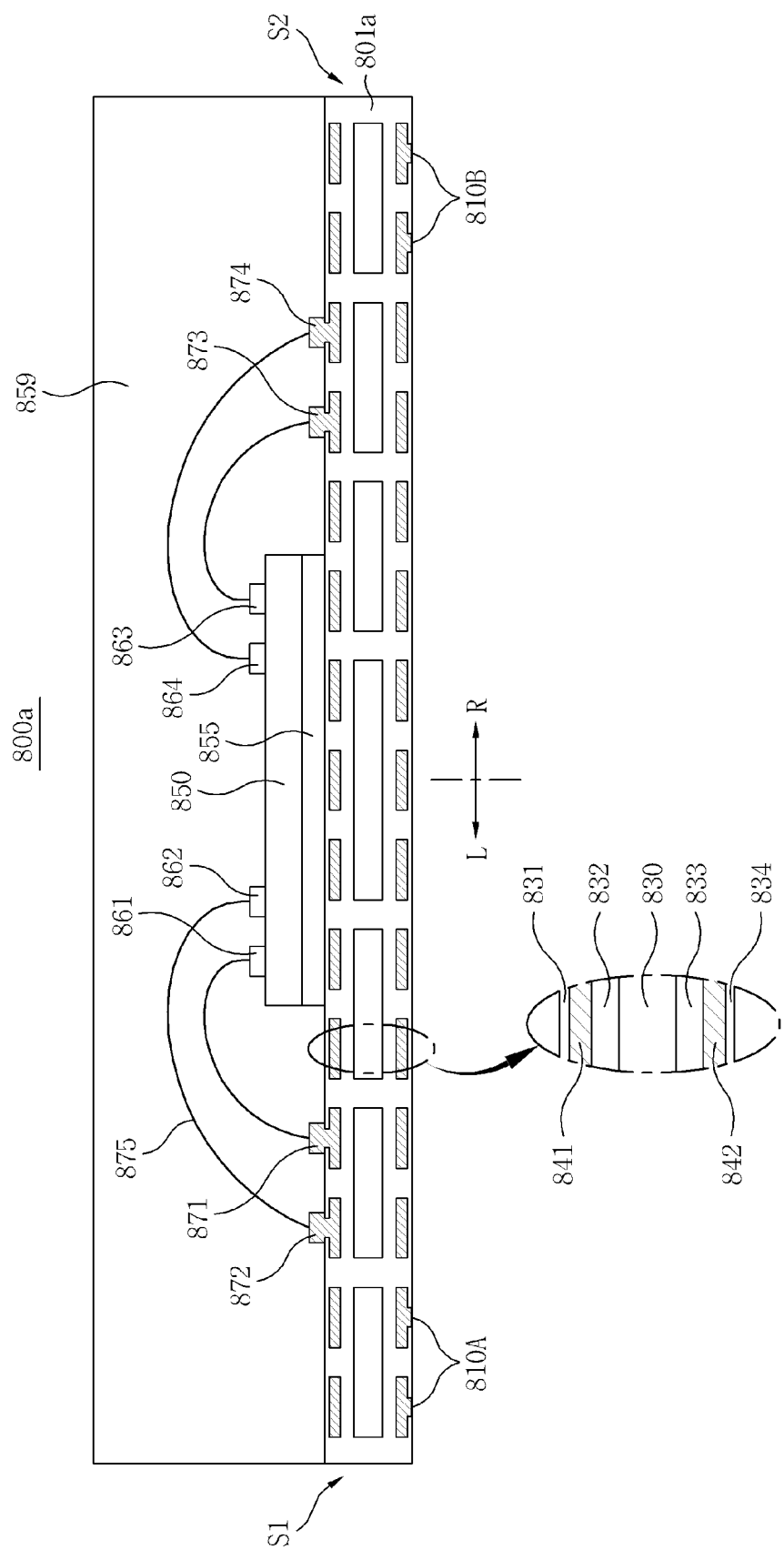
FIGS. 11A and 11B are lateral sectional, longitudinal-sectional, and partial exploded views of semiconductor packages according to some embodiments of the inventive concept.
Figure 11B:
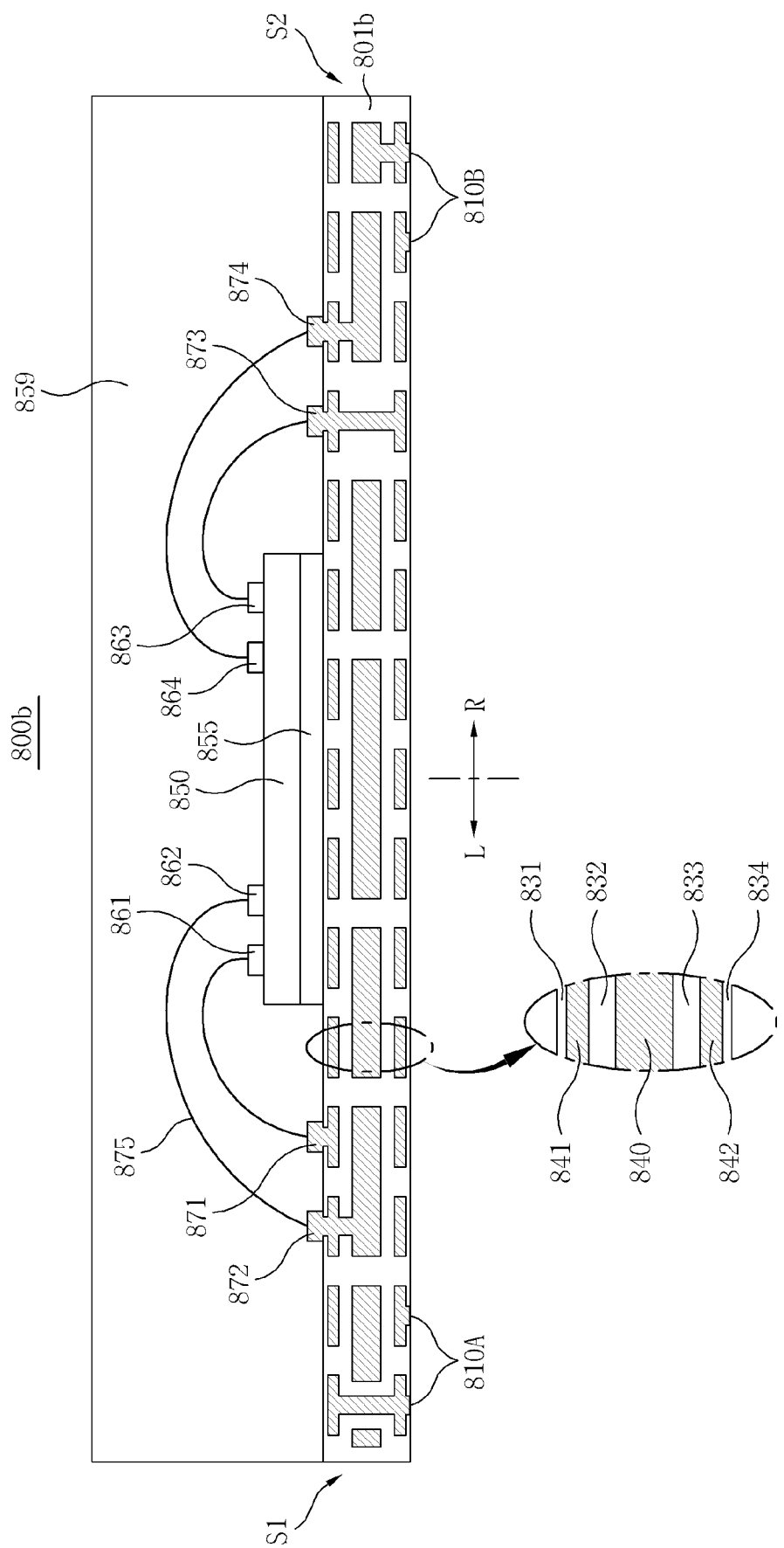
Figure 12A:
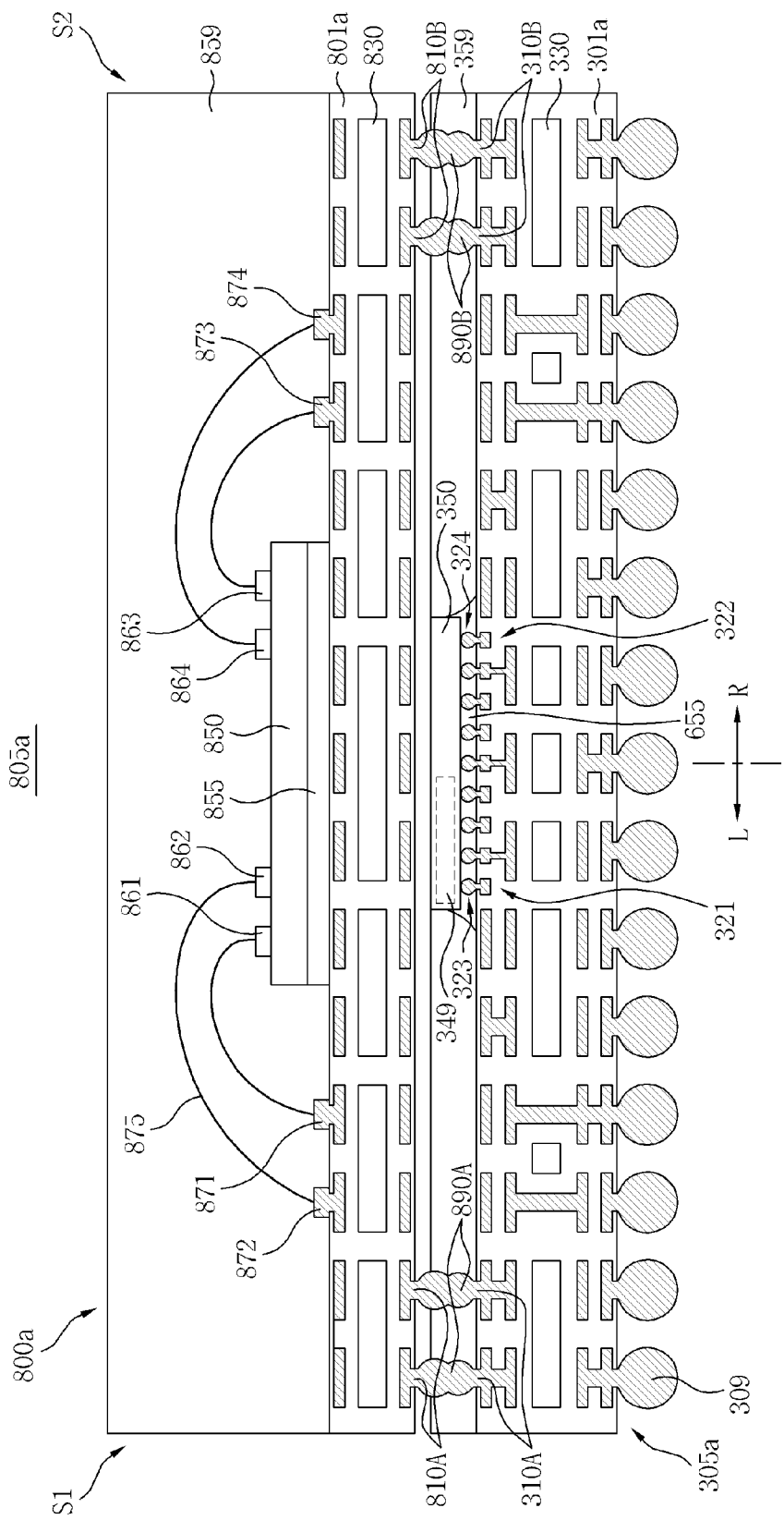
Figure 12B:
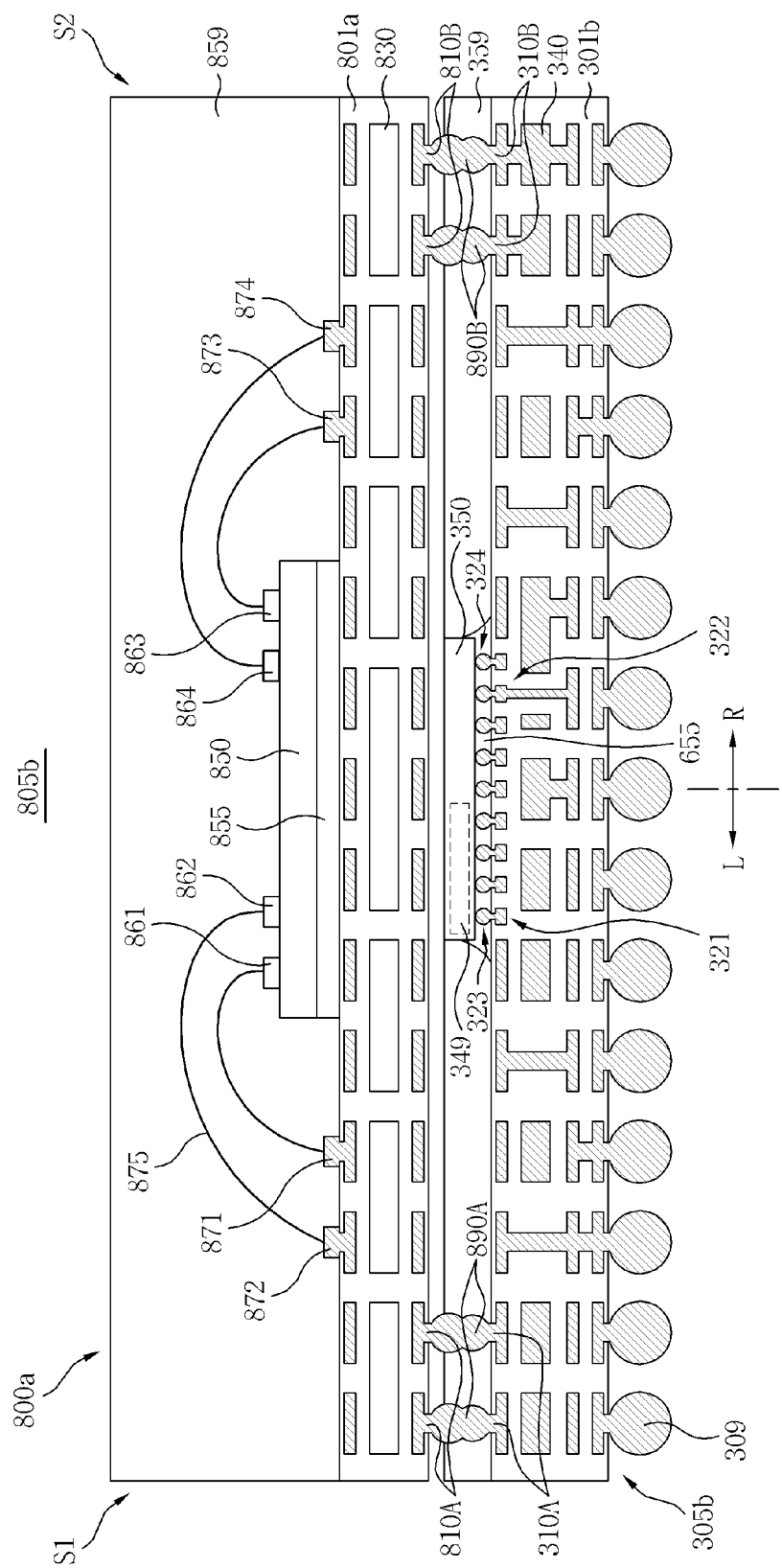
Figure 12C:
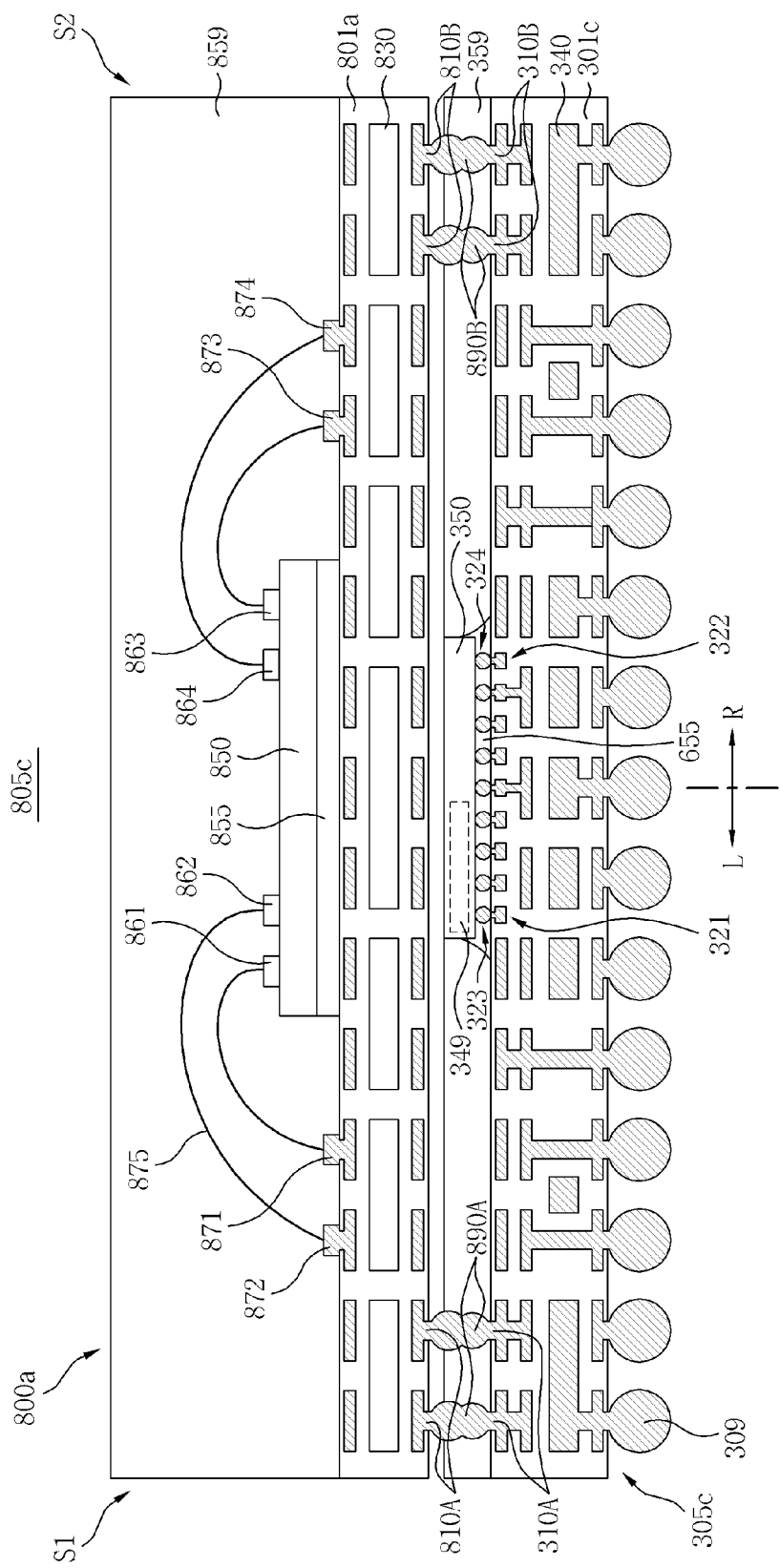
Figure 12D:
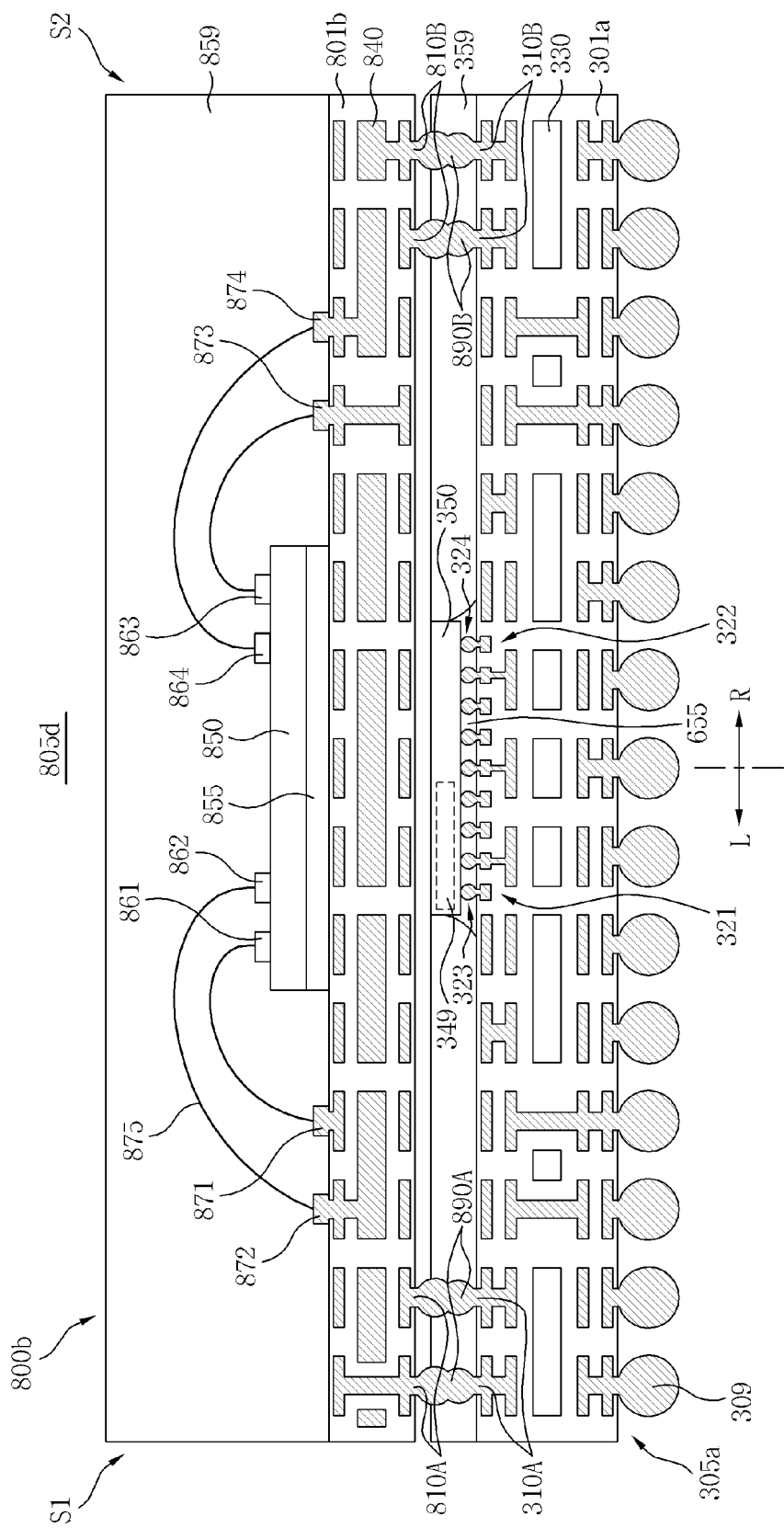
Figure 12E:
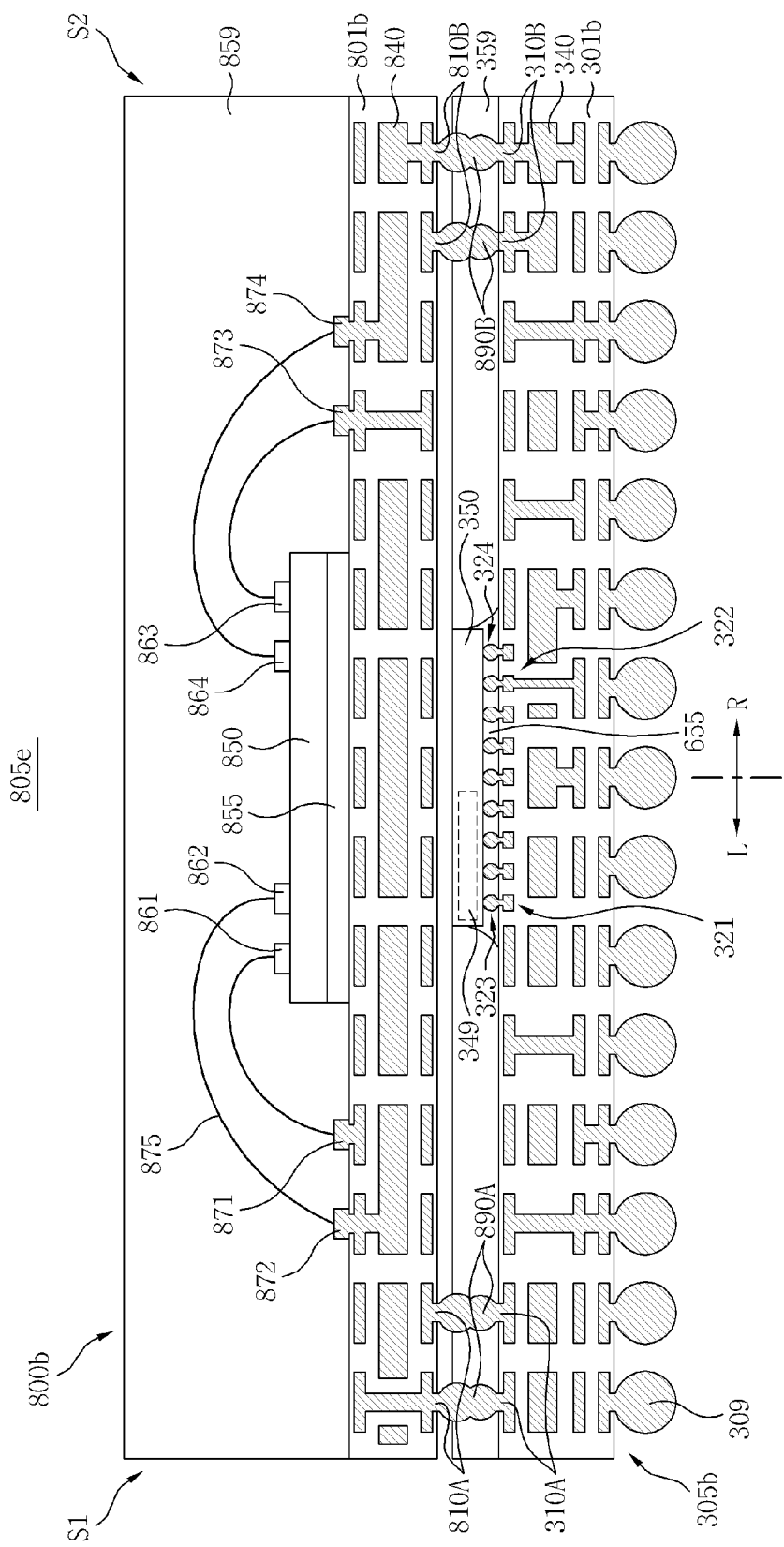
Figure 12F:
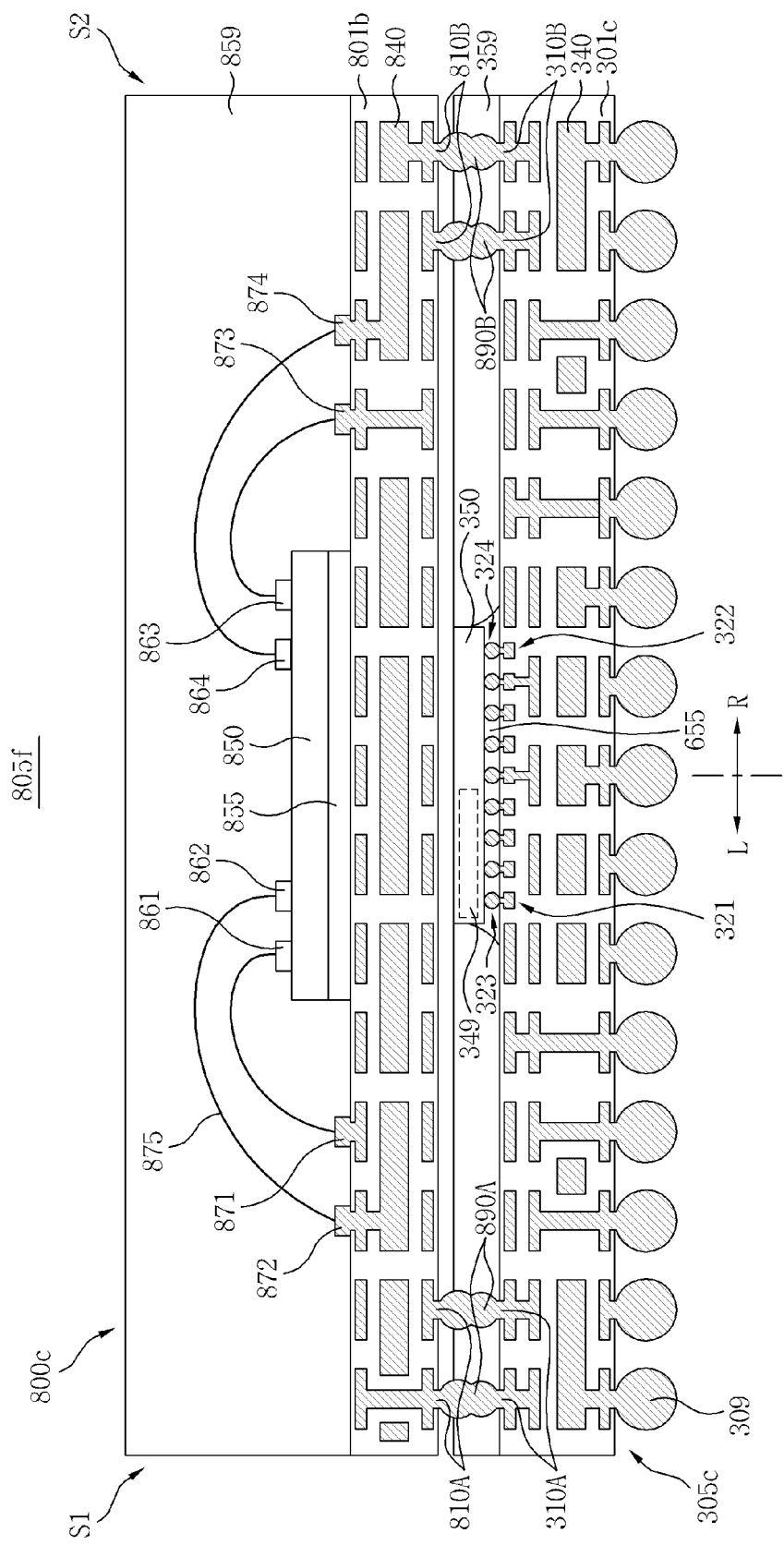
Figure 12G:
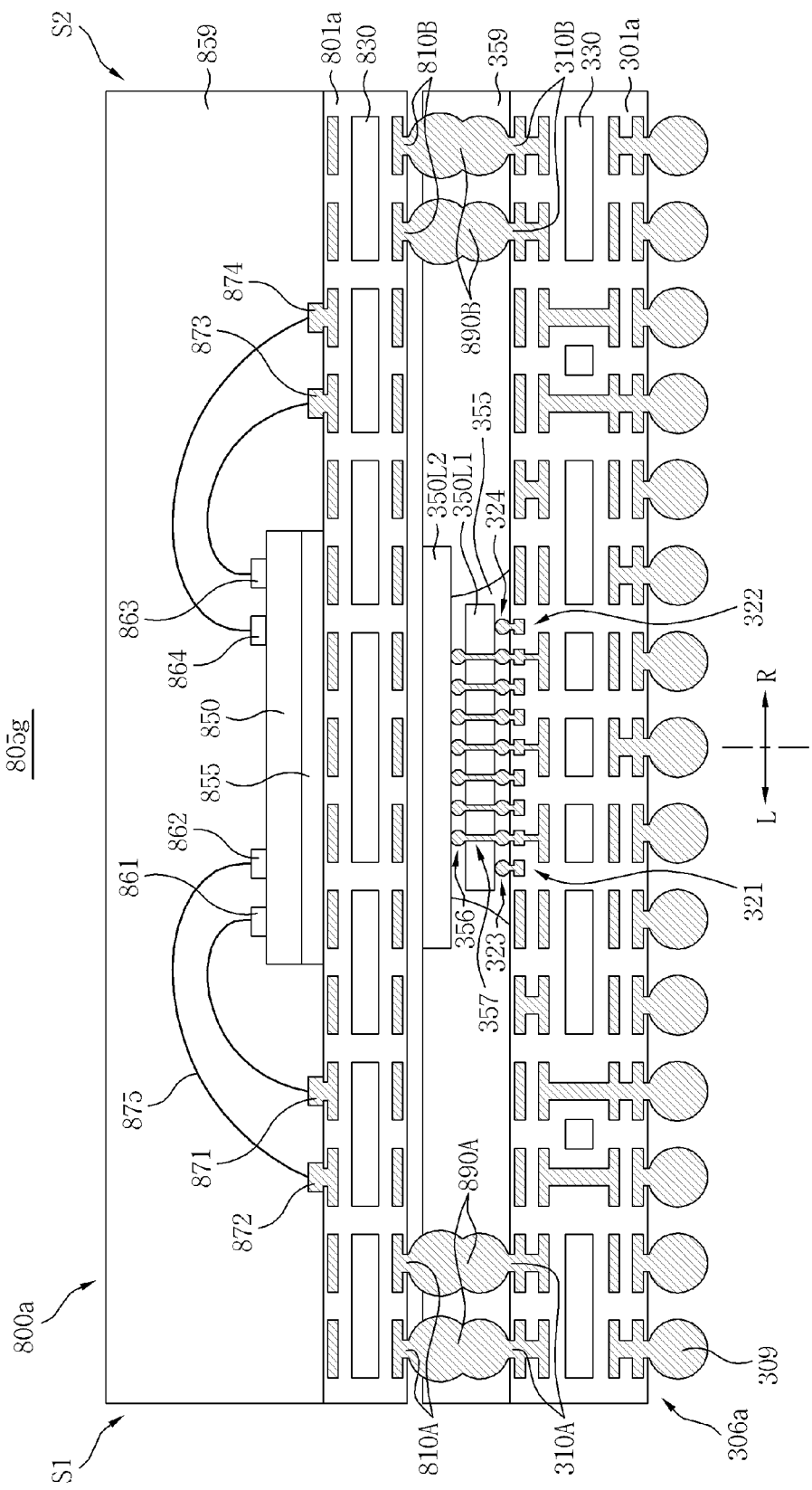
Figure 12H:
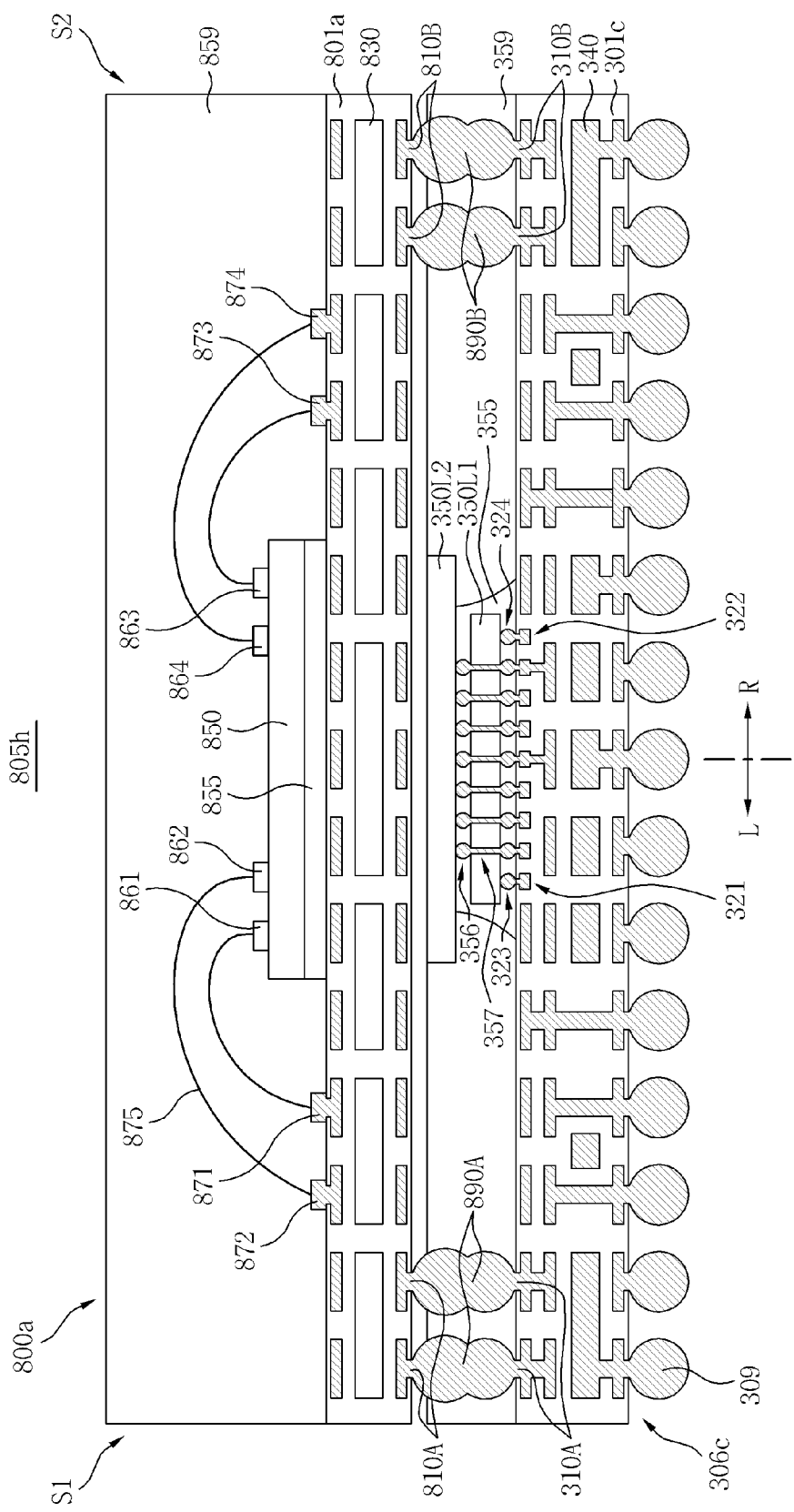
Figure 12J:
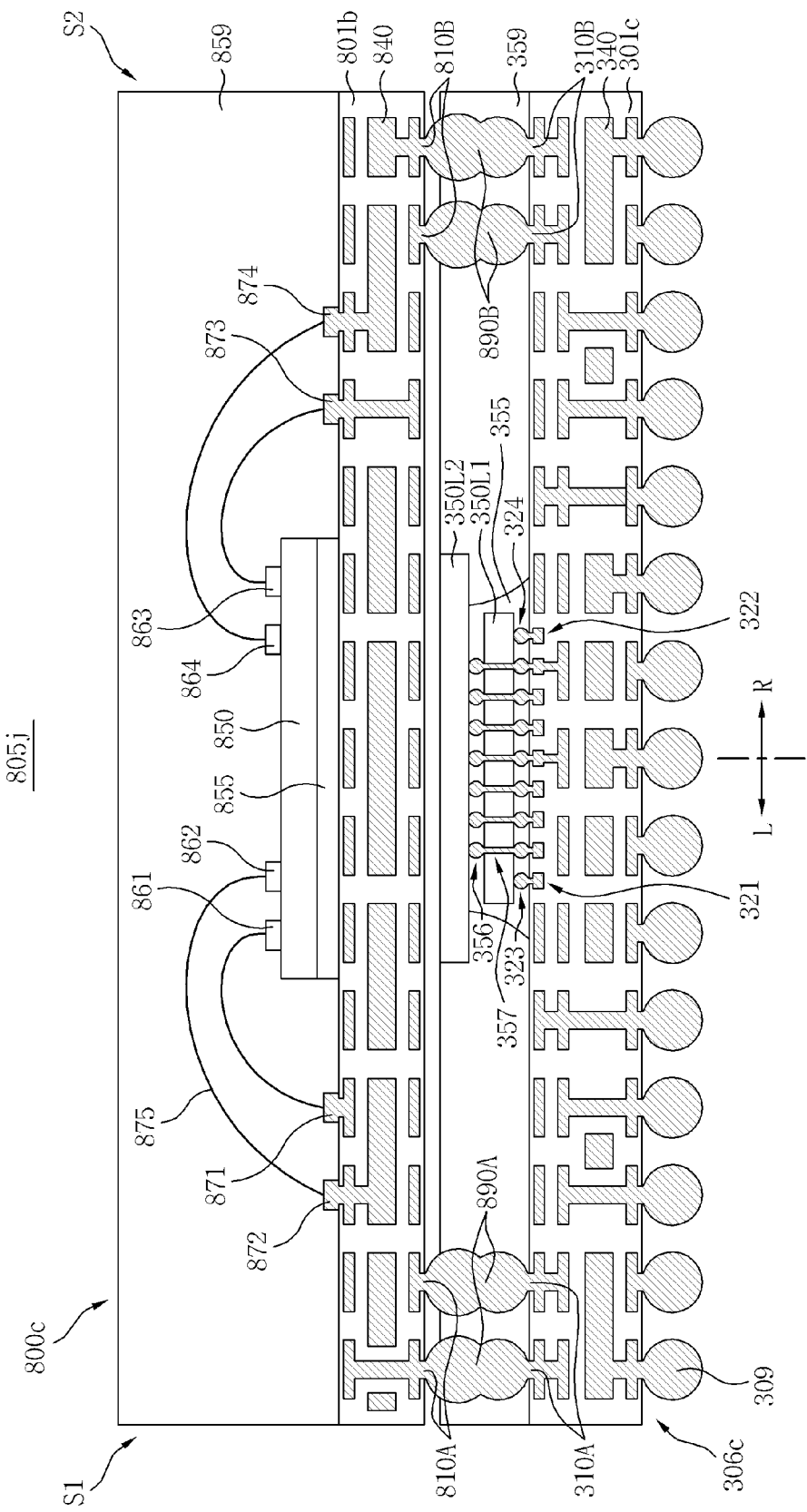
Figure 13A:
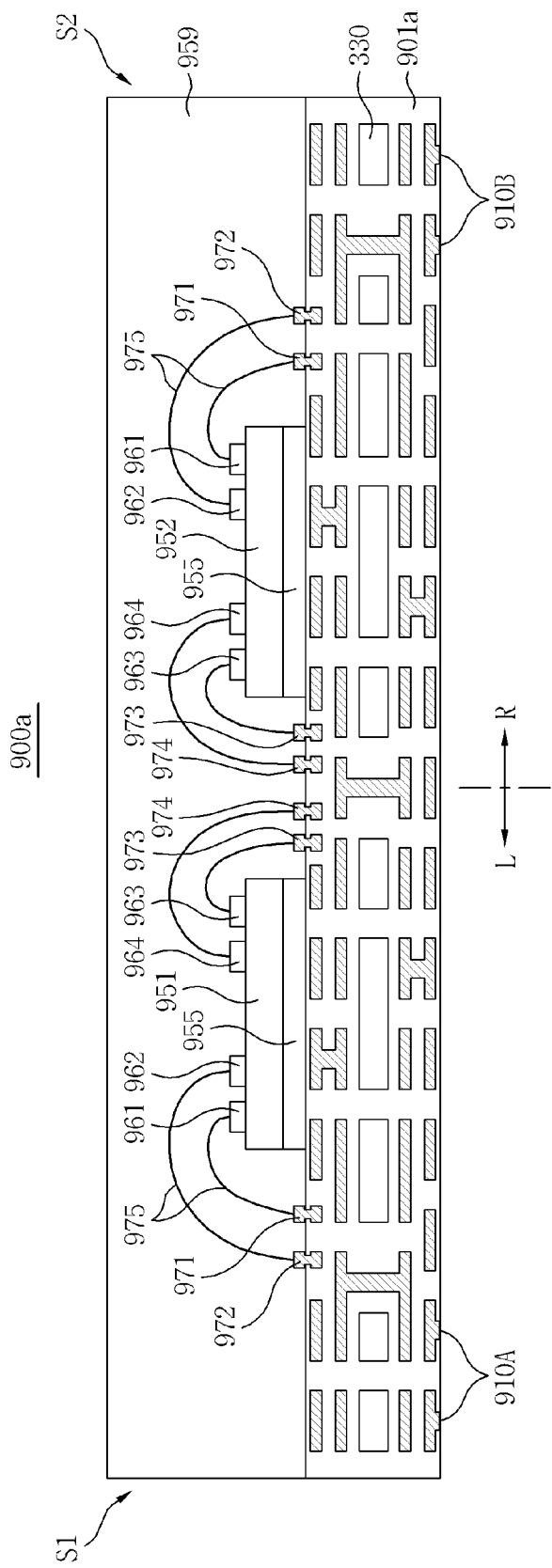
FIGS. 13A through 13D are schematic lateral sectional views of upper packages according to some embodiments of the inventive concept.
Figure 13B:
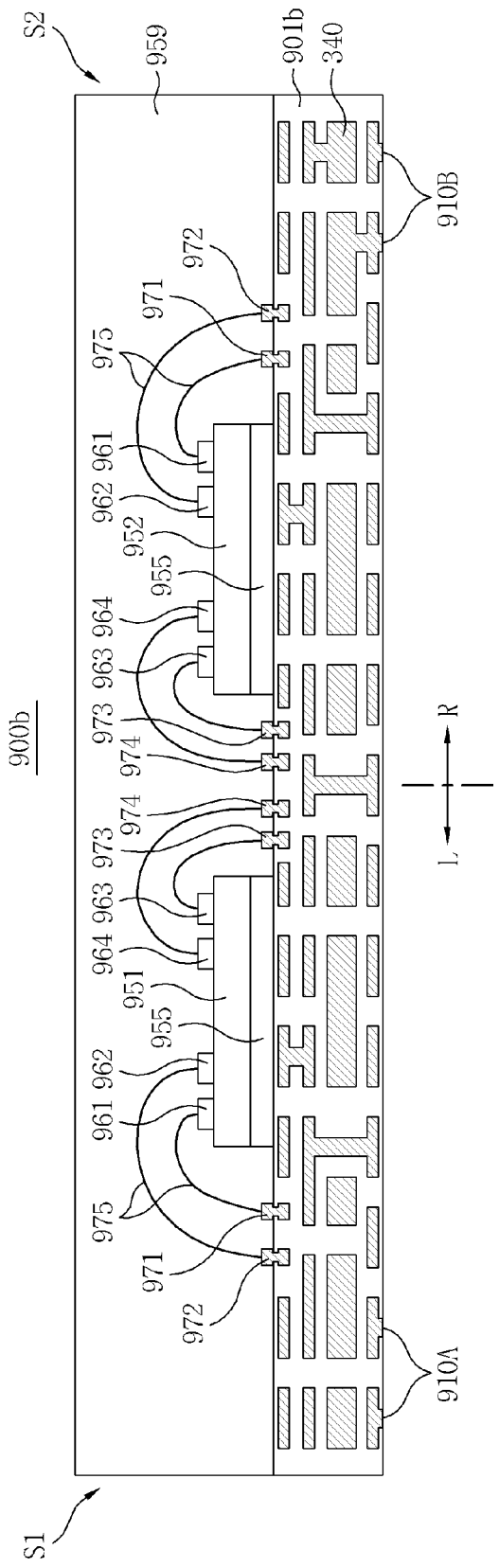
Figure 13C:
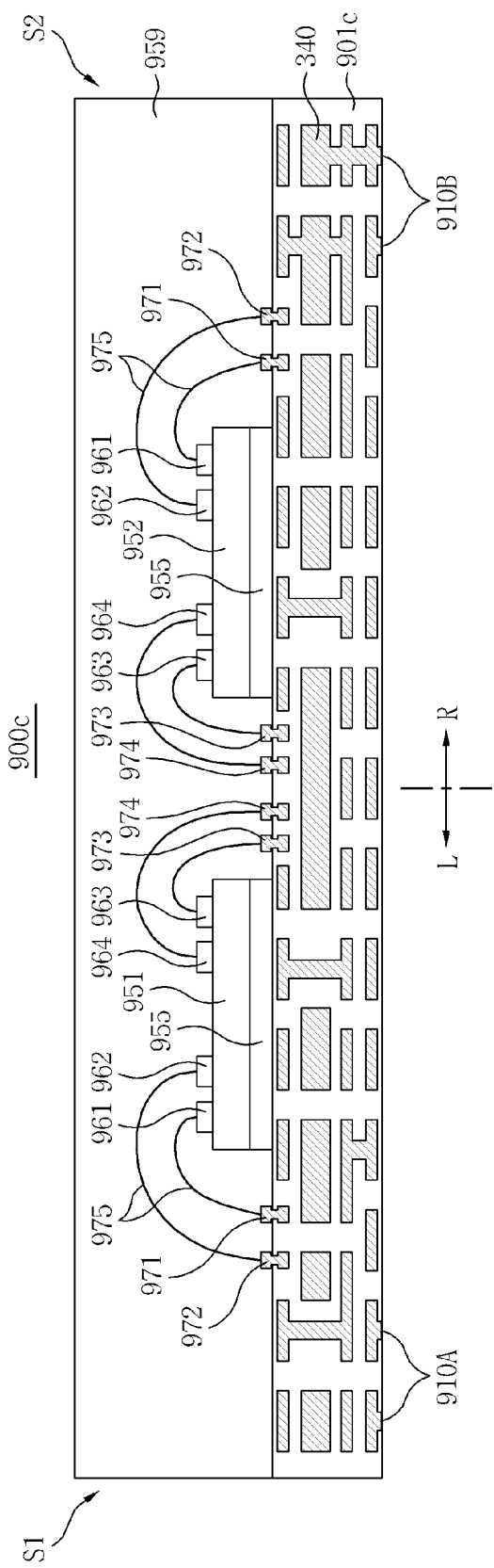
Figure 13D:
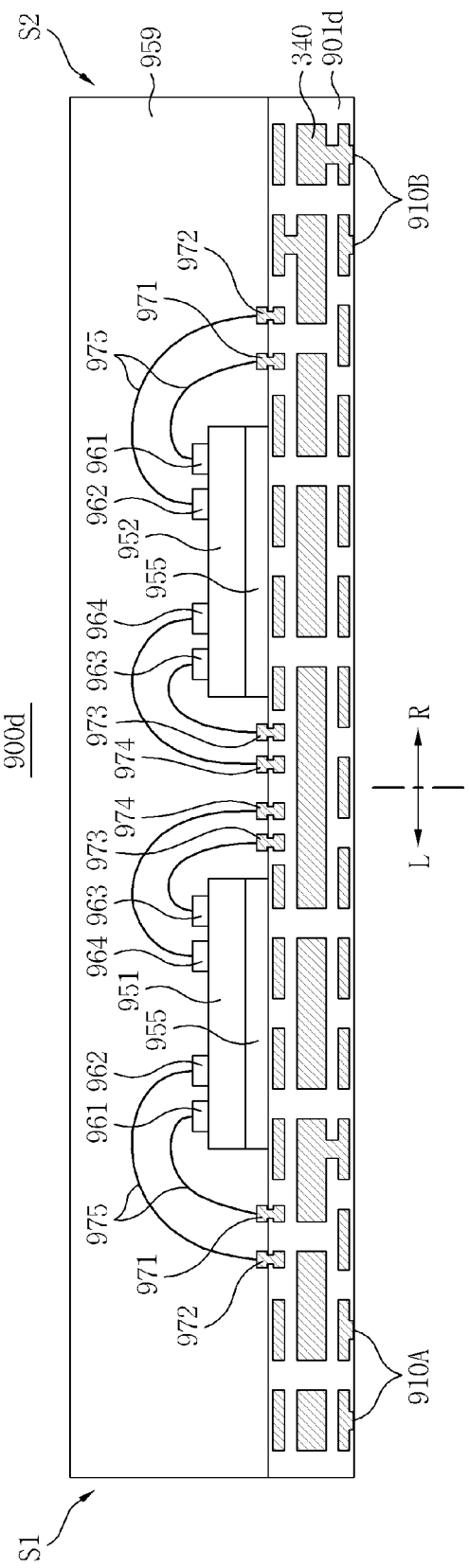

FIGS. 11A and 11B are lateral cross-sectional, longitudinal cross-sectional, and partial exploded views of semiconductor packages according to other embodiments of the inventive concept.

Referring to FIG. 11A, a semiconductor package 800a according to an embodiment of the inventive concept may include a semiconductor device 850 disposed on a package substrate 801a.

The semiconductor device 850 may include first bonding pads 861 and second bonding pads 862 disposed in a left region Ls of a left half portion L thereof and third bonding pads 863 and fourth bonding pads 864 disposed in a right region Rs of a right half portion R thereof. The fourth bonding pads 864 may be arranged in the left region Ls of the left half portion L of the semiconductor device 850. The second through fourth bonding pads 862 to 864 may be understood in further detail with reference to FIG. 10.

The package substrate 801a may include a first insulating layer 831, a first metal layer 841, a second insulating layer 832, an insulating core layer 830, a third insulating layer 833, a second metal layer 842, and a fourth insulating layer 834 stacked sequentially.

The package substrate 801a may include a first wire land 871, a second wire land 872, a third wire land 873, and a fourth wire land 874 disposed on the first metal layer The first, second, third, and fourth bonding pads 861, 862, 863, and 864 may be respectively electrically connected to the first, second, third, and fourth wire lands 871, 872, 873, and 874, respectively, through bonding wires 875.

The package substrate 801a may include inter-package connector lands 810A having a first characteristic disposed on a bottom surface of the second metal layer 842 and inter-package connector lands 810B having a second characteristic disposed on a bottom surface of the second metal layer 842.

The inter-package connector lands 810A having the first characteristic may be electrically connected to the first through third wire lands 871 to 873, and the inter-package connector lands 810B having the second characteristic may be electrically connected to the fourth wire lands 874.

The inter-package connector lands 810A having the first characteristic may be disposed near a first side (or a first edge) S1 of the package substrate 801a, and the inter-package connector lands 810B having the second characteristic may be disposed near a second side (or a second edge) S2 opposite the first side thereof.

In FIG. 11A, the first side S1 may correspond to a left side, and the second side S2 may correspond to a right side. Accordingly, the inter-package connector lands 810A having the first characteristic may be asymmetrically disposed in a left half portion L of the package substrate 801a, while the inter-package connector lands 810B having the second characteristic may be asymmetrically disposed in a right half portion R thereof.

Referring to FIG. 11B, as compared with the semiconductor package 800a of FIG. 11A, a semiconductor package 800b according to an embodiment of the inventive concept may include a first insulating layer 831, a first metal layer 841, a second insulating layer 832, a metal core layer 840, a third insulating layer 833, a second metal layer 842, and a fourth insulating layer 834 stacked in a sequential or alternating manner. Some of the fourth wire lands 874 may be electrically connected to the metal core layer 840. Specifically, the metal core layer 840 may be used as a plane surface (particularly, a ground plane surface) for an element/package reference voltage. The other components will be understood with reference to FIG. 11A.

FIGS. 12A through 12J are lateral sectional and longitudinal sectional views of package stack structures according to various embodiments of the inventive concept.

Referring to FIGS. 12A through 12J, each of package stack structures 805a to 805j according to some embodiments of the inventive concept may include upper packages 800a and 800b, lower packages 305a to 305c, and inter-package connectors 890A and 890B. The upper packages 800a and 800b may be understood in further detail with reference to, for example, FIGS. 11A and 11B, while the lower packages 305a to 305c may be understood in further detail with reference to FIGS. 5A through 5C.

The inter-package connectors 890A and 890B may include inter-package connectors 890A having the first characteristic and inter-package connectors 890B having the second characteristic. The inter-package connectors 890A having the first characteristic may be electrically connected to upper inter-package lands 810A having the first characteristic and lower inter-package lands 310A having the first characteristic. The inter-package connectors 890B having the second characteristic may be electrically connected to upper inter-package lands 810B having the second characteristic and lower inter-package lands 310B having the second characteristic. The inter-package connectors 890A having the first characteristic may be disposed near a first side (or a first edge) 51 of each of the package stack structures 805a to 805j or asymmetrically disposed in a left half portion L thereof. The inter-package connectors 890B having the second characteristic may be disposed near a second side S2 of each of the package stack structures 805a to 805j or asymmetrically disposed in a right half portion R thereof. In addition, a description of the upper and lower inter-package connector lands 810A, 810B, 310A, and 310B, the flip-chip connector lands 321 and 322, and the flip-chip connectors 323 and 324 may be understood in further detail with reference to FIGS. 11A and 11B and 5A through 5C.

Referring to FIGS. 12A, 12B, 12C, 12G, and 12H, an upper package substrate 801a may include an insulating core layer 830. Referring to FIGS. 12D, 12E, 12F, 12I, and 12J, an upper package substrate 801b may include a metal core layer 840. Referring to FIGS. 12A, 12D, 12G, and 12I, a lower package substrate 301a may include an insulating core layer 33. Referring to FIGS. 12B, 12C, 12E, 12F, 12H, and 12J, each of lower package substrates 301b and 301c may include a metal core layer 340. The metal core layer 340 may be electrically connected to some of the inter-package connectors 890B having the second characteristic.

A detailed description of the metal core layer 340 and other components may be understood in further detail with reference to other appended drawings.

Referring to FIGS. 12G through 12J, each of package stack structures 805g to 805j according to some embodiments of the inventive concept may include a lower package 306a or 306c, which may further include a first lower semiconductor device 350L1, a second lower semiconductor device 350L2, inter-chip connectors 356, and lower TSVs 357. The package stack structures 805g to 805j may be formed by employing various embodiments, such as those shown in FIGS. 12A through 12E According to additional aspects of the present disclosure, portions of the previously described embodiments, e.g., embodiments of FIGS. 12A through 12F may be combined to form package stack structures within the spirit and scope of the present disclosure. For example, the first and second lower semiconductor devices 350L1 and 350L2, the inter-chip connectors 356, and the lower TSVs 357 may be combined, applied, and understood in various ways with reference to other drawings and descriptions thereof. FIGS. 13A through 13D are schematic views of upper packages according to some embodiments of the inventive concept, which show lateral cross-sectional views of semiconductor devices and longitudinal cross-sectional views of package substrates for clarity. Hereinafter, the term "primary" may refer to conductive structures electrically connected to a first semiconductor device, and the term "secondary" may refer to conductive structures electrically connected to a second semiconductor device. However, the terms "primary" and "secondary" are not classified in the drawings because a distinction between primary and secondary structures does not affect the understanding of the inventive concept.

Referring to FIGS. 13A through 13D, each of upper packages 900a to 900d according to embodiments of the inventive concept may include a plurality of upper semiconductor devices 951 and 952 disposed on the corresponding one of upper package substrates 901a to 901d. The upper semiconductor devices 951 and 952 may include bonding pads 961 to 964 and wire lands 971 to 974 dispersed at both sides thereof. The semiconductor devices 951 and 952 may be disposed in various shapes shown in FIGS. 6A through 6H. Accordingly, although it is illustrated for brevity that the two semiconductor devices 951 and 952 are horizontally disposed in a mirror-image manner, it should be understood that the semiconductor devices 951 and 952 may be rotated by an angle of 90 or 180° from each other or vertically stacked.

Referring back to FIG. 13A, the upper package substrate 901a may include an insulating core layer 330. Referring back to FIGS. 13B through 13D, each of the upper packages 900b to 900d may include a metal core layer 340.

Each of the upper package substrates 901a to 901d may include upper inter-package connector lands 910A having a first characteristic, which may be disposed near a first side S1 (or first edge) or left side thereof or asymmetrically disposed in a left half portion L thereof, and upper inter-package connector lands 910B having a second characteristic, which may be disposed near a second side (or second edge) S2 or right side opposite the first side S1 or asymmetrically disposed in a right half portion R. The upper semiconductor substrates 910a to 910d may be understood in further detail with reference to, for example, FIGS. 7A through 7D.

Figure 14A:
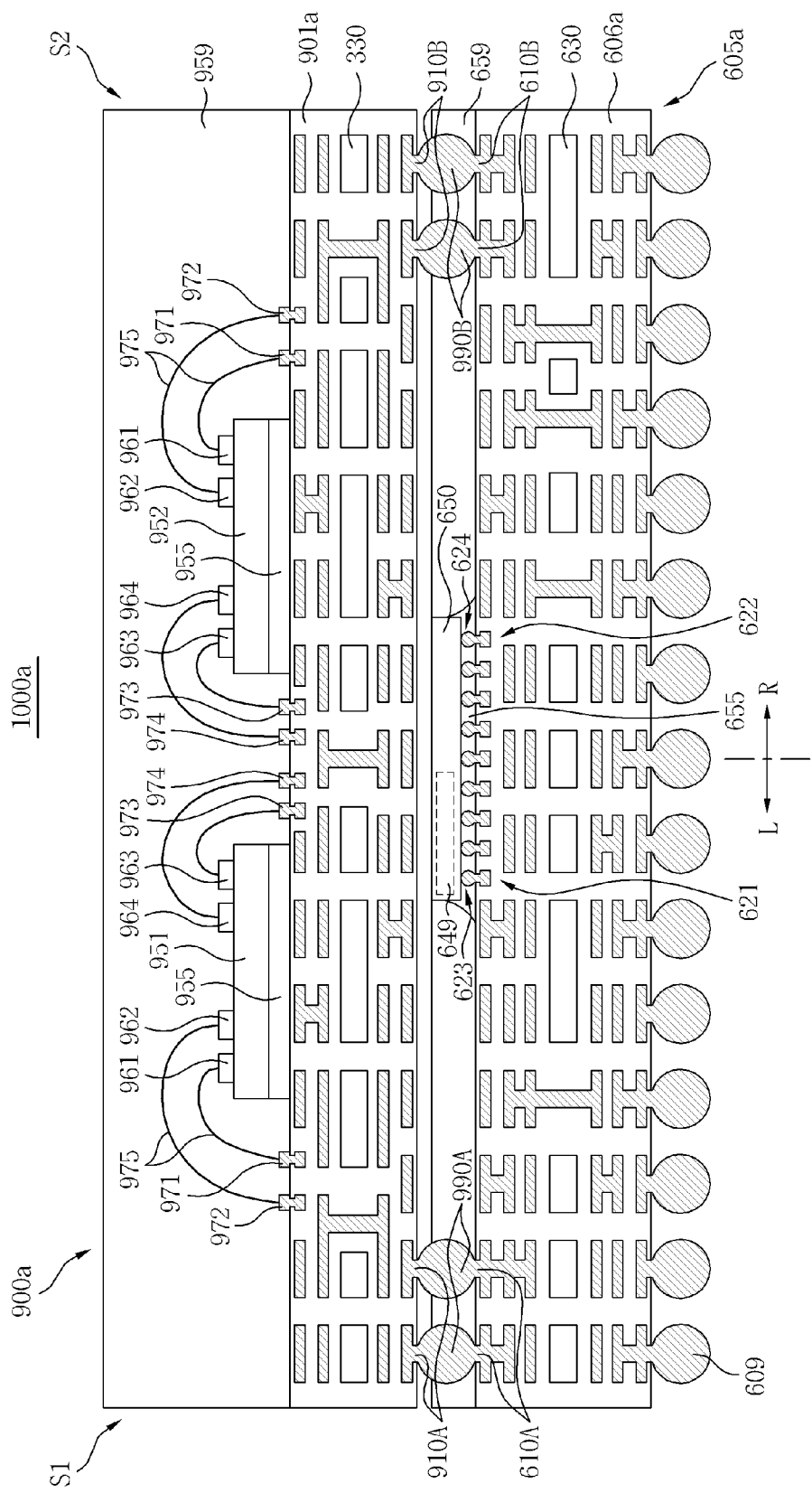
FIGS. 14A through 14U are lateral sectional and longitudinal sectional views of package stack structures of various embodiments of the inventive concept.
Figure 14B:
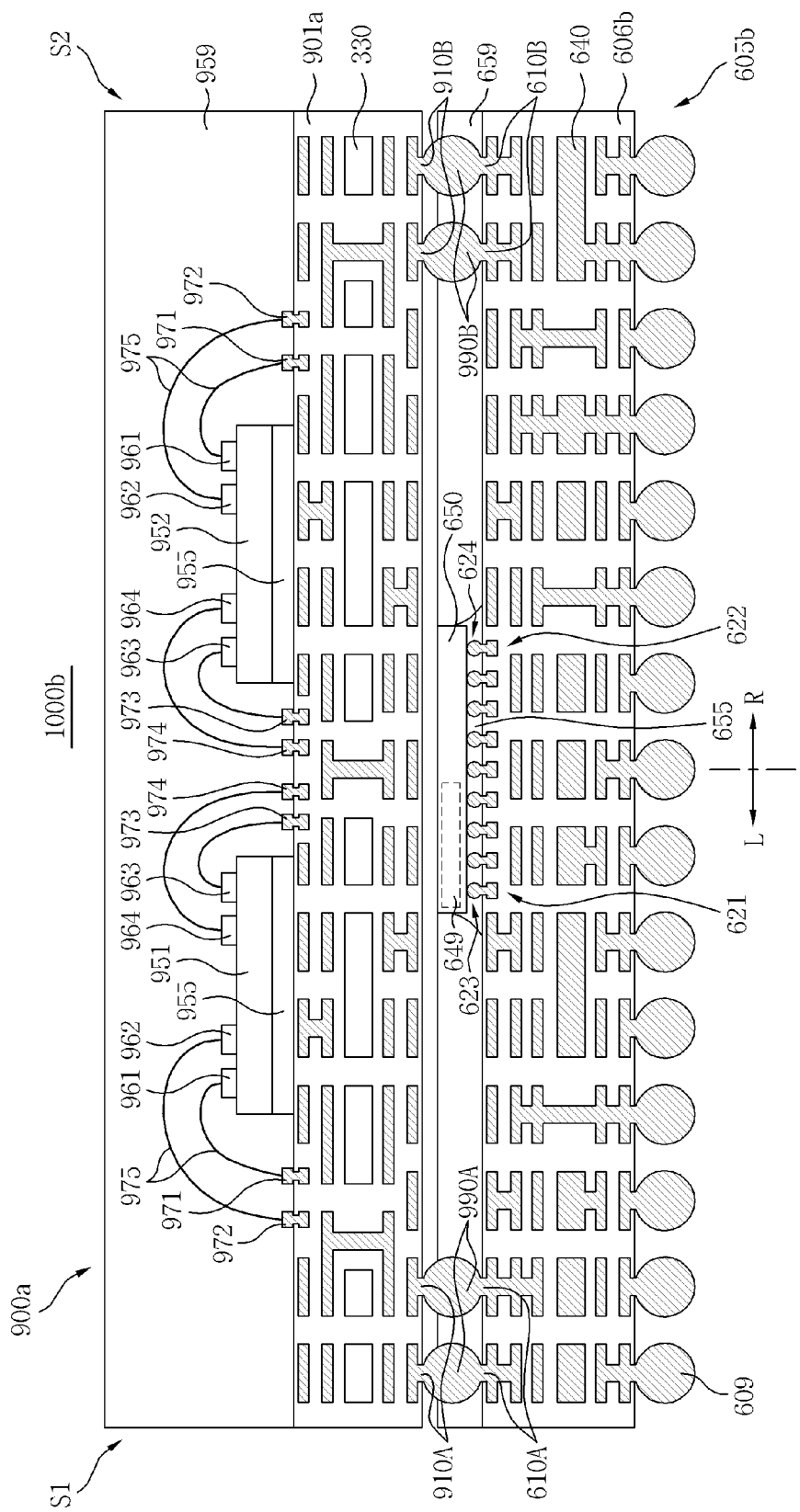
Figure 14C:
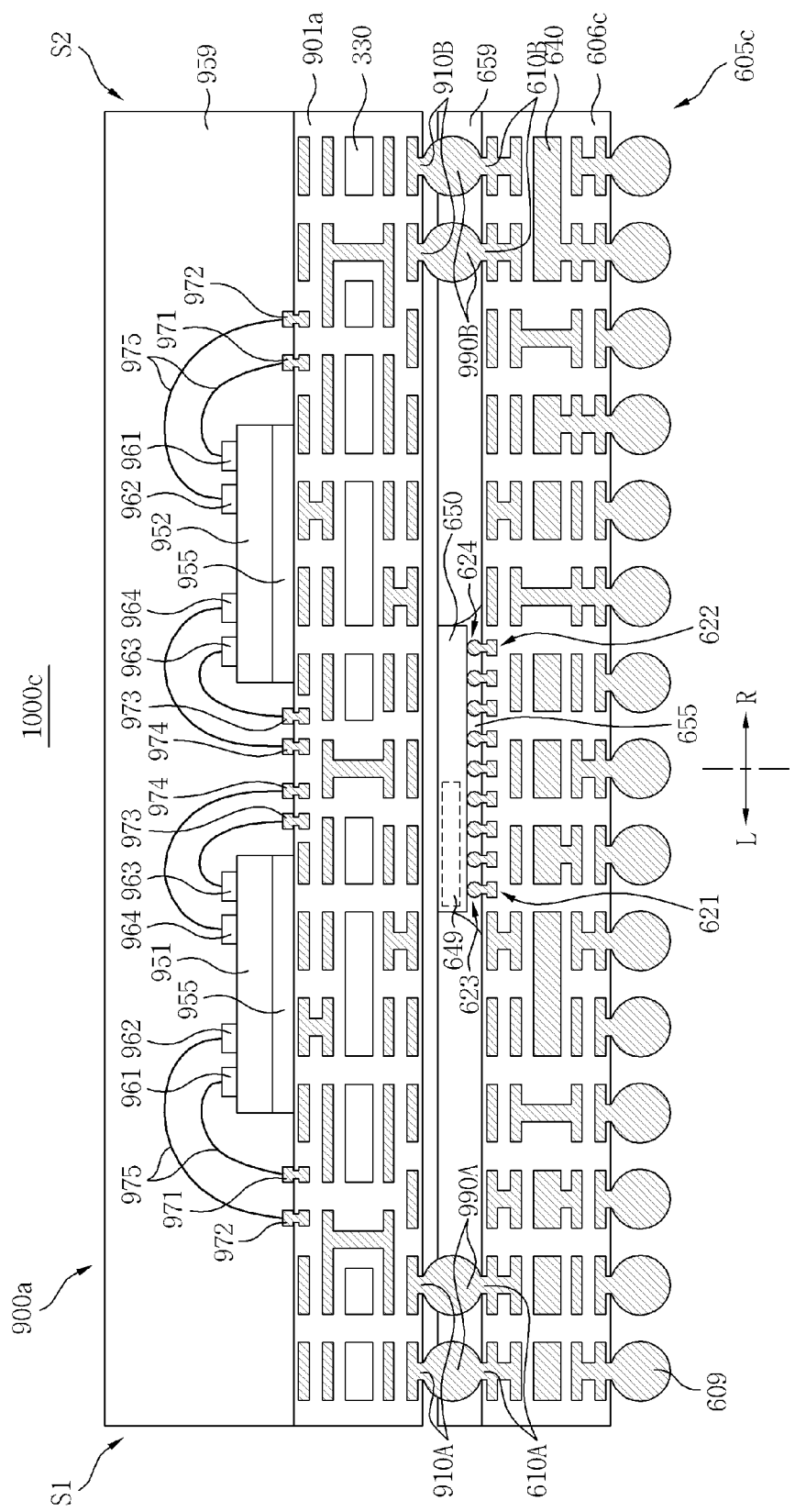
Figure 14D:
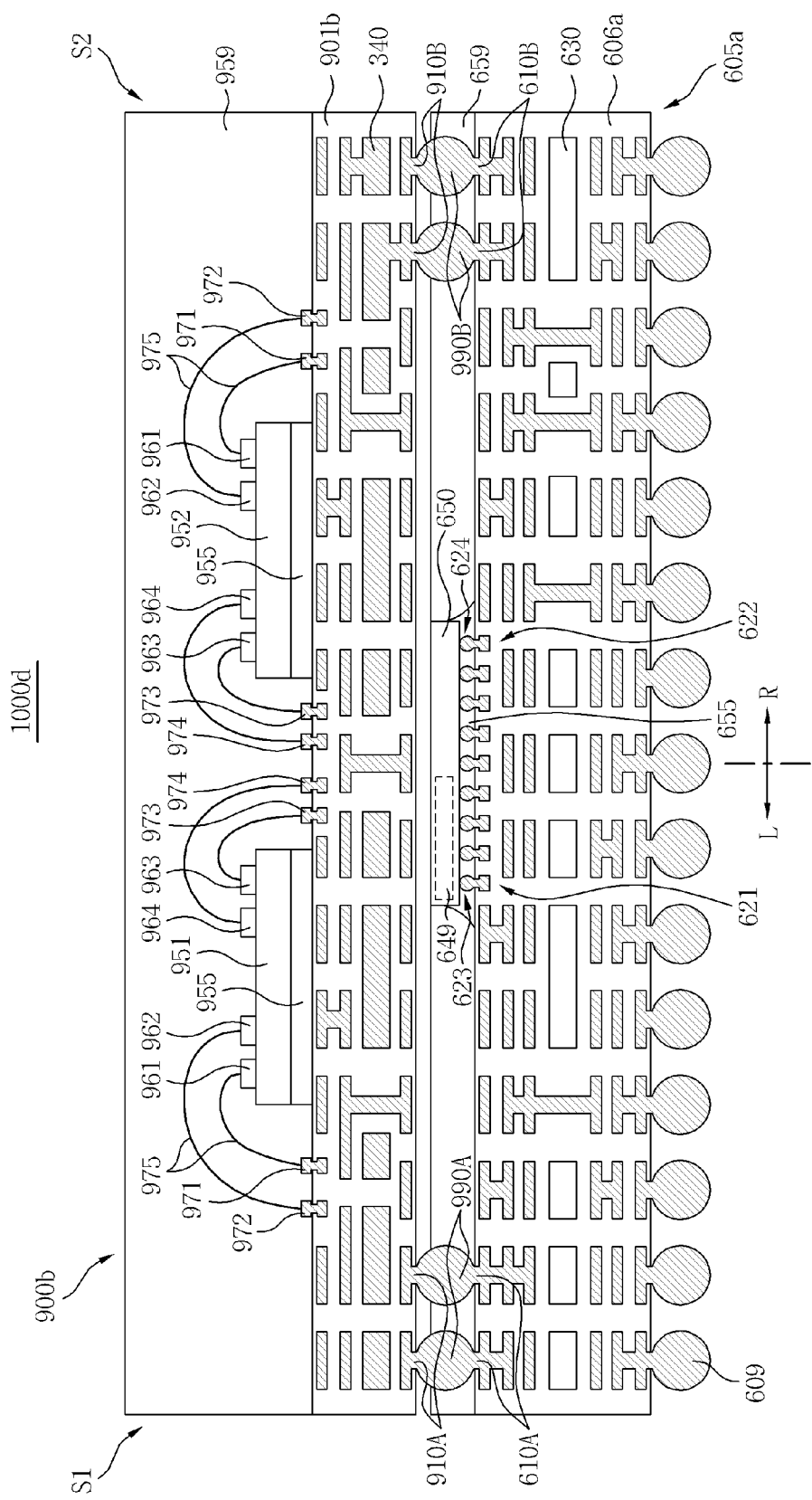
Figure 14E:
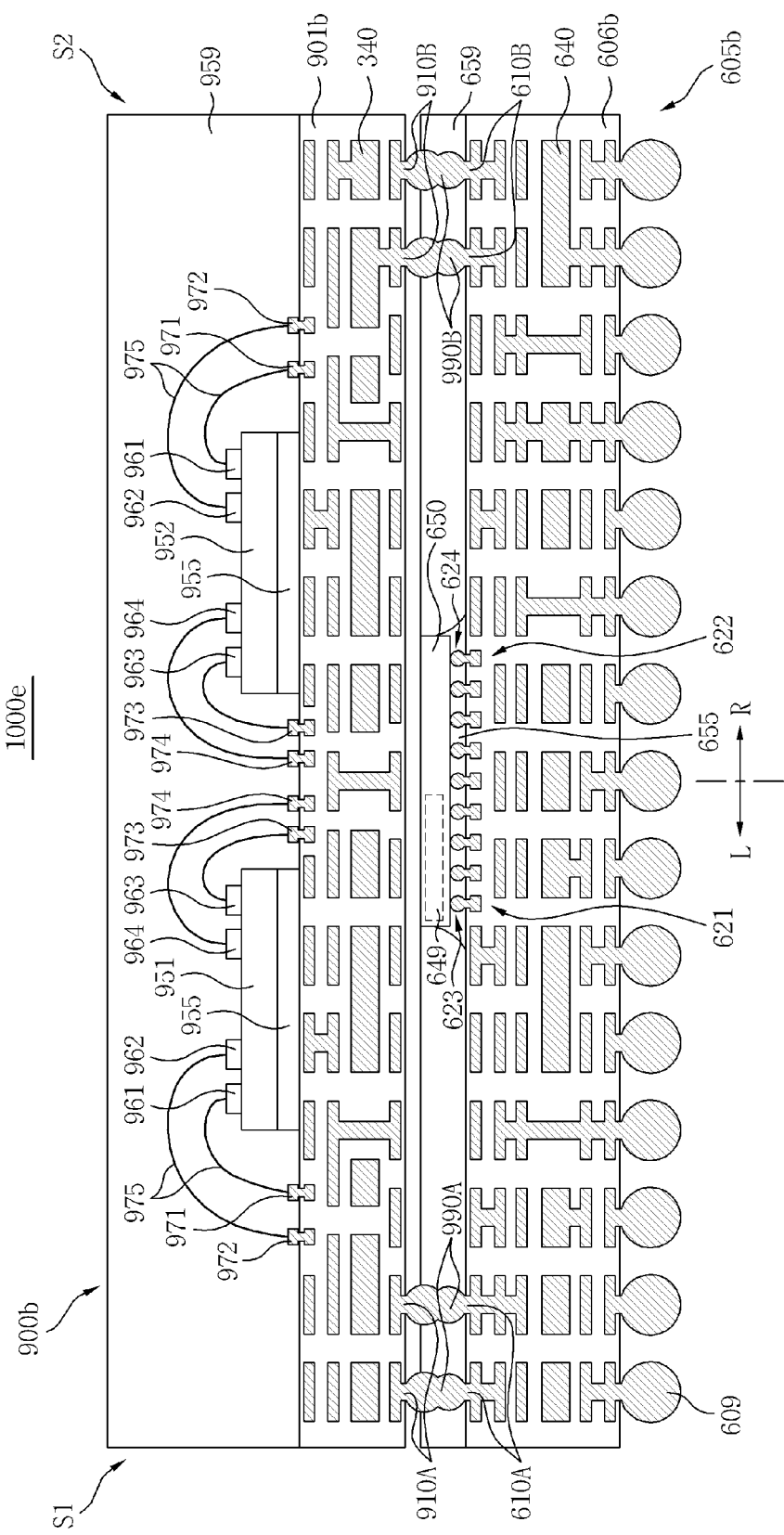
Figure 14F:
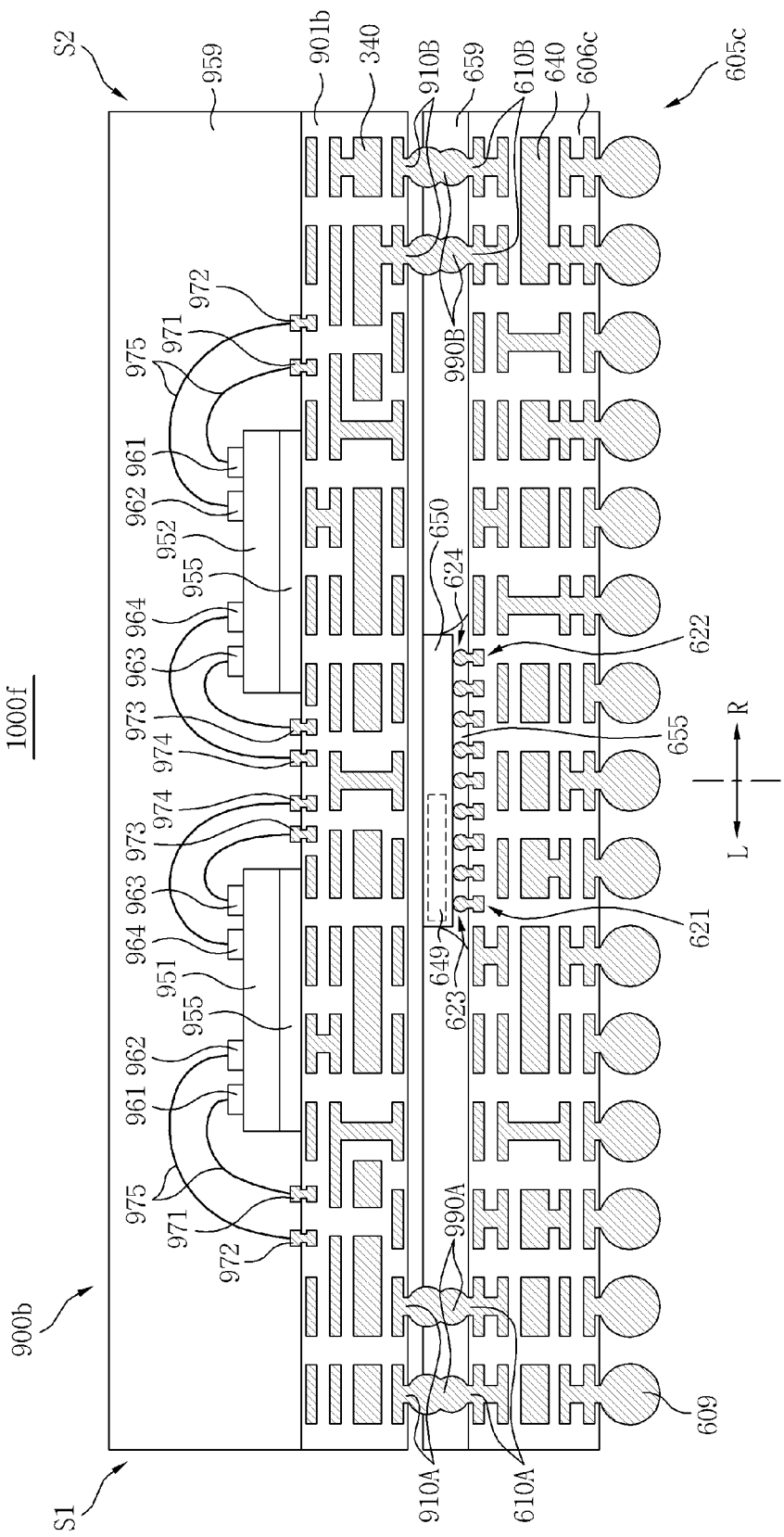
Figure 14G:
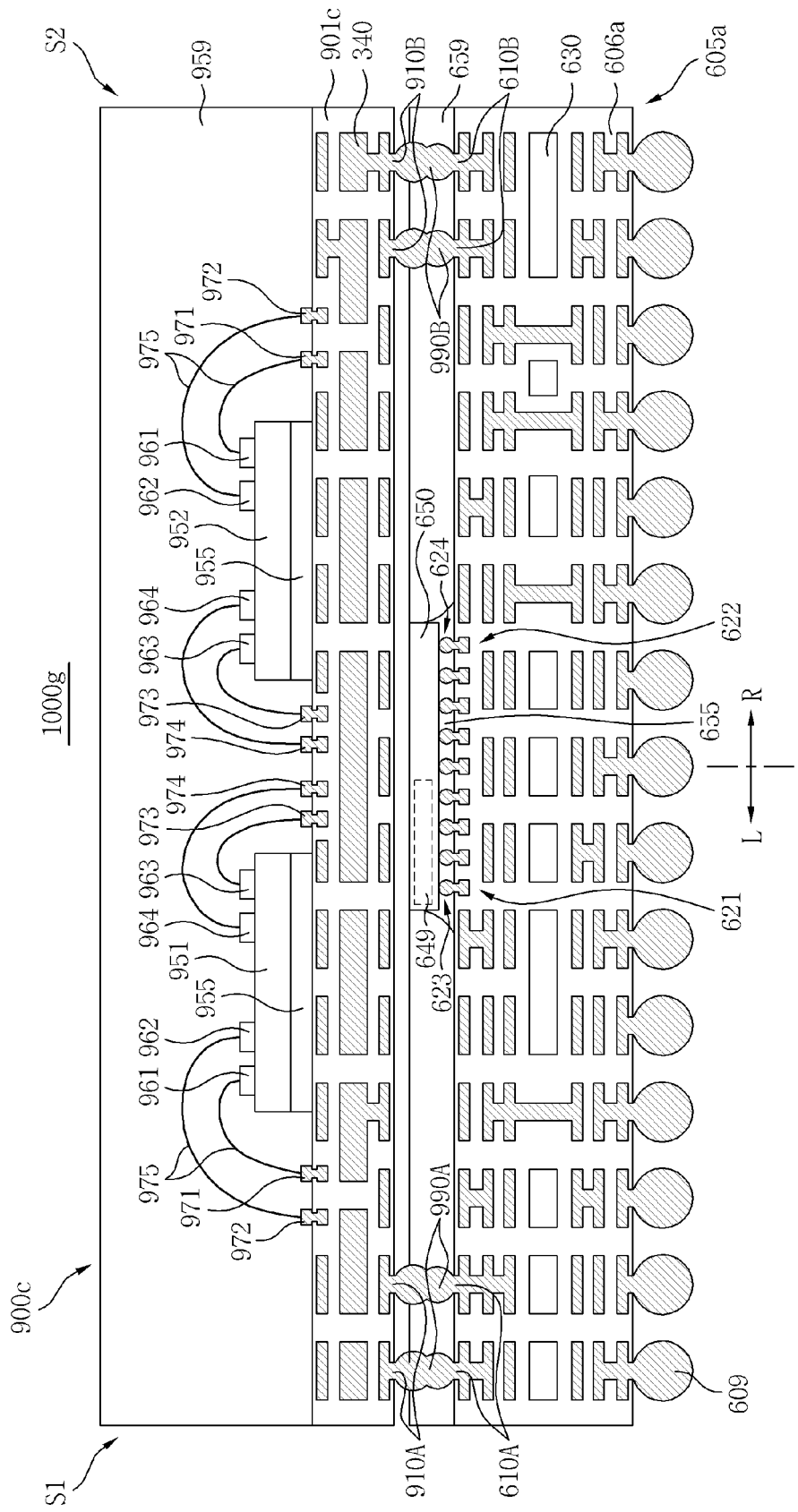
Figure 14H:
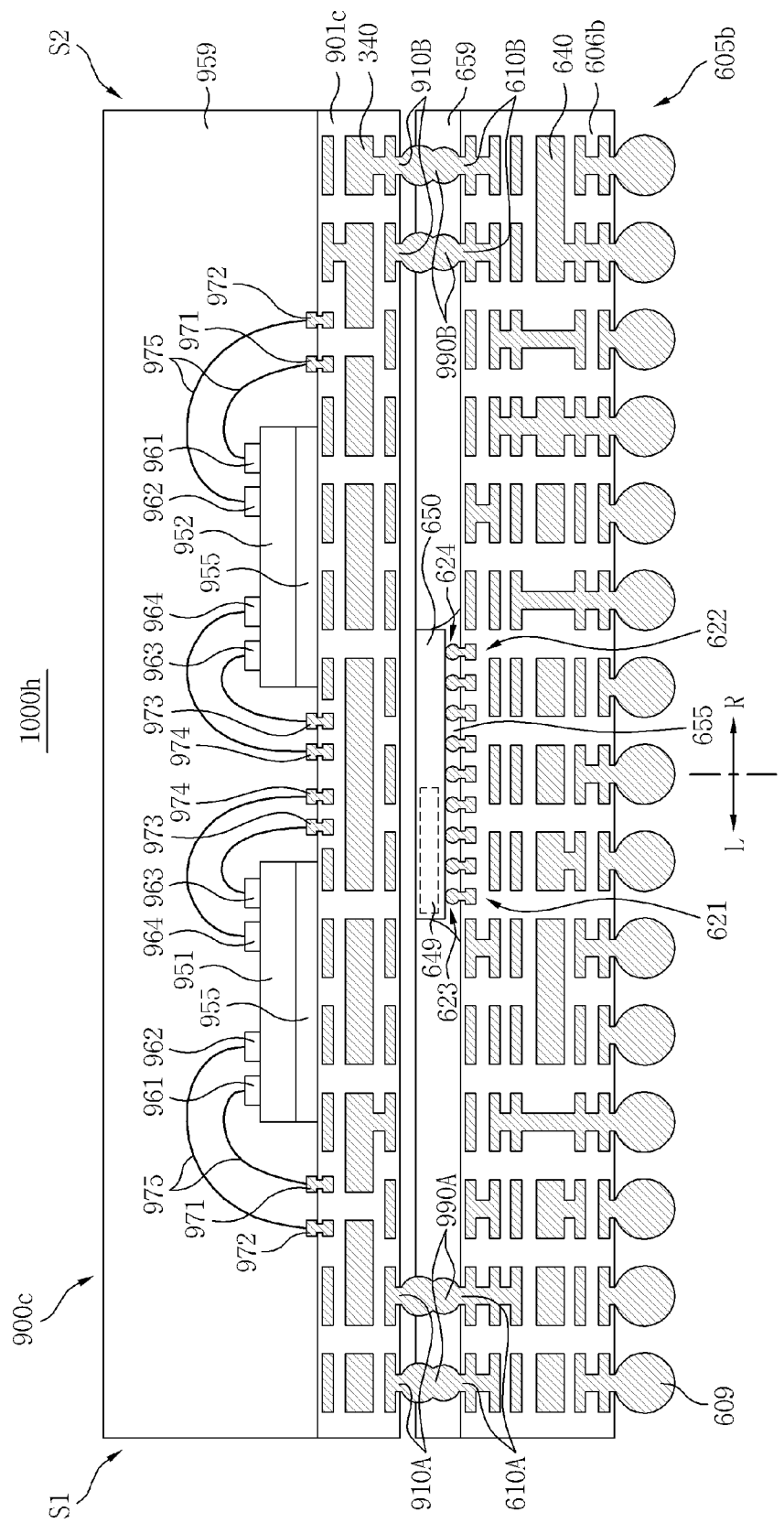
Figure 14I:
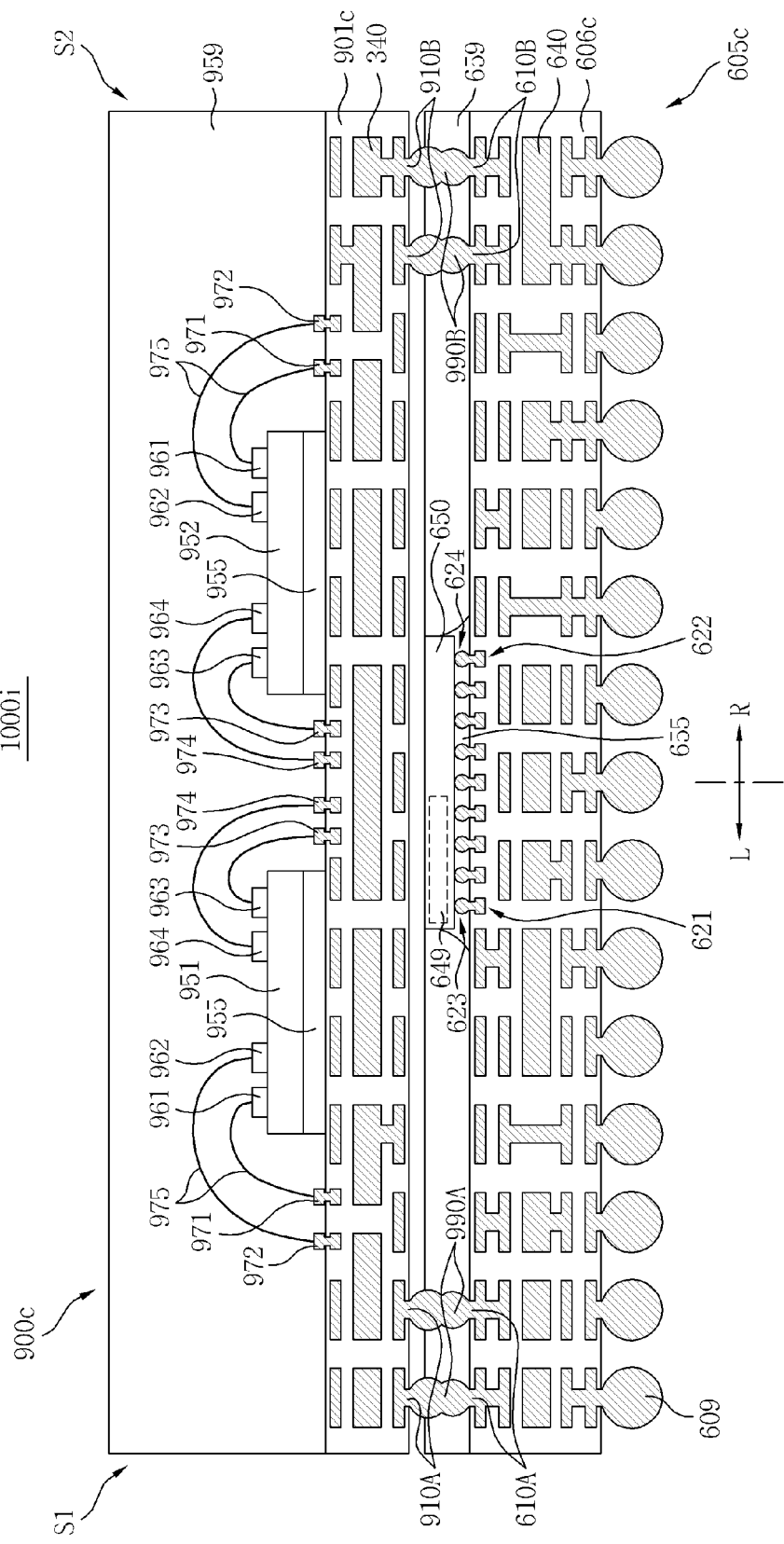
Figure 14J:
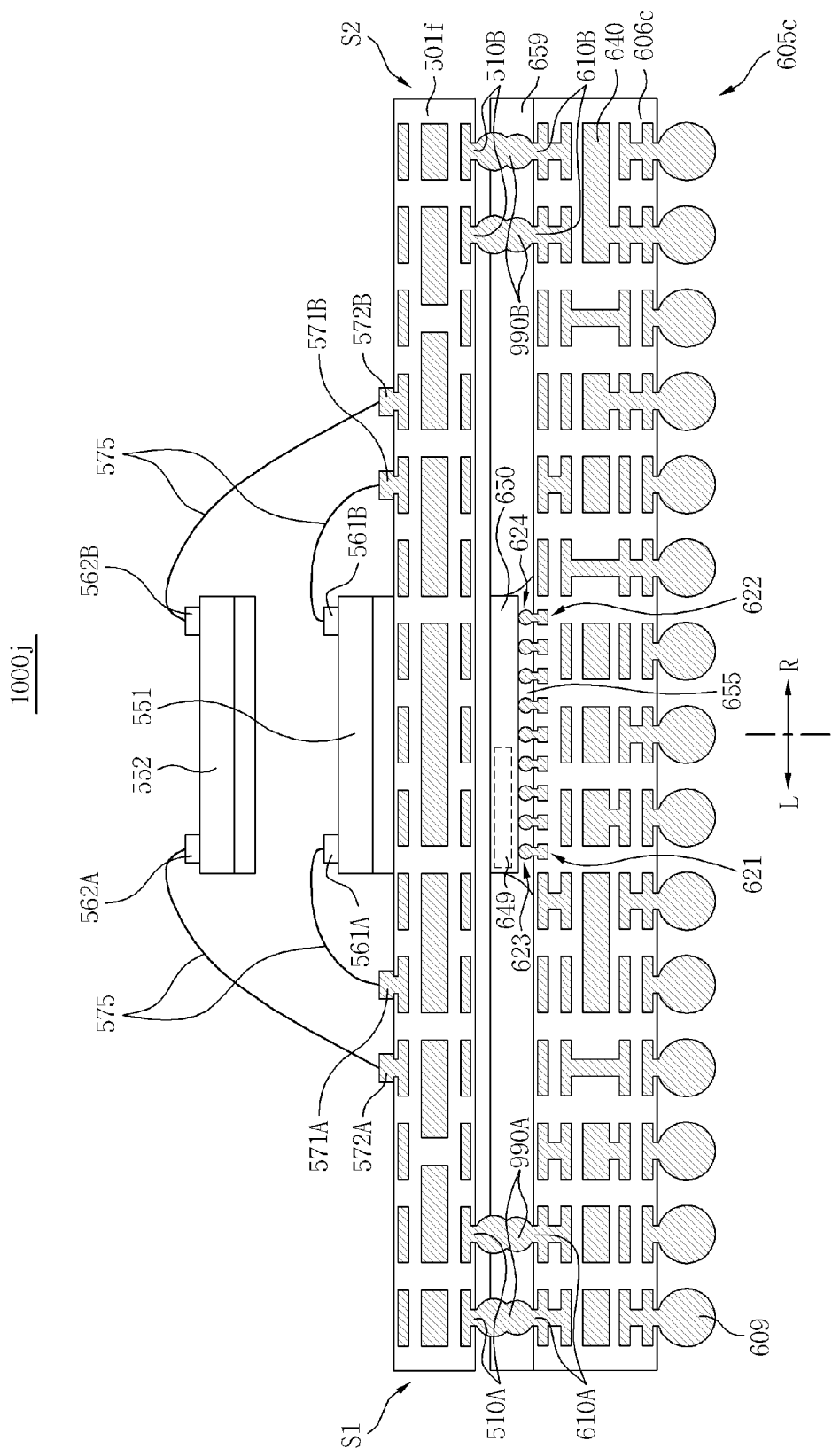
Figure 14K:
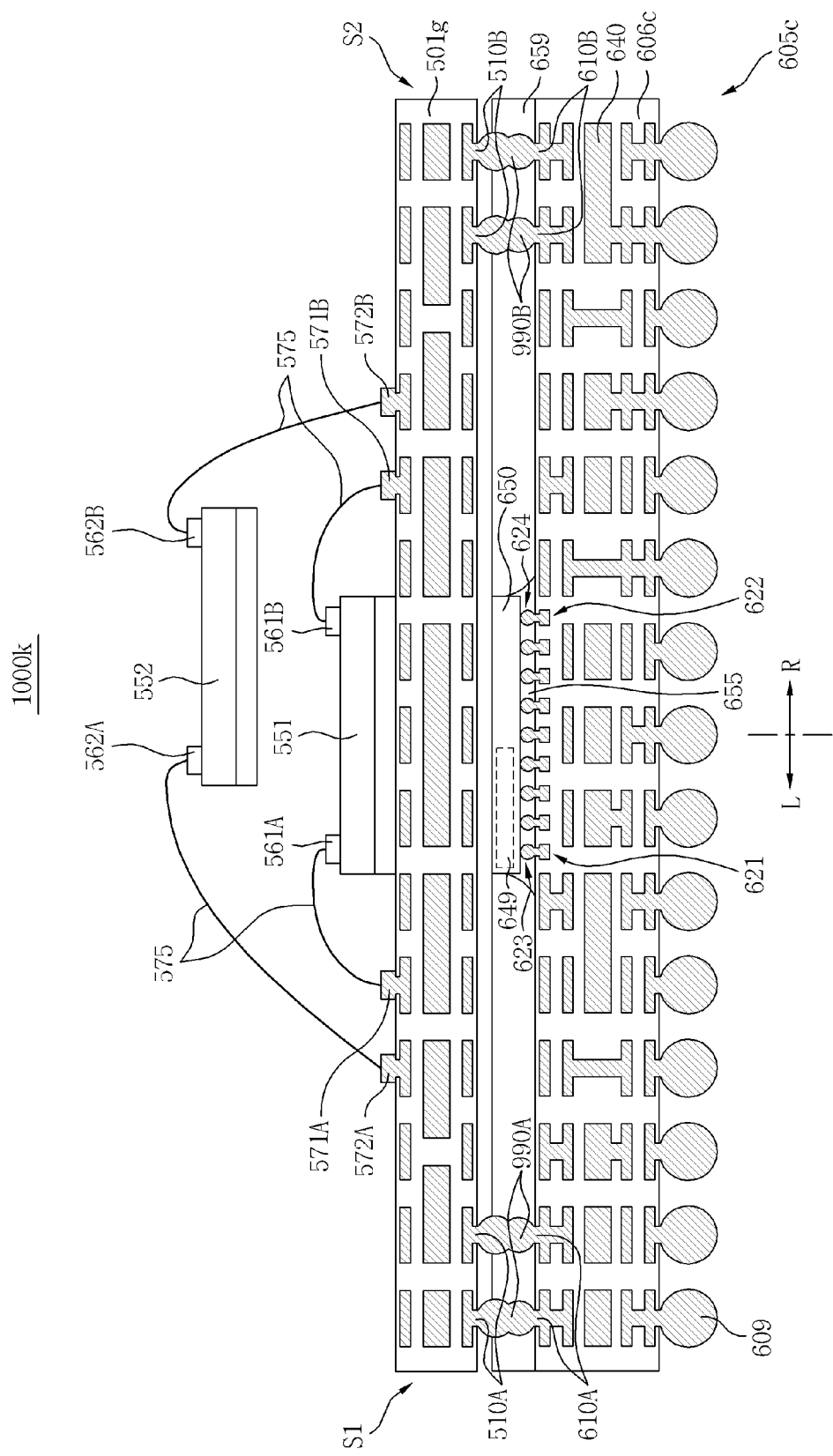
Figure 14L:
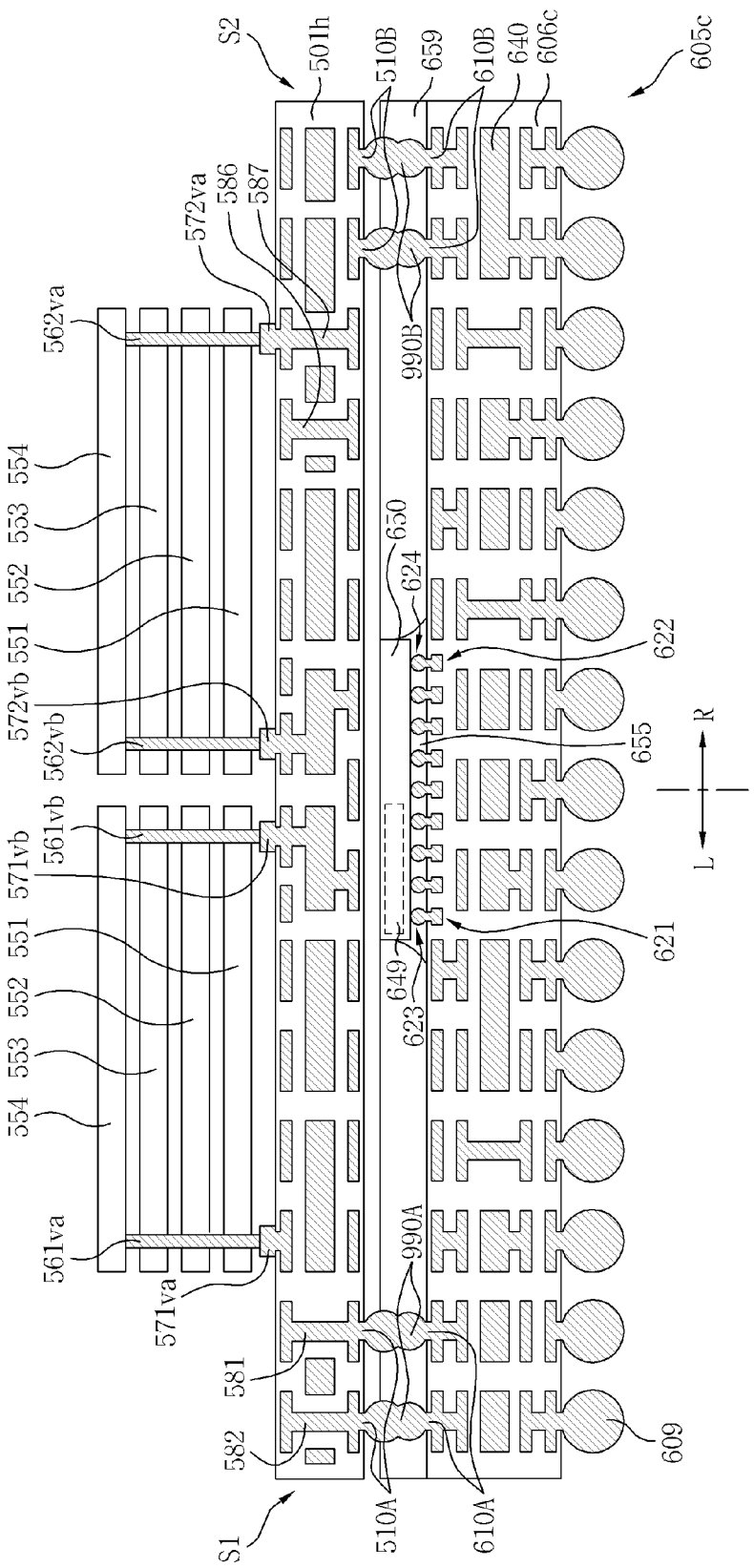
Figure 14M:
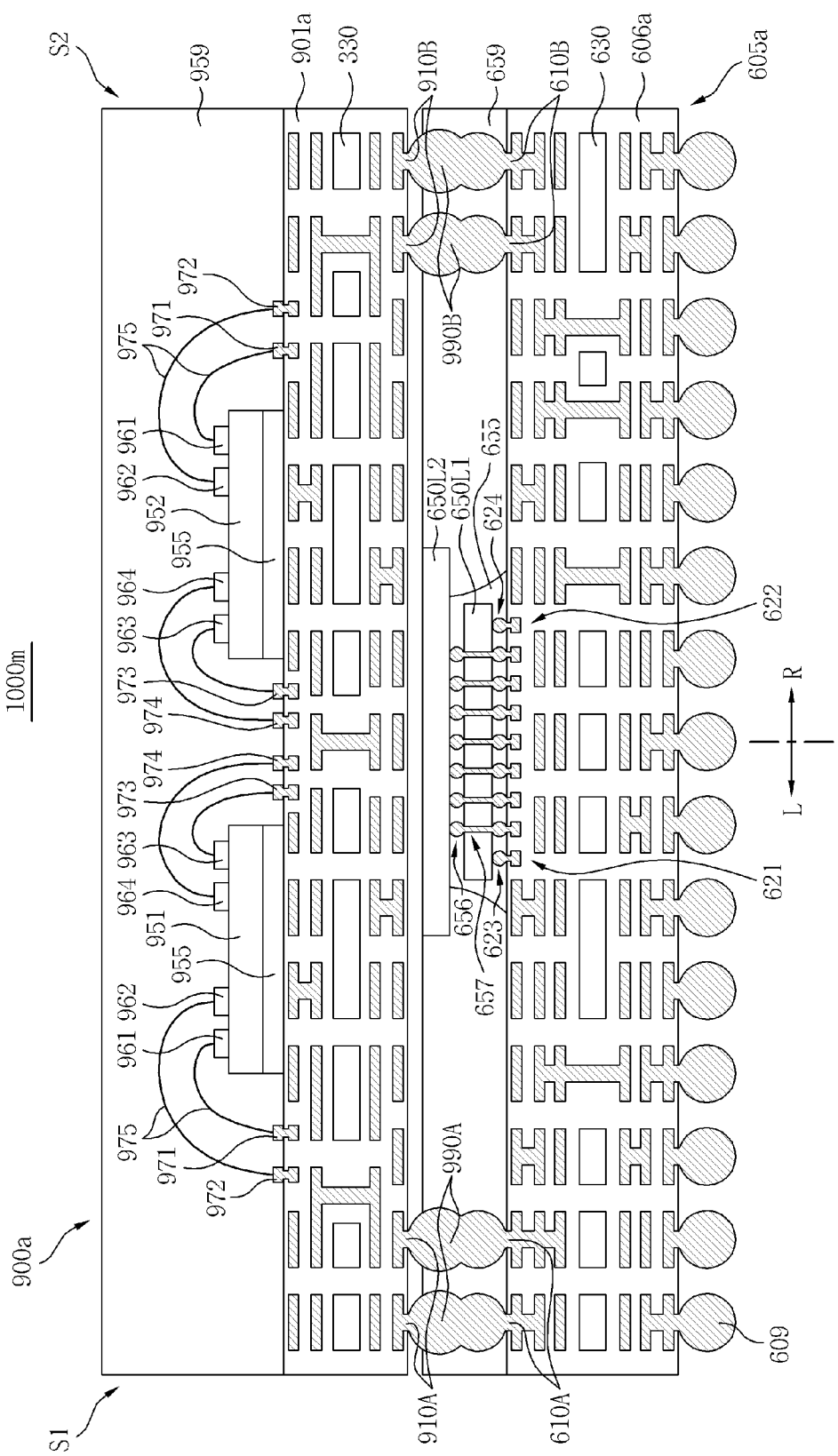
Figure 14N:
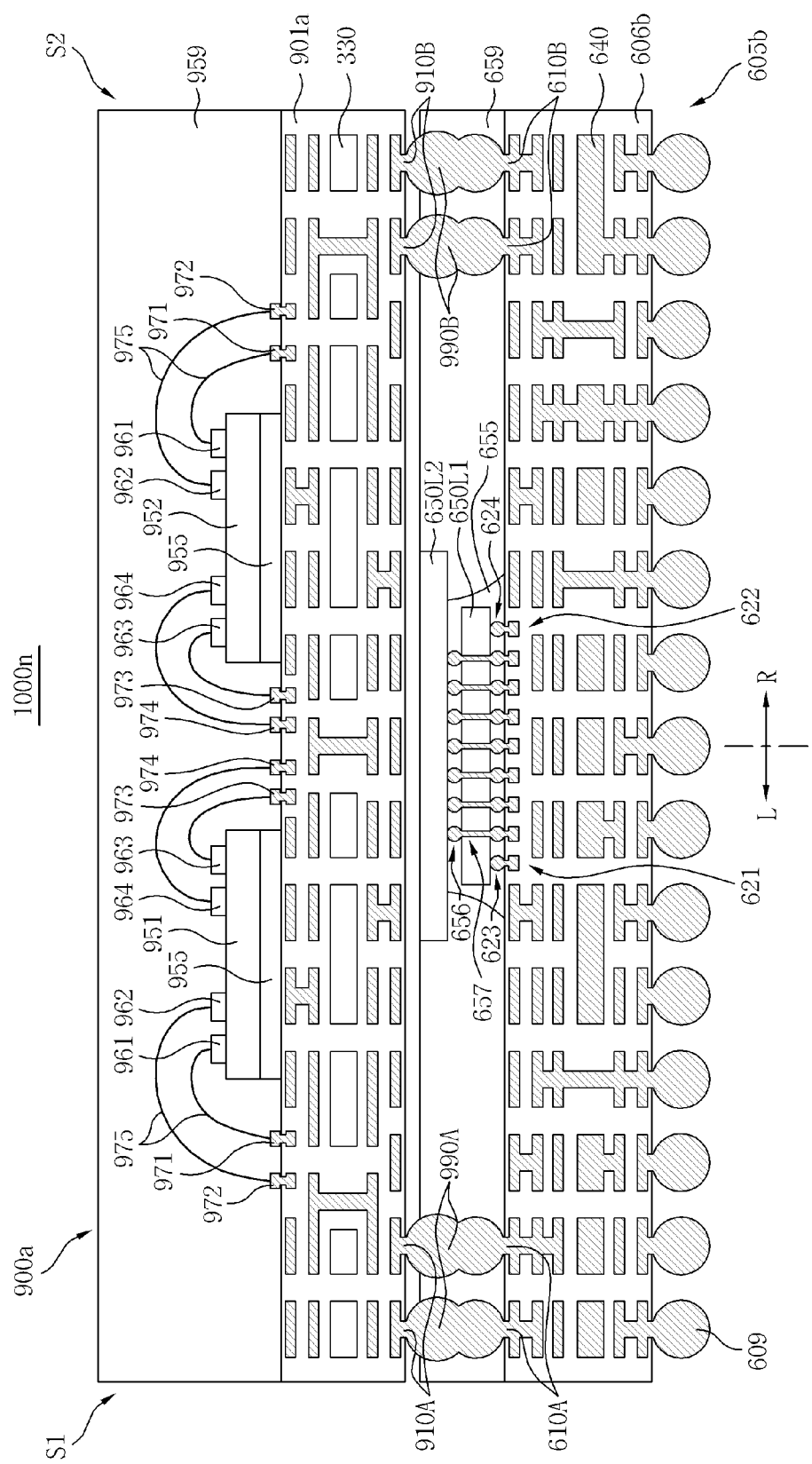
Figure 140:
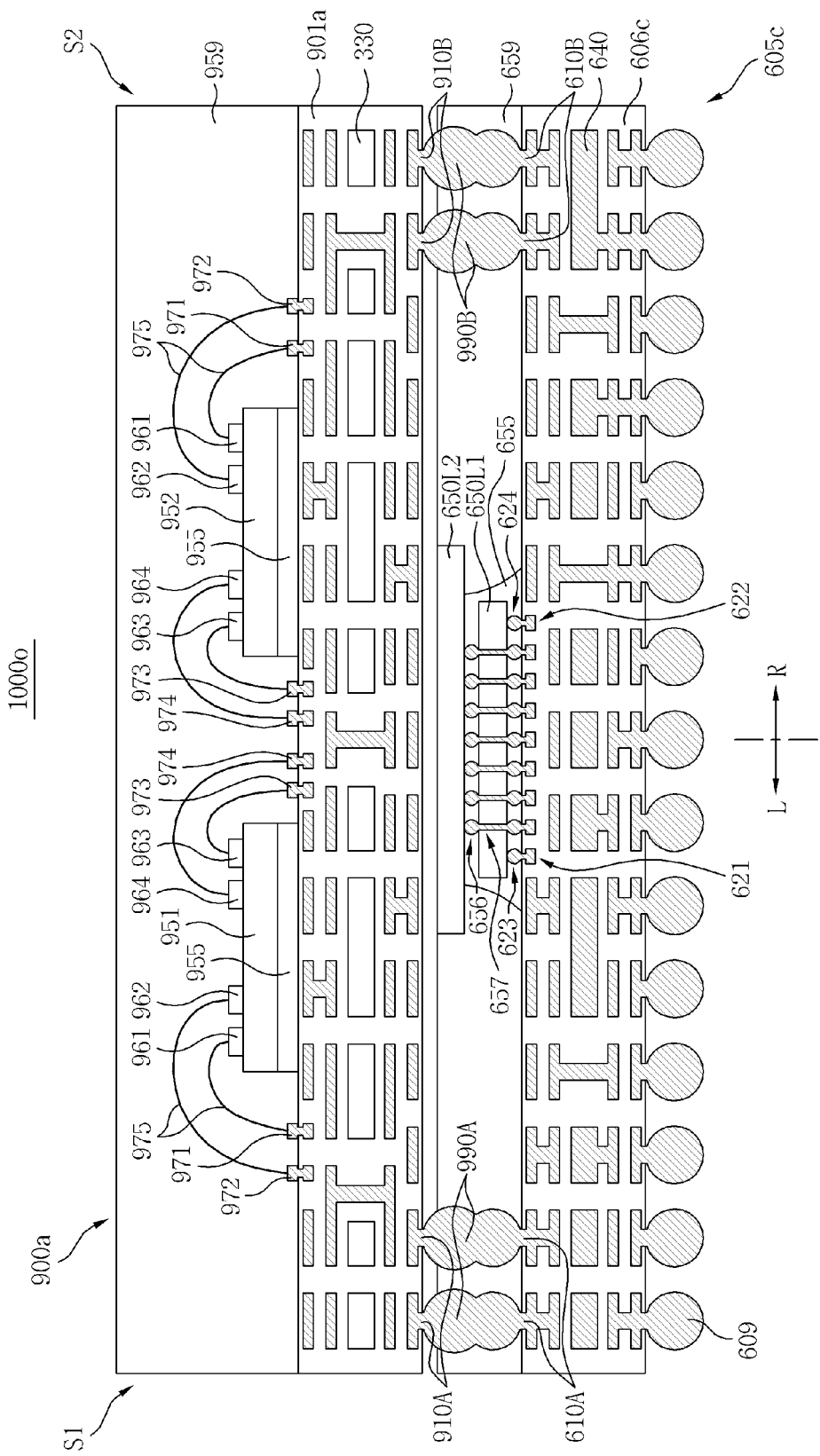
Figure 14P:
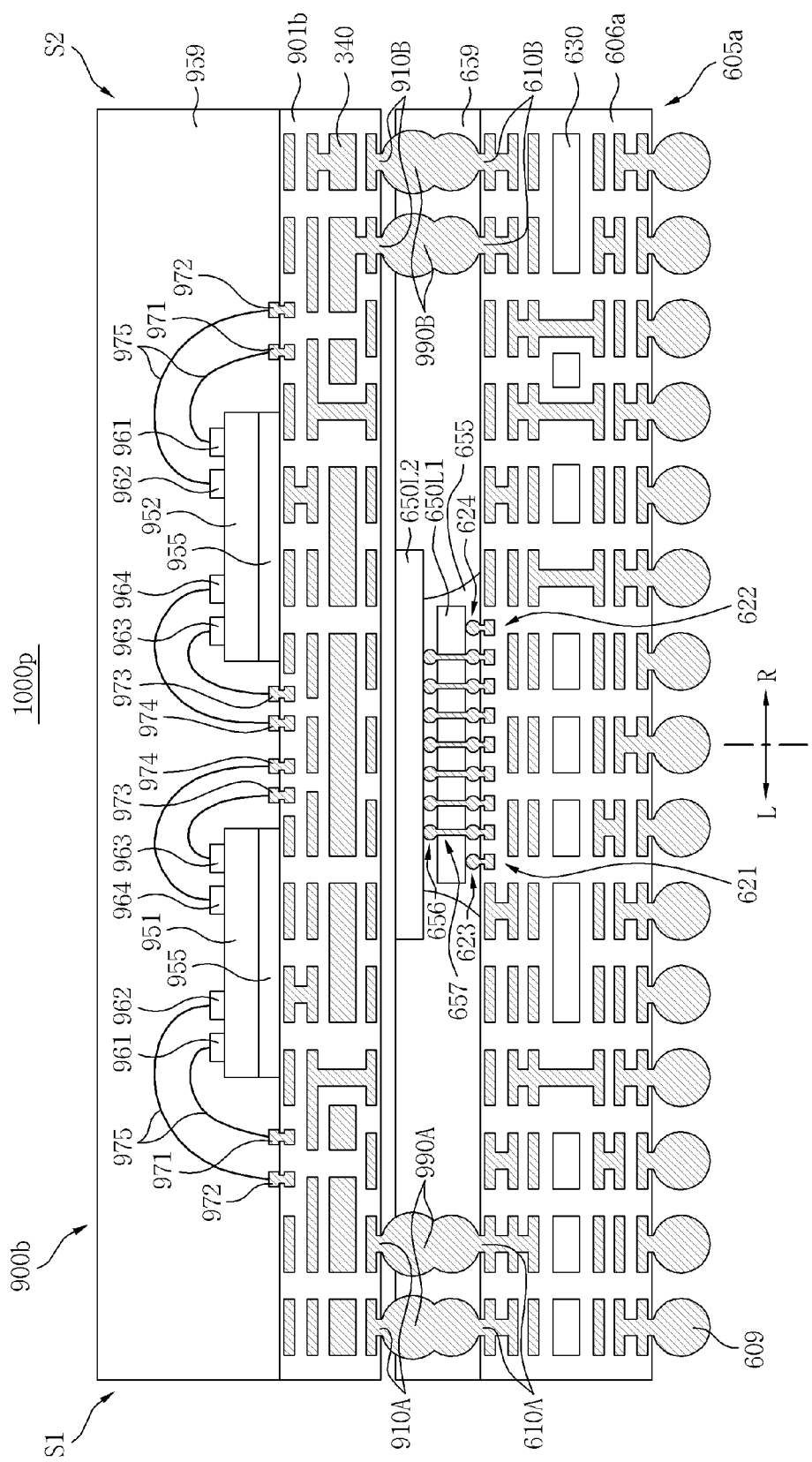
Figure 14Q:
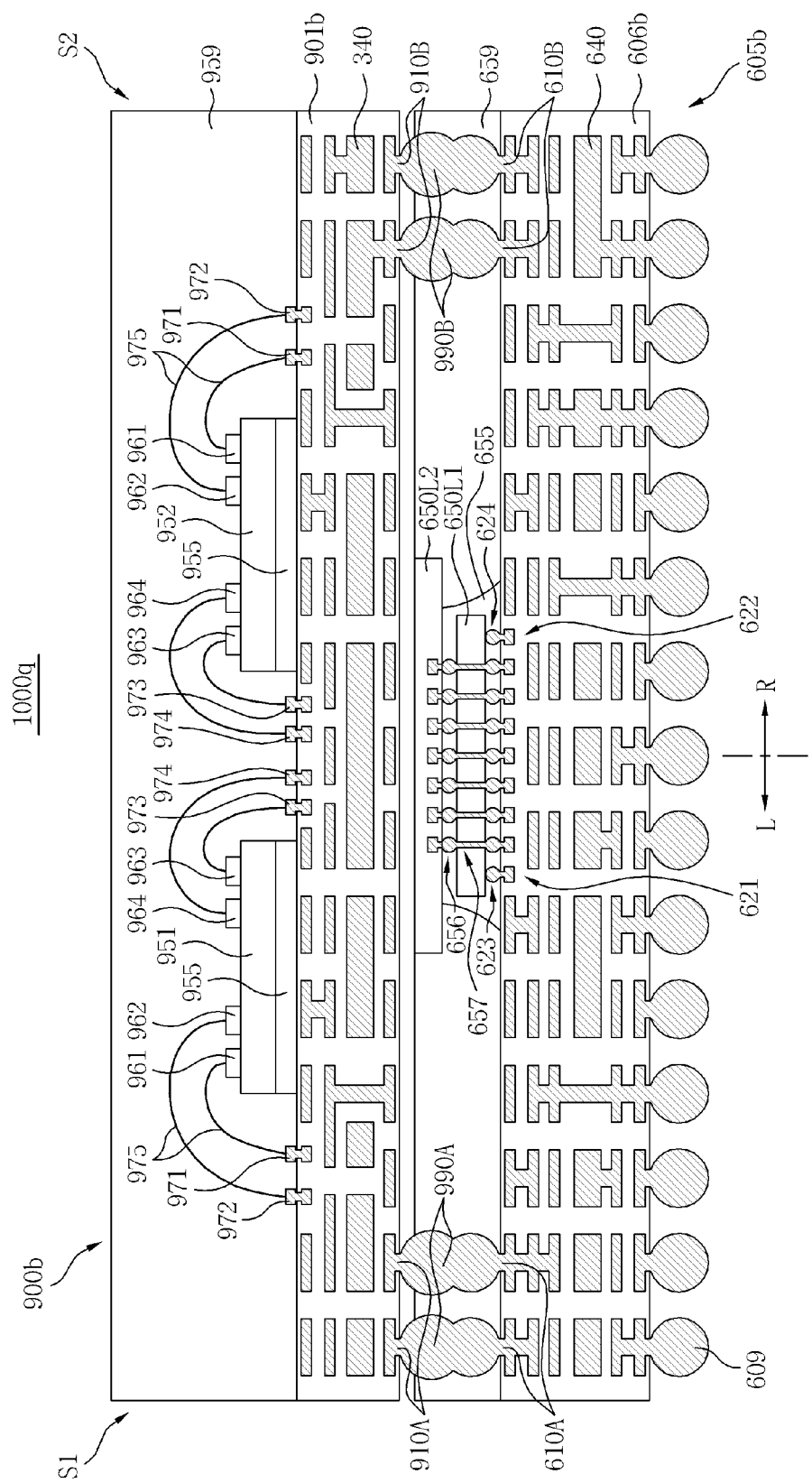
Figure 14R:
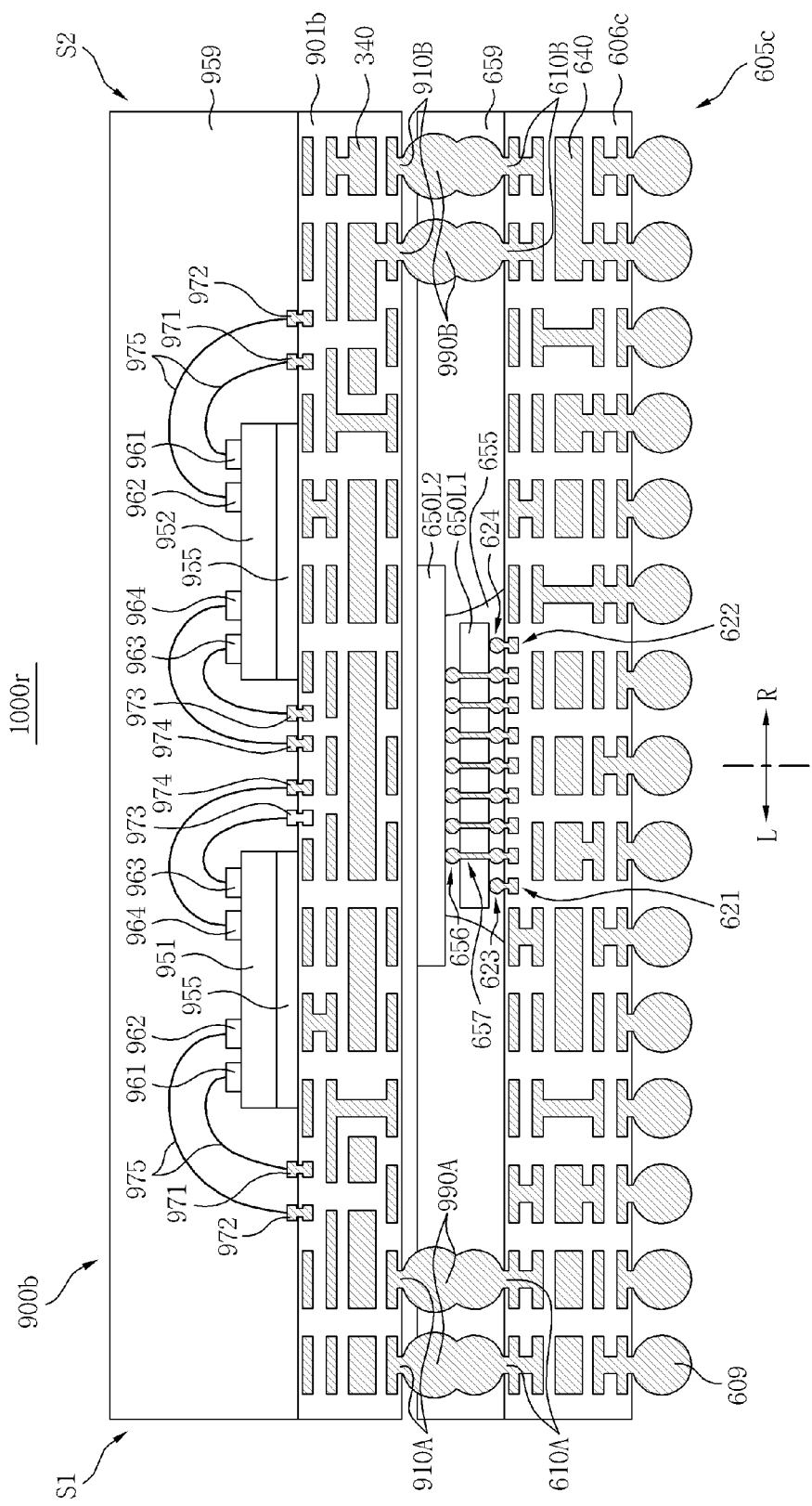
Figure 14S:
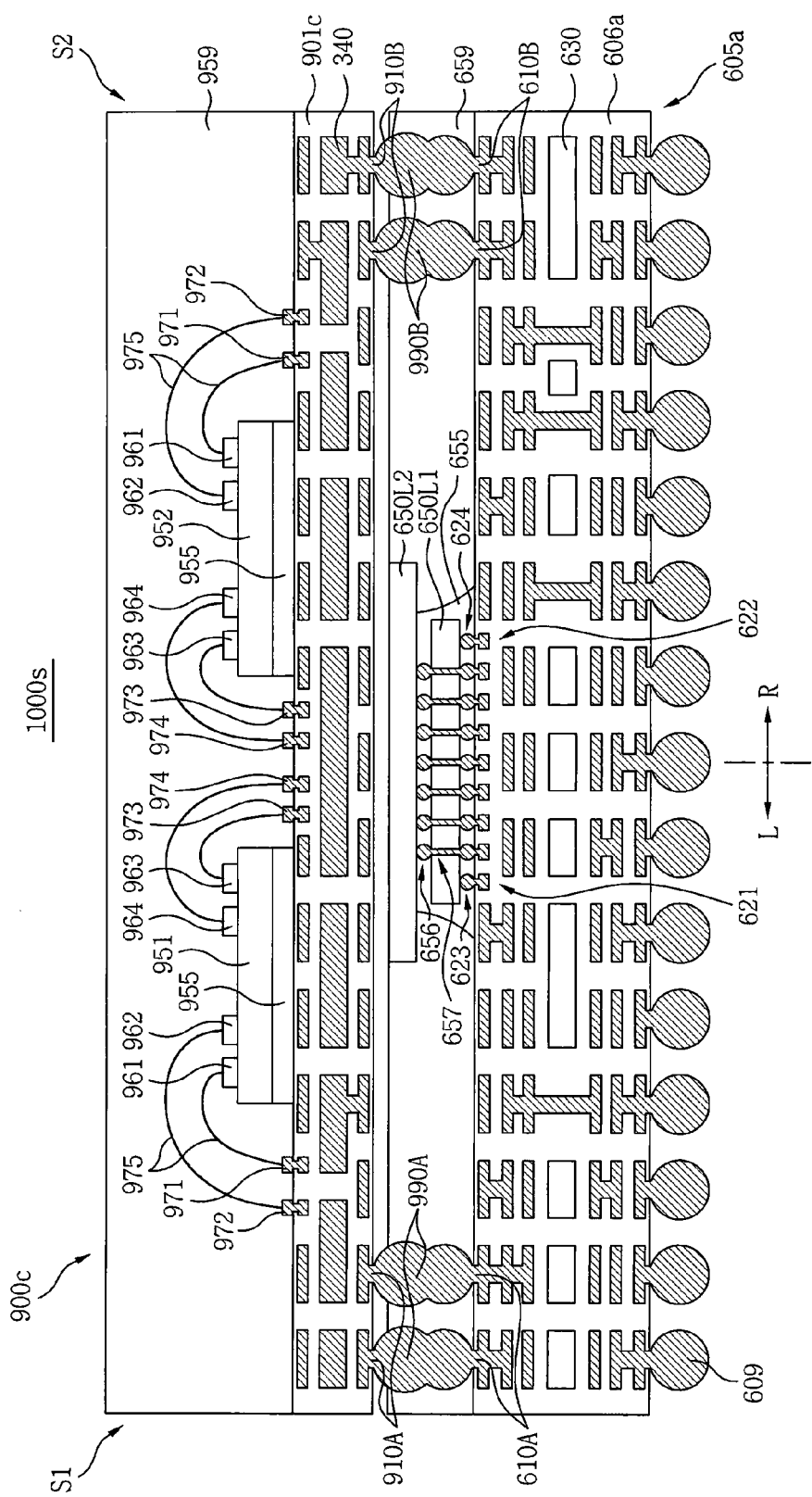
Figure 14T:
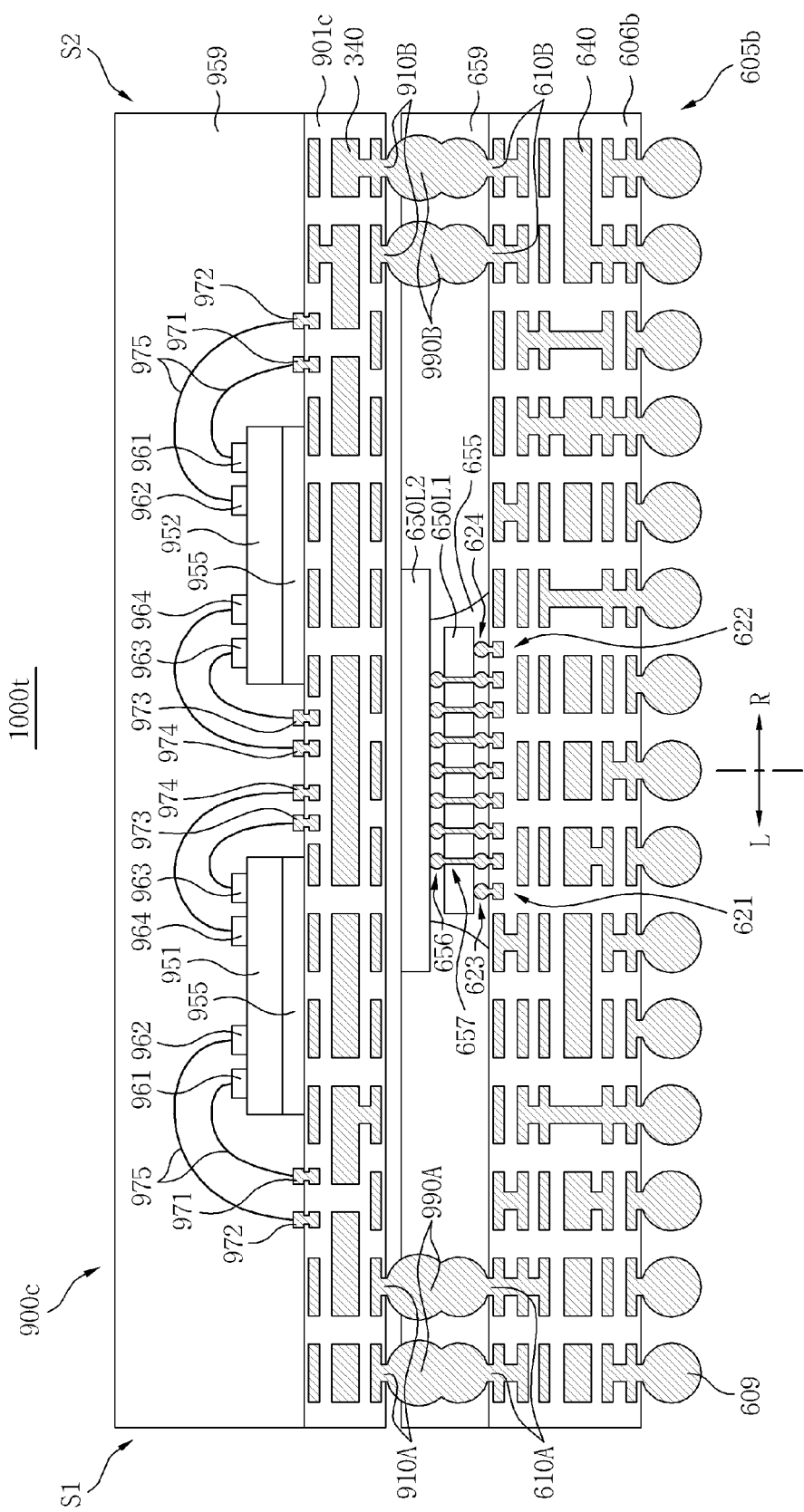
Figure 14U:
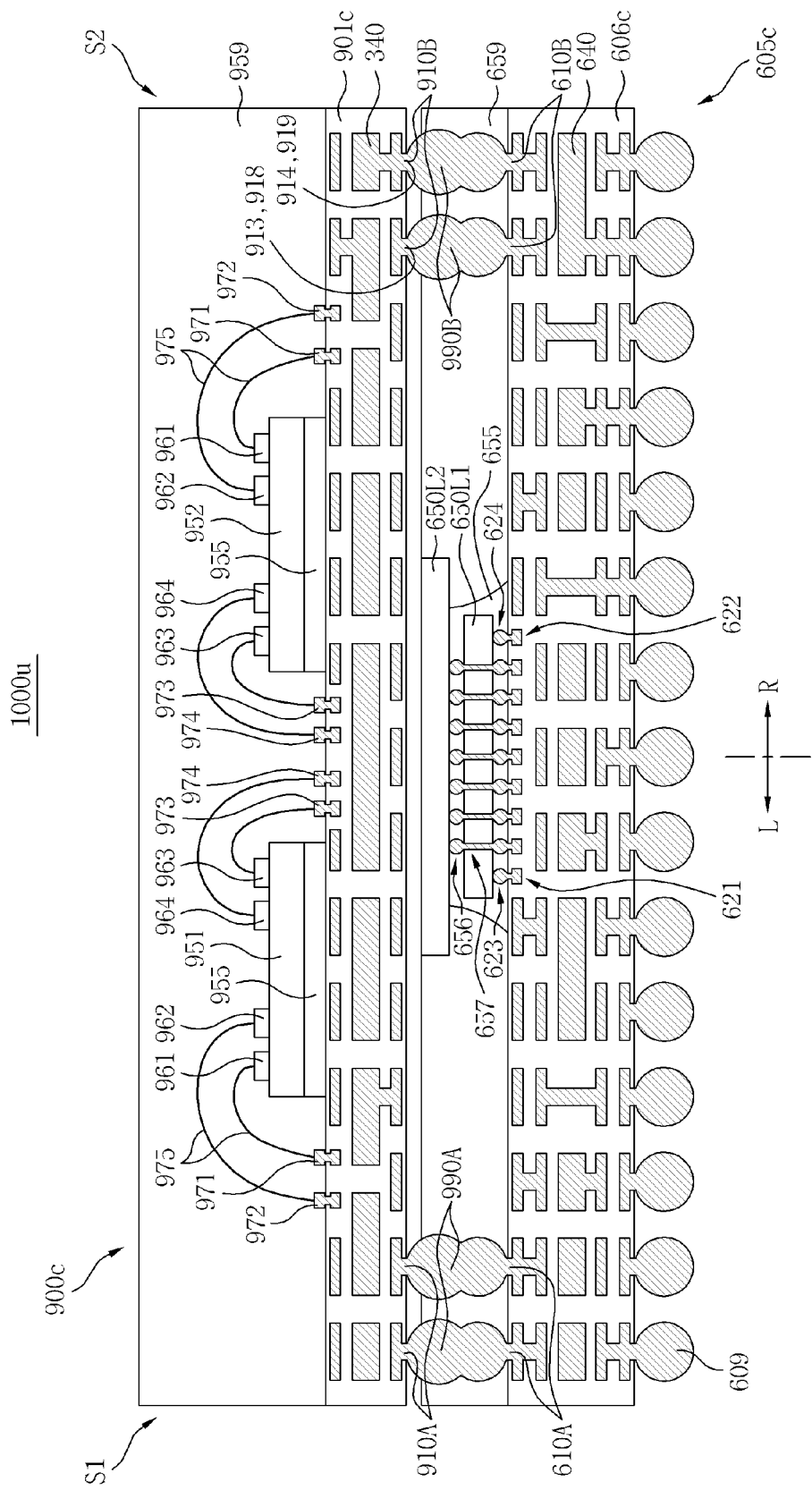

FIGS. 14A through 14U are lateral cross-sectional and longitudinal cross-sectional views of package stack structures of various embodiments of the inventive concept. FIGS. 14A through 14U illustrate various shapes of inter-package connectors. In the present application, the shapes of the inter-package connectors shown in FIGS. 14A through 14U are not limited to the specific embodiments disclosed in FIGS. 14A through 14U, but may also be applied to the other embodiments disclosed in the present disclosure and other modifications thereof.

Referring to FIGS. 14A through 14U, each of package stack structures 1000a to 1000u according to various embodiments of the inventive concept may include one of upper packages 900a to 900f, one of lower packages 605a to 605c, and inter-package connectors 990A and 990B.

Respective components of the upper and lower packages 900a to 900f and 605a to 605c may be understood in further detail with reference to other appended drawings. The inter-package connectors 990A and 990B may include inter-package connectors 990A having a first characteristic described above and inter-package connectors 990B having a second characteristic described above. In some embodiments, the inter-package connectors 990A having the characteristic may transmit or provide data signals; reference voltages (or supply voltages) for a data circuit; and address/control signals of the upper semiconductor devices 951 and 952. The inter-package connectors 990A having the first characteristic may be disposed near a first side (or a first edge) 51 or left side of each of the package stack structures 1000a to 1000u or asymmetrically disposed in a left half portion L thereof. The inter-package connectors 990B having the second characteristic may provide reference voltages (or supply voltages) for an address/control circuit. The inter-package connectors 990B having the second characteristic may be disposed near a second side S2 or right side (or second edge) of each of the package stack structures 1000a to 1000u or asymmetrically disposed in a right half portion R thereof. The inter-package connectors 990A and 990B may be formed in various shapes. The various shapes of the inter-package connectors 990A and 990B will be described in detail later with reference to FIGS. 15A through 15D.

Referring to FIGS. 14A through 14C and 14M to 14O, the upper package substrate 901a may include an insulating core layer 330. Referring to FIGS. 14D to 14I and 14P to 14U, each of upper package substrates 901b, 901c, 501f, 501g, and 501h may include a metal core layer 340.

Referring to FIGS. 14A, 14D, 14G, 14M, 14P, and 14S, a lower package substrate 606a may include an insulating core layer 630. Referring to FIGS. 14B and 14C, 14E and 14F, 14H and 14I, 14N and 14O, 14Q and 14R, and 14T and 14U, each of lower package substrates 606b and 606c may include a metal core layer 640.

FIGS. 15A through 15D are schematic views of inter-package connectors according to various embodiments of the inventive concept.

Figure 15A:
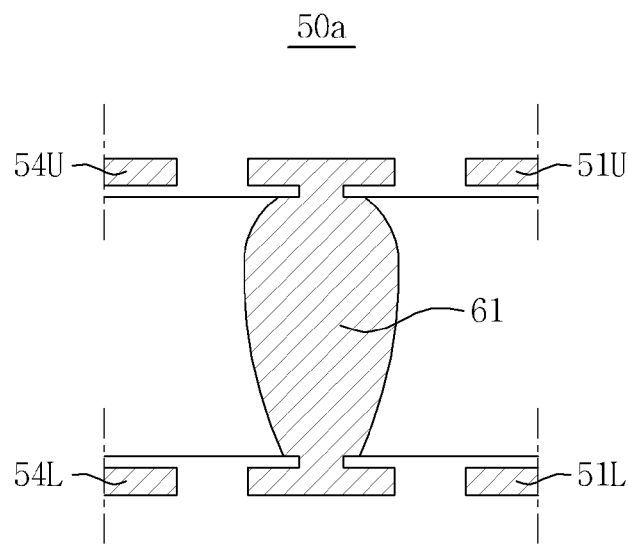
FIGS. 15A through 15D are schematic views of inter-package connectors according to various embodiments of the inventive concept.

Referring to FIG. 15A, an inter-package connector 61 according to an embodiment of the inventive concept may be formed between an upper package substrate 51U and a lower package substrate 51L. Specifically, the inter-package connector 61 may be electrically connected to an upper metal layer 54U and an upper land 55U of the upper package substrate 51U and electrically connected to a lower metal layer 54L and a lower land 55L of the lower package substrate 51L. The inter-package connector 61 may have an upper part having a volume greater than the volume of a lower part. The entire inter-package connector 61 may form a single body.

Figure 15B:
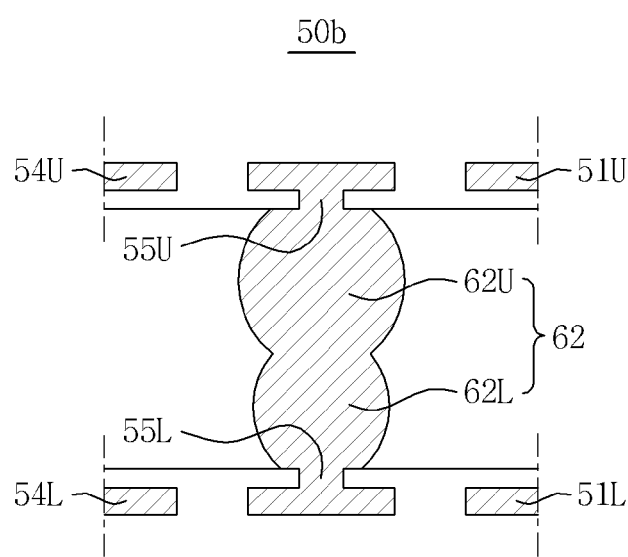

Referring to FIG. 15B, an inter-package connector 62 according to an embodiment of the inventive concept may include an upper inter-package connector 62U having a relatively great volume and a lower inter-package connector 62L having a relatively small volume. When the lower inter-package connector 62L has the relatively small volume, a horizontal pitch of the lower inter-package connector land 55L may be reduced. Accordingly, the inter-package connector 52 may be formed to a smaller horizontal pitch.

Figure 15C:
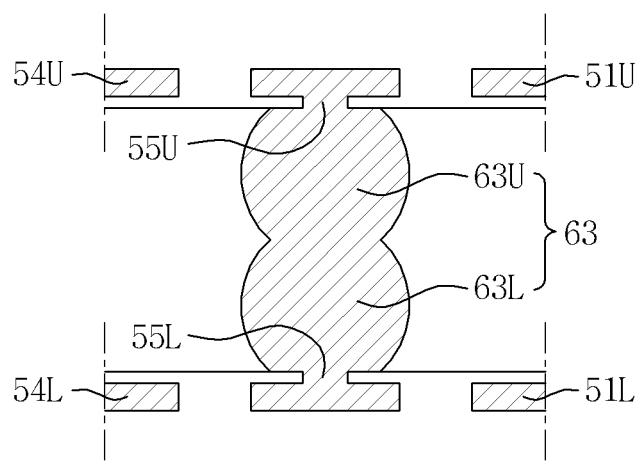

Referring to FIG. 15C, an inter-package connector 63 according to an embodiment of the inventive concept may include an upper inter-package connector 63U having a relatively small volume and a lower inter-package connector 63L having a relatively large volume.

Figure 15D:
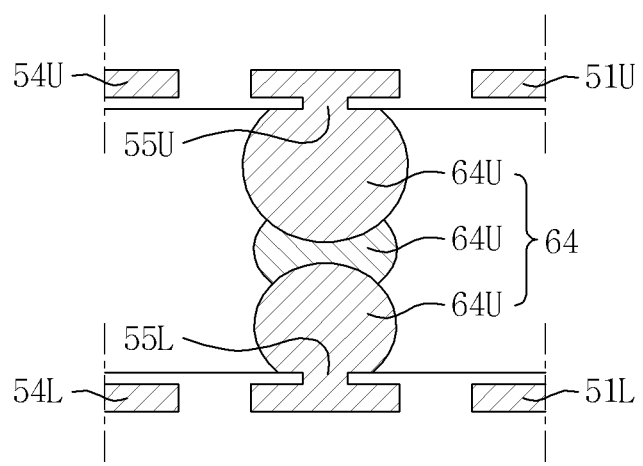

Referring to FIG. 15D, an inter-package connector 64 according to an embodiment of the inventive concept may include an upper inter-package connector 64U, an intermediate inter-package connector 64M, and a lower inter-package connector 64L. When the inter-package connector 64 according to the present embodiment has a very small horizontal pitch, the inter-package connector 64 (formed from the combination of the upper, intermediate, and lower inter-package connectors 64U, 64M, and 64L) may have a relatively large length and a small horizontal width.

Figure 16A:
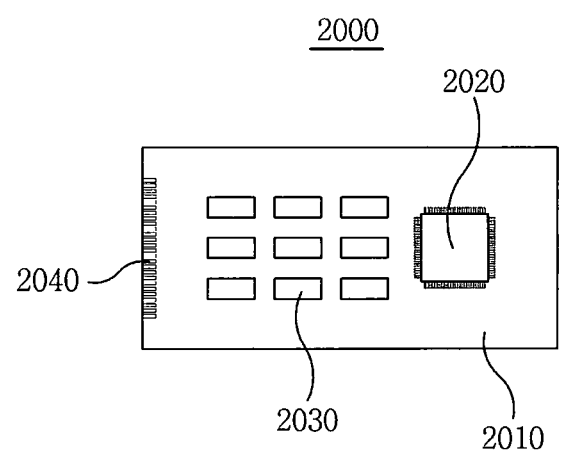
FIGS. 16A and 16B are schematic views of a module according to some embodiments of the inventive concept.
Figure 16B:
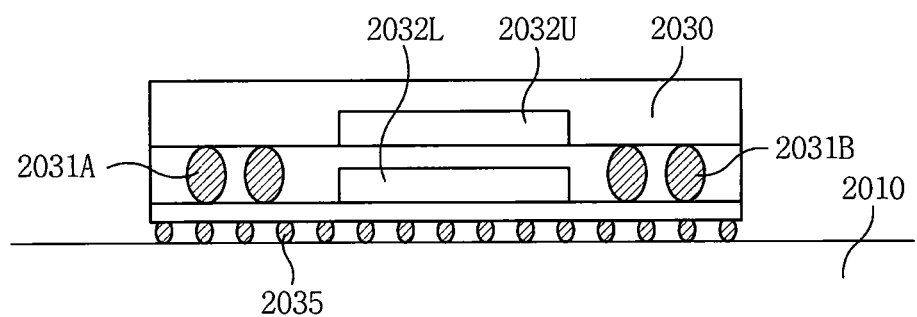

Referring to FIGS. 16A and 16B, a module 2000 according to an embodiment of the inventive concept may include package stack structures 2030 mounted on a module substrate 2010, according to various embodiments of the inventive concept. The module substrate 2000 may further include an MP 2020 mounted on the module substrate 2010. I/O terminals 2040 may be disposed on at least one side of the module substrate 2010. The package stack structures 2030 may be mounted on the module substrate 2010 using a flip-chip technique. For example, the package stack structure 2030 and the module substrate 2010 may be electrically connected to each other by board connectors 2035. The package stack structure 2030 may include an upper semiconductor device 2032U and a lower semiconductor device 2032L. The upper semiconductor device 2032U may include a memory semiconductor device, while the lower semiconductor device 2032L may include a logic semiconductor device.

The package stack structure 2030 may include conductive connectors 2031A having a first characteristic and conductive connectors 2031B having a second characteristic disposed therein. The conductive connectors 2031A having the first characteristic may transmit electric signals to enable communication between the upper and lower semiconductor devices 2032U and 2032L. For example, the conductive connectors 2031A having the first characteristic may transmit or provide data signals, reference voltages for a data circuit, and/or address/control signals. Accordingly, some of the conductive connectors 2031A having the first characteristic may not be directly connected to the board connectors 2035. For example, the conductive connectors 2031A having the first characteristic configured to transmit the data signal and address/control signals may not be directly connected to the board connectors 2035. However, the conductive connectors 2031A having the first characteristic configured to provide the reference voltages for a data circuit may be directly connected to the board connectors 2035. Also, the conductive connectors 2031B having the second characteristic may be electrically connected to the upper semiconductor device 2032U but may not be directly connected to the lower semiconductor device 2032L. For instance, the conductive connectors 2031B having the second characteristic may be directly connected to the board connectors 2035. However, the conductive connectors 3031B having the second characteristic configured to provide reference voltages (or supply voltages) for an address/control circuit may be connected to the lower semiconductor device 2032L. The above-described embodiments may be modified in various ways within the spirit and scope of the present disclosure as needed.

Figure 17:
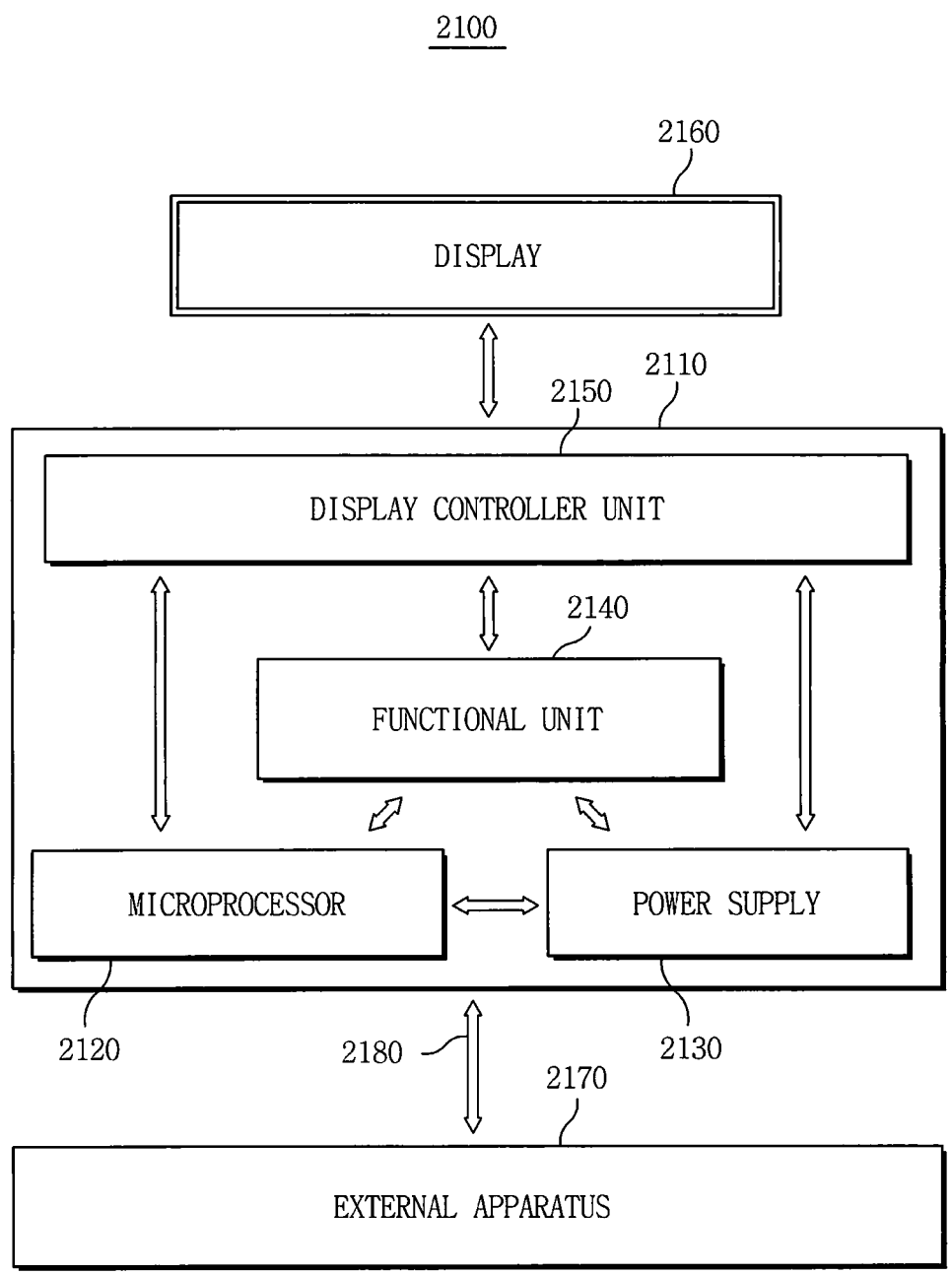
FIG. 17 is a block diagram of an electronic system according to some embodiments of the inventive concept.

Referring to FIG. 17, various semiconductor devices, package substrates, semiconductor packages, and/or package stack structures according to some embodiments of the inventive concept may be employed in an electronic system 2100. The electronic system 2100 may include a body 2110, an MP unit 2120, a power supply unit 2130, a functional unit 2140, and/or a display controller 2150. The body 2110 may be a system board or mother board having a printed circuit board (PCB). The MP unit 2120, the power supply unit 2130, the functional unit 2140, and the display controller 2150 may be mounted on the body 2110. A display unit 2160 may be disposed on a top surface of the body 2110 or outside the body 2110. For example, the display unit 2160 may be disposed on the surface of the body 2110 and display an image processed by the display controller 2150.

The power unit 2130 may receive a predetermined voltage from an external power source, divide the voltage into voltages having various voltage levels, and supply the divided voltages to the MP unit 2120, the functional unit 2140, and the display controller 2150. The MP unit 2120 may receive a voltage from the power supply unit 2130 and control the functional unit 2140 and the display unit 2160. The functional unit 2140 may serve various functions of the electronic system 2100. For example, when the electronic system 2100 is a mobile electronic product, such as a mobile phone, the functional unit 2140 may include several components for performing wireless communication functions, such as the output of an image to the display unit 216 or the output of voices to a speaker, by dialing or communication with an external apparatus 2170. Also, when the electronic system 2100 includes a camera, the electronic system 2100 may serve as an image processor.

In some embodiments, when the electronic system 2100 is connected to a memory card to increase the capacity thereof, the functional unit 2140 may be a memory card controller. The functional unit 2140 may transmit and receive signals to and from the external apparatus 2170 through a wired or wireless communication unit 2180. Furthermore, when the electronic system 2100 requires a universal serial bus (USB) to expand functions thereof, the functional unit 2140 may serve as an interface controller.

Semiconductor devices, package substrates, semiconductor packages, and/or package stack structures described in the various embodiments of the inventive concept may be included in at least one of the MP unit 2120 and the functional unit 2140.

Figure 18:
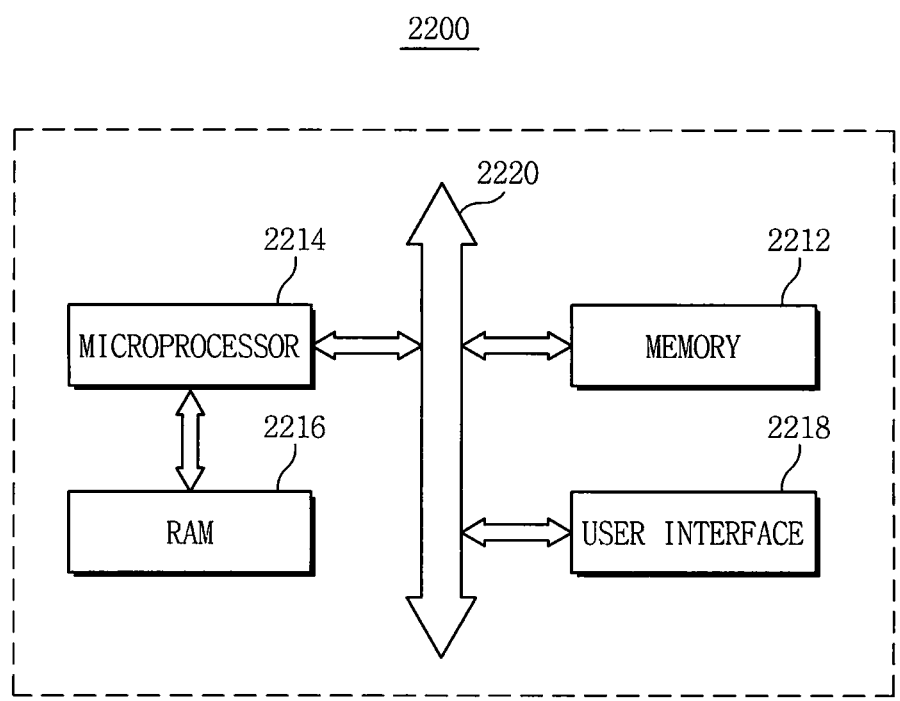
FIG. 18 is a schematic view of an electronic system in which the semiconductor device or a package stack structure according to some embodiments of the inventive concept is used.

FIG. 18 is a schematic view of an electronic system 2200 in which the semiconductor device according to an embodiment of the inventive concept is used. Referring to FIG. 18, the electronic system 2200 may include a semiconductor device or a semiconductor stack package according to example embodiments. The electronic system 2200 may be used to manufacture a mobile device or a computer. For example, the electronic system 2200 may include a memory system 2212, a microprocessor 2214, RAM 2216, and a user interface

2218, which may execute data communication using a bus 2220. The microprocessor 2214 may execute the program and control the electronic system 2200. The RAM 2216 may be used as an operation memory of the processor 2214. For example, the processor 2214 or the RAM 2216 may include a semiconductor device or a semiconductor stack package according to example embodiments. The processor 2214, the RAM 2216 and/or other components may be assembled in a single package. The user interface 2218 may be used in inputting/outputting data to/from the electronic system 2200. The memory system 2212 may store codes for operating the processor 2214, data processed by the processor 2214, or externally input data. The memory system 2212 may include a controller and a memory.

Figure 19:
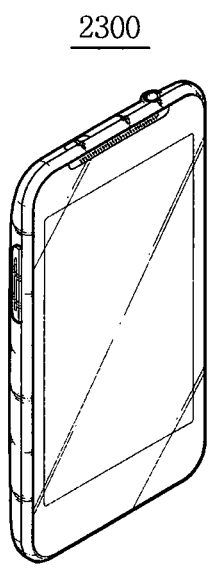
FIG. 19 is a schematic view of a mobile phone in which the electronic system according to an embodiment of the inventive concept is used.

FIG. 19 is a schematic view of a mobile wireless phone 2300 in which the electronic system (2200 of FIG. 18) according to an embodiment of the inventive concept may be used. Additionally, the electronic system (2200 of FIG. 18) may be used for a portable notebook computer, an mpeg-1 audio layer 3 (MP3) player, an MP4 player, a navigation device, a solid state disk (SSD), table PC, automobiles or household appliances.

Figure 20A:
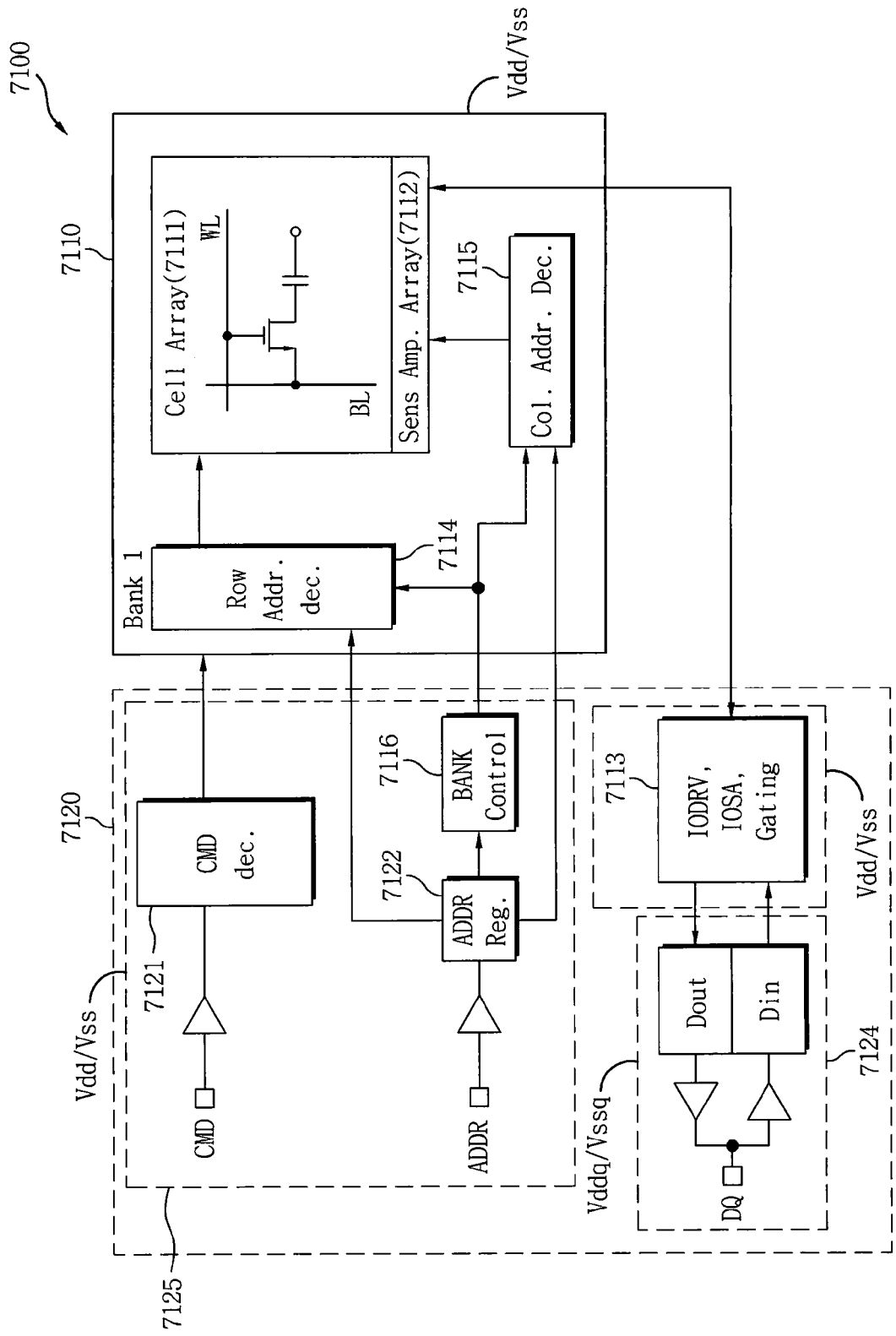
FIG. 20A is a block diagram of an exemplary master semiconductor chip according to one embodiment of the inventive concept.

FIG. 20A is a block diagram of an exemplary master semiconductor chip 7100 according to one embodiment. Referring to FIG. 20A, the semiconductor chip 7100 includes a memory cell region 7110, and a peripheral region 7120. In one embodiment, the memory cell region 7110 may be a memory bank that includes a memory cell array 7111, a sense amplifier array 7112, a row address decoder 7114, and a column address decoder 7115.

In one embodiment, the peripheral region 7120 may include an address/control circuit 7125 discussed above. Also, some of the inter-package connectors discussed above may be configured to provide a supply voltage (or reference voltage) for the address/control circuit 7125. Further, the peripheral region 7120 may additionally include a data circuit 7124 electrically coupled to gating circuitry 7113. Also, some of the inter-package connectors discussed above may be configured to provide a supply voltage for the data circuit 7124 as discussed above.

In another embodiment, as discussed above, some of bonding pads discussed above may be configured to provide a supply voltage (or a reference voltage) for the address/control circuit 7125. Also, some of the bonding pads discussed above may be configured to provide the supply voltage for the data circuit 7124.

In detail, the peripheral region 7120 may include the address/control circuit 7125 having a command decoder 7121 that decoders an external command signal, an address register 7122, and a bank controller 7116. The peripheral region 7120 may also include the data circuit 7124, and an input/output (I/O) driver, an I/O sense amplifier, and the gating circuitry 7113.

In one embodiment, the semiconductor chip 7100 may include multiple memory banks, in which case, the bank controller 7116 may be used to select one of the banks.

In one embodiment, different portions of the master semiconductor chip 7100 receive power independently of each other. For example, the data circuit 7124 may receive a voltage of Vddq and Vssq from a first power source, while the remainder of peripheral 7120 receives a voltage of Vdd and Vss from a second power source. In addition, the memory cell region 7110 of master semiconductor chip 7100 may receive a voltage that is the same as the Vdd and Vss voltage, received from the same power source as the remainder of the peripheral region 7120 or received from a different power source. In one embodiment, Vddq and Vssq may be dedicated to circuit for the data circuit 7124, and thus are electrically isolated within the chip from other portions of the chip. That is, Vddq and Vssq are not electrically connected to any other circuitry other than the data input/output circuitry in the peripheral region of the master semiconductor chip 7100. In one embodiment, Vddq has a lower voltage value than Vdd, in order to reduce the power consumption in the data input/output circuit.

Figure 20B:
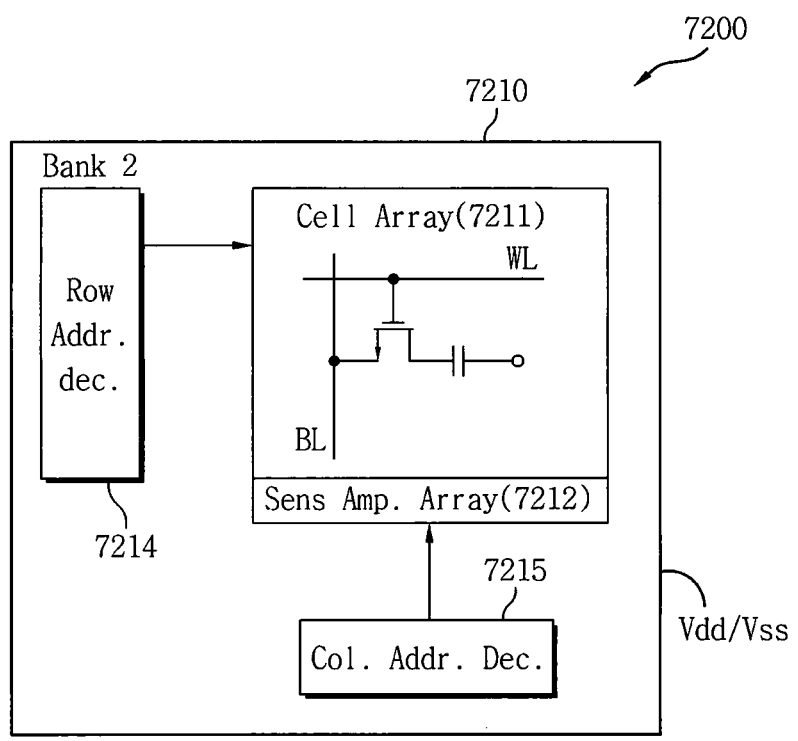
FIG. 20B is a block diagram of an exemplary slave semiconductor chip according to another embodiment of the inventive concept.

FIG. 20B is a block diagram of an exemplary slave semiconductor chip 7200 according to one embodiment. Referring to FIG. 20B, the slave semiconductor chip is a second chip that includes only a memory cell region 7210 and a pad region, but not a peripheral region 7120 such as in master semiconductor chip 7100. In one embodiment, the memory cell region 7210 may be a memory bank that includes a memory cell array 7211, a sense amplifier array 7212, a row address decoder 7214, and a column address decoder 7215.

Figure 20C:
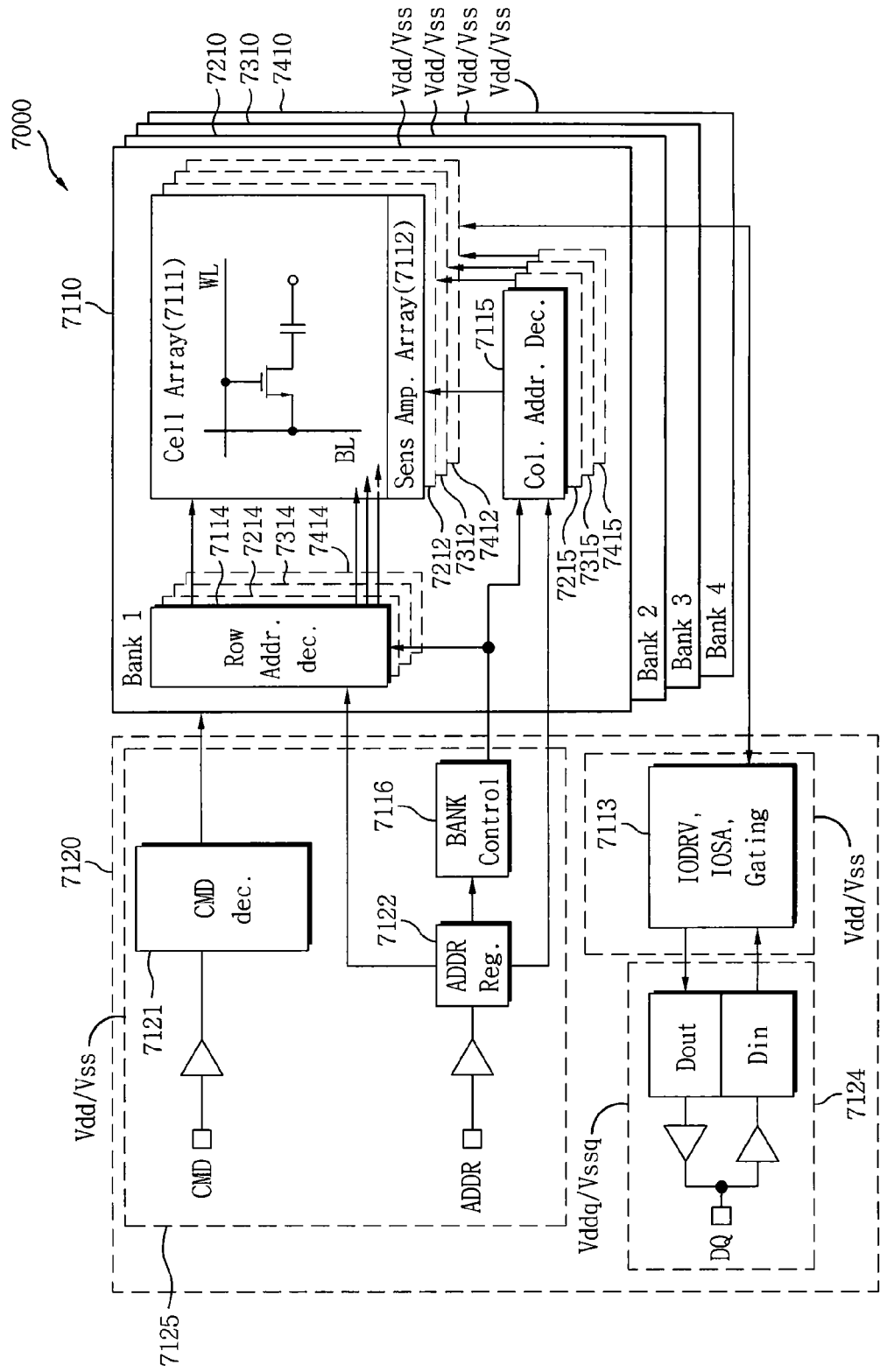
FIG. 20C is a block diagram of an exemplary semiconductor package according to yet another embodiment of the inventive concept.

In one embodiment, these elements have the same layout as the respective elements in the master semiconductor chip 7100 shown in FIG. 20A. In one embodiment, the slave semiconductor chip 7200 receives from a power source the same voltage Vdd and Vss as the Vdd and Vss applied to the memory cell region 7110 of the master semiconductor chip 7100. Alternatively, different voltages may be applied to the slave semiconductor chip 7200 compared to master semiconductor chip 7100. FIG. 20C is a block diagram of an exemplary semiconductor device 7000 according to some embodiments. In one embodiment, the semiconductor device 7000 includes a set of chips, including a master semiconductor chip 7100 including a memory cell region 7110 and a peripheral region 7120 (including a pad region) such as discussed above in connection with FIG. 20A, and a set of additional slave semiconductor chips 7200 including memory cell regions 7210, 7310, 7410, etc., and pad regions such as described above in connection with FIG. 20B. Although only three additional semiconductor chips 7210, 7310, 7410 are shown, semiconductor device 7000 may include further additional semiconductor chips.

As shown in FIG. 20C, each additional semiconductor chip may include a memory cell region (7210, 7310, 7410), including a cell array (7211, 7311, 7411), a sense amplifier array (7212, 7312, 7412), a column address decoder (7215, 7315, 7415), and a row address decoder (7214, 7314, 7414). Each additional semiconductor chip can be controlled by the peripheral circuit of the master semiconductor chip. For example, commands are received at each additional semiconductor chip from the command decoder 7121, an address is received at each additional semiconductor chip from the address register 7122, a chip (or memory bank, as the chips are labeled) may be selected using the bank controller 7116, and input and output data can be controlled by the data circuit 7124 and the input/output (I/O) driver, I/O sense amplifier, and the gating circuitry 7113.

In one embodiment, the slave semiconductor chips may include multiple memory banks, in which case, the bank controller 7116 may be used to select one of the banks. The supply voltage Vdd and/or ground voltage Vss that may be applied to the master semiconductor chip and the additional slave semiconductor chips may be used to drive the memory cell regions or peripheral regions. However, when the supply voltage Vdd and/or the ground voltage Vss are used to drive the memory cell regions, noise generated in the supply voltage Vdd and/or the ground voltage Vss may degrade memory performance. Thus, as described in the above previous embodiments, a path in which the supply voltage Vdd and/or the ground voltage Vss is applied to the master semiconductor chip may be a dedicated, electrically isolated path compared to a path in which the supply voltage Vdd and/or the ground voltage Vss is applied to the slave semiconductor chips.

Furthermore, the supply voltage Vdd and/or the ground voltage Vss may be applied to various blocks of the memory cell regions from the outside. In some cases, the degree of degradation in memory performance when a supply voltage Vdd and/or a ground voltage Vss containing noise is applied to some blocks of the memory cell regions, may be different than when the supply voltage Vdd and/or the ground voltage Vss containing noise is applied to the other blocks. Thus, in one embodiment, the supply voltage Vdd and/or the ground voltage Vss may be applied to some blocks of the memory cell regions of the master semiconductor chip and the slave semiconductor chips in the same path and is applied to the other blocks of the memory cell regions of the master semiconductor chip and the slave semiconductor chips in different paths. For example, even if the supply voltage Vdd and/or the ground voltage Vss containing noise is applied to the row address decoders 7114, 7214, 7314, and 7414 and the column address decoders 7115, 7215, 7315, and 7415, the degree of degradation in memory performance is relatively small. Thus, the supply voltage Vdd and/or the ground voltage Vss may be applied to the row address decoder 7114 of the master semiconductor chip and the row address decoders 7214, 7314, and 7414 of the slave semiconductor chips via the same electrical path (i.e., through TSVs in an aligned stack that is electrically connected to each of the four semiconductor chips). Also, the supply voltage Vdd and/or the ground voltage Vss may be applied to the column address decoder 7115 of the master semiconductor chip and the column address decoders 7215, 7315, and 7415 of the slave semiconductor chips in the same path. To this end, the supply voltage Vdd or the ground voltage Vss is applied to the row address decoder 7114 or the column address decoder 7115 of the master semiconductor chip through a second via (not shown) on the master semiconductor chip. Also, the supply voltage Vdd or the ground voltage Vss may be applied to the row address decoders 7214, 7314, and 7414 or the column address decoders 7215, 7315, and 7415 of the slave semiconductor chips through the third via (not shown) that are formed on the slave semiconductor chips and are electrically connected to the second via. However, when noise occurs in the supply voltage Vdd and/or the ground voltage Vss applied to a memory bank or a sense amplifier, memory performance is degraded greatly. Thus, the supply voltage Vdd and/or the ground voltage Vss may be applied to the memory bank 7111 and the sense amplifier 7112 of the master semiconductor chip in a path different from and electrically isolated from the path in which the supply voltage Vdd and/or the ground voltage Vss are applied to the slave semiconductor chips. For example, the supply voltage Vdd or the ground voltage Vss is applied to the memory bank 7111 or the sense amplifier 7112 of the master semiconductor chip through a first via (not shown) on the master semiconductor chip but is applied to the memory banks 7211, 7311, and 7411 or the sense amplifiers 7212, 7312, and 7412 of the slave semiconductor chips through the second via that is insulated from the first via and is formed on the master semiconductor chip and through the third vias on the slave semiconductor chips.

In some embodiments, a package stack structure comprises: an upper package, a lower package, and a plurality of inter-package connectors; the upper package comprising an upper package substrate and an upper semiconductor device mounted on the upper package substrate, where the upper semiconductor device comprises a plurality of functional conductive elements configured to communicate with the upper package substrate through a plurality of connections, the functional conductive elements configured to provide a first set of functions and a second set of functions different from the first set of functions; the first set of functions comprising one or more functions selected from the group comprising: transmitting data signals, providing a reference voltage for a data circuit, and transmitting an address/control signal; the second set of functions comprising one or more functions selected from the group comprising: providing a supply voltage or reference voltage (Vss/Vdd) for an address/control circuit, and providing element/package reference voltages; the upper package further comprising first and second upper inter-package connector lands disposed on a bottom surface of the upper package substrate, the first upper inter-package connector lands disposed exclusively on a first region of the bottom surface of the upper package substrate, and the second set of upper inter-package connector lands disposed exclusively on a second region of the bottom surface of the upper package substrate, the second region disposed generally opposite the first region, where the upper package substrate comprises a plurality of conductive routing patterns configured to route the connections with the upper semiconductor device such that the functional conductive elements corresponding to the first set of functions communicate with the first upper inter-package connector lands, and such that the functional elements corresponding to the second set of functions communicate with the second inter-package connector lands.

In some embodiments, a package stack structure comprises: an upper package comprising a first corner connecting a first edge and a third edge, a second corner connecting the first edge and a fourth edge, a third corner connecting the third edge and a second edge, and a fourth corner connecting the second edge and the fourth edge; the upper package further comprising a first region arranged adjacent the first corner, a second region located near the second corner, a third region arranged near the third corner, and a fourth region arranged adjacent the fourth corner, and a fifth region arranged near the second edge;

a lower package connected to the upper package through a plurality of inter-package connectors, the inter-package connectors comprising: first inter-package connectors configured to transmit data signals, second inter-package connectors configured to transmit address/control signals, third inter-package connectors configured to provide a supply voltage or reference voltage (Vss/Vdd) for an address/control circuit, and fourth inter-package connectors are configured to provide a supply voltage or reference voltage (Vssq/Vddq) for a data circuit, where the first inter-package connectors exclusively disposed in the first region, the second inter-package connectors exclusively disposed in the first region, the third inter-package connectors exclusively disposed in the first region, the fourth inter-package connectors disposed in the second region.

In some embodiments, a package stack structure comprises: an upper package having a package substrate including a first corner connecting a first edge and a third edge, a second corner connecting the first edge and a fourth edge, a third corner connecting the third edge and a second edge, and a fourth corner connecting the second edge and the fourth edge, where a hypothetical diagonal line (for example, a dotted line 176 shown in FIG. 3J) extends between the first corner and the fourth corner, the diagonal line dividing regions of the upper package into a first region near the first edge and a second region near the second edge; a lower package connected to the upper package through a plurality of inter-package connectors, the inter-package connectors comprising: first inter-package connectors configured to transmit data signals, second inter-package connectors configured to transmit address/control signals, third inter-package connectors configured to provide a supply voltage or reference voltage (Vss/Vdd) for an address/control circuit, and fourth inter-package connectors are configured to provide a supply voltage or reference voltage (Vssq/Vddq) for a data circuit, where a majority the first and second inter-package connectors are disposed in the first region, and wherein a majority of the third inter-package connectors are disposed in the second region.

In some embodiments, a semiconductor package substrate includes a substrate for mounting a semiconductor device thereon. The substrate has a first edge and a second edge opposite to the first edge. The substrate has a first region arranged near the first edge and a second region arranged near the second edge. The substrate also has a plurality of inter-package connectors attached thereto. The plurality of inter-package connectors comprises first inter-package connectors configured to transmit data signals; second inter-package connectors configured to transmit address/control signals; third inter-package connectors configured to provide a supply voltage for an address/control circuit; fourth inter-package connectors configured to provide a supply voltage for a data circuit. A majority of the first and second inter-package connectors may be disposed in the first region. Also, a majority of the third inter-package connectors may be disposed in the second region.

In some embodiments, a method of functionally asymmetrically operating a semiconductor device overlying a package substrate having a first edge and a second edge opposite to the first edge, comprises: transmitting data signals mainly from first bonding pads arranged near the first edge of the package substrate; transmitting address/control signals mainly from second bonding pads arranged near the first edge of the package substrate; and providing a supply voltage or reference voltage (Vss/Vdd) for an address/control circuit through third bonding pads arranged near the second edge of the package substrate.

In some embodiments, a system comprises a package stack structure having an upper package including an upper package substrate having a first edge and a second edge opposite to the first edge, the upper package substrate having a first region arranged near the first edge and a second region arranged near the second edge, the upper package comprising a first upper semiconductor device overlying the upper package substrate; a lower package having a lower package substrate and a lower semiconductor device, the lower package connected to the upper package through a plurality of inter-package connectors, the inter-package connectors comprising: first inter-package connectors configured to transmit data signals; second inter-package connectors configured to transmit address/control signals; third inter-package connectors configured to provide a supply voltage for an address/control circuit; fourth inter-package connectors configured to provide a supply voltage for a data circuit, where a majority of the first and second inter-package connectors are disposed in the first region, and where a majority of the third inter-package connectors are disposed in the second region; a display electrically connected with the package stack structure; and an input/output device coupled to the display device.

In addition, the names and functions of components that have not been shown or described may be easily understood with reference to other drawings of the present specification and descriptions thereof. Also, one skilled in the art will appreciate that a specific portion of any one of the embodiments may be coupled with other embodiments within the spirit and scope of the present disclosure.

A semiconductor device, a package substrate, a semiconductor package, a package stack structure, and an electronic system according to some embodiments of the inventive concept include asymmetric conductive components or a metal core layer so that signal routes of metal layers can be simplified at a package substrate level. For example, the signal routes of the metal layers can be disposed not to overlap one another. Accordingly, signal routes can be routed on a reduced number of metal layers as compared with the conventional case where the signal routes are arranged in a relatively large number of metal layers.

Therefore, electronic components according to the inventive concept can reduce signal loss, suppress occurrence of noise, and increase a signal transmission rate. Further, with embodiments of the present disclosure, thinner and smaller electronic devices compared to the prior art devices can be manufactured as electronic components made employing the concept of the present disclosure need only a small space and are substantially thinner than conventional components.

Embodiments of the present application may also be applied to form ASICs, PLDs/Gate Arrays, DSPs, Graphics and PC chipsets. Also, embodiments of the present application can be used to form a storage device for notebook PCs and sub-notebooks for enterprises, Ultra-Mobile PCs (UMPC), and Tablet PCs.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A package stack structure comprising:
an upper package comprising an upper package substrate having a first edge and a second edge opposite to the first edge, the upper package substrate having a first region arranged near the first edge and a second region arranged near the second edge, the upper package comprising a first upper semiconductor device overlying the upper package substrate;
a lower package having a lower package substrate and a lower semiconductor device, the lower package connected to the upper package through a plurality of inter-package connectors, the inter-package connectors comprising:

first inter-package connectors configured to transmit data signals;

second inter-package connectors configured to transmit address/control signals;

third inter-package connectors configured to provide a supply voltage for a address/control circuit;

fourth inter-package connectors configured to provide a supply voltage for a data circuit, wherein a majority of the first and second inter-package connectors are disposed in the first region, and wherein a majority of the third inter-package connectors are disposed in the second region.

2. The package stack structure of claim 1, wherein a majority of the fourth inter-package connectors are disposed in the first region.

3. The package stack structure of claim 1, wherein a boundary line dividing the first region and the second region extends along approximately a center of the upper package substrate.

4. The structure of claim 1, wherein the first upper semiconductor device includes:

first bonding pads configured to transmit the data signals being electrically connected to the first inter-package connectors;

second bonding pads configured to transmit the address/control signals being electrically connected to the second inter-package connectors;

third bonding pads configured to provide the supply voltage for the address/control circuit; and fourth bonding pads configured to provide the supply voltage for the data circuit.

5. The structure of claim 4, wherein a majority of the first bonding pads are disposed near the first edge and a majority of the second bonding pads are disposed near the second edge.

6. The structure of claim 4, wherein a majority of the first and second bonding pads are disposed near the first edge.

7. The structure of claim 6, wherein a majority of the third bonding pads are located near the second edge.

8. The structure of claim 6, wherein a majority of the fourth bonding pads are located near the first edge.

9. The structure of claim 6, wherein a majority of the third and fourth bonding pads are located near the first edge.

10. The structure of claim 4, wherein the first upper semiconductor device comprises:

first chip pads electrically connected to the first bonding pads via a first redistribution layer;

second chip pads electrically connected to the second bonding pads via a second redistribution layer.

11. The structure of claim 4, wherein the first and second bonding pads are chip pads.

12. The structure of claim 4, wherein the upper package further includes a second upper semiconductor device adjacent the first upper semiconductor device, wherein the second upper semiconductor devices includes:

first bonding pads configured to transmit the data signals being electrically connected to the first inter-package connectors;

second bonding pads configured to transmit the address/control signals being electrically connected to the second inter-package connectors, third bonding pads configured to provide the supply voltage for the address/control circuit; and fourth bonding pads configured to provide the supply voltage for the data circuit.

13. The structure of claim 12, wherein a majority of the first and second bonding pads of the first and second upper semiconductor devices are disposed near the first region and a majority of the third bonding pads of the first and second upper semiconductor devices are disposed near the second region.

14. The structure of claim 13, wherein the lower semiconductor device includes a memory control circuit disposed near the first region of the upper package substrate, wherein a single signal channel is formed between the first and second bonding pads of the first and second upper semiconductor devices and the memory control circuit for controlling the first and second upper semiconductor devices together.

15. The structure of claim 13, wherein the first and second upper semiconductor devices are DRAMs and the lower semiconductor device is a logic device.

16. The structure of claim 12, wherein substantially all of the first through fourth bonding pads of the first and second upper semiconductor devices are disposed near the first region.

17. The structure of claim 16, wherein the first and second upper semiconductor devices are non-volatile memories and the lower semiconductor device is a logic device.

18. The structure of claim 12, wherein the upper package substrate has a third edge and a fourth edge opposite to the third edge disposed between the first edge and the second edge, wherein a majority of the first and second bonding pads of the second upper semiconductor device are disposed near the third edge and wherein a majority of the third bonding pads of the second upper semiconductor device are disposed near the fourth edge opposite to the third edge.

19. The structure of claim 18, wherein the lower semiconductor device includes a first memory control circuit disposed near the first edge of the upper package substrate and a second memory control circuit near the third edge of the upper package substrate, wherein a first channel is formed between the first and second bonding pads of the first upper semiconductor device and the first memory control circuit to control the first upper semiconductor device, and wherein a second channel is formed between the first and second bonding pads of the second upper semiconductor device and the second memory control circuit to control the second upper semiconductor device such that multiple channels are formed between the first and second upper semiconductor devices and the lower semiconductor device.

20. The structure of claim 19, wherein the lower semiconductor device is electrically connected to the lower semiconductor substrate using conductive bumps, and the conductive bumps are electrically connected to the first and second memory control circuits.

21. The structure of claim 18, wherein the first and second upper semiconductor devices are DRAMs and the lower semiconductor device is a logic device.

22. The structure of claim 1, wherein the upper package further includes a second upper semiconductor device overlying the first upper semiconductor device, wherein a long axis of the second upper semiconductor device is substantially parallel with respect to a long axis of the first upper semiconductor device.

23. The structure of claim 1, wherein the upper package further includes a second upper semiconductor device overlying the first upper semiconductor device, wherein a long axis of the second upper semiconductor device is disposed at right angles with respect to a long axis of the first upper semiconductor device.

24. The structure of claim 1, wherein the upper package substrate includes a first upper metal layer, an upper metal core layer, and a second upper metal layer, which are sequentially stacked, and the upper metal core layer is thicker than each of the first and second upper metal layers.

25. The structure of claim 24, wherein the upper metal core layer of the upper package substrate is electrically connected to the second inter-package connectors.

26. The structure of claim 1, wherein the lower package substrate includes a first lower metal layer, a second lower metal layer, a lower metal core layer, a third lower metal layer, and a fourth lower metal layer, which are stacked sequentially, and the lower metal core layer is thicker than each of the first lower metal layer, the second lower metal layer, the third lower metal layer, and the fourth lower metal layer.

27. The structure of claim 26, wherein the lower metal core layer of the lower package substrate is electrically connected to the second inter-package connectors.

28. The structure of claim 26, wherein the first inter-package connectors are electrically connected to the first upper semiconductor device through the first metal layer.

29. A semiconductor package comprising:
a package substrate having a first edge and a second edge opposite to the first edge, the package substrate having a first region arranged near the first edge and a second region arranged near the second edge,
a semiconductor device overlying the package substrate;
a plurality of inter-package connectors attached a bottom surface of the package substrate, the plurality of inter-package connectors comprising:
  first inter-package connectors configured to transmit data signals;
  second inter-package connectors configured to transmit address/control signals;
  third inter-package connectors configured to provide a supply voltage for an address/control circuit;
  fourth inter-package connectors configured to provide a supply voltage for a data circuit,
wherein a majority of the first and second inter-package connectors are disposed in the first region, and
wherein a majority of the third inter-package connectors are disposed in the second region.

30. A package stack structure comprising:
an upper package comprising a first edge and a second edge opposite or near the first edge;
the upper package further comprising a surface comprising a first region arranged near the first edge and a second region located near the second edge;
a lower package connected to the upper package through a plurality of inter-package connectors, the inter-package connectors comprising:
  first inter-package connectors configured to transmit data signals,
  second inter-package connectors configured to transmit address/control signals, and
  third inter-package connectors configured to provide a supply voltage for an address/control circuit,
wherein the first and second inter-package connectors are exclusively disposed in the first region, and
wherein the third inter-package connectors are exclusively disposed in the second region.

31. The package stack structure of claim 30, wherein the inter-package connectors further comprise fourth inter-package connectors configured to provide a supply voltage for a data circuit, the fourth inter-package connectors being exclusively disposed in the first region.

* * * * *